US009411230B2

(12) United States Patent
Takizawa et al.

(10) Patent No.: US 9,411,230 B2
(45) Date of Patent: Aug. 9, 2016

(54) PATTERN FORMING METHOD, ELECTRON BEAM-SENSITIVE OR EXTREME ULTRAVIOLET-SENSITIVE COMPOSITION, RESIST FILM, METHOD FOR MANUFACTURING ELECTRONIC DEVICE USING THE SAME, AND ELECTRONIC DEVICE

(71) Applicant: FUJIFILM Corporation, Tokyo (JP)

(72) Inventors: Hiroo Takizawa, Shizuoka (JP); Kaoru Iwato, Shizuoka (JP); Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 14 days.

(21) Appl. No.: 14/227,344

(22) Filed: Mar. 27, 2014

(65) Prior Publication Data

US 2014/0212796 A1 Jul. 31, 2014

Related U.S. Application Data

(63) Continuation of application No. PCT/JP2012/074315, filed on Sep. 14, 2012.

(30) Foreign Application Priority Data

Sep. 30, 2011 (JP) ................................ 2011-218546

(51) Int. Cl.

| | |
|---|---|
| ***G03F 7/038*** | (2006.01) |
| ***G03F 7/32*** | (2006.01) |
| ***G03F 7/004*** | (2006.01) |
| ***G03F 7/039*** | (2006.01) |
| ***G03F 7/11*** | (2006.01) |
| ***G03F 7/20*** | (2006.01) |
| ***G03F 7/40*** | (2006.01) |

(52) U.S. Cl.

CPC ............ *G03F 7/0388* (2013.01); *G03F 7/0045* (2013.01); *G03F 7/0046* (2013.01); *G03F 7/038* (2013.01); *G03F 7/0392* (2013.01); *G03F 7/0397* (2013.01); *G03F 7/11* (2013.01); *G03F 7/2041* (2013.01); *G03F 7/325* (2013.01); *G03F 7/405* (2013.01)

(58) Field of Classification Search

CPC ... G03F 7/0045; G03F 7/0046; G03F 7/0388; G03F 7/325; G03F 7/2041; G03F 7/038; G03F 7/0392; G03F 7/11; G03F 7/405; G03F 7/0397; G03F 7/2059; G03F 7/2004

USPC .......................... 430/9, 18, 270.1, 288.1, 325

See application file for complete search history.

(56) References Cited

U.S. PATENT DOCUMENTS

| | | | |
|---|---|---|---|
| 2002/0061462 | A1 | 5/2002 | Uenishi |
| 2008/0241745 | A1 | 10/2008 | Shirakawa et al. |
| 2010/0167178 | A1 | 7/2010 | Yamato et al. |
| 2010/0248143 | A1 | 9/2010 | Ito et al. |
| 2011/0159433 | A1 | 6/2011 | Takahashi et al. |
| 2011/0177462 | A1 | 7/2011 | Hatakeyama et al. |
| 2011/0236826 | A1 | 9/2011 | Hatakeyama et al. |
| 2011/0236831 | A1 | 9/2011 | Hasegawa et al. |
| 2011/0300485 | A1 | 12/2011 | Tsubaki et al. |
| 2012/0009527 | A1 | 1/2012 | Hatakeyama et al. |
| 2012/0009529 | A1 | 1/2012 | Hatakeyama |
| 2012/0077131 | A1 | 3/2012 | Enomoto et al. |
| 2013/0040096 | A1 | 2/2013 | Iwato et al. |
| 2013/0337385 | A1 | 12/2013 | Furukawa et al. |
| 2014/0004467 | A1 | 1/2014 | Hirano et al. |

FOREIGN PATENT DOCUMENTS

| | | | |
|---|---|---|---|
| CN | 101473268 | A | 7/2009 |
| JP | 2002-148806 | A | 5/2002 |
| JP | 2008-268935 | A | 11/2008 |
| JP | 2010-85499 | A | 4/2010 |
| JP | 2010-85971 | A | 4/2010 |
| JP | 2010-217884 | A | 9/2010 |
| JP | 2010-256856 | A | 11/2010 |
| JP | 2011-123469 | A | 6/2011 |
| JP | 2011-170316 | A | 9/2011 |
| JP | 2011-221513 | A | 11/2011 |
| JP | 2011-248019 | A | 12/2011 |
| JP | 2012-32806 | A | 2/2012 |
| JP | 2012-32807 | A | 2/2012 |
| TW | 200804243 | A | 1/2008 |
| TW | 201202269 | A1 | 1/2012 |
| WO | 2007/147782 | A2 | 12/2007 |
| WO | 2007/147782 | A3 | 12/2007 |
| WO | WO 2011/025070 | A1 * | 3/2011 |
| WO | 2011/104127 | A1 | 9/2011 |
| WO | 2011/149035 | A1 | 12/2011 |
| WO | 2012/114963 | A1 | 8/2012 |
| WO | 2012/121278 | A1 | 9/2012 |
| WO | 2013/047895 | A1 | 4/2013 |

OTHER PUBLICATIONS

Computer-generated translation of JP 2010-085499 (Apr. 2010).*

(Continued)

*Primary Examiner* — John A McPherson

(74) *Attorney, Agent, or Firm* — Sughrue Mion, PLLC

(57) ABSTRACT

There is provided a pattern forming method comprising (1) a step of forming a film by using an electron beam-sensitive or extreme ultraviolet-sensitive resin composition, (2) a step of exposing the film by using an electron beam or an extreme ultraviolet ray, and (3) a step of developing the exposed film by using an organic solvent-containing developer, wherein the electron beam-sensitive or extreme ultraviolet-sensitive resin composition contains (A) a resin containing (R) a repeating unit having a structural moiety capable of decomposing upon irradiation with an electron beam or an extreme ultraviolet ray to generate an acid, and (B) a solvent.

25 Claims, No Drawings

(56) References Cited

OTHER PUBLICATIONS

Office Action dated Jul. 8, 2014, issued by the Japanese Patent Office in counterpart Japanese Application No. 2011-218546.

Communication from the Japanese Patent Office dated Nov. 11, 2014, in a counterpart Japanese application No. 2011-218546.

Communication from the European Patent Office issued Apr. 24, 2015 in a counterpart European Application No. 12837295.0.

International Search Report (PCT/ISA/210), dated Oct. 23, 2012, issued by the International Searching Authority in counterpart International Patent Application No. PCT/JP2012/074315.

Written Opinion (PCT/ISA/237), dated Oct. 23, 2012, issued by the International Searching Authority in counterpart International Patent Application No. PCT/JP2012/074315.

Communication from the Taiwanese Patent Office dated Nov. 18, 2015 in a counterpart Taiwanese application No. 101134915.

Communication issued Apr. 21, 2016, issued by the State Intellectual Property Office of the People's Republic of China in counterpart Chinese Patent Application No. 201280047789.5.

Office Action dated May 12, 2016 issued by the Taiwanese Patent Office in counterpart Taiwanese Patent Application No. 101134915.

* cited by examiner

PATTERN FORMING METHOD, ELECTRON BEAM-SENSITIVE OR EXTREME ULTRAVIOLET-SENSITIVE COMPOSITION, RESIST FILM, METHOD FOR MANUFACTURING ELECTRONIC DEVICE USING THE SAME, AND ELECTRONIC DEVICE

CROSS REFERENCE TO RELATED APPLICATION

This is a continuation of International Application No. PCT/JP2012/074315 filed on Sep. 14, 2012, and claims priority from Japanese Patent Application No. 2011-218546 filed on Sep. 30, 2011, the entire disclosures of which are incorporated therein by reference.

TECHNICAL FIELD

The present invention relates to a pattern forming method using a developer containing an organic solvent, an electron beam-sensitive or extreme ultraviolet-sensitive resin composition, and a resist film, which are suitably used for the ultramicrolithography process such as production of VLSI or high-capacity microchip or in other photofabrication processes, and also relates to a manufacturing method of an electronic device using the same, and an electronic device. More specifically, the present invention relates to a resist pattern forming method using a developer containing an organic solvent, an electron beam-sensitive or extreme ultraviolet-sensitive resin composition, and a resist film, which can be suitably used for semiconductor microfabrication employing an electron beam or EUV light (wavelength: near 13 nm), and also relates to a manufacturing method of an electronic device using the same, and an electronic device.

BACKGROUND ART

In the process of producing a semiconductor device such as IC and LSI, microfabrication by lithography using a photoresist composition has been conventionally performed. Recently, with the increase in integration degree of an integrated circuit, formation of an ultrafine pattern in the submicron or quarter-micron region is required. To cope with this requirement, the exposure wavelength also tends to become shorter, for example, from g line to i line or further to KrF excimer laser light. At present, other than the excimer laser light, development of lithography using electron beam, X-ray or EUV light is also proceeding.

The lithography using electron beam, X-ray or EUV light is positioned as a next-generation or next-next-generation pattern formation technology and a high-sensitivity and high-resolution resist composition is being demanded.

Particularly, in order to shorten the wafer processing time, elevation of sensitivity is very important, but when higher sensitivity is sought for, the pattern profile or the resolution indicated by the limiting resolution line width is deteriorated, and development of a resist composition satisfying all of these properties at the same time is strongly demanded.

The high sensitivity is in a trade-off relationship with high resolution and good pattern profile, and it is very important how to satisfy all of these properties at the same time.

The actinic ray-sensitive or radiation-sensitive resin composition generally includes "a positive type" using a resin sparingly-soluble or insoluble in an alkali developer, where the exposed area is solubilized in an alkali developer upon exposure to radiation and a pattern is thereby formed, and "a negative type" using a resin soluble in an alkali developer, where the exposed area is sparingly solubilized or insolubilized in an alkali developer upon exposure to radiation and a pattern is thereby formed.

As the actinic ray-sensitive or radiation-sensitive resin composition suitable for such a lithography process using electron beam, X-ray or EUV light, a chemical amplification positive resist composition utilizing an acid catalytic reaction is studied from the standpoint of elevating the sensitivity, and a chemical amplification positive resist composition containing an acid generator and, as the main component, a phenolic resin having a property of being insoluble or sparingly soluble in an alkali developer but becoming soluble in an alkali developer by the action of an acid (hereinafter simply referred to as a "phenolic acid-decomposable resin") is being effectively used.

In the production of a semiconductor device or the like, patterns having various profiles such as line, trench and hole need to be formed. For meeting the requirement to form patterns having various profiles, not only a positive actinic ray-sensitive or radiation-sensitive resin composition but also a negative composition are currently under development (for example, see JP-A-2002-148806 (the term "JP-A" as used herein means an "unexamined published Japanese patent application") and JP-A-2008-268935).

In the formation of an ultrafine pattern, more improvements are demanded on the reduction of resolution and the pattern profile.

In order to solve this problem, there has been proposed a use of a resin having a photo-acid generating group at a main chain of a polymer or a side chain thereof (see JP-A-2010-85971 and JP-A-2010-256856). Moreover, there has been also proposed a method where an acid-decomposable resin is developed using a developer other than an alkali developer (see, for example, JP-A-2010-217884 and JP-A-2011-123469).

However, in the ultrafine region, it is demanded to further satisfy high sensitivity, high resolution and high line width roughness (LWR) performance all at the same time at high levels.

SUMMARY OF INVENTION

An object of the present invention is to solve the technical problem of enhancing the performance in the semiconductor microfabrication using an electron beam or an extreme ultraviolet ray (EUV light) and provide a pattern forming method, an electron beam-sensitive or extreme ultraviolet-sensitive resin composition, and a resist film, which can satisfy high sensitivity, high resolution (e.g., high resolving power) and high line width roughness (LWR) performance all at the same time at remarkably high levels, as well as providing a manufacturing method of an electronic device using the same, and an electronic device.

It has been found that the above-described object can be attained by the following configurations.

[1] A pattern forming method comprising:

(1) a step of forming a film by using an electron beam-sensitive or extreme ultraviolet-sensitive resin composition, (2) a step of exposing the film by using an electron beam or an extreme ultraviolet ray, and (3) a step of developing the exposed film by using an organic solvent-containing developer, wherein the electron beam-sensitive or extreme ultraviolet-sensitive resin composition contains (A) a resin containing (R) a repeating unit having a structural moiety capable of decomposing upon irradiation with an electron beam or an extreme ultraviolet ray to generate an acid, and (B) a solvent.

[2] The pattern forming method as described in [1] above, wherein the resin (A) further contains a repeating unit having a polar group.

[3] The pattern forming method as described in [2] above, wherein the polar group is selected from a hydroxyl group, a cyano group, a lactone group, a carboxylic acid group, a sulfonic acid group, an amide group, a sulfonamide group, an ammonium group, a sulfonium group, and a group formed by combining two or more thereof

[4] The pattern forming method as described in [1] above, wherein the resin (A) further contains a repeating unit having an acidic group.

[5] The pattern forming method as described in [4] above, wherein the acidic group is any one of a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

[6] The pattern forming method as described in any one of [1] to [5] above,
wherein the structural moiety in the repeating unit (R) is a structure capable of generating an acid group in the side chain of the resin (A) upon irradiation with an electron beam or an extreme ultraviolet ray.

[7] The pattern forming method as described in any one of [1] to [6] above, 'wherein the structural moiety in the repeating unit (R) is a nonionic structure.

[8] The pattern forming method as described in [7] above, wherein the nonionic structure is an oxime structure.

[9] The pattern forming method as described in any one of [1] to [8] above,
wherein the resin (A) further contains a repeating unit having a group capable of decomposing by the action of an acid to produce an alcoholic hydroxyl group.

[10] The pattern forming method as described in any one of [1] to [9] above,
wherein the electron beam-sensitive or extreme ultraviolet-sensitive resin composition further contains a hydrophobic resin.

[11] The pattern forming method as described in any one of [1] to [10] above, further comprising:
a step of rinsing the developed film by using a rinsing solution containing an organic solvent.

[12] An electron beam-sensitive or extreme ultraviolet-sensitive resin composition used in the pattern forming method as described in any one of [1] to [11] above.

[13] A resist film formed using the electron beam-sensitive or extreme ultraviolet-sensitive resin composition as described in [12] above.

[14] A method for manufacturing an electronic device, comprising the pattern forming method as described in any one of [1] to [11] above.

[15] An electronic device manufactured by the method for manufacturing an electronic device as described in [14] above.

According to the present invention, a pattern forming method, an electron beam-sensitive or extreme ultraviolet-sensitive resin composition, and a resist film, which can satisfy high sensitivity, high resolution (e.g., high resolving power) and high line width roughness (LWR) performance all at the same time at remarkably high levels, as well as a manufacturing method of an electronic device using the same, and an electronic device, can be provided.

DESCRIPTION OF EMBODIMENTS

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the description of the present invention, the "light" encompasses not only an extreme ultraviolet ray (EUV light) but also an electron beam.

Furthermore, in the description of the present invention, unless otherwise indicated, the "exposure" encompasses not only exposure to an extreme ultraviolet ray (EUV light) but also lithography with an electron beam.

[Pattern Forming Method]

The pattern forming method of the present invention is described below.

The pattern forming method of the present invention comprises (1) forming a film by using an electron beam-sensitive or extreme ultraviolet-sensitive resin composition, (2) exposing the film by using an electron beam or an extreme ultraviolet ray, and (3) developing the exposed film by using an organic solvent-containing developer. The electron beam-sensitive or extreme ultraviolet-sensitive resin composition contains (A) a resin containing (R) a repeating unit having a structural moiety capable of decomposing upon irradiation with an electron beam or an extreme ultraviolet ray to generate an acid, and (B) a solvent.

According to the present invention, a pattern forming method, an electron beam-sensitive or extreme ultraviolet-sensitive resin composition, and a resist film, which can satisfy high sensitivity, high resolution and high line width roughness (LWR) performance all at the same time at remarkably high levels, as well as a manufacturing method of an electronic device using the same, and an electronic device, can be provided. The reason therefor is not clearly known but is presumed as follows.

In the pattern forming method of exposing a resist film containing a resin having the repeating unit (R) to an electron beam or an extreme ultraviolet ray, a moiety capable of generating a secondary electron (typically a moiety having a polarity or acidity higher than in other moieties) is irradiated with light (that is, an electron beam or an extreme ultraviolet ray) and thereafter, the secondary electron generated from the moiety decomposes the structural moiety in the repeating unit (R) to generate an acid, whereby reaction of the acid with the resin proceeds in the exposed area.

Here, in the case of, after the exposure above, developing the resist film with an alkali developer to form a positive pattern, when a moiety capable of generating a secondary electron (as described above, typically a moiety having a higher polarity or acidity) is present at a high content in the resist film, the reaction efficiency of the acid with the resin in the exposed area may be high, but the polarity or acidity of the original resist film is increased, and there arises a tendency that also the unexposed area readily dissolves in the alkali developer to adversely affect the resolution and the like of the pattern. For this reason, in the case of forming a positive pattern by use of an alkali developer, it is considered that the resist composition must be formulated to keep low the content of the moiety capable of generating a secondary electron.

However, the present inventors have found that a system of forming a negative pattern through exposure to an electron beam or an extreme ultraviolet ray and then development with an organic solvent-containing developer (hereinafter, sometimes referred to as "organic developer") is a system where even if the content of the moiety capable of generating a secondary electron in the resist film is increased so as to enhance the sensitivity, the dissolution rate of the unexposed area for an organic developer is sufficiently high and good resolution is obtained. This is presumed to be a result because the original resist film uses a resin as the main component and has high affinity for an organic developer and the size of the content of the moiety capable of generating a secondary electron does not greatly affect easy solubility of the unexposed area for an organic developer.

The pattern forming method of performing exposure by using an electron beam or an extreme ultraviolet ray is expected to enable successful formation of a very fine pattern (for example, a pattern having a line width of 50 nm or less).

However, for example, in the case of forming a line-and-space pattern having a line width of 50 nm or less, where the ratio between the line width and the space width is 1:1, a stronger capillary force is liable to be generated in the fine space void formed at the development and when the developer is discharged from the space void, the capillary force is imposed on the side wall of the pattern having a fine line width. In this connection, in the case of forming a positive pattern by using an alkali developer, the affinity of the pattern containing a resin as the main component for the alkali developer tends to be low and therefore, the capillary force imposed on the side wall of the pattern is large to readily cause pattern collapse.

On the other hand, in the case of forming a negative pattern by using an organic developer as in the present invention, the affinity of the pattern containing a resin as the main component for the organic developer tends to be high and therefore, the capillary force imposed on the side wall of the pattern is small to hardly allow for generation of pattern collapse. In turn, it is considered that according to the present invention, high resolution (excellent limiting resolution) can be achieved. Also, the above-described small capillary force seems to contribute to improving the line width roughness (LWR) performance.

Furthermore, in the pattern forming method of the present invention, the resin (A) contains (R) a repeating unit having a structural moiety capable of decomposing upon irradiation with an electron beam or an extreme ultraviolet ray to generate an acid and the structural moiety capable of generating an acid is fixed in the resin, so that the acid diffusion length can be reduced (excessive diffusion of acid into the unexposed area can be prevented). This is considered to contribute to enhancing the resolution.

Also, when a resin having the repeating unit (R) is used, the amount of an acid having a low molecular weight in the exposed area can be decreased. Therefore, in the case of using an organic developer, the solubility of the exposed area for the developer can be easily reduced and in the case of using a resin containing the repeating unit (R), particularly the dissolution contrast for a developer containing an organic solvent can be increased, which is considered to contribute to enhancing the solubility. On the other hand, in the case of using an alkali developer, the exposed area dissolves and therefore, an enhancement of dissolution contrast thanks to the above-described mechanism is not produced.

Furthermore, in the case where only a low molecular compound capable of decomposing upon irradiation with an actinic ray or radiation to generate an acid is used as the acid generator, aggregation of the acid generator may be caused in the composition and the composition film. On the other hand, when a resin containing the repeating unit (R) is used, such aggregation can be prevented. That is, the structural moiety capable of decomposing upon irradiation with an actinic ray or radiation to generate an acid can be relatively uniformly distributed in the resist film, and this is considered to improving the LWR performance.

As described above, in the present invention, in addition to enhancement of sensitivity by virtue of employing a negative pattern forming method using an organic developer, thanks to more improvement of resolution and LWR performance, which is probably brought about by the synergistic effect of reduction in the capillary force with the function of the repeating unit (R), high sensitivity, high resolution and high LWR performance are considered to be satisfied all at the same time at remarkably high levels.

<Electron Beam-Sensitive or Extreme Ultraviolet-Sensitive Resin Composition>

The electron beam-sensitive or extreme ultraviolet-sensitive resin composition which can be used in the present invention is described below.

The electron beam-sensitive or extreme ultraviolet-sensitive resin composition according to the present invention is used for negative development (development where the solubility for developer is decreased when exposed, as a result, the exposed area remains as a pattern and the unexposed area is removed). That is, the electron beam-sensitive or extreme ultraviolet-sensitive resin composition according to the present invention can be an electron beam-sensitive or extreme ultraviolet-sensitive resin composition for organic solvent development, which is used for development using an organic solvent-containing developer. The "for organic solvent development" as used herein means usage where the composition is subjected to at least a step of performing development by using an organic solvent-containing developer.

In this way, the present invention also relates to the electron beam-sensitive or extreme ultraviolet-sensitive resin composition used for the pattern forming method of the present invention.

The electron beam-sensitive or extreme ultraviolet-sensitive resin composition of the present invention is typically a resist composition and is preferably a negative resist composition (that is, a resist composition for organic solvent development), because particularly high effects can be obtained. The composition according to the present invention is typically a chemical amplification resist composition.

The composition for use in the present invention contains [A] a resin and [B] a solvent. The composition may further contain at least one of [C] a compound capable of decomposing upon irradiation with an actinic ray or radiation to generate an acid (hereinafter, sometimes referred to as "acid generator"), [D] a basic compound, [E] a hydrophobic resin, [F] a surfactant, and [G] other additives. These components are described below in order.

[A] Resin

The composition according to the present invention contains a resin. This resin contains a repeating unit having a partial structure capable of decomposing upon irradiation with an actinic ray or radiation [hereinafter, sometimes referred to as "repeating unit (R)"].

[1] Repeating Unit (R)

The repeating unit (R) may have any structure as long as it has a structural unit capable of decomposing upon irradiation with an actinic ray or radiation to generate an acid.

The repeating unit (R) is preferably represented by any one of the following formulae (III) to (VII), more preferably represented by any one of the following formulae (III), (VI) and (VII), still more preferably represented by the following formula (III):

(III)

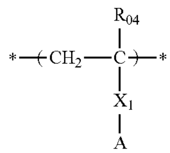

(IV)

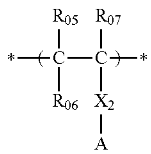

(V)

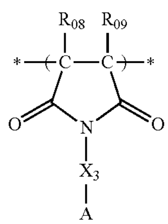

(VI)

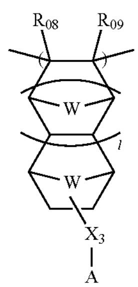

(VII)

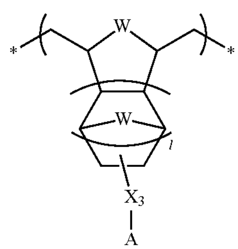

In the formula, each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group.

$R_{06}$ represents a cyano group, a carboxy group, —CO—$OR_{25}$ or —CO—N($R_{26}$)($R_{27}$). In the case where $R_{06}$ represents —CO—N($R_{26}$)($R_{27}$), $R_{26}$ and $R_{27}$ may combine with each other to form a ring together with the nitrogen atom.

Each of $X_1$ to $X_3$ independently represents a single bond, an arylene group, an alkylene group, a cycloalkylene group, —O—, —$SO_2$—, —CO—, —N($R_{33}$)— or a divalent linking group formed by combining a plurality of these.

$R_{25}$ represents an alkyl group, a cycloalkyl group, an alkenyl group, a cycloalkenyl group, an aryl group or an aralkyl group.

Each of $R_{26}$, $R_{27}$ and $R_{33}$ independently represents a hydrogen atom, an alkyl group, a cycloalkyl group, an alkenyl group, a cycloalkenyl group, an aryl group or an aralkyl group.

W represents —O—, —S— or a methylene group.

l represents 0 or 1.

A represents a structural moiety capable of decomposing upon irradiation with an actinic ray or radiation to generate an acid.

Each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group. Each of $R_{04}$, $R_{05}$ and $R_{07}$ to $R_{09}$ is preferably a hydrogen atom or an alkyl group.

The alkyl group of $R_{04}$, $R_{05}$ and $R_{07}$ to $R_{09}$ may be a linear or branched-chain alkyl group. The carbon umber of the alkyl group is preferably 20 or less, more preferably 8 or less. Examples of the alkyl group include a methyl group, an ethyl group, a propyl group, an isopropyl group, an n-butyl group, a sec-butyl group, a hexyl group, a 2-ethylhexyl group, an octyl group and a dodecyl group.

The cycloalkyl group of $R_{04}$, $R_{05}$ and $R_{07}$ to $R_{09}$ may be monocyclic or polycyclic. The carbon number of the cycloalkyl group is preferably from 3 to 8. Examples of the cycloalkyl group include a cyclopropyl group, a cyclopentyl group and a cyclohexyl group.

The halogen atom of $R_{04}$, $R_{05}$ and $R_{07}$ to $R_{09}$ includes fluorine atom, chlorine atom, bromine atom and iodine atom, with fluorine atom being preferred.

As the alkyl group moiety in the alkoxycarbonyl group of $R_{04}$, $R_{05}$ and $R_{07}$ to $R_{09}$, those described above as the alkyl group of $R_{04}$, $R_{05}$ and $R_{07}$ to $R_{09}$ are preferred.

$R_{06}$ represents a cyano group, a carboxy group, —CO—$OR_{25}$ or —CO—N($R_{26}$)($R_{27}$). $R_{06}$ is preferably a carboxy group or —CO—$OR_{25}$.

Each of $X_1$ to $X_3$ independently represents a single bond, an arylene group, an alkylene group, a cycloalkylene group, —O—, —$SO_2$—, —CO—, —N($R_{33}$)— or a divalent linking group formed by combining a plurality of these. Each of $X_i$ to $X_3$ preferably contains —COO— or an arylene group, more preferably —COO—.

The arylene group which may be contained in the divalent linking group of $X_i$ to $X_3$ is preferably an arylene group having a carbon number of 6 to 14. Examples of such an arylene group include a phenylene group, a tolylene group and a naphthylene group.

The alkylene group which may be contained in the divalent linking group of $X_1$ to $X_3$ is preferably an alkylene group having a carbon number of 1 to 8. Examples of such an alkylene group include a methylene group, an ethylene group, a propylene group, a butylene group, a hexylene group and an octylene group.

The cycloalkylene group which may be contained in the divalent linking group of $X_1$ to $X_3$ is preferably a cycloalkylene group having a carbon number of 5 to 8. Examples of such a cycloalkylene group include a cyclopentylene group and a cyclohexylene group.

$R_{25}$ represents an alkyl group, a cycloalkyl group, an alkenyl group, a cycloalkenyl group, an aryl group or an aralkyl group. $R_{25}$ is preferably an alkyl group.

Each of $R_{26}$, $R_{27}$ and $R_{33}$ independently represents a hydrogen atom, an alkyl group, a cycloalkyl group, an alkenyl group, a cycloalkenyl group, an aryl group or an aralkyl group. Each of $R_{26}$, $R_{27}$ and $R_{33}$ is preferably a hydrogen atom or an alkyl group.

Examples of the alkyl group of $R_{25}$ to $R_{27}$ and $R_{33}$ are the same as those described above as the alkyl group of $R_{04}$, $R_{05}$ and $R_{07}$ to $R_{09}$.

Examples of the cycloalkyl group of $R_{25}$ to $R_{27}$ and $R_{33}$ are the same as those described above as the cycloalkyl group of $R_{04}$, $R_{05}$ and $R_{07}$ to $R_{09}$.

The alkenyl group of $R_{25}$ to $R_{27}$ and $R_{33}$ may be a linear or branched-chain alkenyl group. The carbon number of the alkenyl group is preferably from 2 to 6. Examples of such an alkenyl group include a vinyl group, a propenyl group, an allyl group, a butenyl group, a pentenyl group and a hexenyl group.

The cycloalkenyl group of $R_{25}$ to $R_{27}$ and $R_{33}$ may be monocyclic or polycyclic. The carbon number of the cycloalkenyl group is preferably from 3 to 6. Examples of such a cycloalkenyl group include a cyclohexenyl group.

The aryl group of $R_{25}$ to $R_{27}$ and $R_{33}$ may be monocyclic or polycyclic. The carbon number of the aryl group is preferably from 6 to 14. Examples of such an aryl group include a phenyl group, a tolyl group, a chlorophenyl group, a methoxyphenyl group and a naphthyl group. Incidentally, the aryl groups may combine with each other to form a heterocyclic ring.

The aralkyl group of $R_{25}$ to $R_{27}$ and $R_{33}$ is preferably an aralkyl group having a carbon number of 7 to 15. Examples of such an aralkyl group include a benzyl group, a phenethyl group and a cumyl group.

As described above, $R_{26}$ and $R_{27}$ may combine with each other to form a ring together with the nitrogen atom. The ring formed is preferably a 5-to 8-membered ring. Examples of such a ring include a pyrrolidine ring, a piperidine ring and a piperazine ring.

W represents —O—, —S— or a methylene group. W is preferably a methylene group.

l represents 0 or 1. l is preferably 0.

Each of these groups may have a substituent. Examples of the substituent include a hydroxy group; a halogen atom (e.g., fluorine atom, chlorine atom, bromine atom, iodine atom); a nitro group; a cyano group; an amido group; a sulfonamido group; the alkyl group described above, for example, for $R_{04}$ to $R_{09}$, $R_{25}$ to $R_{27}$ and $R_{33}$; an alkoxy group such as methoxy group, ethoxy group, hydroxyethoxy group, propoxy group, hydroxypropoxy group and butoxy group; an alkoxycarbonyl group such as methoxycarbonyl group and ethoxycarbonyl group; an acyl group such as formyl group, acetyl group and benzoyl group; an acyloxy group such as acetoxy group and butyryloxy group; and a carboxy group. The carbon number of the substituent is preferably 8 or less.

A represents a structural moiety capable of decomposing upon irradiation with an actinic ray or radiation to produce an acid anion. This structural unit is described in detail below.

The structural moiety capable of decomposing upon irradiation with an actinic ray or radiation to produce an acid anion (for example, the structural moiety represented by A), contained in the repeating unit (R), includes, for example, structural moieties contained in a photo-initiator for cationic photopolymerization, a photo-initiator for radical photopolymerization, a photodecoloring agent for dyes, a photodiscoloring agent, and compounds capable of generating an acid by light and used for a microresist and the like.

The structural moiety preferably has a structure capable of generating an acid group in the side chain of the resin upon irradiation with an actinic ray or radiation. When such a structure is employed, the acid generated is more inhibited from diffusion, and the resolution, exposure latitude (EL) and pattern profile can be more improved.

The structural moiety may have an ionic structure or a nonionic structure. As the structural moiety, a nonionic structural moiety is preferably employed. In this case, as compared with employing an ionic structural moiety as the above-described structural moiety, the roughness characteristics can be more improved. The reason therefor is not necessarily clarified, but the present inventors presume as follows. That is, in the case of using a developer containing an organic solvent, by virtue of employing a nonionic structure, the solubility of the unexposed area in the developer is more increased. In turn, the dissolution contrast for the developer containing an organic solvent is more enhanced. In addition, also in the case of using an alkali developer, by virtue of the unexposed area having a nonionic structure, film loss is more difficult to occur. As a result, the pattern profile can be more improved.

(Nonionic Structural Moiety)

As described above, the repeating unit (R) preferably has a nonionic structural unit capable of generating an acid upon irradiation with an actinic ray or radiation. Preferred examples of the nonionic structural moiety include a structural moiety having an oxime structure.

The nonionic structural moiety includes, for example, a structural moiety represented by the following formula (N1). This structural moiety has an oxime sulfonate structure.

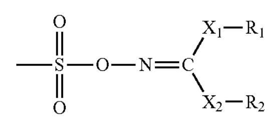

(N1)

In the formula, each of $R_1$ and $R_2$ independently represents a hydrogen atom, a halogen atom, a cyano group, an alkyl group, a cycloalkyl group, an alkenyl group, a cycloalkenyl group, an aryl group or an aralkyl group. Here, the aromatic ring in the aryl group and the aralkyl group may be an aromatic heterocyclic ring.

Each of $X_1$ and $X_2$ independently represents a single bond or a divalent linking group. $X_1$ and $X_2$ may combine with each other to form a ring.

The alkyl group of $R_1$ and $R_2$ may be a linear or branched-chain alkyl group. The carbon number of the alkyl group is preferably 30 or less, more preferably 18 or less. Examples of the alkyl group include a methyl group, an ethyl group, a propyl group, an isopropyl group, an n-butyl group, a sec-butyl group, a hexyl group, a 2-ethylhexyl group, an octyl group and a dodecyl group.

The cycloalkyl group of $R_1$ and $R_2$ may be monocyclic or polycyclic. The carbon number of the cycloalkyl group is preferably from 3 to 30. Examples of the cycloalkyl group include a cyclopropyl group, a cyclopentyl group and a cyclohexyl group.

The alkenyl group of $R_1$ and $R_2$ may be a linear or branched-chain alkenyl group. The carbon number of the alkenyl group is preferably from 2 to 30. Examples of the alkenyl group include a vinyl group, a propenyl group, an allyl group, a butenyl group, a pentenyl group and a hexenyl group.

The cycloalkenyl group of $R_1$ and $R_2$ may be monocyclic or polycyclic. The carbon number of the cycloalkenyl group is preferably from 3 to 30. Examples of the cycloalkenyl group include a cyclohexenyl group.

The aryl group of $R_1$ and $R_2$ may be monocyclic or polycyclic. The aryl group is preferably an aromatic group having a carbon number of 6 to 30. Examples of such an aryl group include a phenyl group, a tolyl group, a chlorophenyl group, a methoxyphenyl group, a naphthyl group, a biphenyl group, and a terphenyl group. Incidentally, the aryl groups may combine with each other to form a heterocyclic ring.

The aralkyl group of $R_1$ and $R_2$ is preferably an aralkyl group having a carbon number of 7 to 15. Examples of the aralkyl group include a benzyl group, a phenethyl group and a cumyl group.

As described above, the aromatic ring in the aryl group and the aralkyl group may be an aromatic heterocyclic ring. That is, these groups may have a heterocyclic structure containing a heteroatom such as oxygen atom, nitrogen atom and sulfur atom.

Each of these groups may have a substituent. Examples of the substituent include a hydroxy group; a halogen atom (e.g., fluorine atom, chlorine atom, bromine atom, iodine atom); a nitro group; a cyano group; an amido group; a sulfonamido group; the alkyl group described above, for example, for $R_1$ and $R_2$; an alkoxy group such as methoxy group, ethoxy group, hydroxyethoxy group, propoxy group, hydroxypropoxy group and butoxy group; an alkoxycarbonyl group such as methoxycarbonyl group and ethoxycarbonyl group; an acyl group such as formyl group, acetyl group and benzoyl group; an acyloxy group such as acetoxy group and butyryloxy group; and a carboxy group. The carbon number of the substituent is preferably 8 or less.

The divalent linking group of $X_1$ and $X_2$ includes, for example, the groups illustrated below, and a group formed by combining at least two of these structural units. Such a linking group may have a substituent. The number of atoms of the divalent linking group as $X_1$ and $X_2$ is preferably 40 or less.

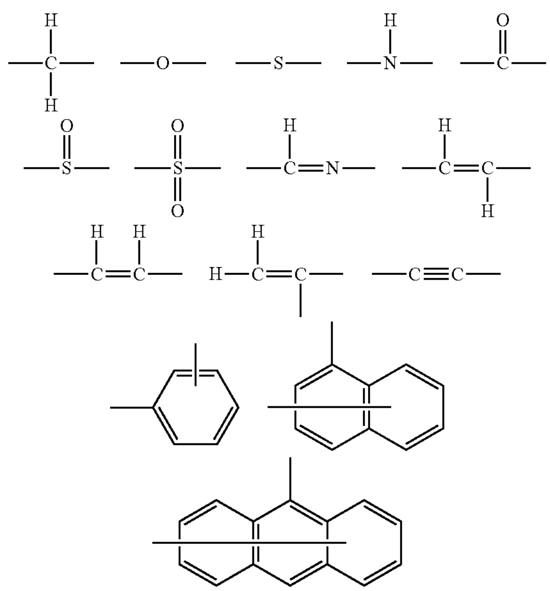

Examples of the substituent which the above-described divalent linking group may have are the same as those described above for $R_1$ and $R_2$.

As described above, $X_1$ and $X_2$ may combine with each other to form a ring. The ring is preferably a 5-to 7-membered ring. Also, the ring may contain a sulfur atom or an unsaturated bond.

The structural moiety represented by formula (N1) is more preferably represented by either one of the following formulae (N1-I) and (N1-II):

(N1-I)

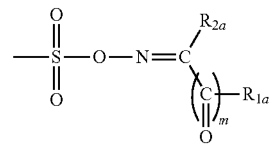

(N1-II)

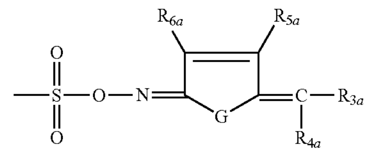

In the formulae, $R_{1a}$ represents a hydrogen atom, an alkyl group (preferably having a carbon number of 1 to 18; may have a divalent linking group in the chain), a cycloalkyl group (preferably having a carbon number of 3 to 30; may have a divalent linking group in the chain), a monocyclic or polycyclic aryl group (preferably having a carbon number of 6 to 30; a plurality of aryl groups may combine through a single bond, an ether group or a thioether group), a heteroaryl group (preferably having a carbon number of 6 to 30), an alkenyl group (preferably having a carbon number of 2 to 12), a cycloalkenyl group (preferably having a carbon number of 4 to 30), an aralkyl group (preferably having a carbon number of 7 to 15; may have a heteroatom), a halogen atom, a cyano group, an alkoxycarbonyl group (preferably having a carbon number of 2 to 6), or a phenoxycarbonyl group.

$R_{2a}$ represents a hydrogen atom, an alkyl group (preferably having a carbon number of 1 to 18; may have a divalent linking group in the chain), a cycloalkyl group (preferably having a carbon number of 3 to 30; may have a divalent linking group in the chain), a monocyclic or polycyclic aryl group (preferably having a carbon number of 6 to 30; a plurality of aryl groups may combine through a single bond, an ether group or a thioether group), a heteroaryl group (preferably having a carbon number of 6 to 30), an alkenyl group (preferably having a carbon number of 2 to 12), a cycloalkenyl group (preferably having a carbon number of 4 to 30), an aralkyl group (preferably having a carbon number of 7 to 15; may have a heteroatom), a halogen atom, a cyano group, an alkoxycarbonyl group (preferably having a carbon number of 2 to 6), a phenoxycarbonyl group, an alkanoyl group (preferably having a carbon number of 2 to 18), a benzoyl group, a nitro group, —$S(O)_p$-alkyl group (preferably having a carbon number of 1 to 18; in the formula, p represents 1 or 2), —$S(O)_p$-aryl group (preferably having a carbon number of 6 to 12; in the formula, p represents 1 or 2), —$SO_2O$-alkyl group (preferably having a carbon number of 1 to 18), or —$SO_2O$-aryl group (preferably having a carbon number of 6 to 12).

$R_{1a}$ and $R_{2a}$ may combine with each other to form a ring (preferably a 5-to 7-membered ring).

m represents 0 or 1.

Each of $R_{3a}$ and $R_{4a}$ independently represents a hydrogen atom, an alkyl group (preferably having a carbon number of 1 to 18; may have a divalent linking group in the chain), a cycloalkyl group (preferably having a carbon number of 3 to 30; may have a divalent linking group in the chain), a monocyclic or polycyclic aryl group (preferably having a carbon number of 6 to 30; a plurality of aryl groups may combine through a single bond, an ether group or a thioether group), a heteroaryl group (preferably having a carbon number of 6 to 30), an alkenyl group (preferably having a carbon number of 2 to 12), a cycloalkenyl group (preferably having a carbon number of 4 to 30), a cyano group, an alkoxycarbonyl group (preferably having a carbon number of 2 to 6), a phenoxycarbonyl group, an alkanoyl group (preferably having a carbon number of 2 to 18), a benzoyl group, a nitro group, —$S(O)_p$-alkyl group (preferably having a carbon number of 1 to 18; in the formula, p represents 1 or 2), —$S(O)_p$-aryl group (preferably having a carbon number of 6 to 12; in the formula, p represents 1 or 2), —$SO_2O$-alkyl group (preferably having a carbon number of 1 to 18), or —$SO_2O$-aryl group (preferably having a carbon number of 6 to 12).

$R_{3a}$ and $R_{4a}$ may combine with each other to form a ring (preferably a 5-to 7-membered ring).

Each of $R_{5a}$ and $R_{6a}$ independently represents a hydrogen atom, an alkyl group (preferably having a carbon number of 1 to 18), a cycloalkyl group (preferably having a carbon number of 3 to 30; may have a divalent linking group in the chain), a halogen atom, a nitro group, a cyano group, an aryl group (preferably having a carbon number of 6 to 30), or a heteroaryl group (preferably having a carbon number of 6 to 30).

Examples of the divalent linking group in $R_{1a}$ to $R_{6a}$ are the same as those of the divalent linking group of $X_1$ and $X_2$ in formula (N1), and an ether group and a thioether group are preferred.

G represents an ether group or a thioether group.

Each of the above-described groups may have a substituent. Examples of the substituent include a hydroxy group; a halogen atom (e.g., fluorine atom, chlorine atom, bromine atom, iodine atom); a nitro group; a cyano group; an amido group; a sulfonamido group; the alkyl group described above, for example, for $R_1$ and $R_2$ of formula (N1); an alkoxy group such as methoxy group, ethoxy group, hydroxyethoxy group, propoxy group, hydroxypropoxy group and butoxy group; an alkoxycarbonyl group such as methoxycarbonyl group and ethoxycarbonyl group; an acyl group such as formyl group, acetyl group and benzoyl group; an acyloxy group such as acetoxy group and butyryloxy group; and a carboxy group. The carbon number of the substituent is preferably 8 or less.

Specific examples of the group represented by formula (N1-I) or (N1-II) are illustrated below.

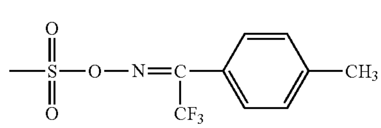

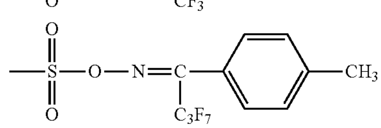

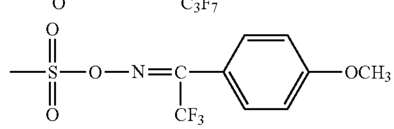

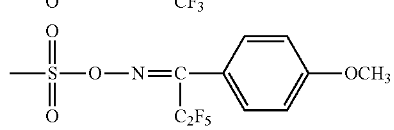

-continued

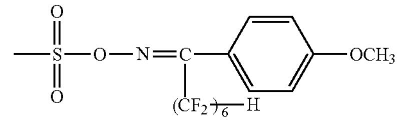

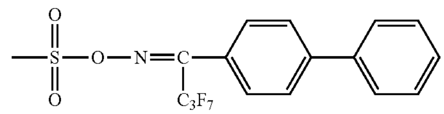

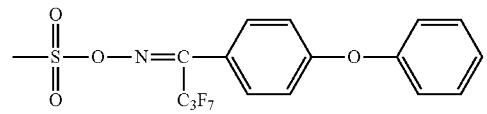

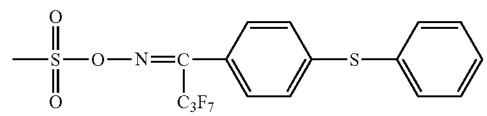

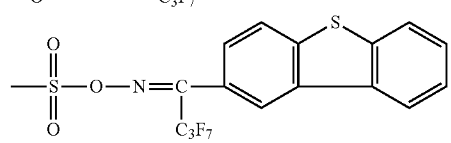

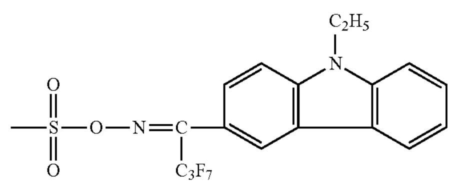

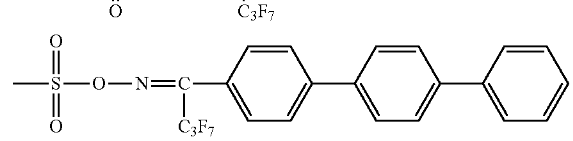

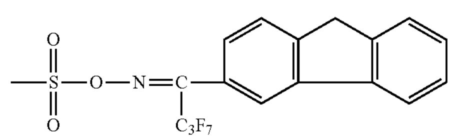

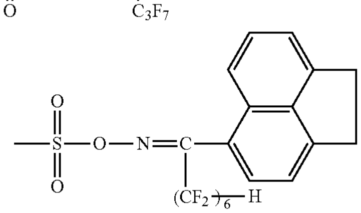

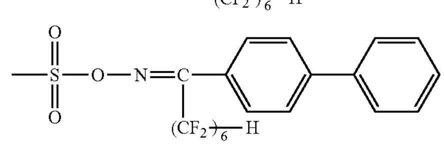

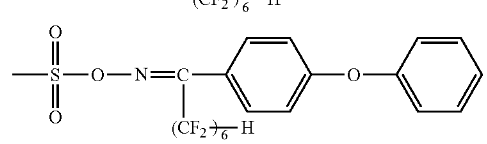

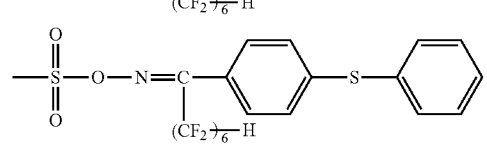

-continued
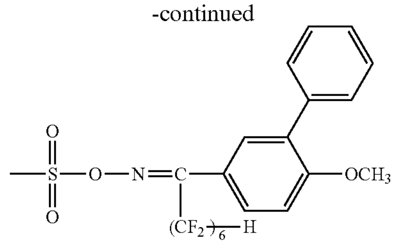
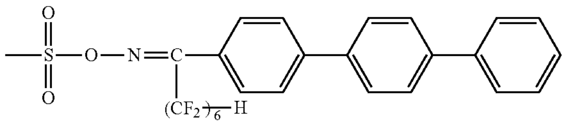
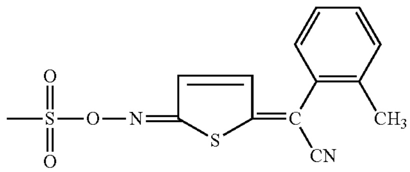
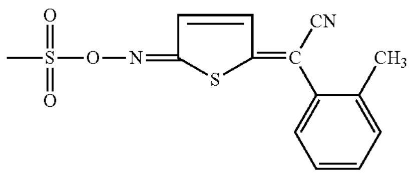
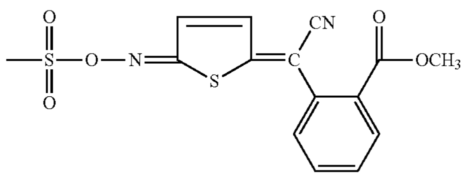
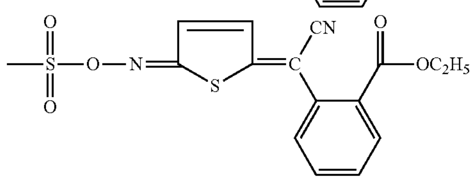
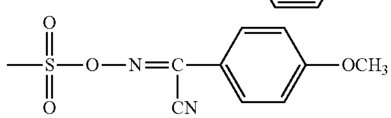
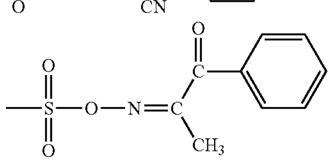
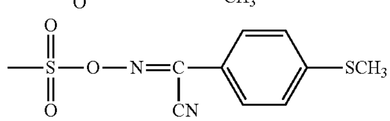
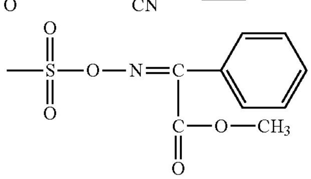
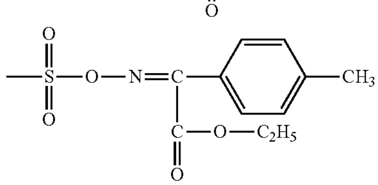
-continued
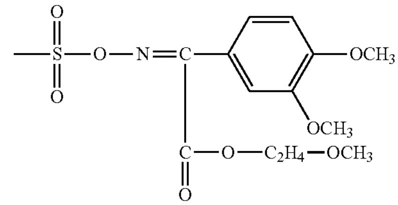
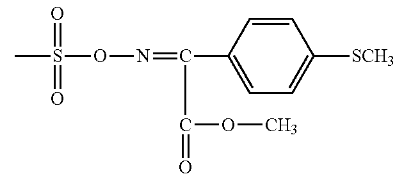
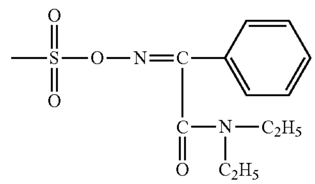
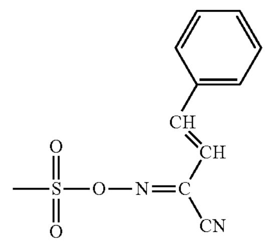
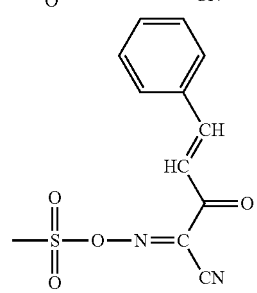
The nonionic structural moiety also includes a structural moiety represented by any one of the following formulae (N2) to (N9). The nonionic structural moiety is preferably a structural moiety represented by any one of formulae (N1) to (N4), more preferably a structural unit represented by formula (N1).
$$—SO_2—SO_2—Ar_6 \qquad (N2)$$
(N3)
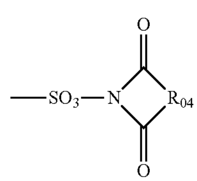
(N4)
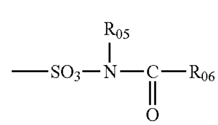

-continued (N5)

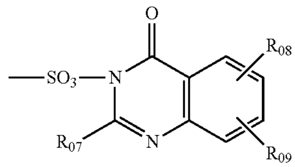

(N6)

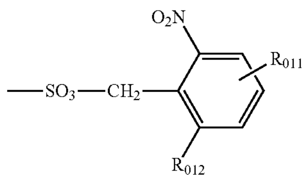

(N7)

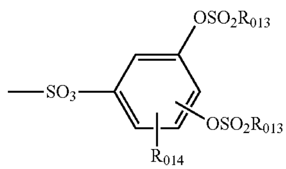

(N8)

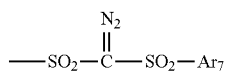

(N9)

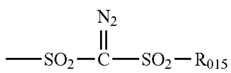

In the formulae, each of $Ar_6$ and $Ar_7$ independently represents an aryl group. Examples of the aryl group are the same as those described above for $R_{25}$ to $R_{27}$ and $R_{33}$.

$R_{04}$ represents an arylene group, an alkylene group or an alkenylene group. The alkenylene group is preferably an alkenylene group having a carbon number of 2 to 6. Examples of such an alkenylene group include an ethenylene group, a propenylene group and a butenylene group. The alkenylene group may have a substituent. Examples of the substituent which the arylene group and alkylene group of $R_{04}$ and the group represented by $R_{04}$ may have are the same as those described above for the divalent linking group of $X_1$ to $X_3$ in formulae (III) to (VII).

Each of $R_{05}$ to $R_{09}$, $R_{013}$ and $R_{015}$ independently represents an alkyl group, a cycloalkyl group, an aryl group or an aralkyl group. Examples of these groups are the same as those described above for $R_{25}$ to $R_{27}$ and $R_{33}$. Incidentally, in the case where the alkyl group of $R_{05}$ to $R_{09}$, $R_{013}$ and $R_{015}$ has a substituent, the alkyl group is preferably a haloalkyl group.

Each of $R_{011}$ and $R_{014}$ independently represents a hydrogen atom, a hydroxy group, a halogen atom (a fluorine atom, a chlorine atom, a bromine atom or an iodine atom), or an alkyl group, an alkoxy group, an alkoxycarbonyl group or an acyloxy group, described above as the preferred substituent.

$R_{012}$ represents a hydrogen atom, a nitro group, a cyano group or a perfluoroalkyl group. Examples of the perfluoroalkyl group include a trifluoromethyl group and a pentafluoroethyl group.

Specific examples of the nonionic structural moiety include the corresponding moieties in specific examples of the repeating unit (R) described later.

(Ionic Structural Moiety)

As described above, the repeating unit (R) may have an ionic structural moiety capable of decomposing upon irradiation with an actinic ray or radiation to generate an acid.

The ionic structural moiety includes, for example, an onium salt-containing structural moiety. Examples of such a structural unit include a structural unite represented by either one of the following formulae (ZI) and (ZII). The structural units represented by the following formulae (ZI) and (ZII) contain a sulfonium salt and an iodonium salt, respectively.

ZI

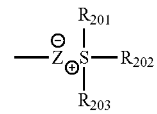

ZII

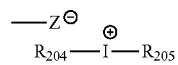

The structural unit represented by formula (ZI) is described below.

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20. Also, two members out of $R_{201}$ to $R_{203}$ may combine to form a ring structure, and the ring may contain therein an oxygen atom, a sulfur atom, an ester bond, an amide bond or a carbonyl group. Examples of the group formed by combining two members out of $R_{201}$ to $R_{203}$ include an alkylene group (e.g., butylene group, pentylene group).

$Z^-$ represents an acid anion that is generated by decomposition upon irradiation with an actinic ray or radiation and is preferably a non-nucleophilic anion. Examples of the non-nucleophilic anion include sulfonate anion ($—SO_3^-$), carboxylate anion ($—CO_2^-$), an imidate anion, and a methidate anion. The imidate anion is preferably represented by the following formula (AN-1), and the methidate anion is preferably represented by the following formula (AN-2):

(AN-1)

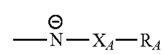

(AN-2)

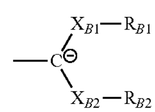

In the formulae, each of $X_A$, $X_{B1}$ and $X_{B2}$ independently represents —CO— or $—SO_2—$.

Each of $R_A$, $R_{B1}$ and $R_{B2}$ independently represents an alkyl group. The alkyl group may have a substituent. Above all, the substituent is preferably a fluorine atom.

Incidentally, $R_{B1}$ and $R_{B2}$ may combine with each other to form a ring. Also, each of $R_A$, $R_{B1}$ and $R_{B2}$ may combine with an arbitrary atom constituting the side chain of the repeating unit (R) to form a ring. In this case, each of $R_A$, $R_{B1}$ and $R_{B2}$ represents, for example, a single bond or an alkylene group.

The non-nucleophilic anion is an anion having an extremely low ability of causing a nucleophilic reaction and this anion can suppress the decomposition with aging due to intramolecular nucleophilic reaction. Thanks to this anion, the aging stability of the resin is enhanced, and the aging stability of the composition is also enhanced.

Examples of the organic group as $R_{201}$, $R_{202}$ and $R_{203}$ in formula (ZI) include the corresponding groups in the structural units (ZI-1), (ZI-2), (ZI-3) and (ZI-4) described below.

The structural unit (ZI-1) is a structural unit where at least one of $R_{201}$ to $R_{203}$ in formula (ZI) is an aryl group. That is, the structural unit (ZI-1) is a structural unit having an arylsulfonium as the cation.

In this structural unit, all of $R_{201}$ to $R_{203}$ may be an aryl group, or a part of $R_{201}$ to $R_{203}$ may be an aryl group with the remaining being an alkyl group or a cycloalkyl group. Examples of the structural unit (ZI-1) include structural unites corresponding to a triarylsulfonium, a diarylalkylsulfonium, an aryldialkylsulfonium, a diarylcycloalkylsulfonium and an aryldicycloalkylsulfonium.

The aryl group in the arylsulfonium is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole structure, a furan structure, a thiophene structure, an indole structure, a benzofuran structure and a benzothiophene structure. In the case where the arylsulfonium has two or more aryl groups, these two or more aryl groups may be the same or different.

The alkyl or cycloalkyl group which is contained, if desired, in the arylsulfonium is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The structural unit (ZI-2) is described below.

The structural unit (ZI-2) is a structural unit where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C═O at the 2-position of the above-described alkyl group.

The 2-oxocycloalkyl group is preferably a group having >C═O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

The structural unit (ZI-3) is a structural unit represented by the following formula (ZI-3), and this is a structural unit having a phenacylsulfonium salt structure.

(ZI-3)

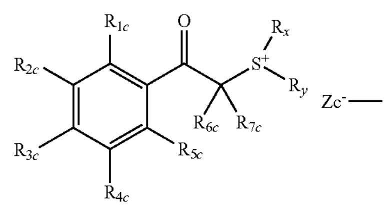

In the formula, each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amide bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents an acid anion that is generated by decomposition upon irradiation with an actinic ray or radiation and is preferably a non-nucleophilic anion. Examples of the anion are the same as those of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (such as methyl group, ethyl group, linear or branched propyl group, linear or branched butyl group, and linear or branched pentyl group). The cycloalkyl group is, for example, a cycloalkyl group having a carbon number of 3 to 8 (such as cyclopentyl group and cyclohexyl group).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group, and linear or branched pentoxy group), or a cyclic alkoxy group having a carbon number of 3 to 8 (such as cyclopentyloxy group and cyclohexyloxy group).

A structural moiety where any one of $R_{1c}$ to $R_{5c}$ is a linear or branched alkyl group, a cycloalkyl group, or a linear, branched or cyclic alkoxy group is preferred, and a structural moiety where the sum of carbon numbers of $R_{1c}$ to $R_{5c}$ is from 2 to 15 is more preferred. Thanks to such a structural moiety, the solvent solubility is more enhanced and production of particles during storage can be suppressed.

The aryl group as $R_{6c}$ and $R_{7c}$ is preferably an aryl group having a carbon number of 5 to 15, and examples thereof include a phenyl group and a naphthyl group.

In the case where $R_{6c}$ and $R_{7c}$ combine to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group include a group having >C═O at the 2-position of the alkyl group or cycloalkyl group as $R_{1c}$ to $R_{7c}$.

Examples of the alkoxy group in the alkoxycarbonylalkyl group are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (e.g., methyl group, ethyl group).

The allyl group is not particularly limited but is preferably an unsubstituted allyl group or an allyl group substituted with a monocyclic or polycyclic cycloalkyl group.

The vinyl group is not particularly limited but is preferably an unsubstituted vinyl group or a vinyl group substituted with a monocyclic or polycyclic cycloalkyl group.

The ring structure which may be formed by combining $R_x$ and $R_y$ with each other includes a 5-or 6-membered ring, preferably a 5-membered ring (that is, tetrahydrothiophene ring), formed together with the sulfur atom in formula (ZI-3) by divalent $R_x$ and $R_y$ (e.g., methylene group, ethylene group, propylene group).

Each of $R_x$ and $R_y$ is preferably an alkyl group or a cycloalkyl group, having a carbon number of 4 or more, more preferably 6 or more, still more preferably 8 or more.

Specific examples of the cation moiety in the structural unit (ZI-3) are illustrated below.

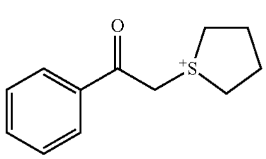
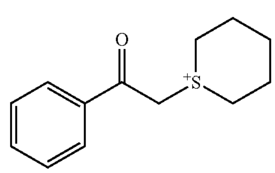
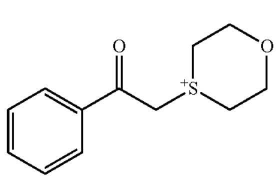
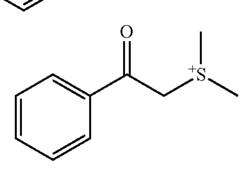

-continued

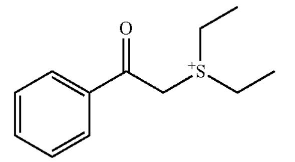
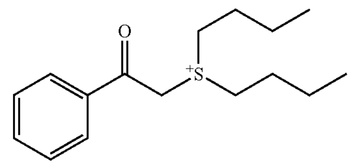
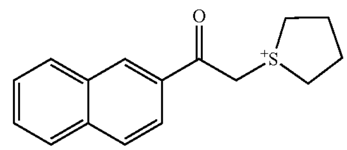
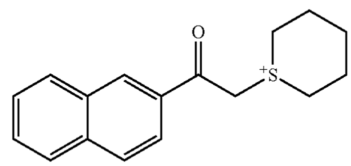
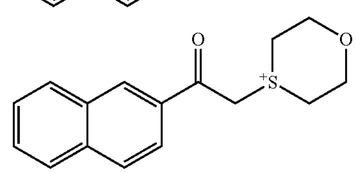
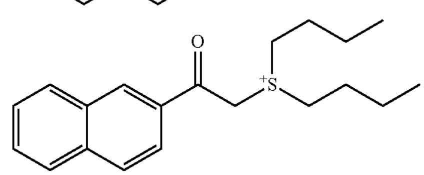
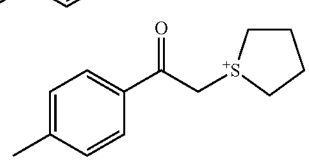
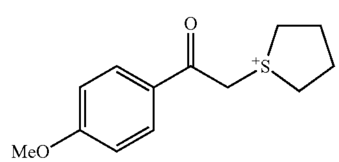
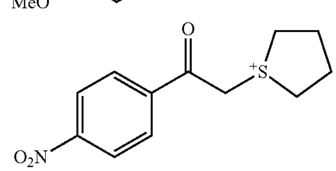
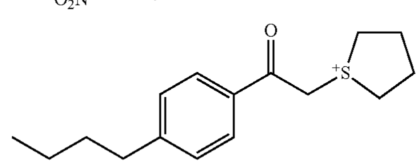
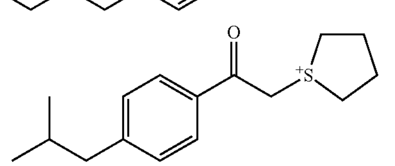

-continued
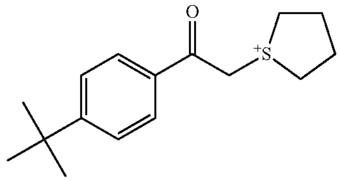
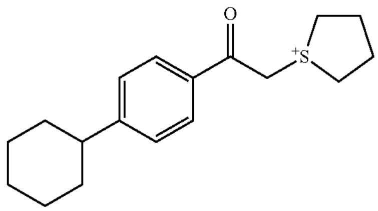
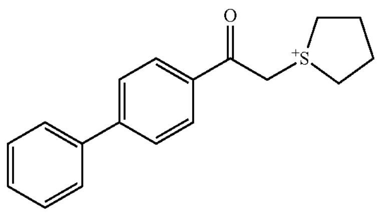
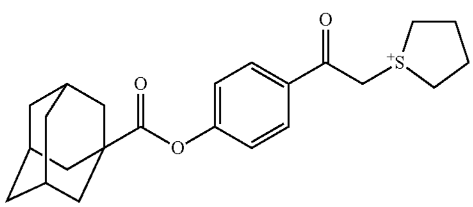
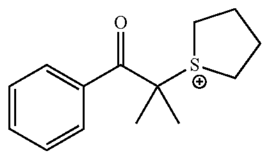
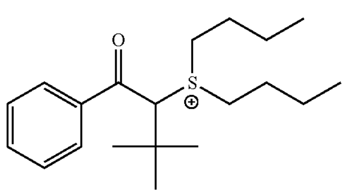
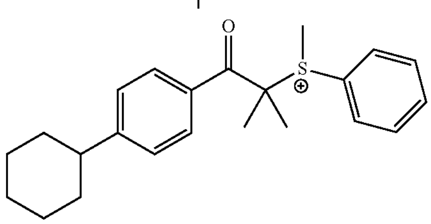
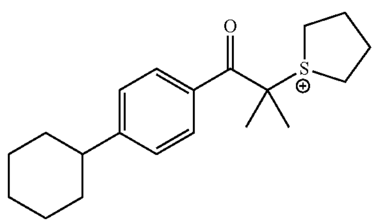
-continued
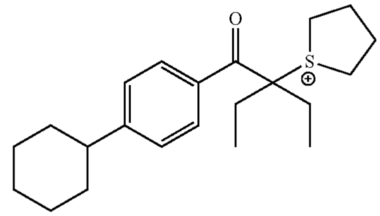
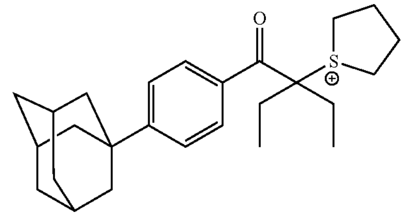
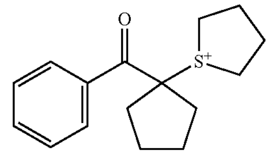
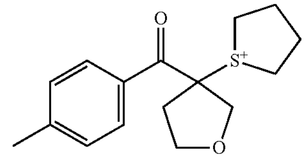
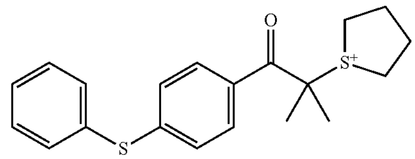
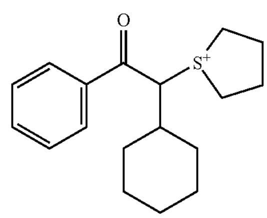
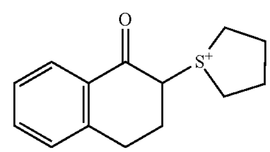
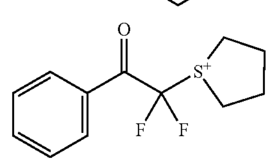
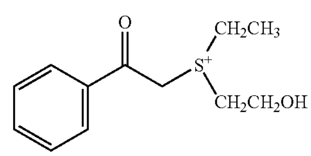
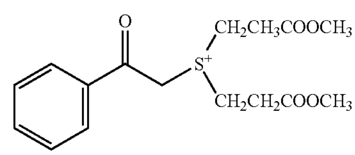
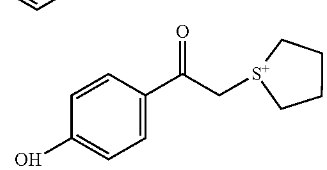
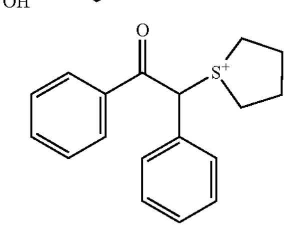

-continued

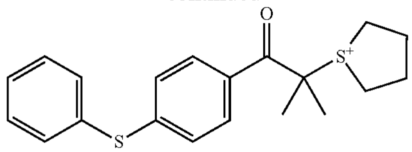

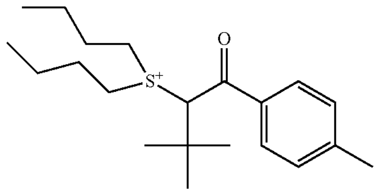

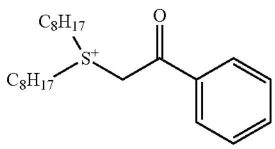

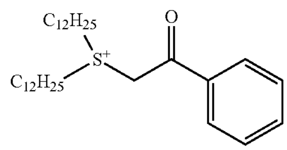

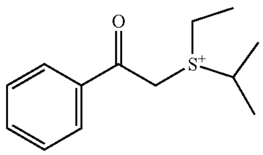

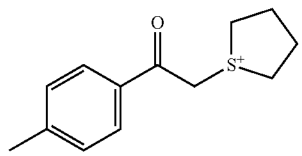

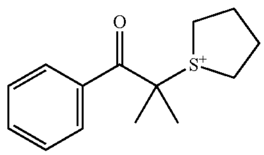

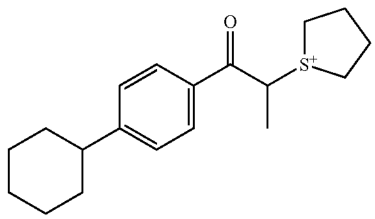

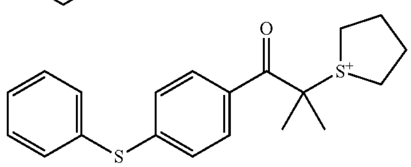

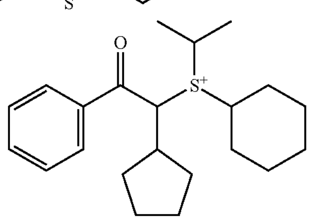

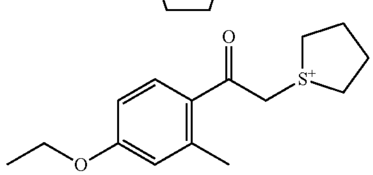

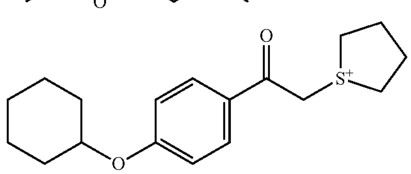

-continued

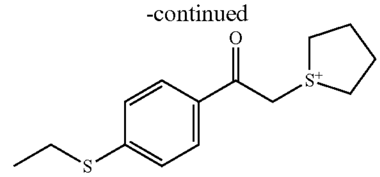

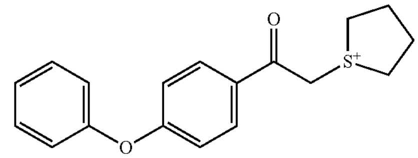

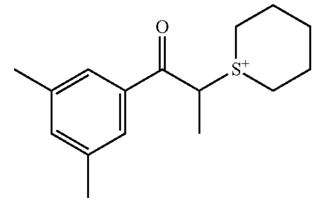 [SMILES: Cc1cc(C)cc(C(=O)C(C)[S+]2CCCCC2)c1]

The structural unit (ZI-4) is a structural unit represented by the following formula (ZI-4):

(ZI-4)

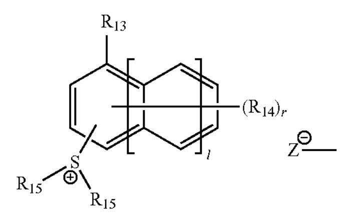

In the formula, $R_{13}$ represents a hydrogen atom, a fluorine atom, a hydroxy group, an alkyl group, a cycloalkyl group, an alkoxy group, an alkoxycarbonyl group, or a group having a monocyclic or polycyclic cycloalkyl skeleton. These groups may have a substituent.

$R_{14}$ represents, when a plurality of $R_{14}$s are present, each independently represents, an alkyl group, a cycloalkyl group, an alkoxy group, an alkoxycarbonyl group, an alkylcarbonyl group, an alkylsulfonyl group, a cycloalkylsulfonyl group, or a group having a monocyclic or polycyclic cycloalkyl skeleton. These groups may have a substituent.

Each $R_{15}$ independently represents an alkyl group, a cycloalkyl group or a naphthyl group. Two $R_{15}$s may combine with each other to form a ring. These groups may have a substituent.

l represents an integer of 0 to 2.

r represents an integer of 0 to 8.

$Z^-$ represents an acid anion that is generated by decomposition upon irradiation with an actinic ray or radiation and is preferably a non-nucleophilic anion. Examples of the anion are the same as those of $Z^-$ in formula (ZI).

In formula (ZI-4), the alkyl group of $R_{13}$, $R_{14}$ and $R_{15}$ is a linear or branched alkyl group preferably having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

Examples of the cycloalkyl group of $R_{13}$, $R_{14}$ and $R_{15}$ include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl and adamantyl. Among these, cyclopropyl, cyclopentyl, cyclohexyl and cyclooctyl are preferred.

The alkoxy group of $R_{13}$ and $R_{14}$ is a linear or branched alkoxy group preferably having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ and $R_{14}$ is a linear or branched alkoxycarbonyl group preferably having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The group having a monocyclic or polycyclic cycloalkyl skeleton of $R_{13}$ and $R_{14}$ includes, for example, a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ is preferably a monocyclic or polycyclic cycloalkyloxy group having a total carbon number of 7 or more, more preferably a total carbon number of 7 to 15, and it is preferred to have a monocyclic cycloalkyl skeleton. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cyclobutyloxy group, cyclooctyloxy group and cyclododecanyloxy group has an arbitrary substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, iso-amyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl skeleton of $R_{13}$ and $R_{14}$ preferably has a total carbon number of 7 or more, more preferably a total carbon number of 7 to 15, and is preferably an alkoxy group having a monocyclic cycloalkyl skeleton. The alkoxy group having a total carbon number of 7 or more and having a monocyclic cycloalkyl skeleton indicates a group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy, iso-amyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl skeleton include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

The alkylsulfonyl group and cycloalkylsulfonyl group of $R_{14}$ are a linear, branched or cyclic alkylsulfonyl group preferably having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

Examples of the substituent which each of the groups above may have include a halogen atom (e.g., fluorine atom), a hydroxyl group, a carboxy group, a cyano group, a nitro group, an alkoxy group, an alkoxyalkyl group, an alkoxycarbonyl group and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$s with each other includes a 5-or 6-membered ring, preferably a 5-membered ring (that is, tetrahydrothiophene ring), formed together with the sulfur atom in formula (ZI-4) by two divalent $R_{15}$s and may be ring-fused to an aryl group or a cycloalkyl group. The divalent $R_{15}$ may have a substituent, and examples of the substituent include a hydroxyl group, a carboxy group, a cyano group, a nitro group, an alkoxy group, an alkoxyalkyl group, an alkoxycarbonyl group, and an alkoxycarbonyloxy group. In formula (ZI-4), $R_{15}$ is preferably, for example, a methyl group, an ethyl group, a naphthyl group, or a divalent group of forming a tetrahydrothiophene ring structure together with the sulfur atom by combining two $R_{15}$s.

The substituent which $R_{13}$ and $R_{14}$ may have is preferably a hydroxy group, an alkoxy group, an alkoxycarbonyl group, or a halogen atom (particularly fluorine atom).

l is preferably 0 or 1, more preferably 1.

r is preferably from 0 to 2.

Specific examples of the cation moiety of the structural unit (ZI-4) are illustrated below.

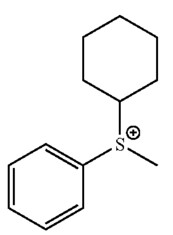

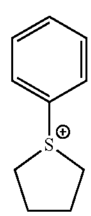

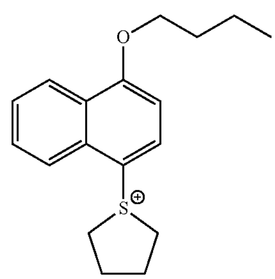

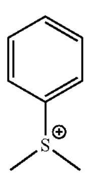

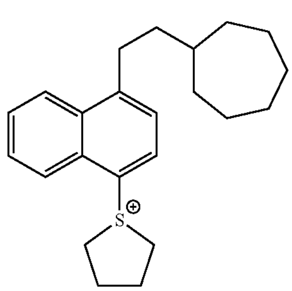

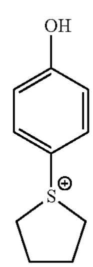

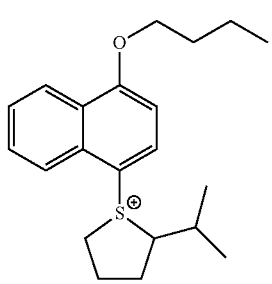

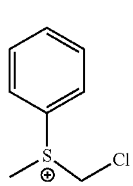

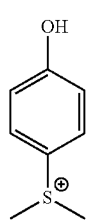

-continued

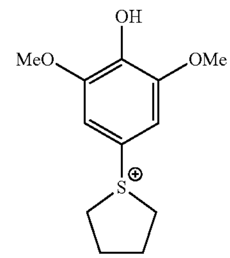

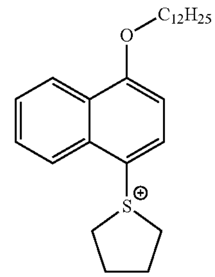

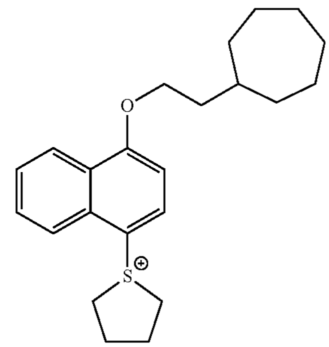

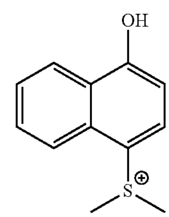

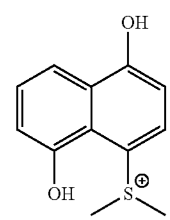

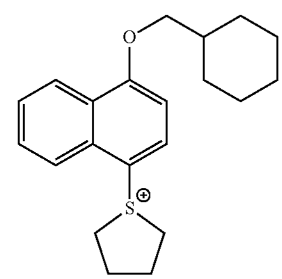

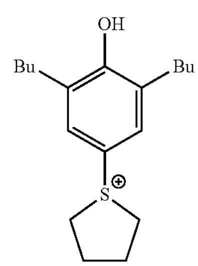

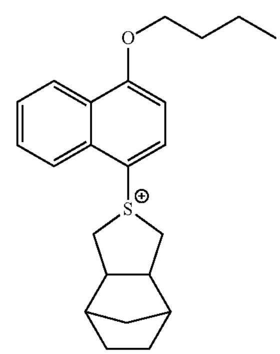

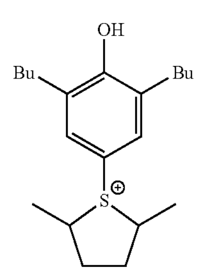

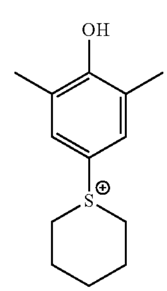

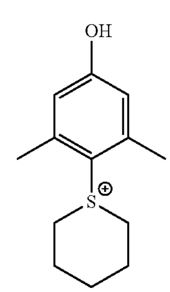

-continued
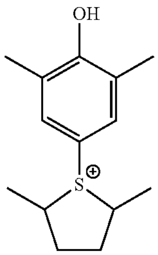
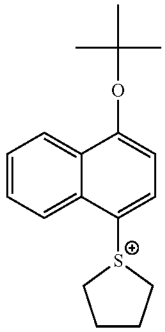
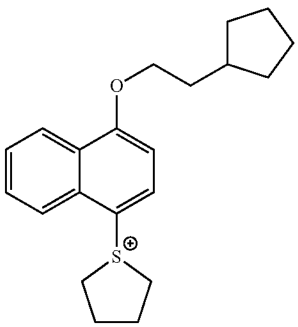
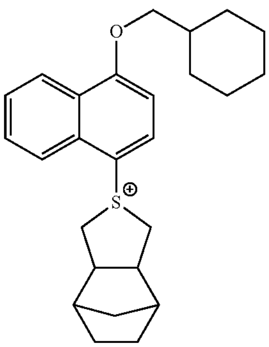
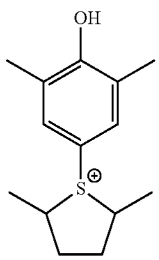
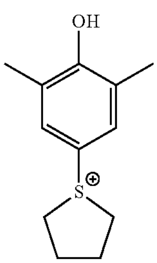
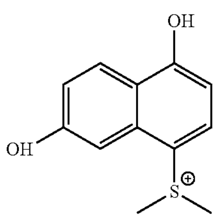
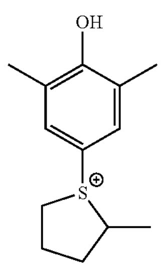
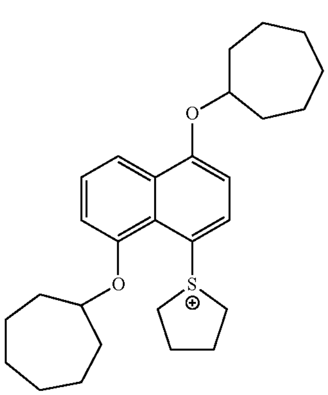
-continued
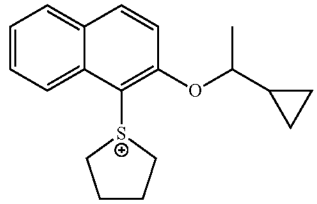
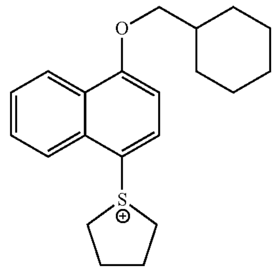
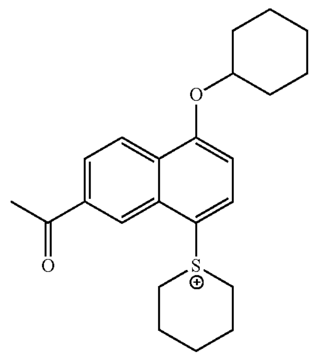
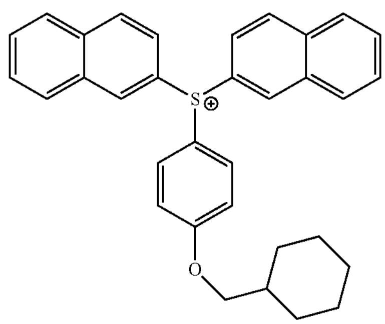
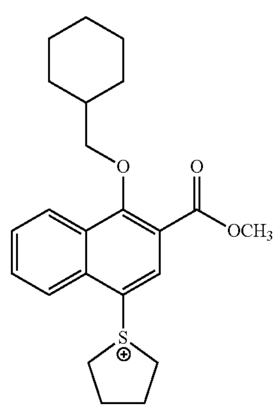
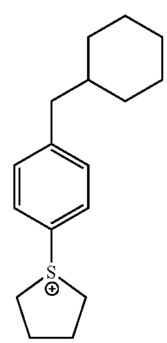

-continued
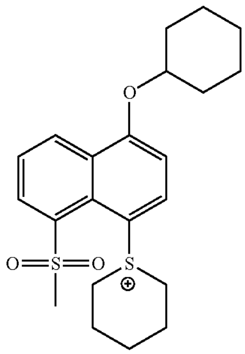
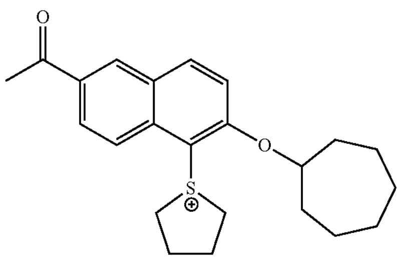
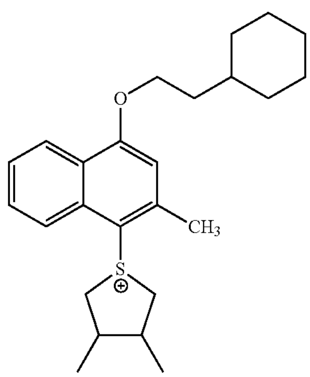
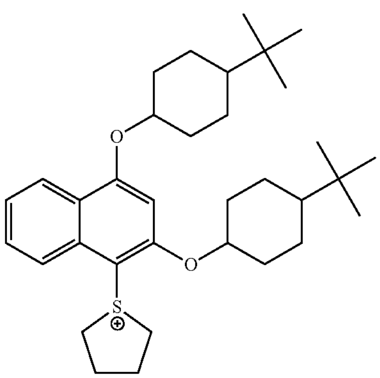
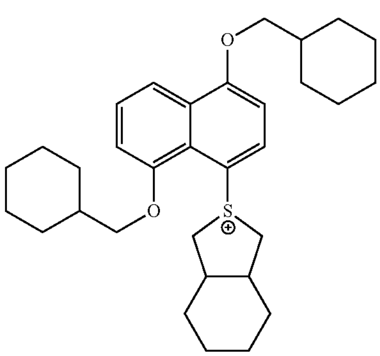
-continued
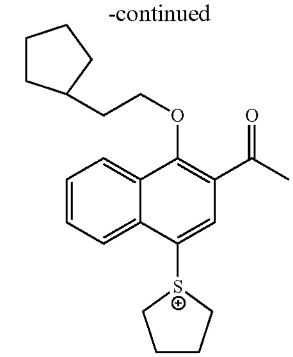
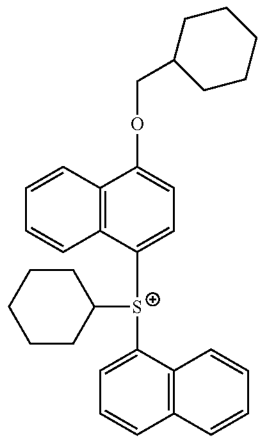
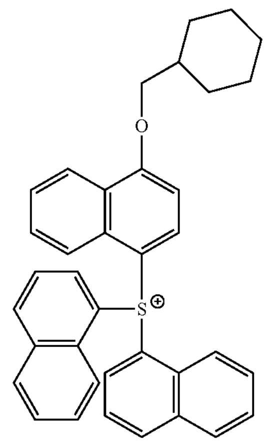
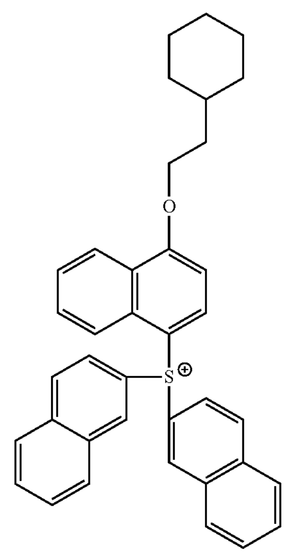
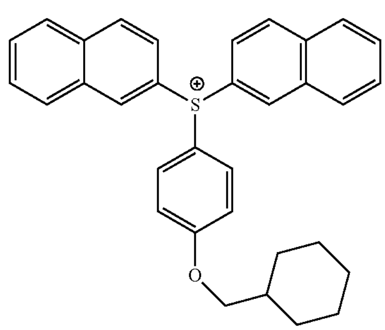

-continued

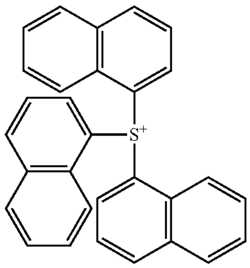

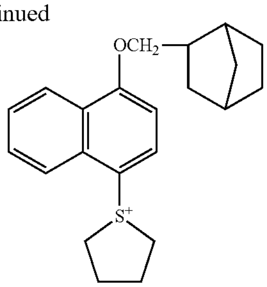

The structural unit represented by formula (ZII) is described below.

In formula (ZII), each of $R_{204}$ and $R_{205}$ independently represents an aryl group, an alkyl group or a cycloalkyl group.

Specific examples, preferred embodiments and the like of the aryl group, alkyl group and cycloalkyl group of $R_{204}$ to $R_{205}$ are the same as those described above for the aryl group, alkyl group and cycloalkyl group of $R_{201}$ to $R_{203}$ in the structural unit (ZI-1).

The aryl group, alkyl group and cycloalkyl group of $R_{204}$ to $R_{205}$ may have a substituent. Examples of the substituent are also the same as those of the substituent which the aryl group, alkyl group and cycloalkyl group of $R_{201}$ to $R_{203}$ in the structural unit (ZI-1) may have.

$Z^-$ represents an acid anion that is generated by decomposition upon irradiation with an actinic ray or radiation and is preferably a non-nucleophilic anion. Examples thereof are the same as those of $Z^-$ in formula (ZI).

As the ionic structural unit, structural units represented by the following formulae (ZCI) and (ZCII) are also preferred:

ZCI

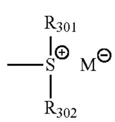

ZCII

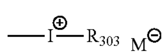

In the formulae, each of $R_{301}$ and $R_{302}$ independently represents an organic group.

The carbon number of the organic group as $R_{301}$ and $R_{302}$ is generally from 1 to 30, preferably from 1 to 20.

$R_{301}$ and $R_{302}$ may combine to form a ring structure, and the ring structure may contain an oxygen atom, a sulfur atom, an ester bond, an amide bond or a carbonyl group in the ring. The group formed by combining $R_{301}$ and $R_{302}$ includes an alkylene group (such as butylene group and pentylene group).

Specific examples of the organic group of $R_{301}$ and $R_{302}$ include the aryl group, alkyl group and cycloalkyl group described as examples of $R_{201}$ to $R_{203}$ in formula (ZI).

M represents an atomic group for forming an acid by accepting a proton.

$R_{303}$ represents an organic group. The carbon number of the organic group as $R_{303}$ is generally from 1 to 30, preferably from 1 to 20. Specific examples of the organic group of $R_{303}$ include the aryl group, alkyl group and cycloalkyl group described above as specific examples of $R_{204}$ and $R_{205}$ in formula (ZII).

Specific examples of the ionic structural unit are illustrated below.

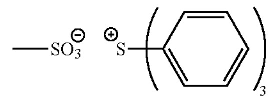

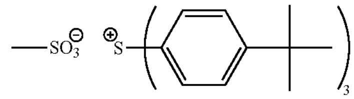

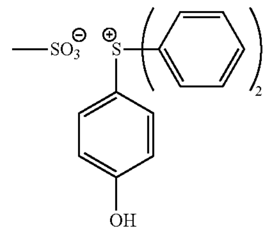

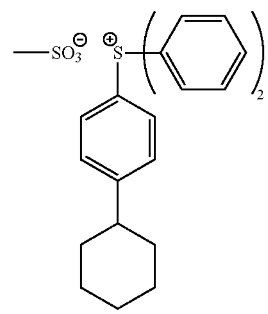

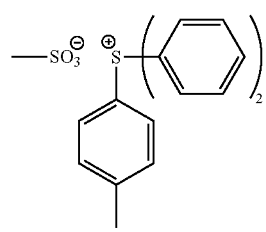

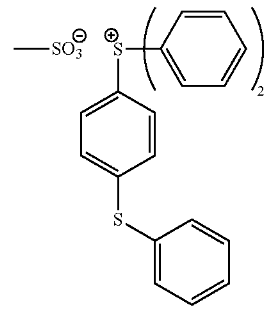

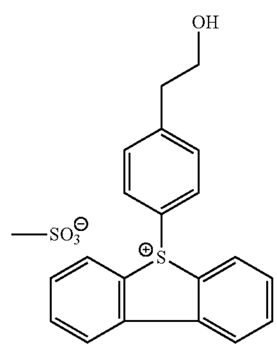

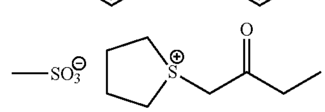

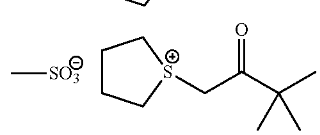

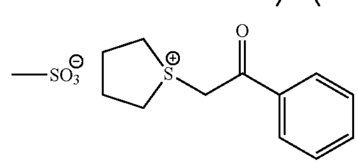

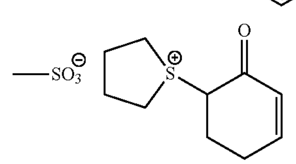

-continued
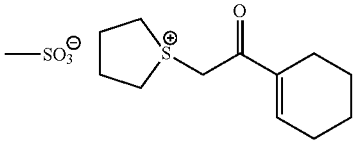
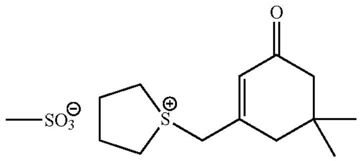
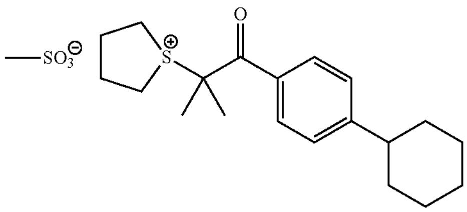
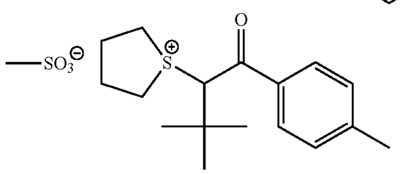
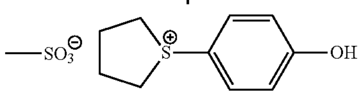
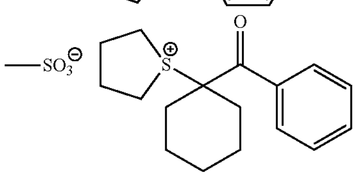
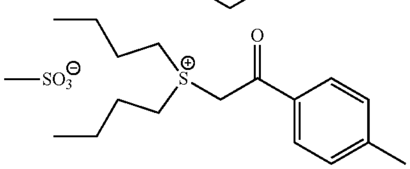
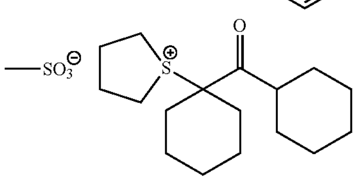
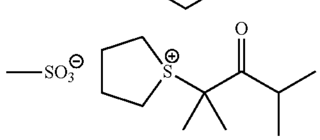
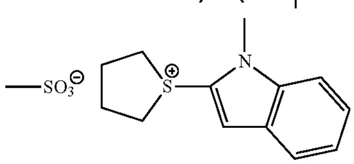
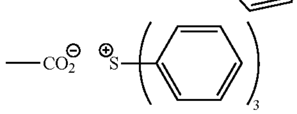
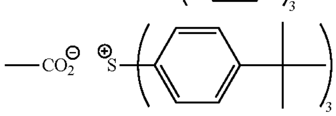
-continued
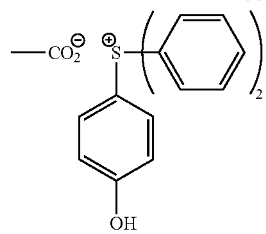
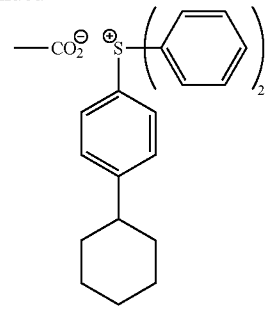
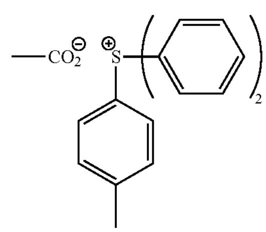
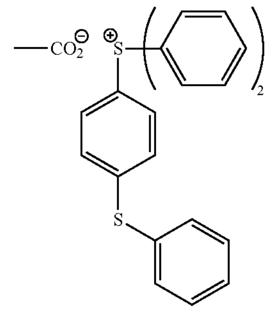
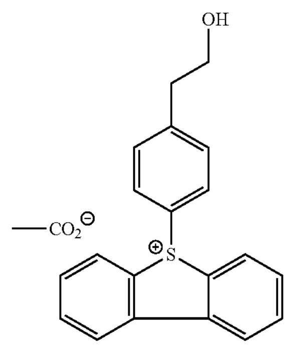
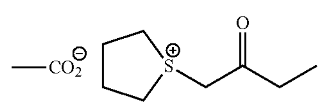
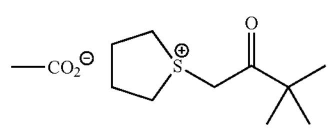
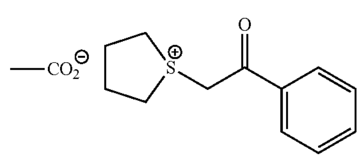
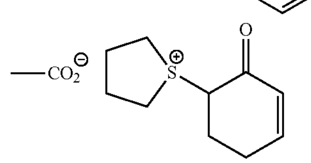
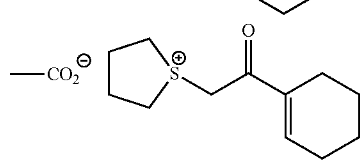

-continued
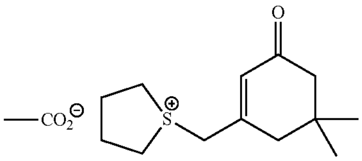
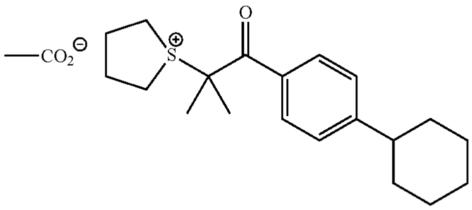
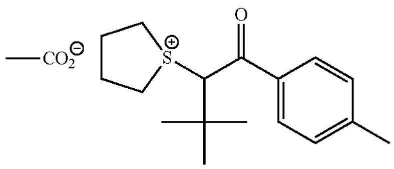
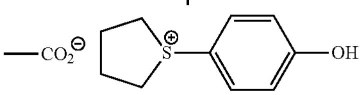
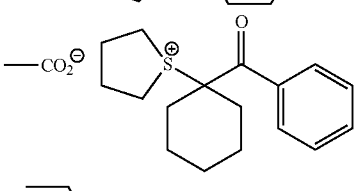
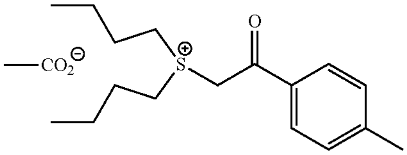
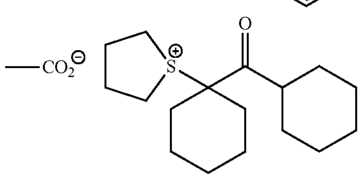
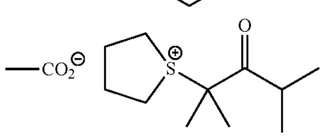
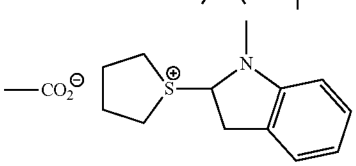
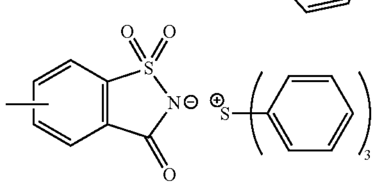
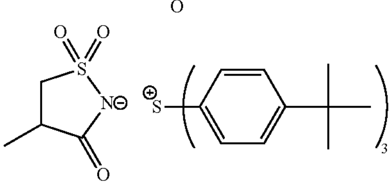
-continued
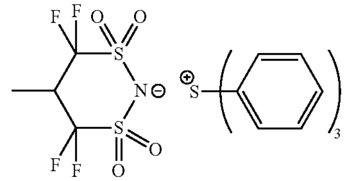
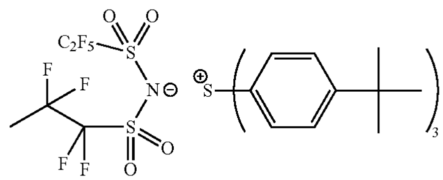
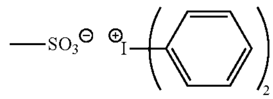
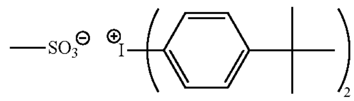
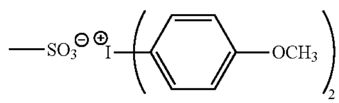
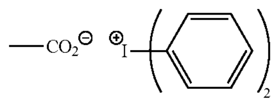
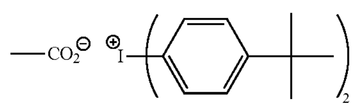
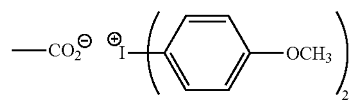
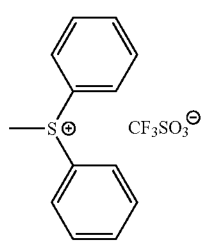
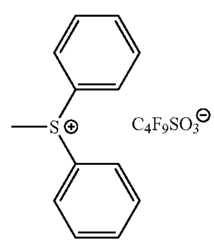
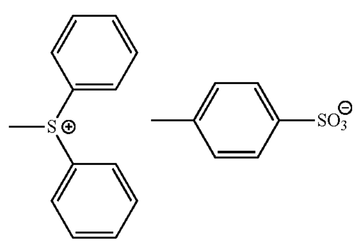
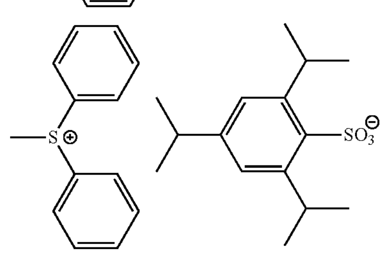

-continued
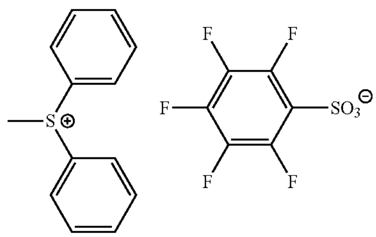
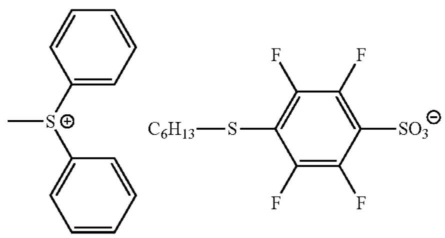
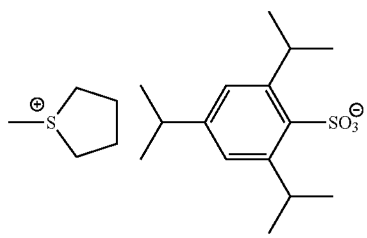
The repeating unit (R) also includes a repeating unit represented by any one of the following formulae (III-1) to (III-6), formulae (IV-1) to (IV-4), and formulae (V-1) and (V-2):
(III-1)
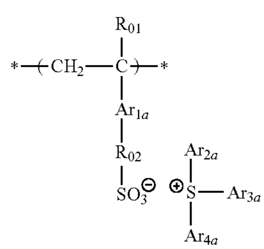
(III-2)
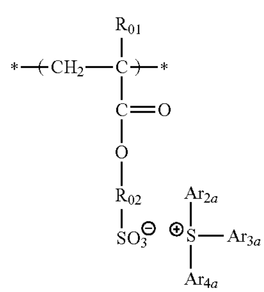
-continued
(III-3)
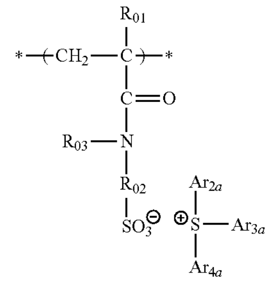
(III-4)
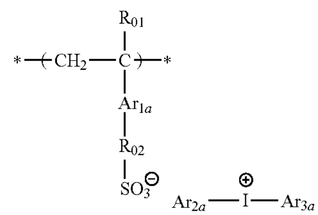
(III-5)
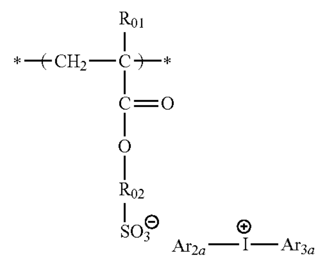
(III-6)
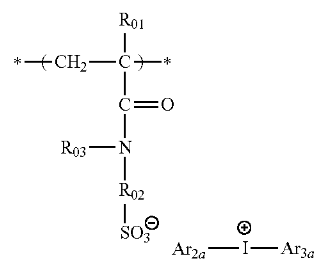
(IV-1)
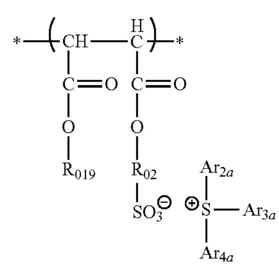
(IV-2)
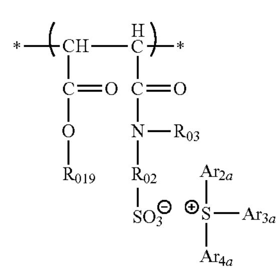

-continued (IV-3)

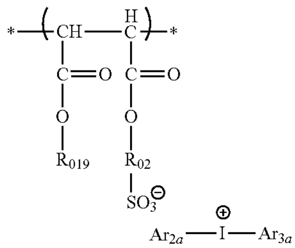

(IV-4)

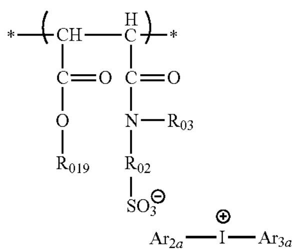

(V-1)

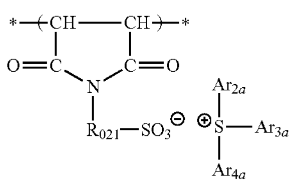

(V-2)

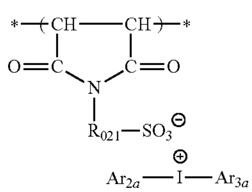

In the formulae, $Ar_{1a}$ represents an arylene group which is the same as that described above for $X_1$ to $X_3$ in formulae (III) to (VII).

Each of $Ar_{2a}$ to $Ar_{4a}$ represents an aryl group which is the same as that described above for $R_{201}$ to $R_{203}$, $R_{204}$ and $R_{205}$ in formulae (ZI) to (ZII).

$R_{01}$ represents a hydrogen atom, a methyl group, a chloromethyl group, a trifluoromethyl group or a cyano group.

Each of $R_{02}$ and $R_{021}$ represents a single bond, an arylene group, an alkylene group, a cycloalkylene group, —O—, —$SO_2$—, CO—, —$N(R_{33})$—, or a divalent linking group formed by combining a plurality thereof, which are the same as those described above for $X_1$ to $X_3$ in formulae (III) to (VII).

Each of $R_{03}$ and $R_{019}$ independently represents a hydrogen atom, an alkyl group, a cycloalkyl group, an aryl group or an aralkyl group. Examples of these groups are the same as those described above for $R_{25}$ in formula (IV).

The repeating unit preferred as the repeating unit (R) further includes a repeating unit represented by any one of the following formulae (I-7) to (I-34):

(I-7)

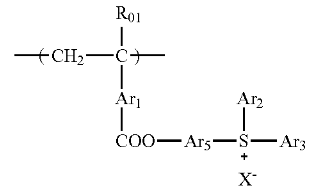

(I-8)

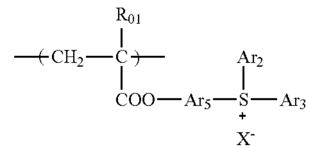

(I-9)

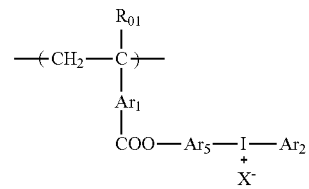

(I-10)

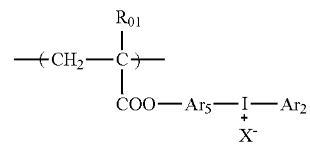

(I-11)

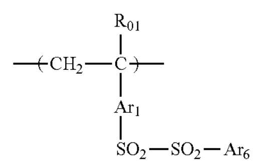

(I-12)

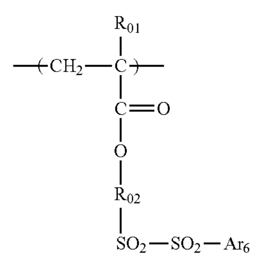

(I-13)

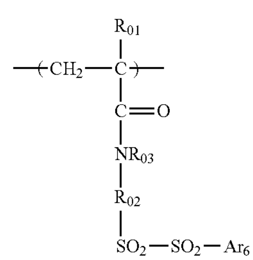

(I-14)

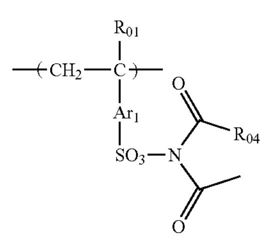

-continued
(I-15)
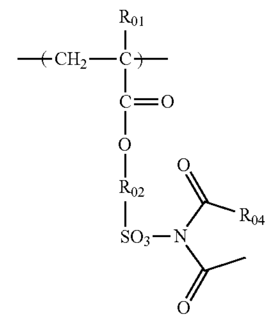
(I-16)
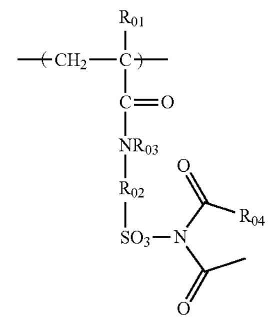
(I-17)
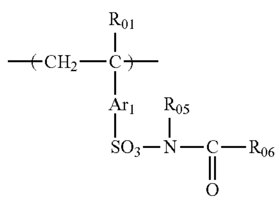
(I-18)
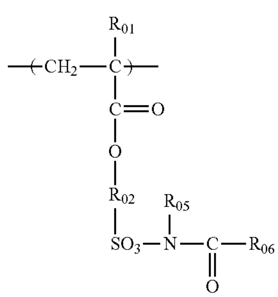
(I-19)
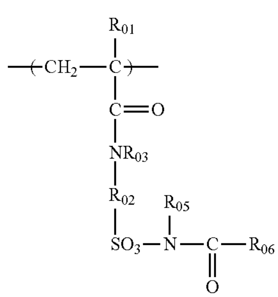
-continued
(I-20)
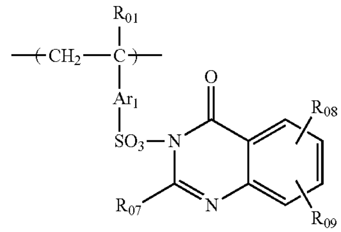
(I-21)
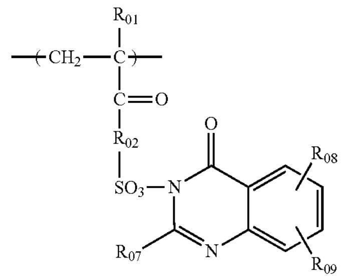
(I-22)
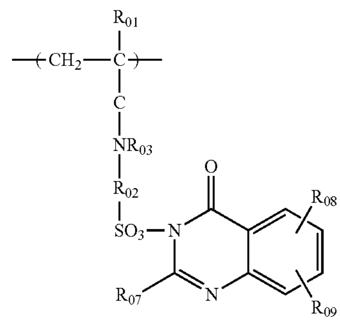
(I-23)
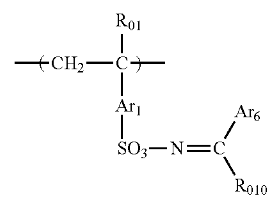
(I-24)
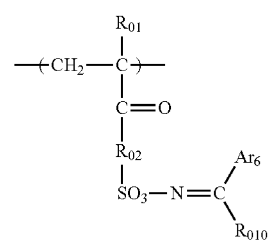
(I-25)
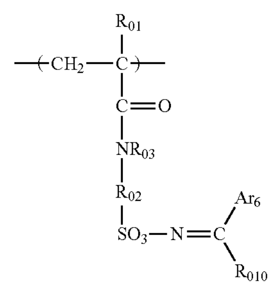

-continued (I-26)

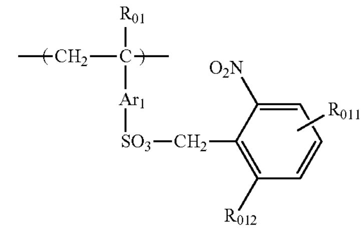

(I-27)

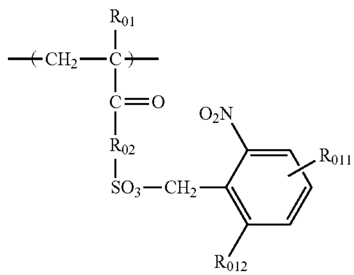

(I-28)

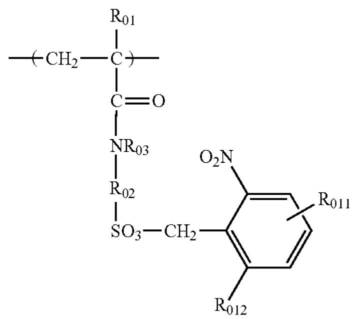

(I-29)

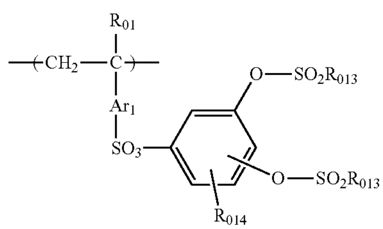

(I-30)

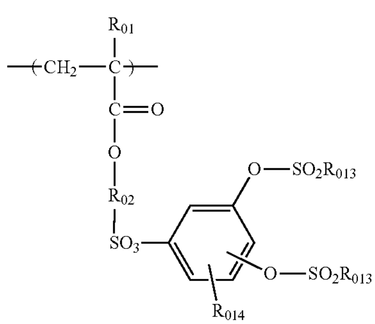

-continued (I-31)

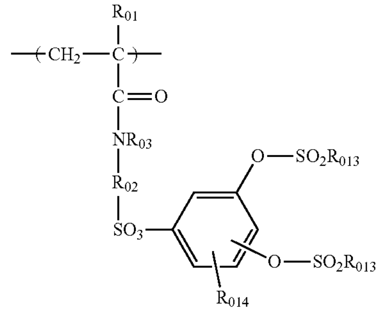

(I-32)

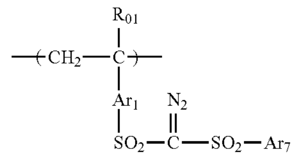

(I-33)

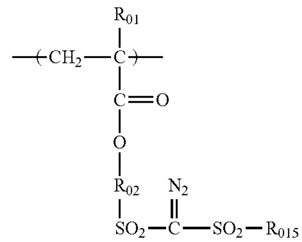

(I-34)

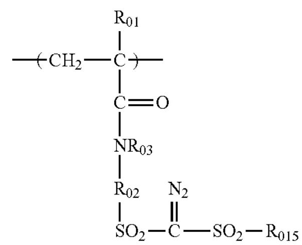

In the formulae, each of $Ar_1$ and $Ar_5$ represents an arylene group which is the same as that described above, for example, for $X_1$ to $X_3$ in formulae (III) to (VII). Each of $Ar_2$, $Ar_3$, $Ar_6$ and $Ar_7$ represents an aryl group which is the same as that described above, for example, for $R_{25}$ to $R_{27}$ and $R_{33}$. $R_{01}$ has the same meaning as that described above in formulae (III-1) to (III-6), formulae (IV-1) to (IV-4) and formulae (V-1) and (V-2).

$R_{02}$ represents an arylene group, an alkylene group or a cycloalkylene group, which are the same as those described above, for example, for $X_1$ to $X_3$. Each of $R_{03}$, $R_{05}$ to $R_{010}$, $R_{013}$ and $R_{015}$ represents an alkyl group, a haloalkyl group, a cycloalkyl group, an aryl group, or an aralkyl group. $R_{04}$ represents an arylene group, an alkylene group or an alkenylene group. The alkenylene group is preferably an alkenylene group having a carbon number of 2 to 6, such as ethenylene group, propenylene group and butenylene group, which may have a substituent.

Each of $R_{011}$ and $R_{014}$ represents a hydrogen atom, a hydroxyl group, a halogen atom (fluorine, chlorine, bromine, iodine), or the alkyl group, alkoxy group, alkoxycarbonyl group or acyloxy group, described above, for example, as a preferred further substituent.

$R_{012}$ represents a hydrogen atom, a nitro group, a cyano group, or a perfluoroalkyl group such as trifluoromethyl group and pentafluoroethyl group.

$X^-$ represents an acid anion. Examples of $X^-$ include an arylsulfonate anion, a heteroarylsulfonate anion, an alkylsulfonate anion, a cycloalkylsulfonate anion, and a perfluoroalkylsulfonate anion.

The content of the repeating unit (R) in the resin is preferably from 0.5 to 80 mol %, more preferably from 1 to 60 mol %, still more preferably from 3 to 40 mol %, yet still more preferably from 5 to 35 mol %, and most preferably from 10 to 30 mol %, based on all repeating units.

The method for synthesizing the monomer corresponding to the repeating unit (R) is not particularly limited but includes, for example, a method of synthesizing the monomer by exchanging an acid anion having a polymerizable unsaturated bond corresponding to the repeating unit with a halide of a known onium salt.

More specifically, a metal ion salt (such as sodium ion or potassium ion) or ammonium salt (such as ammonium or triethylammonium) of an acid having a polymerizable unsaturated bond corresponding to the repeating unit and an onium salt having a halogen ion (such as chloride ion, bromide ion or iodide ion) are stirred in the presence of water or methanol to perform an anion exchange reaction, and the reaction product is subjected to separation and washing operations with an organic solvent such as dichloromethane, chloroform, ethyl acetate, methyl isobutyl ketone and tetrahydroxyfuran, and water, whereby the target monomer corresponding to the repeating unit (R) can be synthesized.

The monomer can be also synthesized by stirring the salts in the presence of water and an organic solvent separable from water, such as dichloromethane, chloroform, ethyl acetate, methyl isobutyl ketone and tetrahydroxyfuran, to perform the anion exchange reaction and then performing the separation and washing operations with water.

Specific examples of the repeating unit (R) are illustrated below.

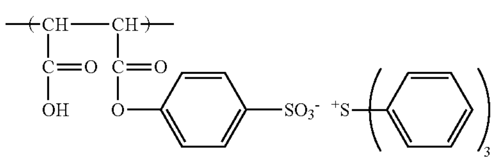

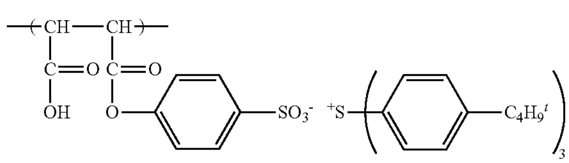

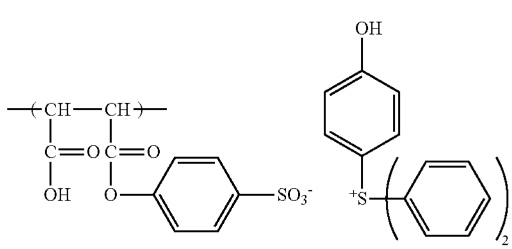

-continued

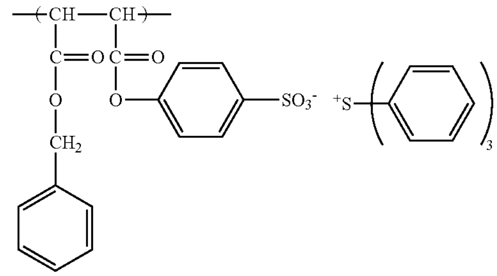

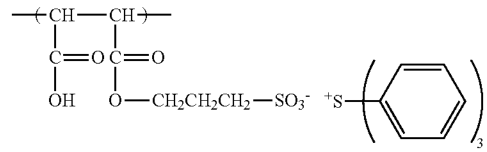

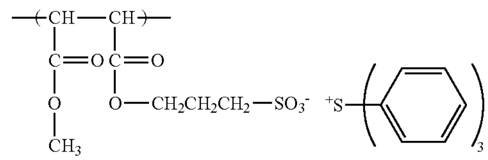

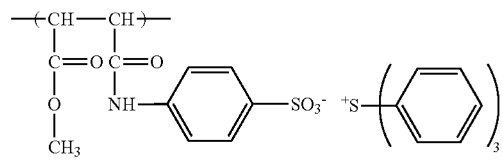

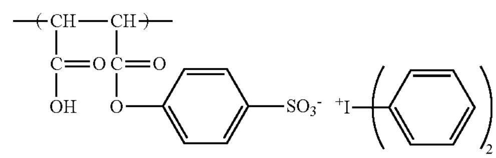

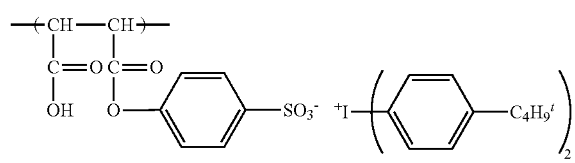

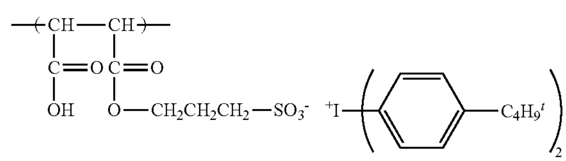

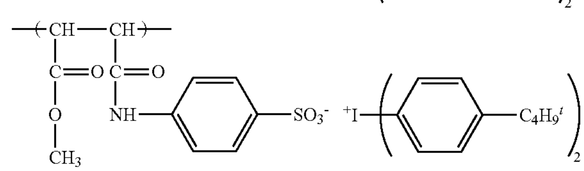

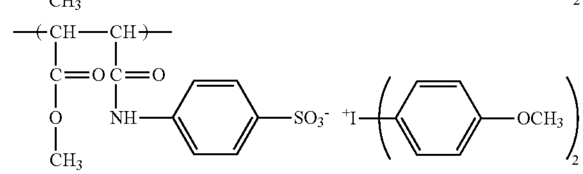

-continued
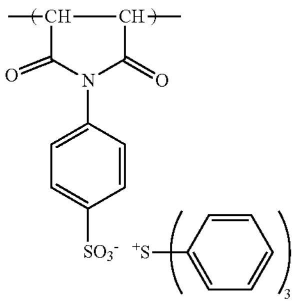
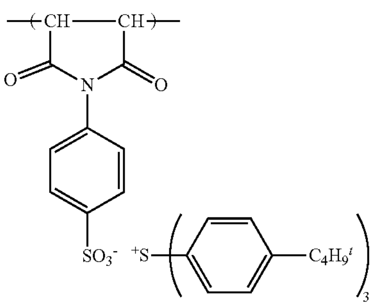
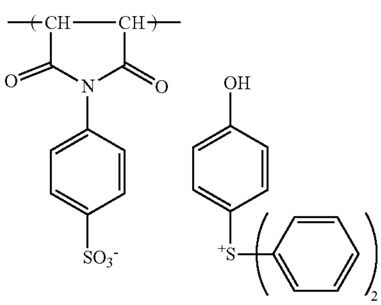
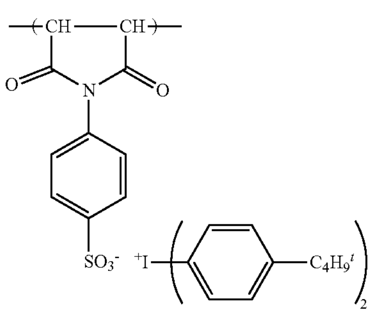
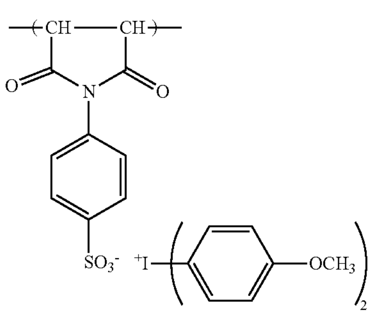
-continued
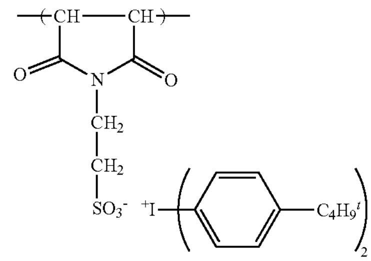
(a15)
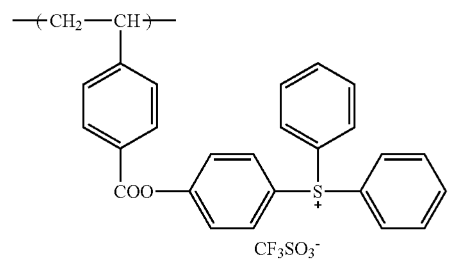
(a16)
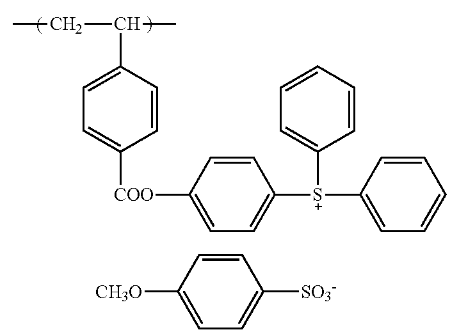
(a17)
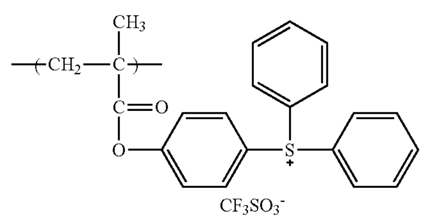
(a18)
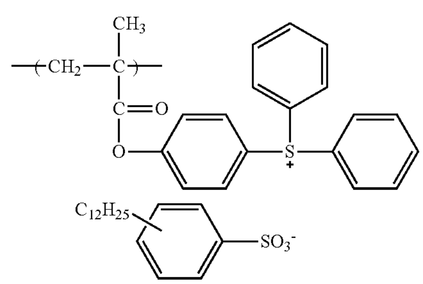

-continued
(a19)
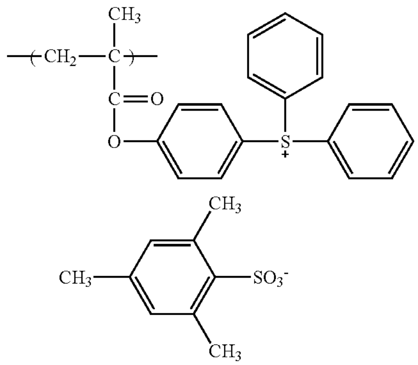
(a20)
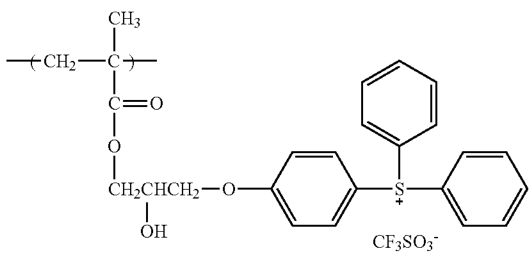
(a21)
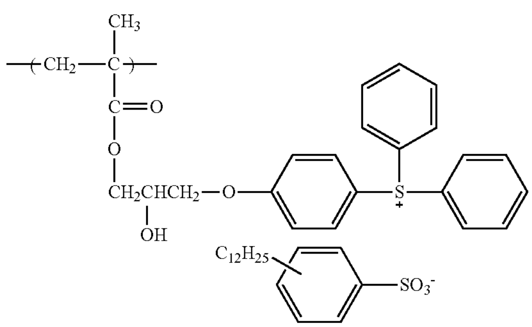
(a22)
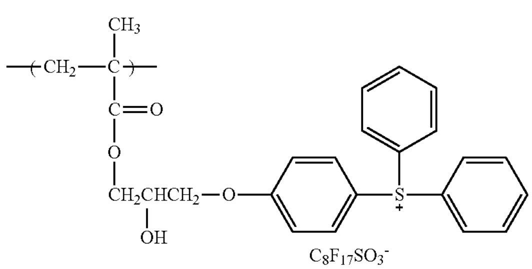
(a23)
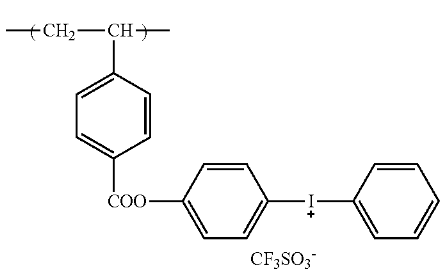
-continued
(a24)
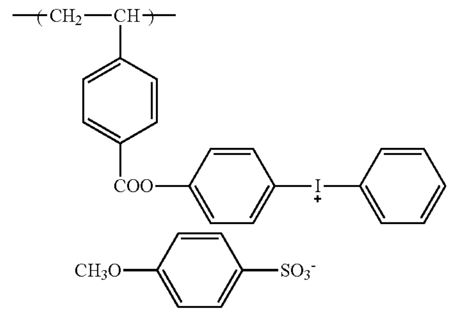
(a25)
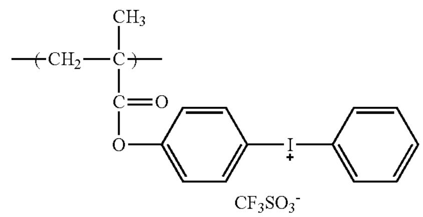
(a26)
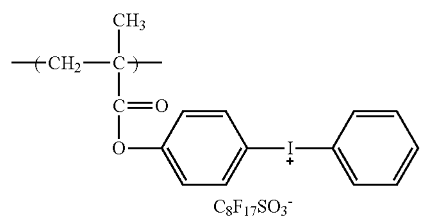
(a27)
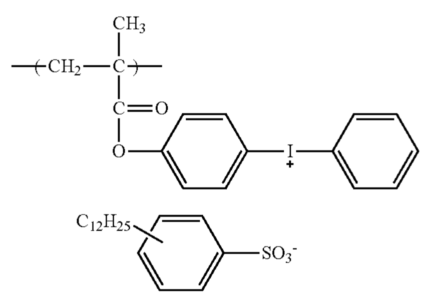
(a28)
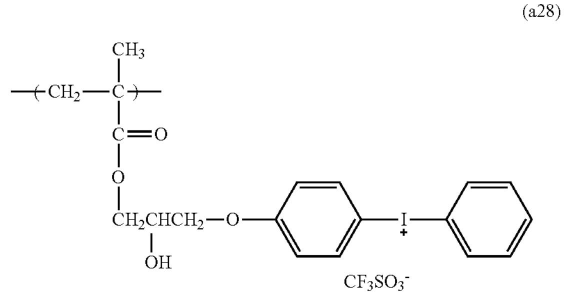

(a29)
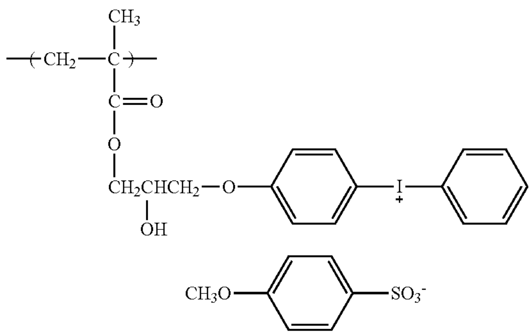
(a30)
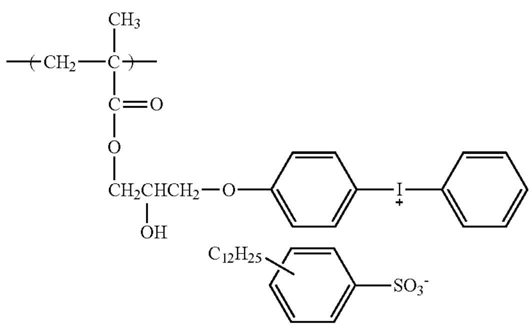
(a31)
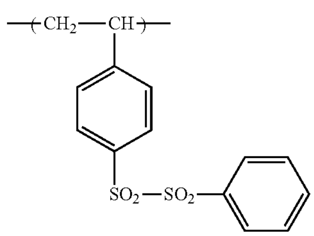
(a32)
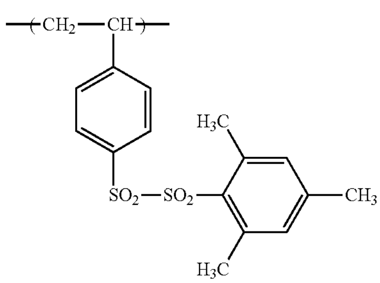
(a33)
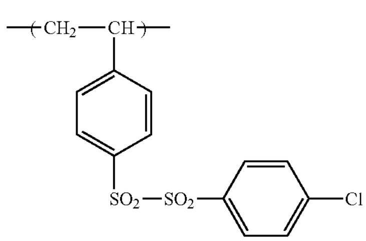
(a34)
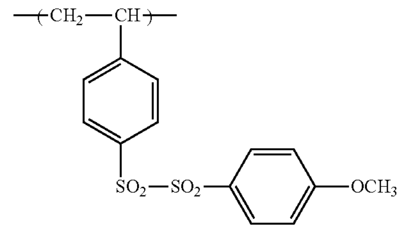
(a35)
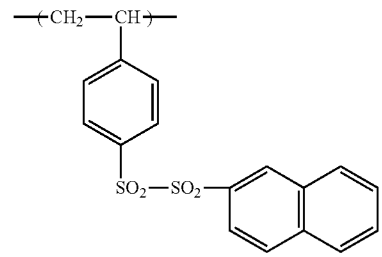
(a36)
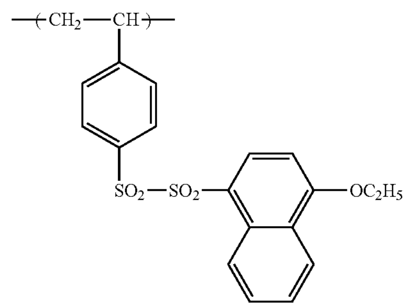
(a37)
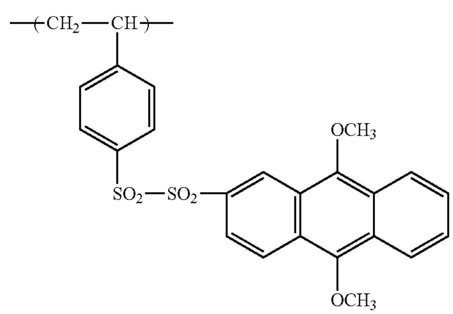
(a38)
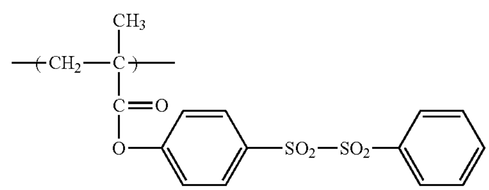
(a39)
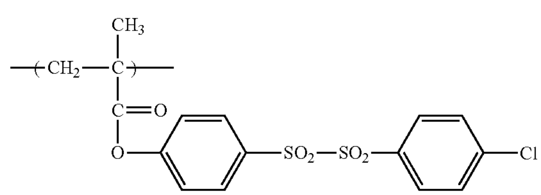

-continued
(a40)
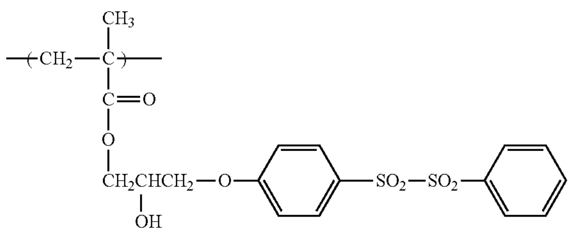
(a41)
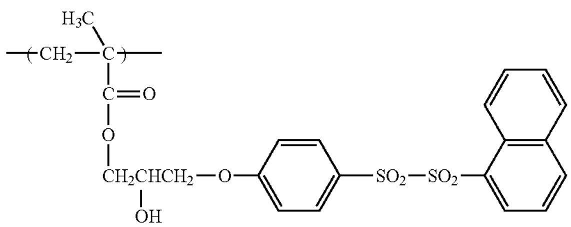
(a42)
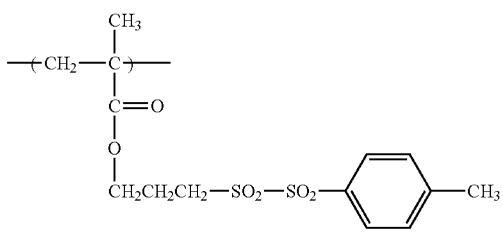
(a43)
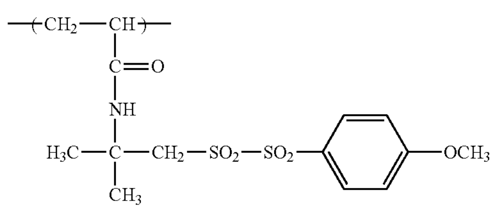
(a44)
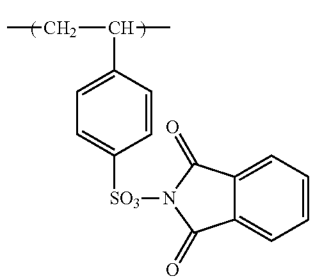
(a45)
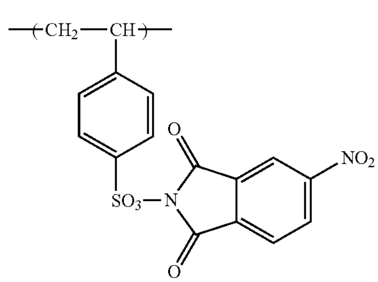
-continued
(a46)
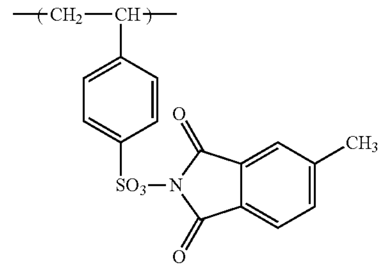
(a47)
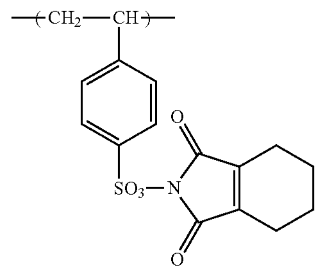
(a48)
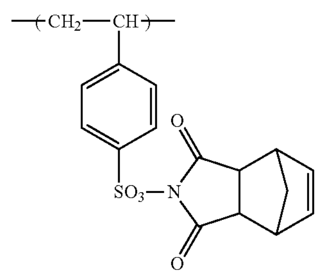
(a49)
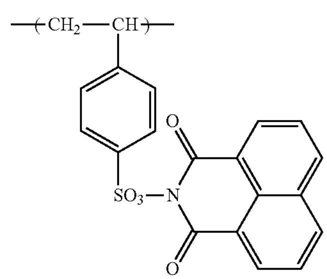
(a50)
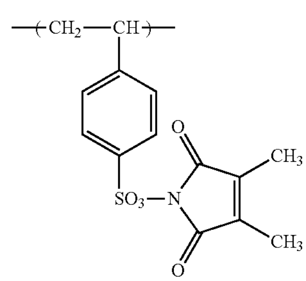
(a51)
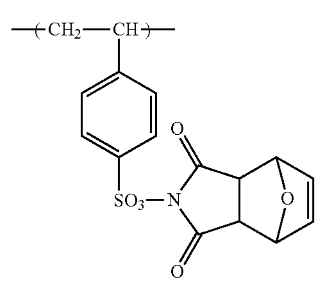

-continued
(a52)
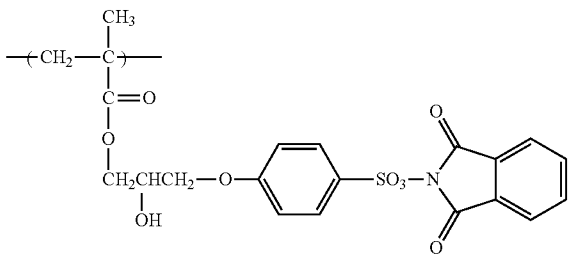
(a53)
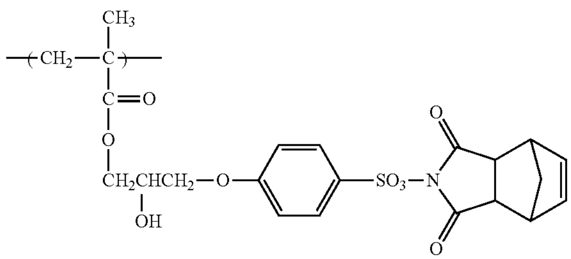
(a54)
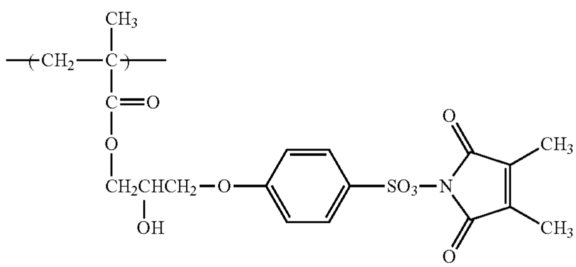
(a55)
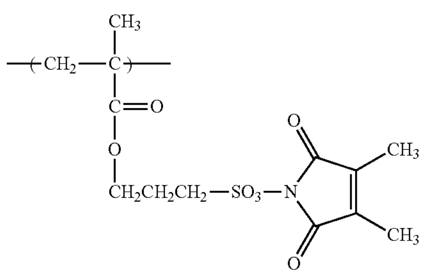
(a56)
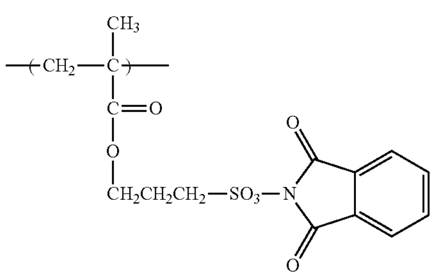
(a57)
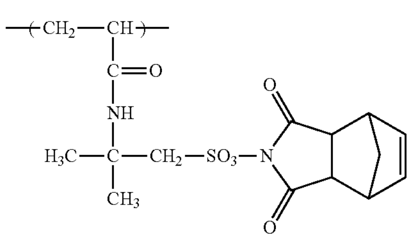
-continued
(a58)
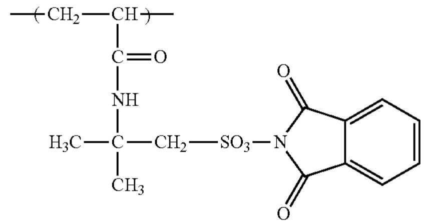
(a59)
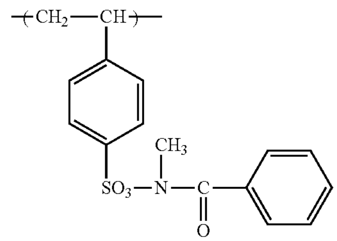
(a60)
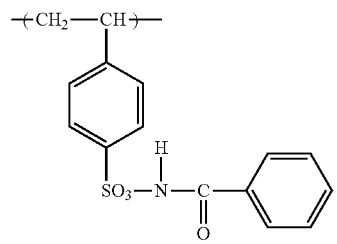
(a61)
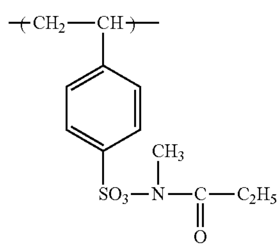
(a62)
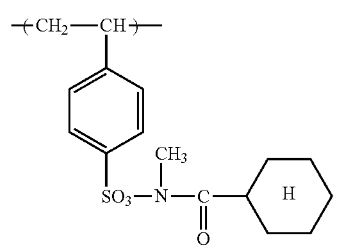
(a63)
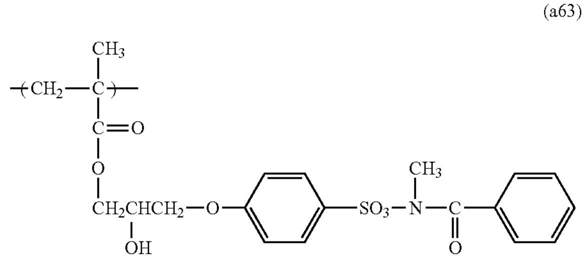

-continued
(a64)
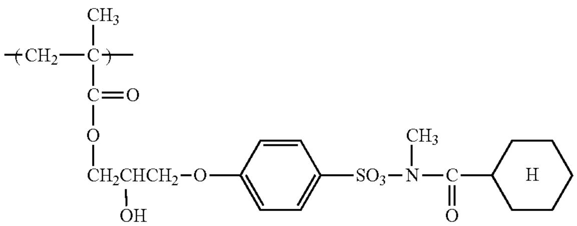
(a65)
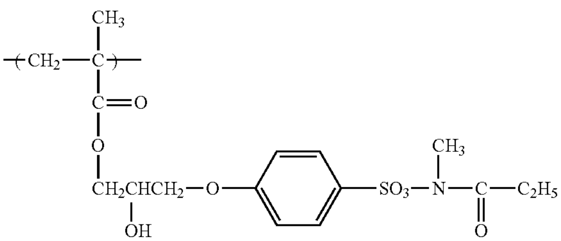
(a66)
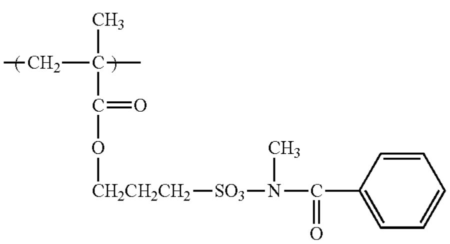
(a67)
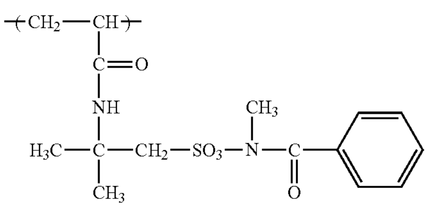
(a68)
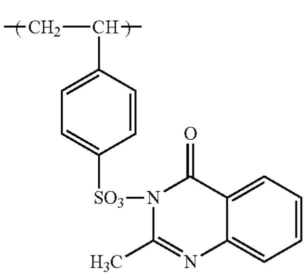
(a69)
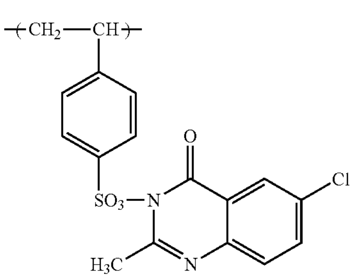
-continued
(a70)
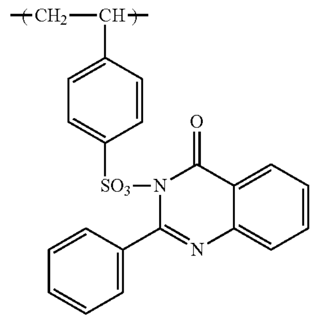
(a71)
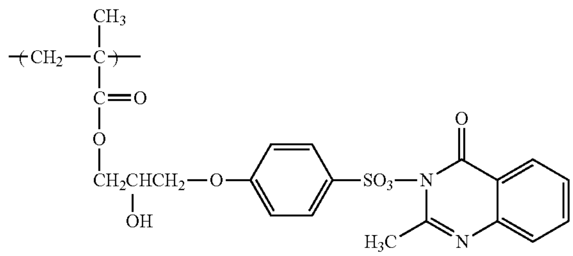
(a72)
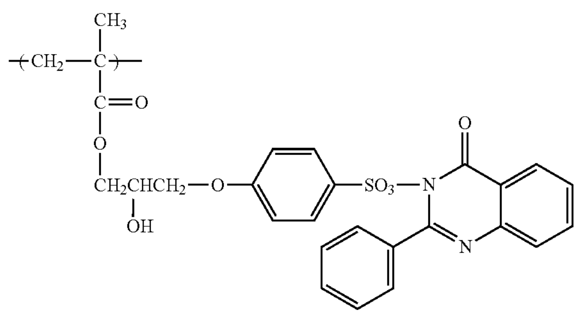
(a73)
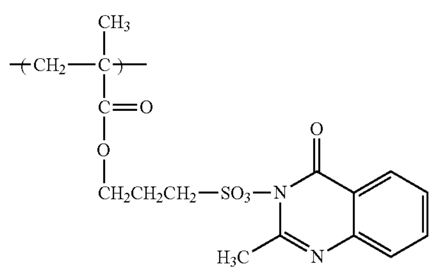
(a74)
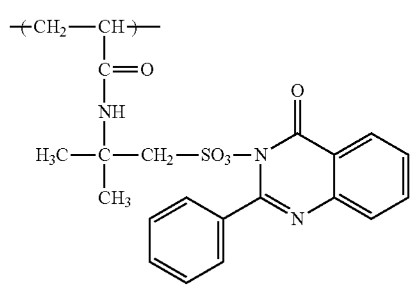

-continued
(a75)
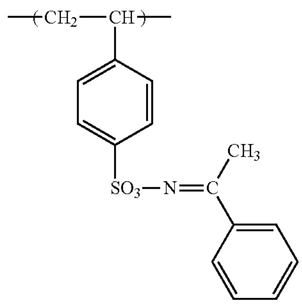
(a76)
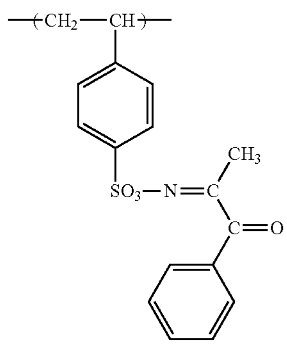
(a77)
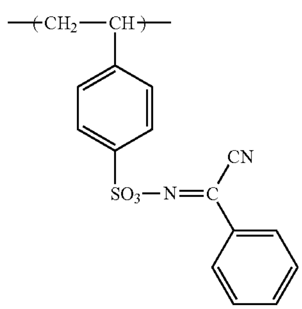
(a78)
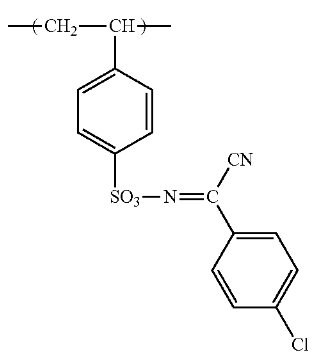
(a79)
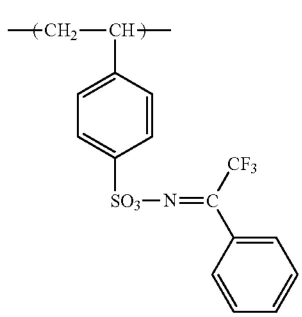
(a80)
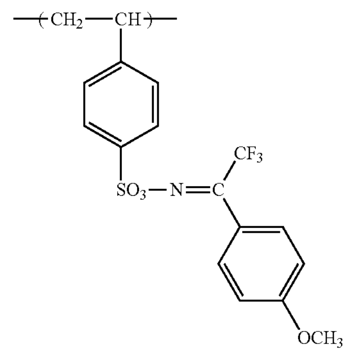
(a81)
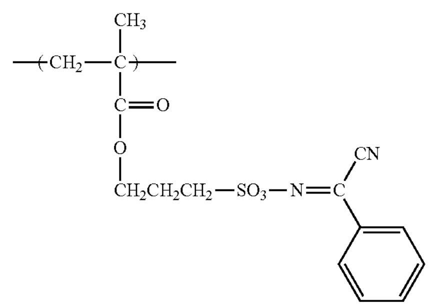
(a82)
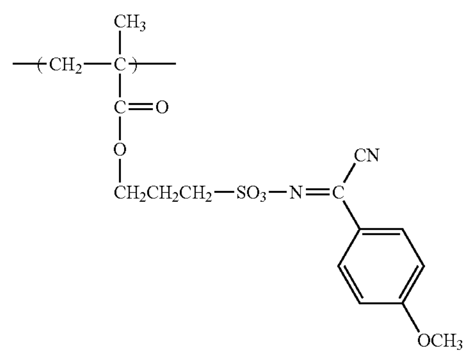
(a83)
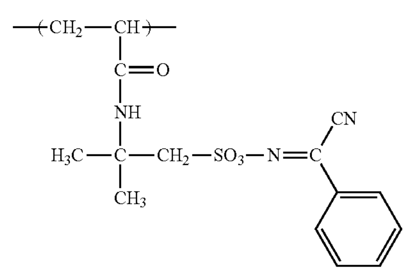
(a84)
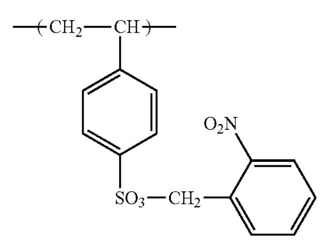

-continued
(a85)
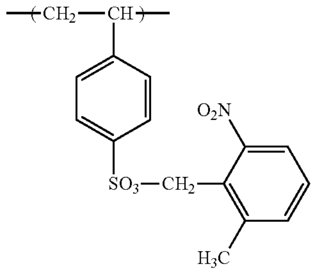
(a86)
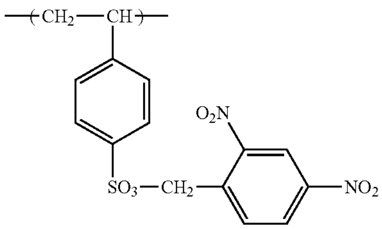
(a87)
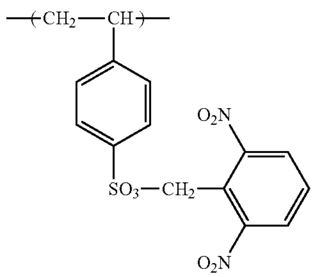
(a88)
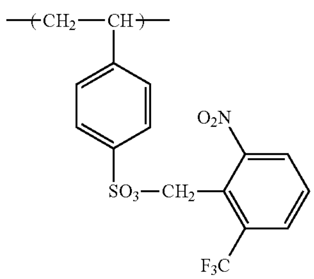
(a89)
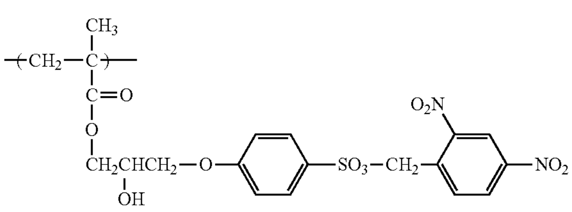
(a90)
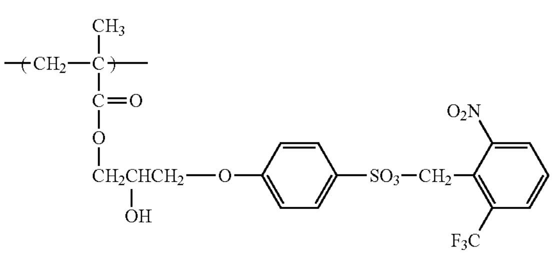
-continued
(a91)
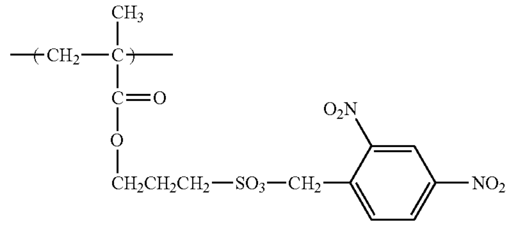
(a92)
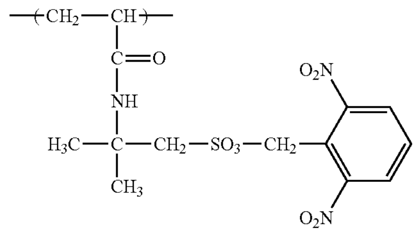
(a93)
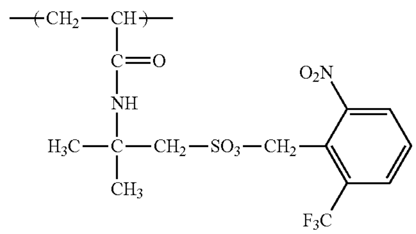
(a94)
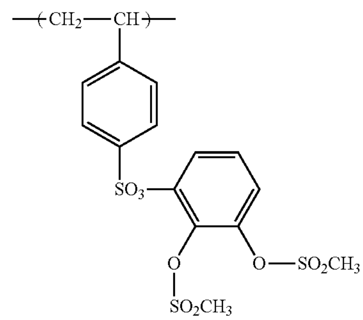
(a95)
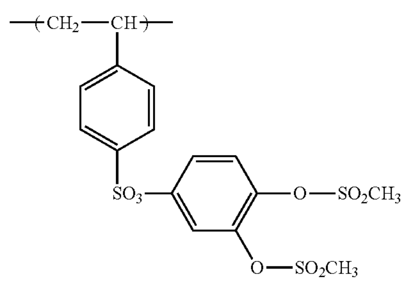
(a96)
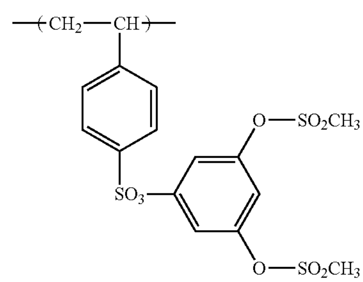

-continued
(a97)
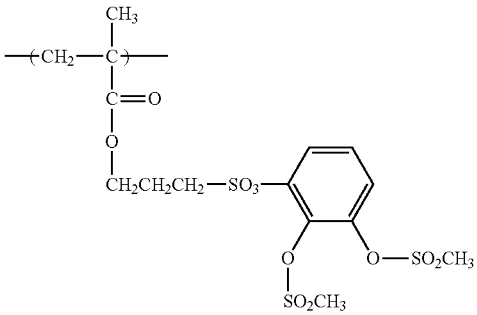
(a98)
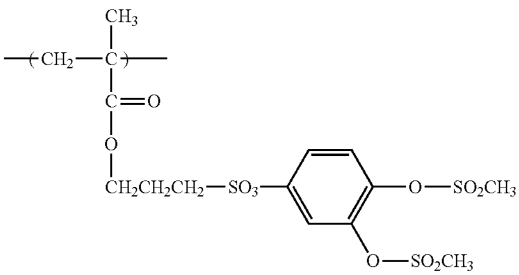
(a99)
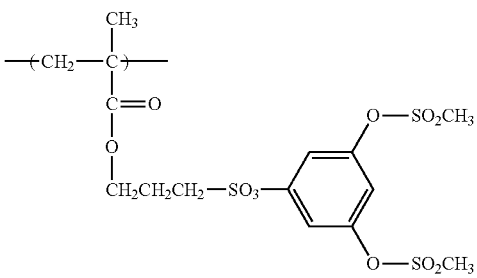
(a100)
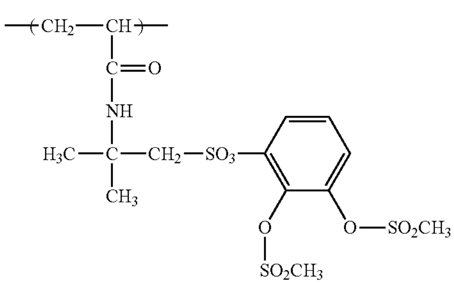
(a101)
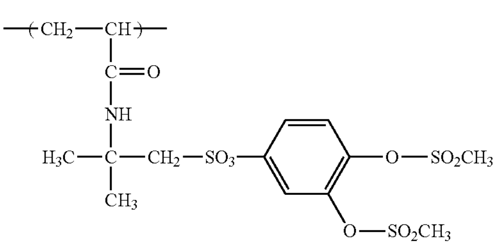
-continued
(a102)
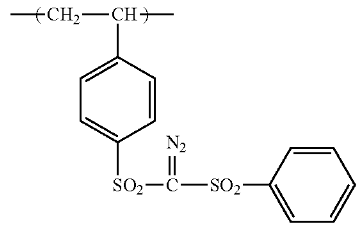
(a103)
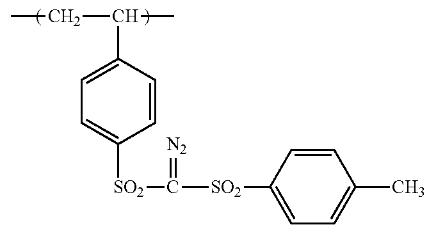
(a104)
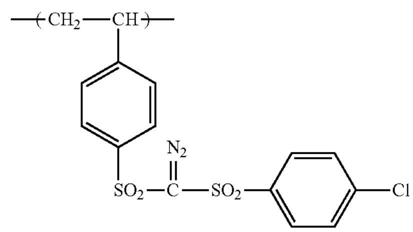
(a105)
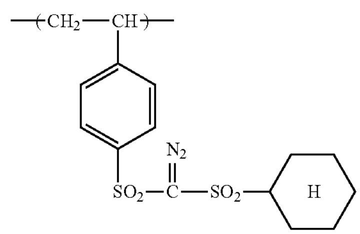
(a106)
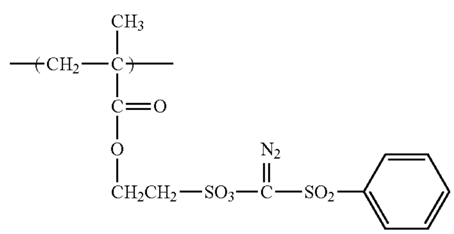
(a107)
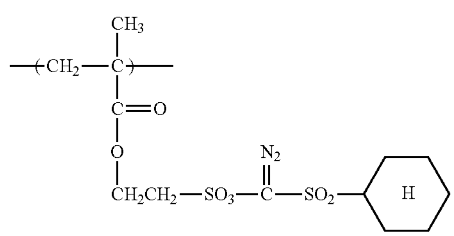
(a108)
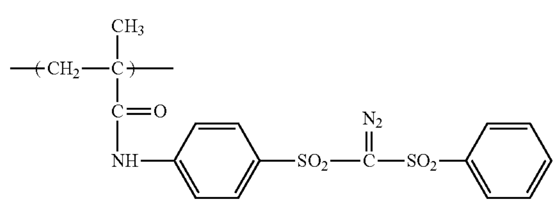

-continued
(a109)
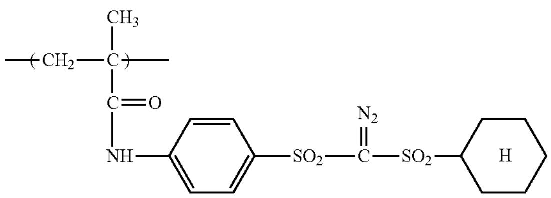
(a110)
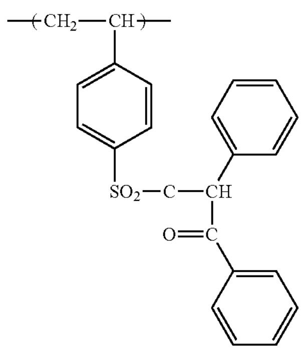
(a111)
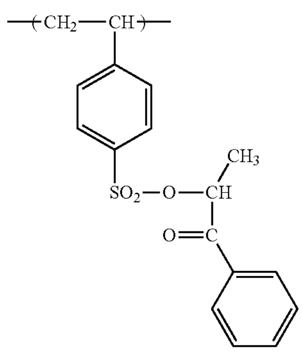
(a112)
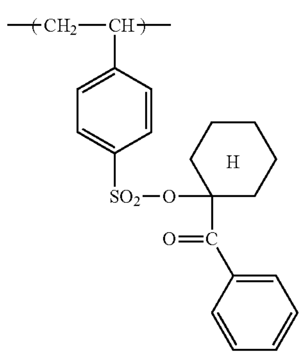
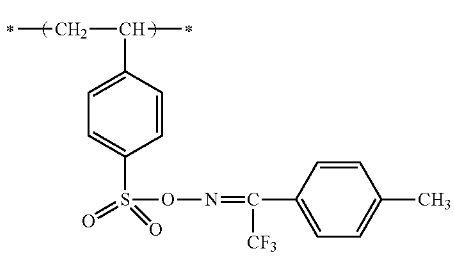
-continued
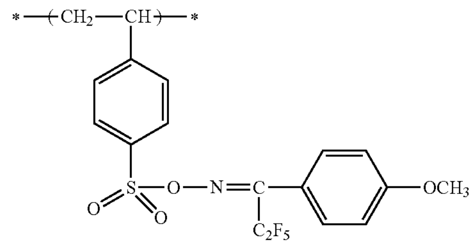
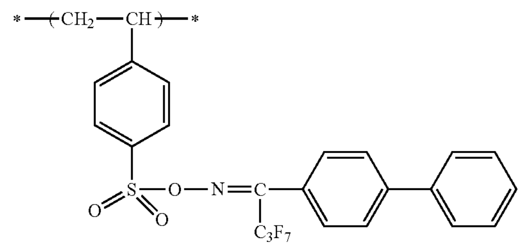
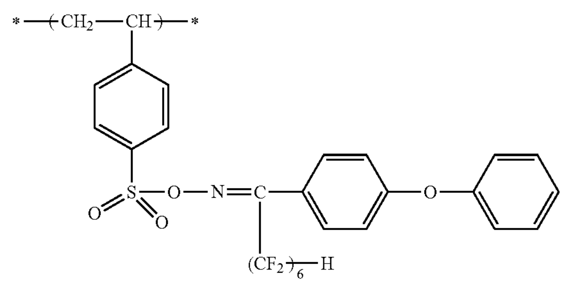
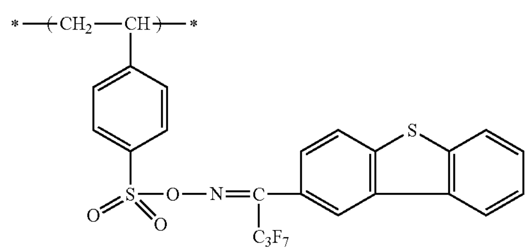
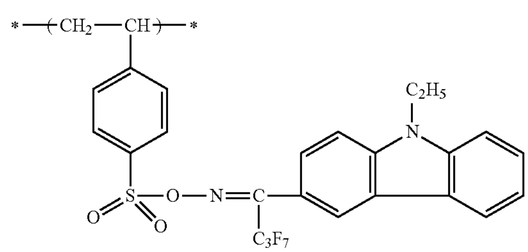
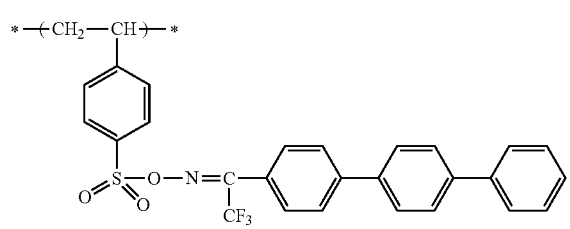

-continued
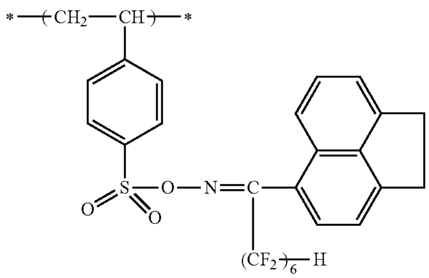
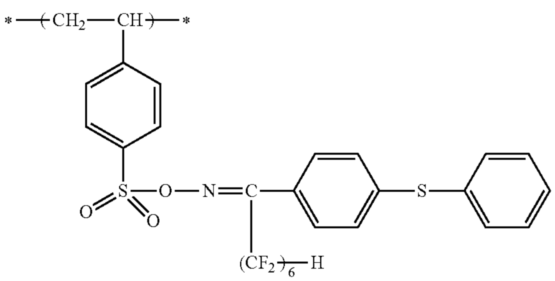
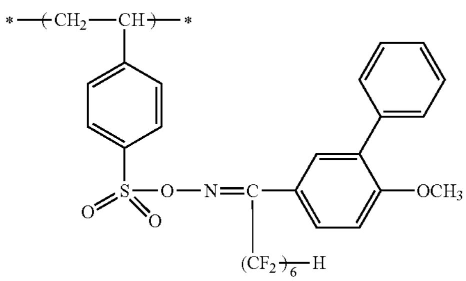
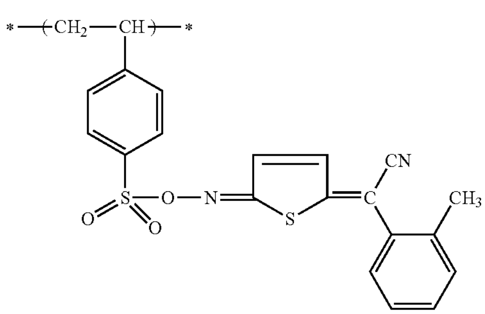
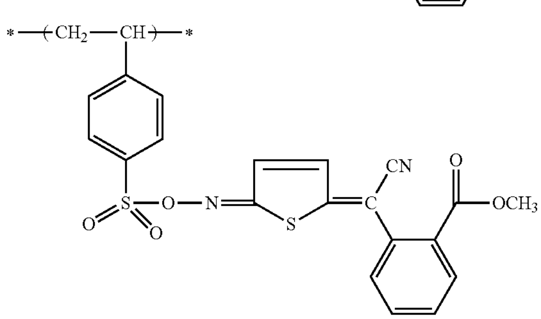
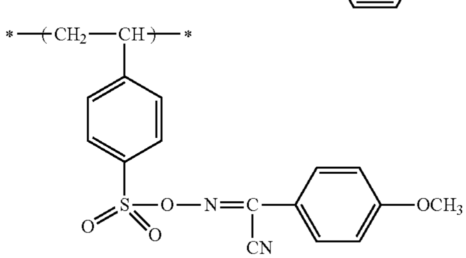
-continued
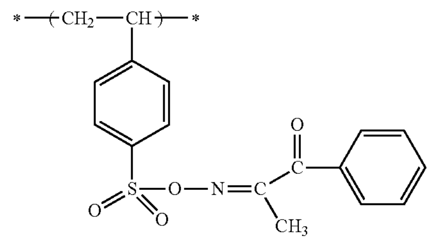
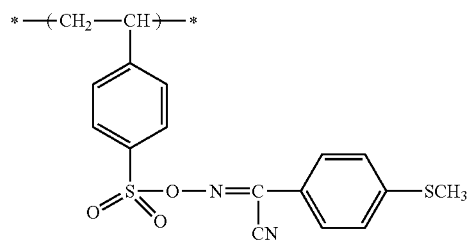
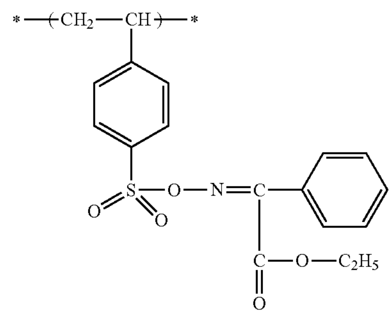
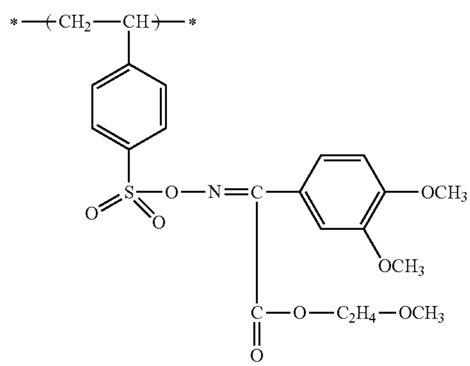
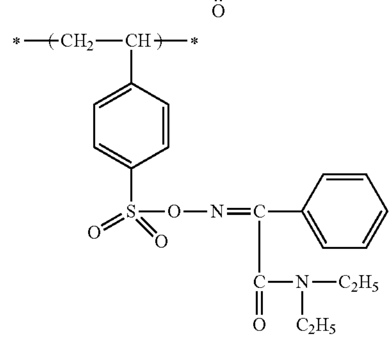
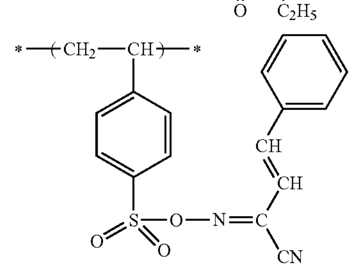

-continued
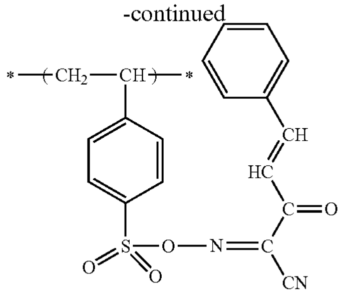
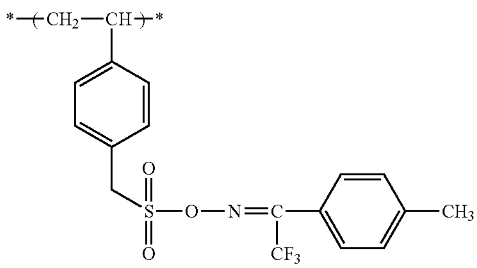
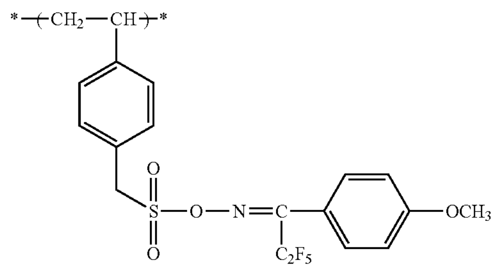
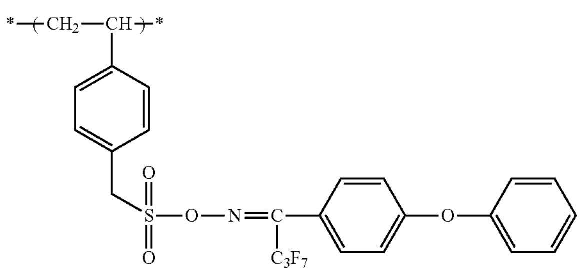
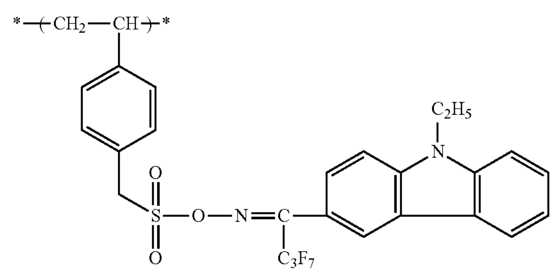
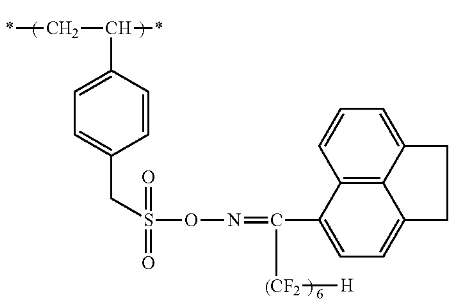
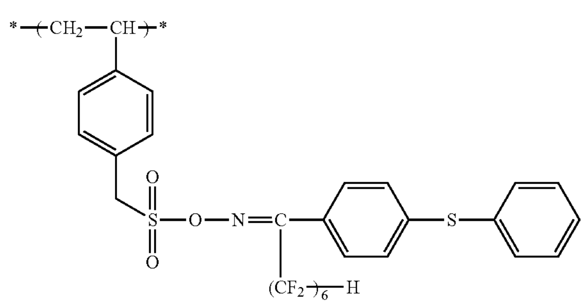
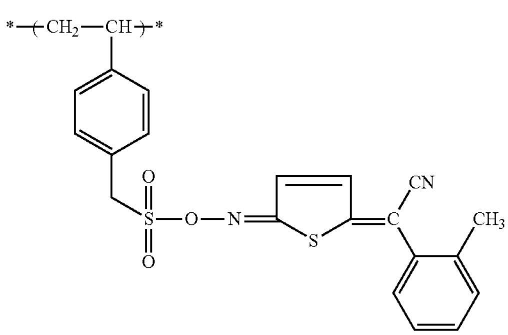
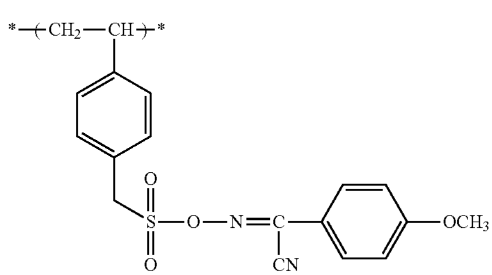

-continued
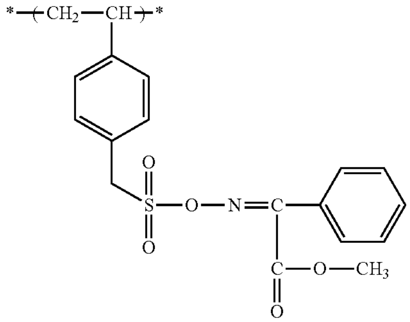
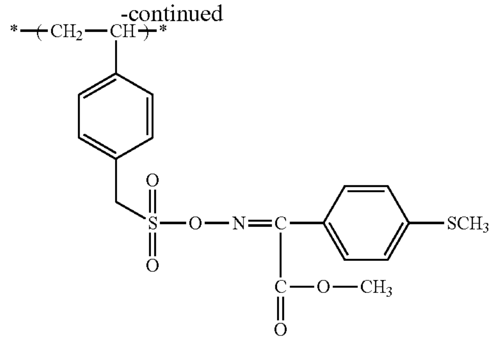
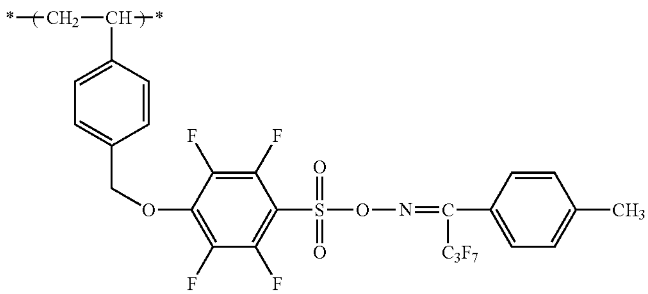
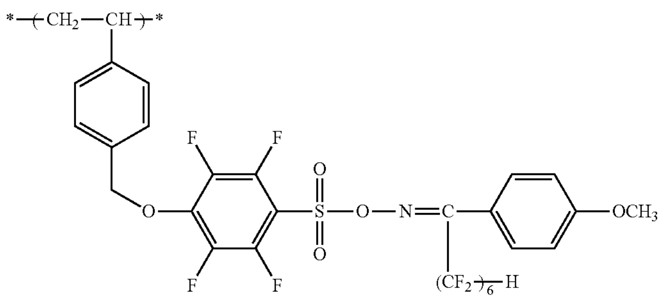
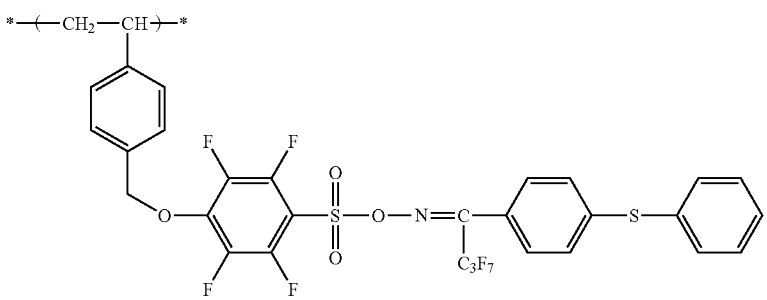
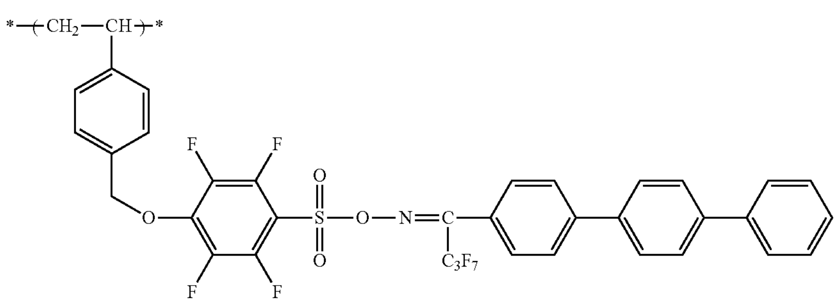

-continued
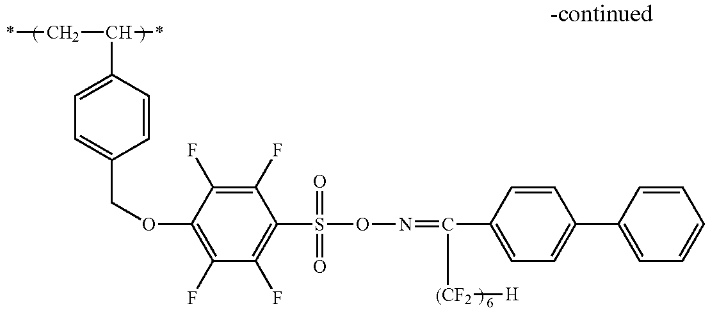
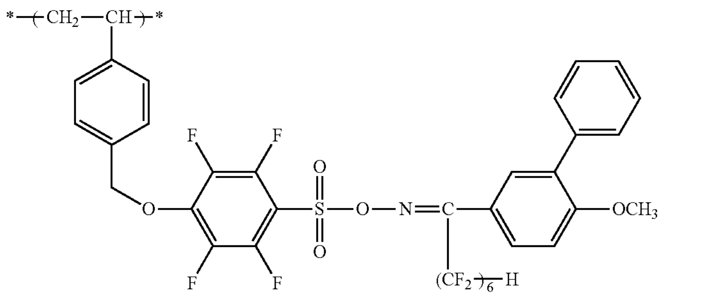
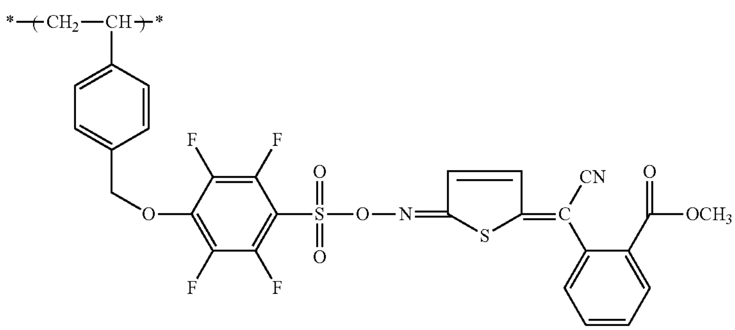
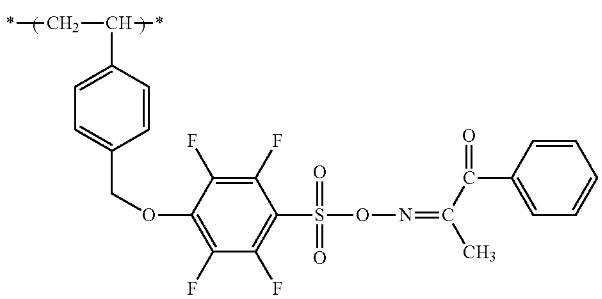
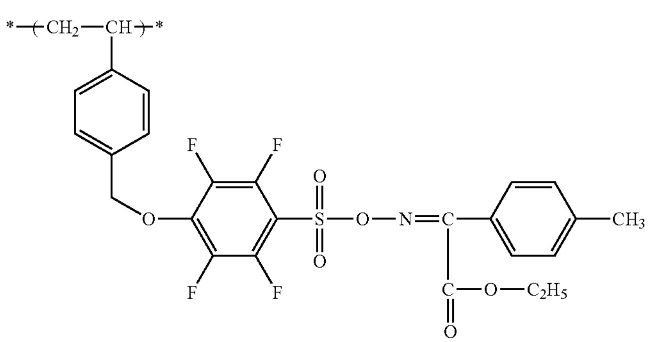

-continued
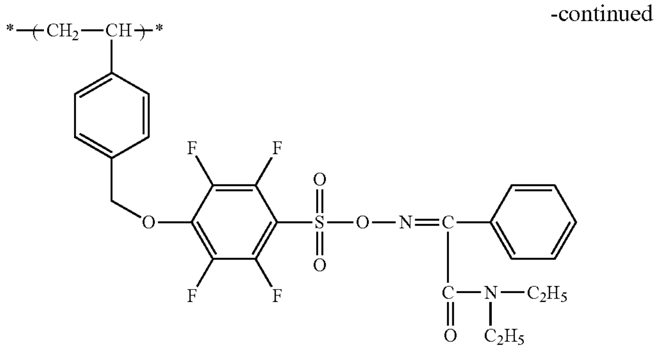
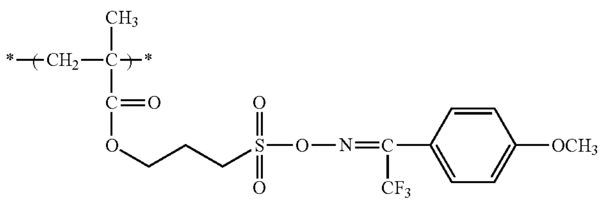
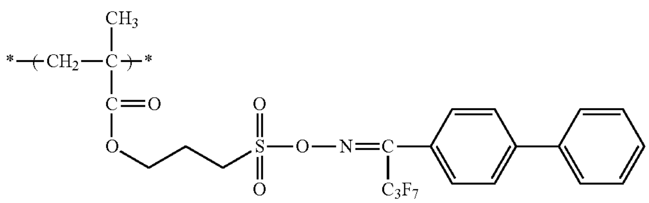
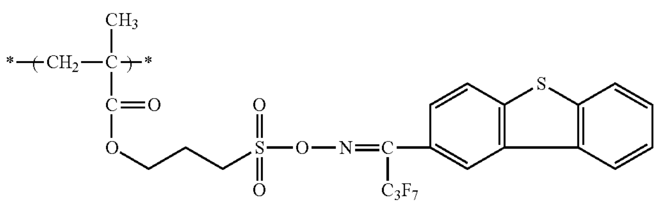
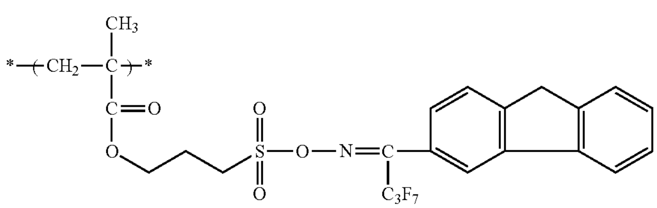
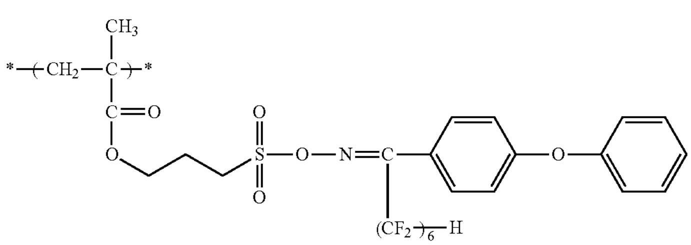
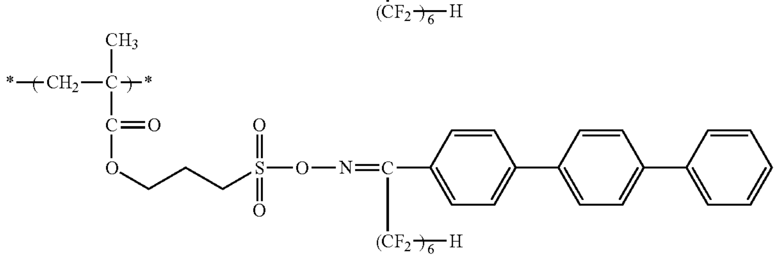

-continued
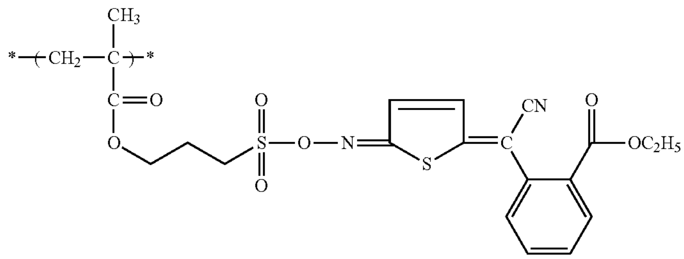
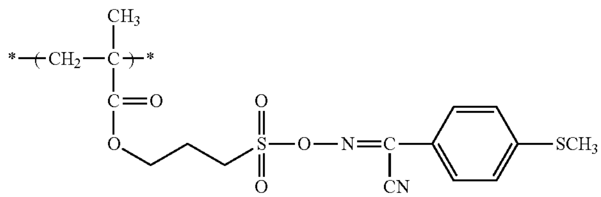
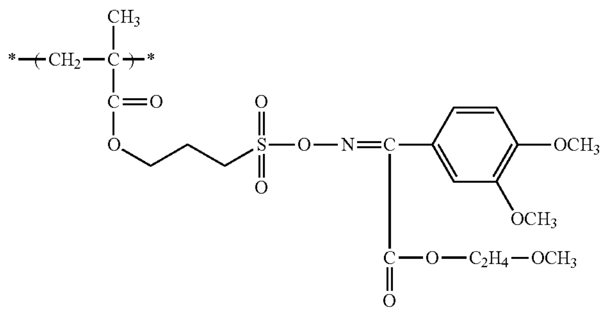
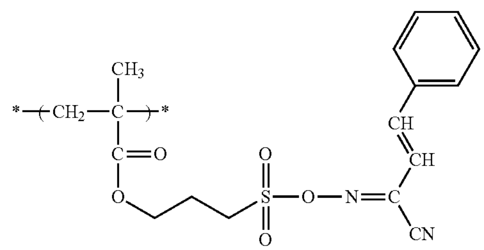
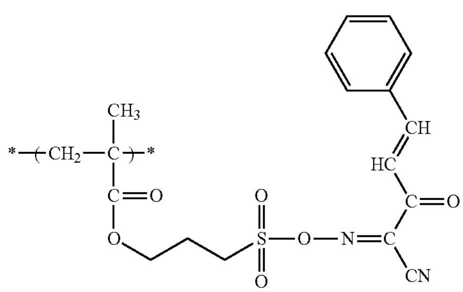
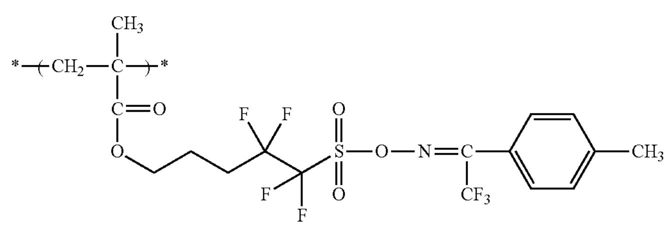
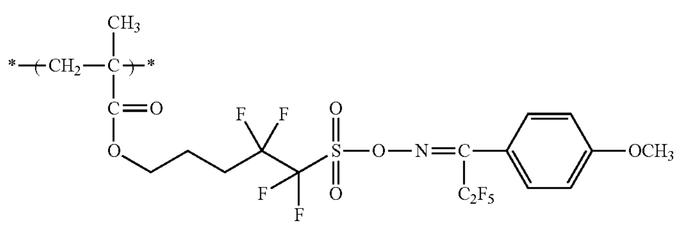
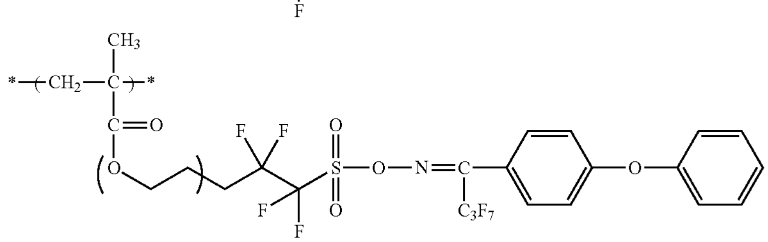
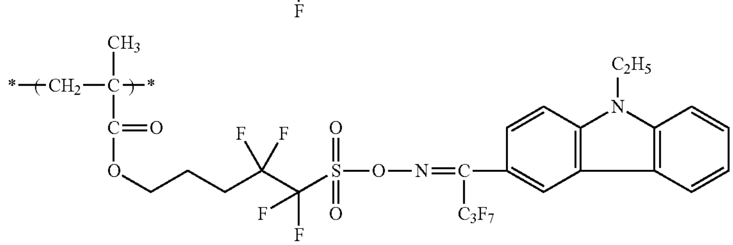

-continued
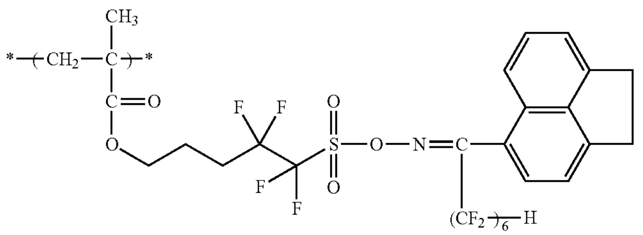
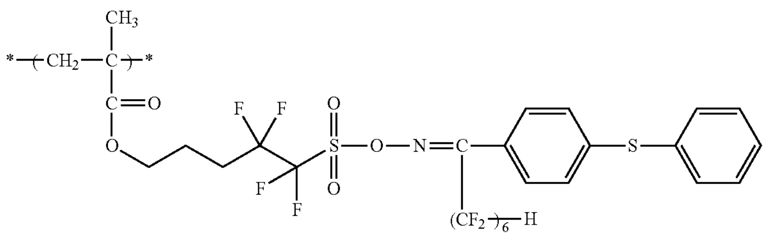
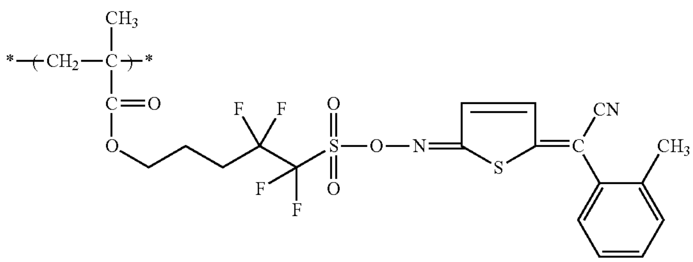
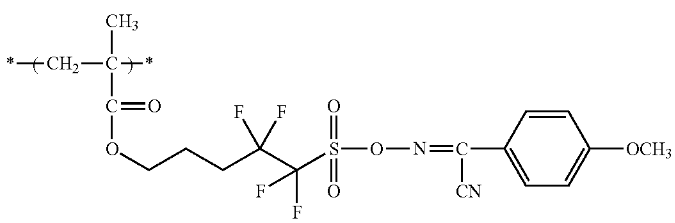
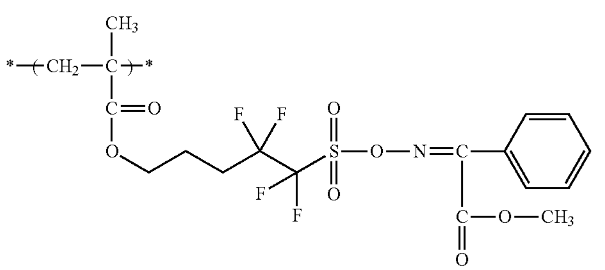
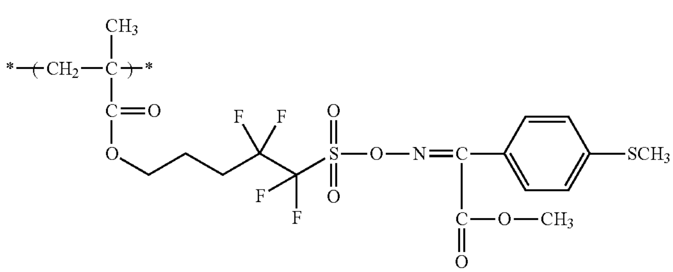
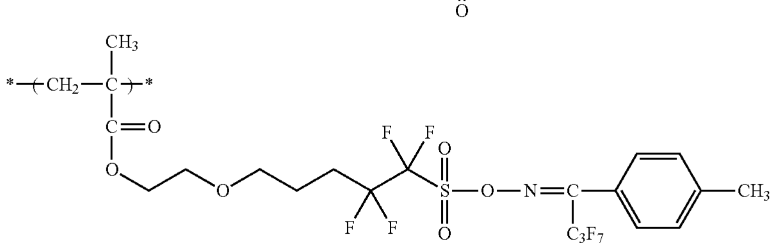

-continued
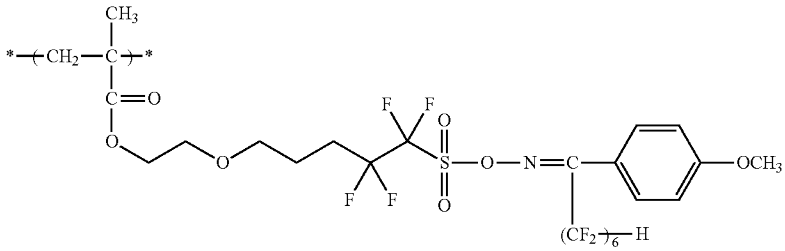
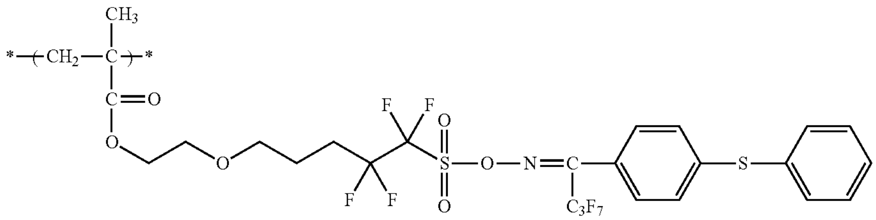
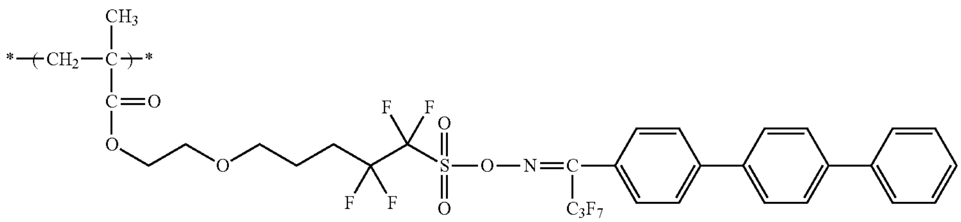
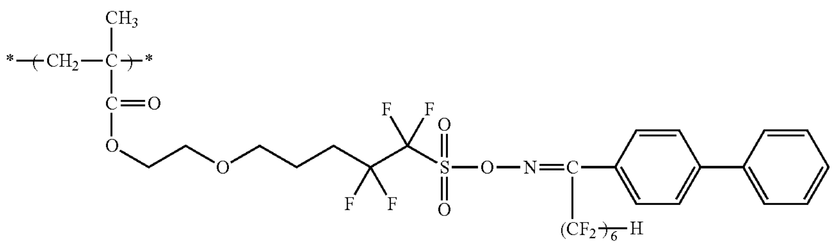
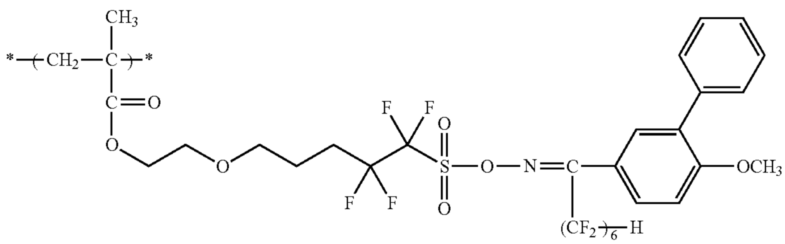
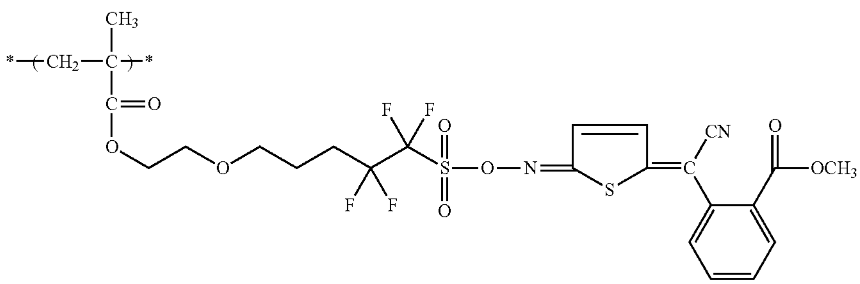
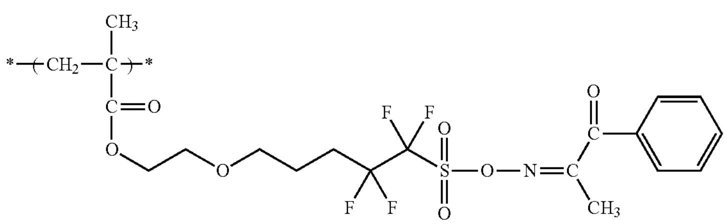

-continued
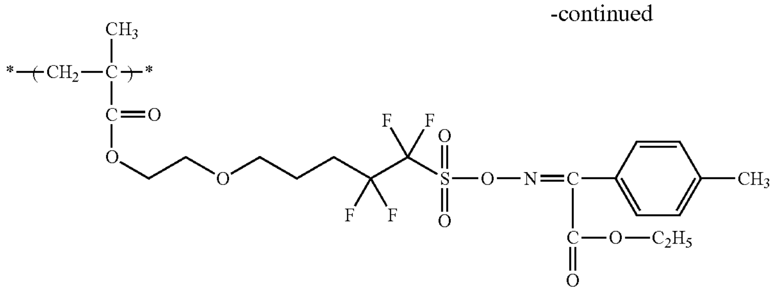
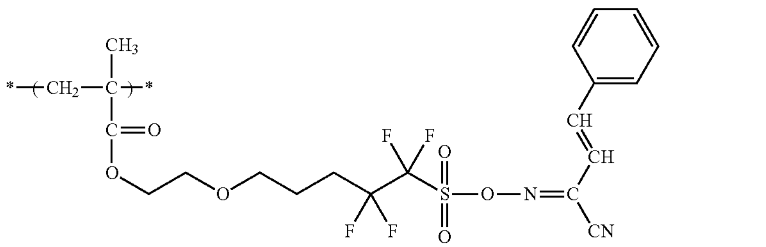
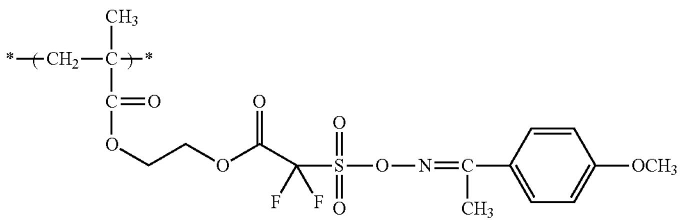
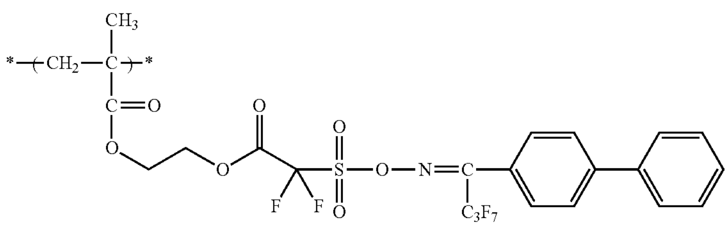
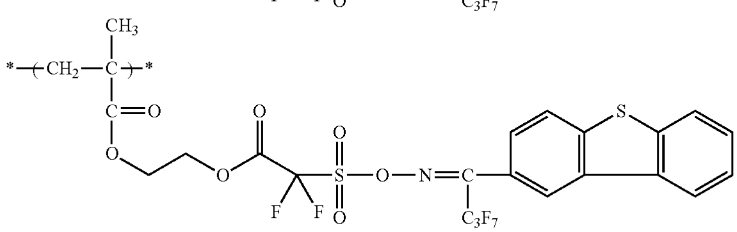
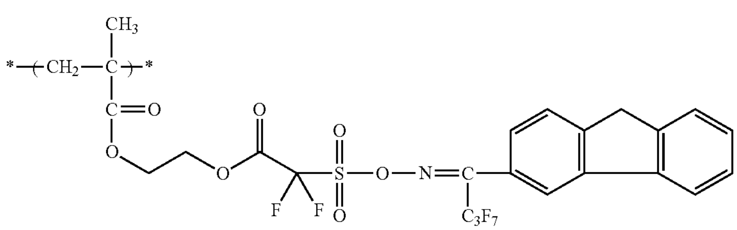
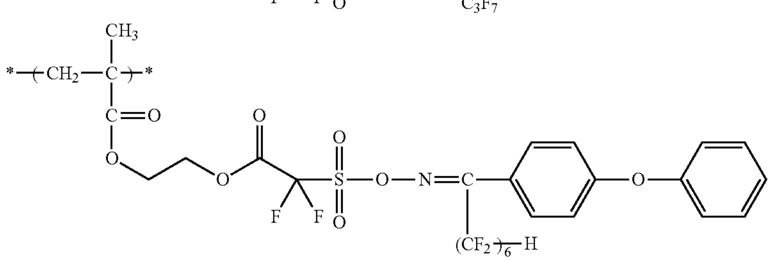

-continued
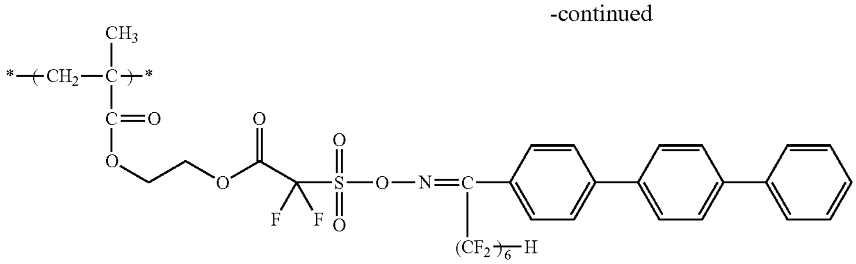
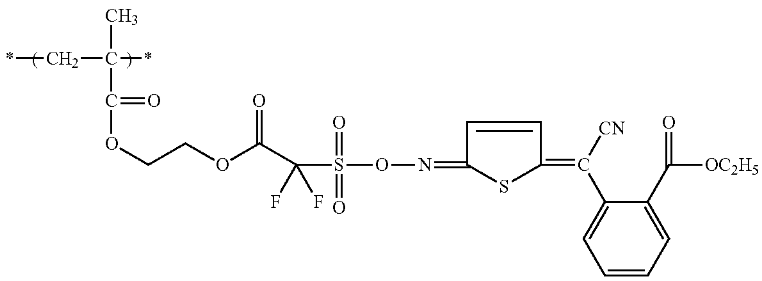
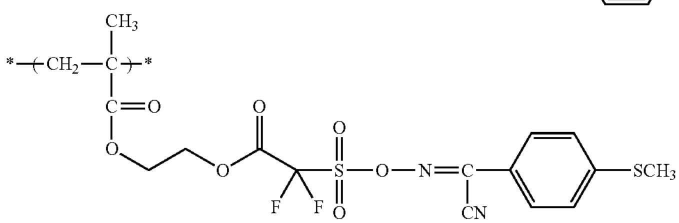
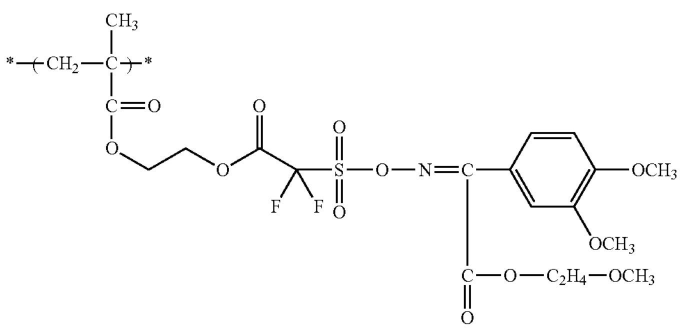
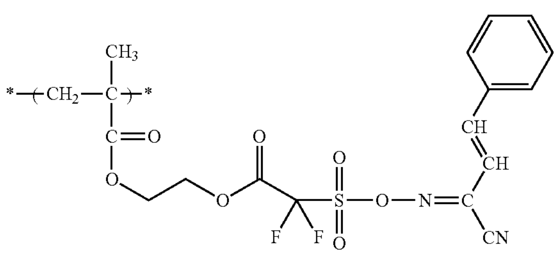
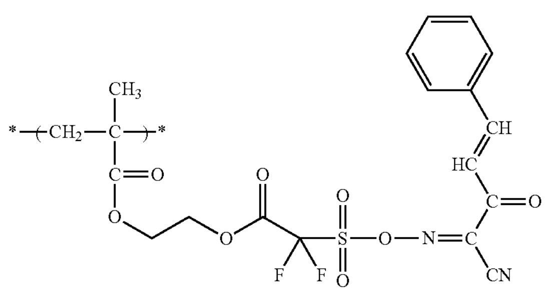
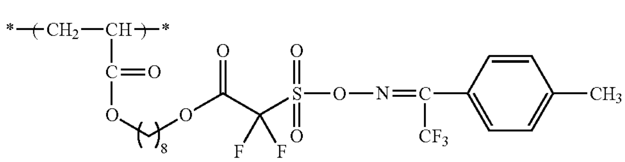
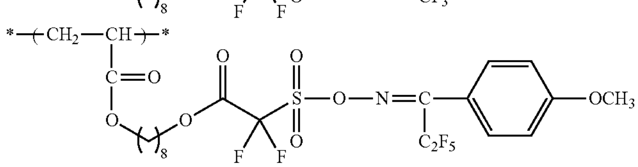

-continued
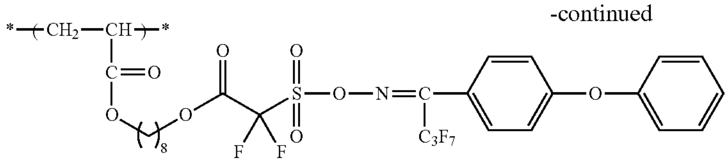
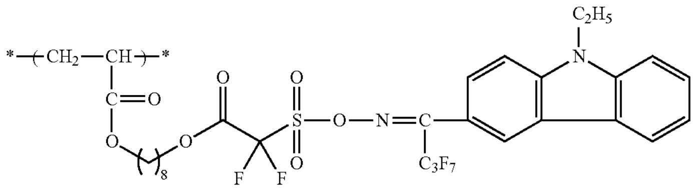
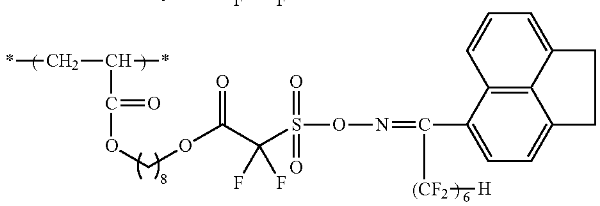
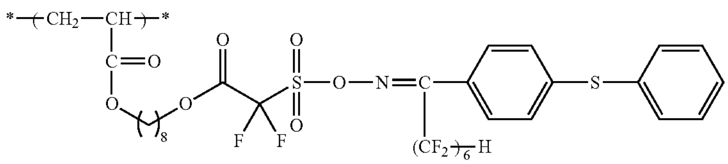
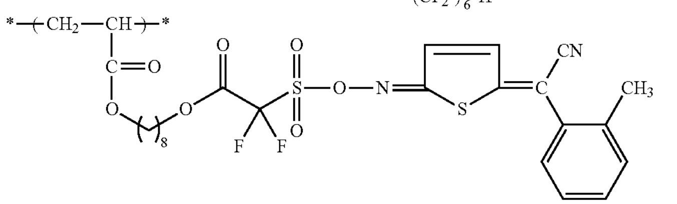
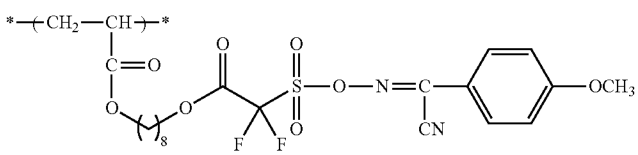
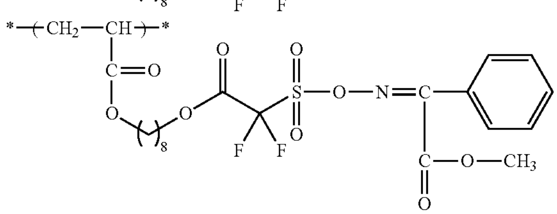
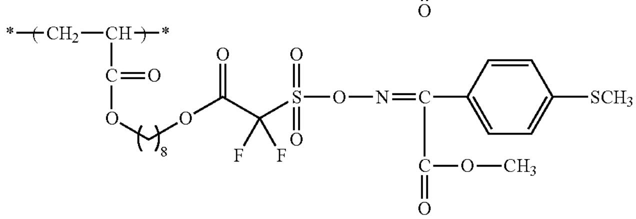
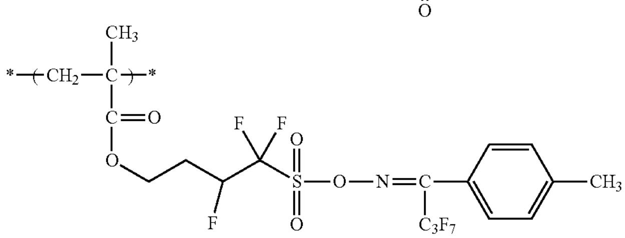

-continued
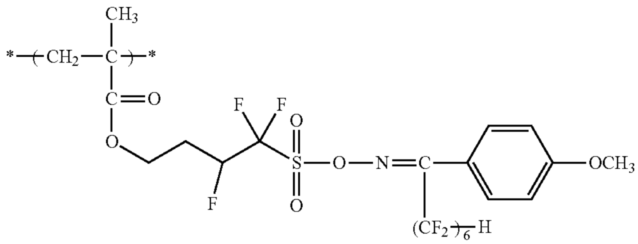
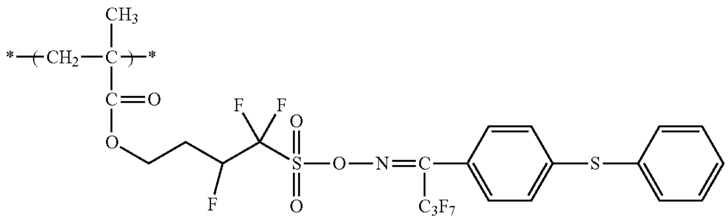
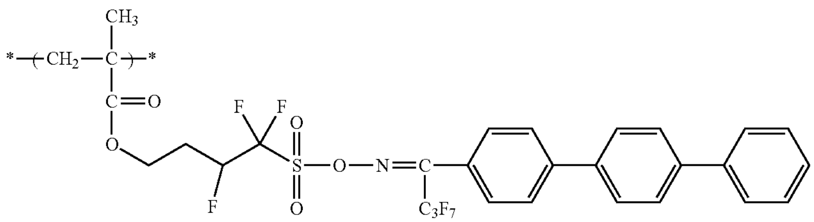
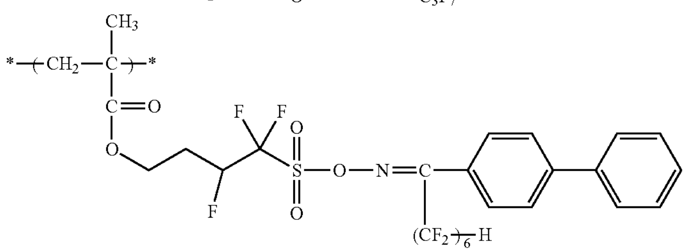
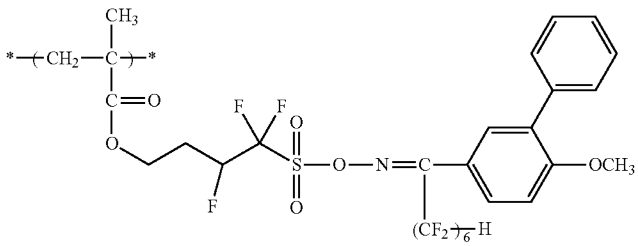
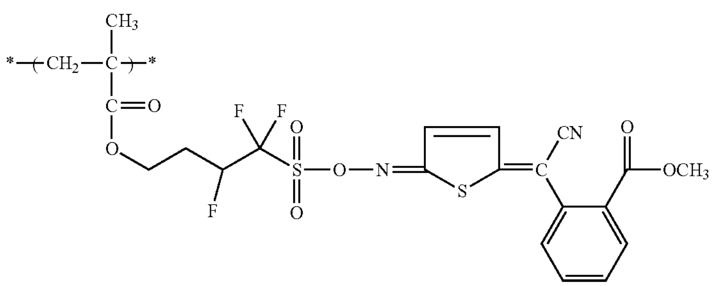
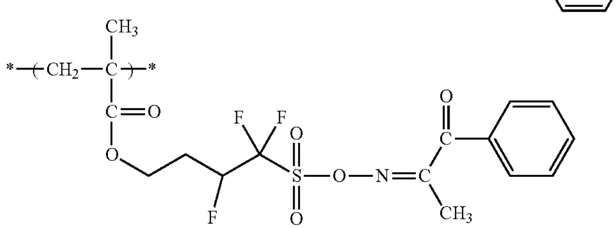

-continued
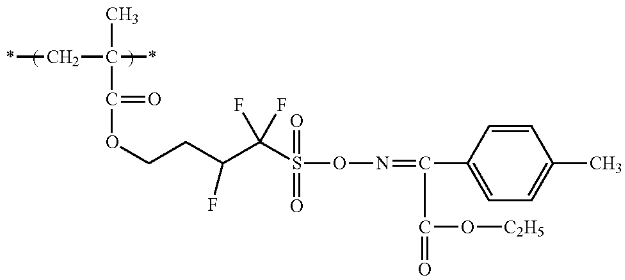
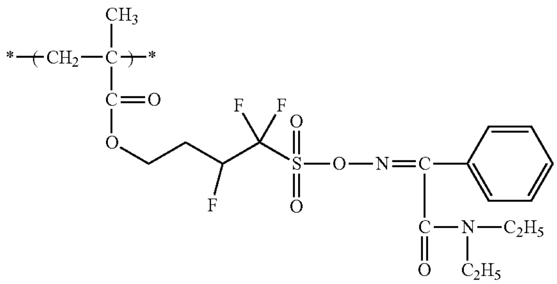
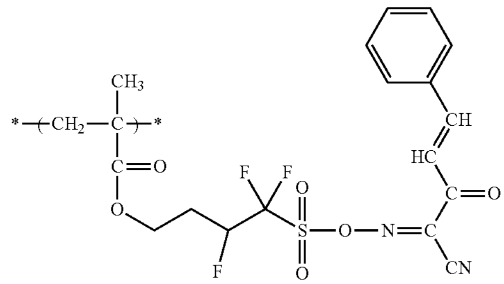
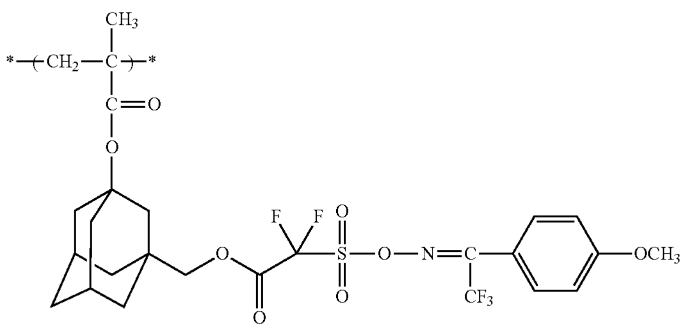
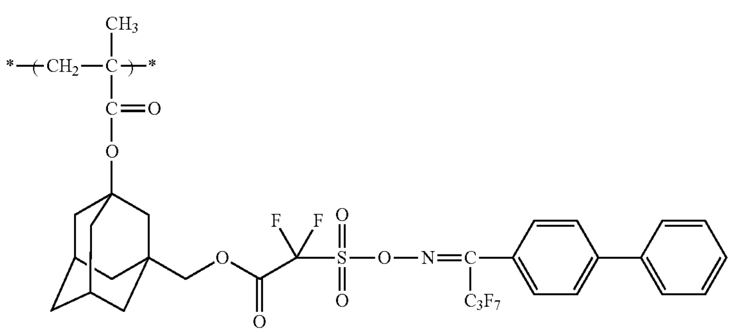
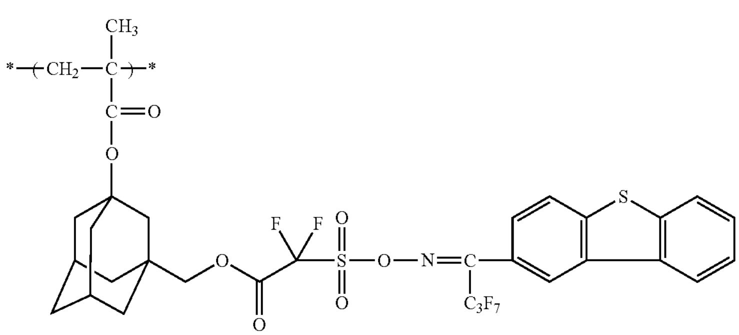

-continued
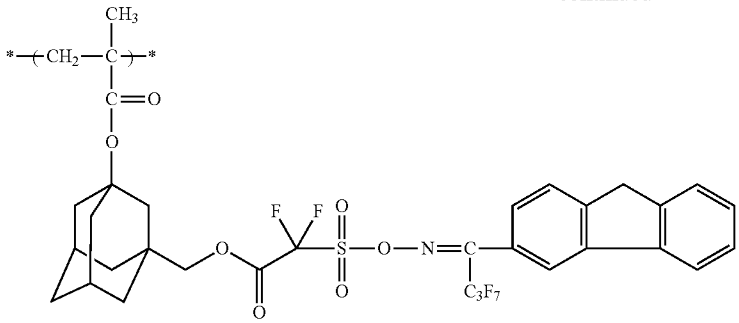
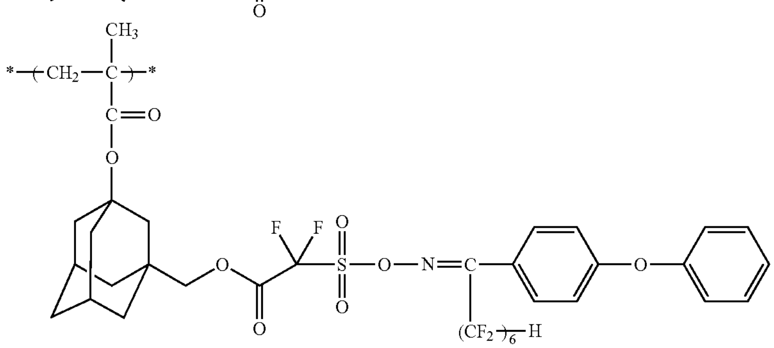
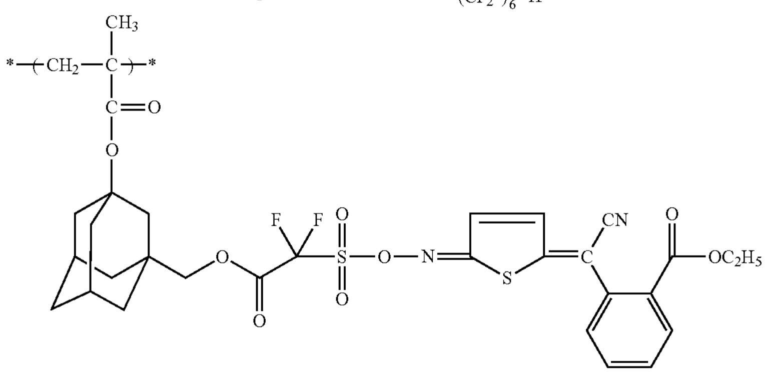
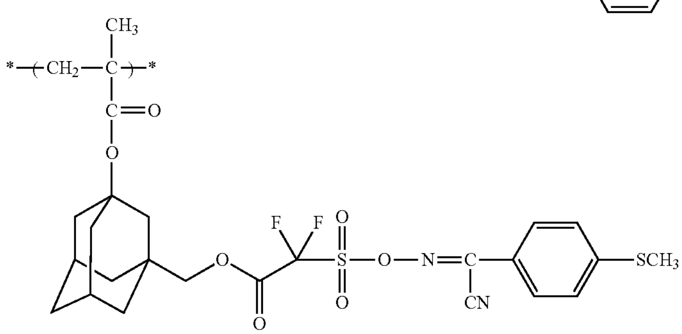
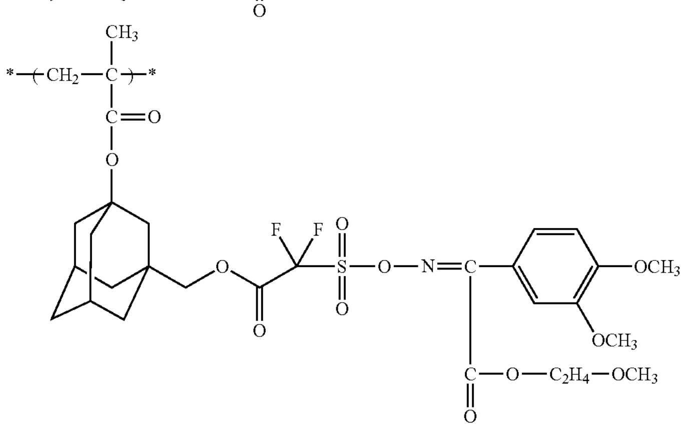

-continued
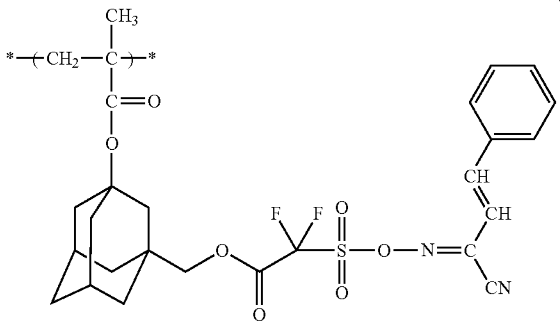
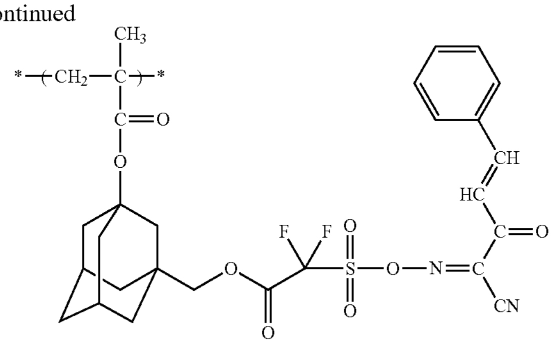
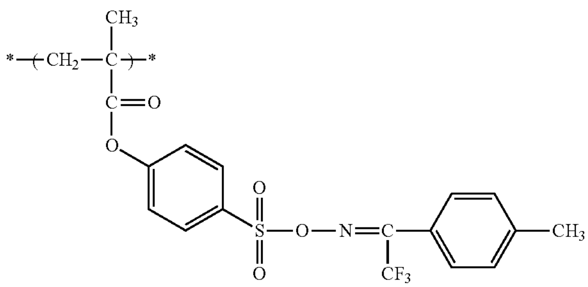
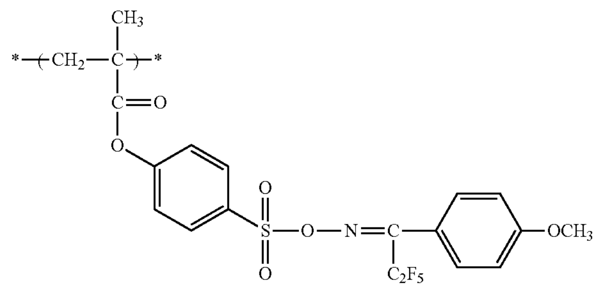
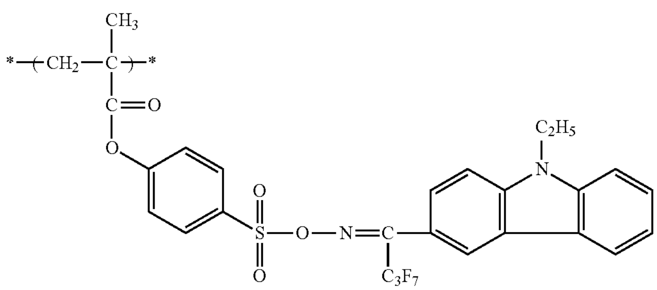
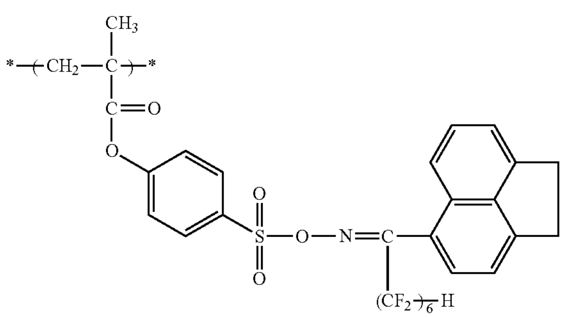
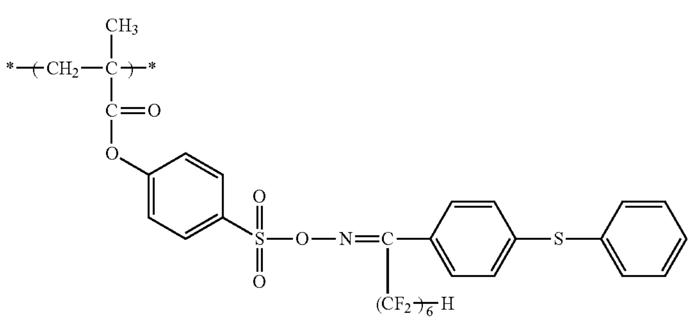

-continued
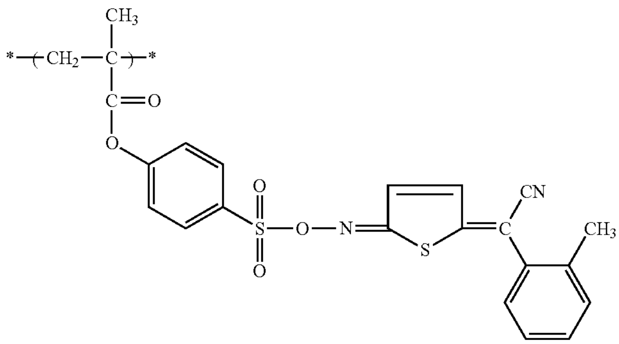
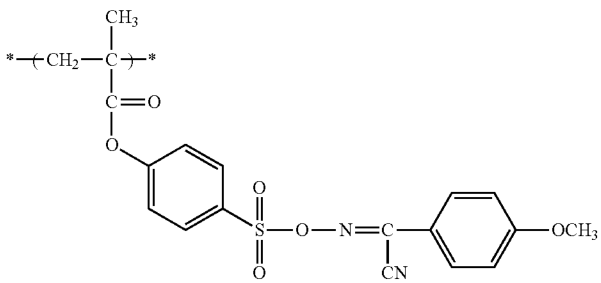
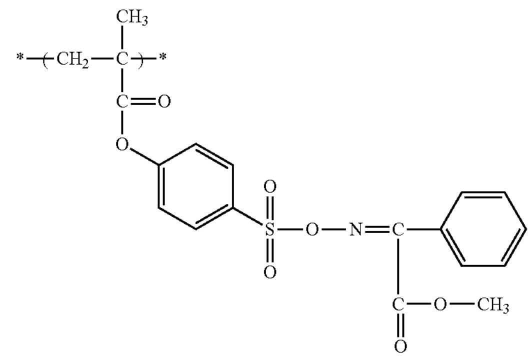
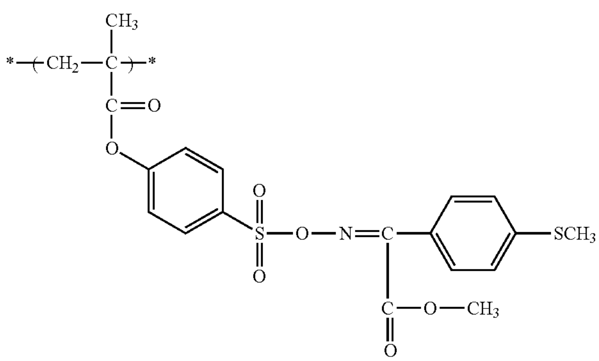
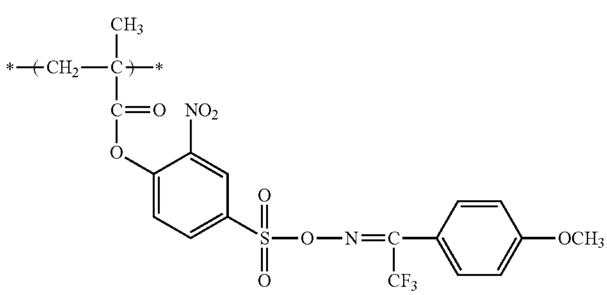
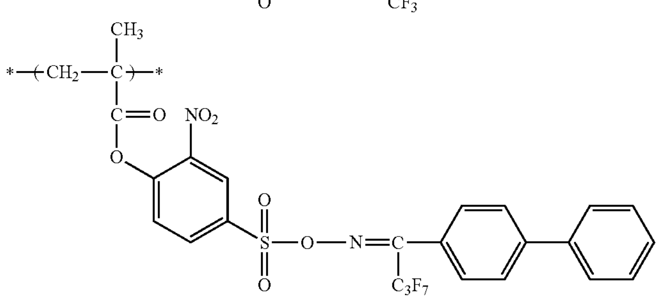

-continued
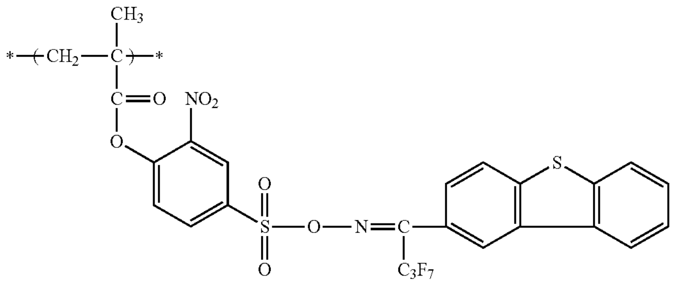
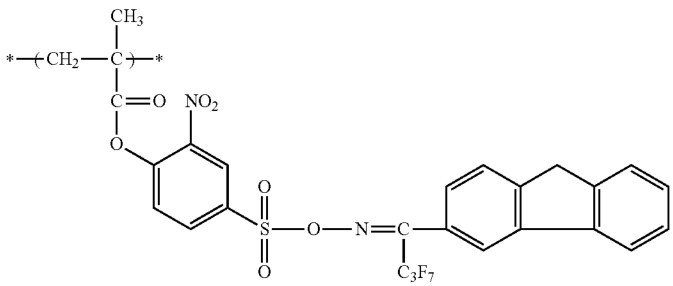
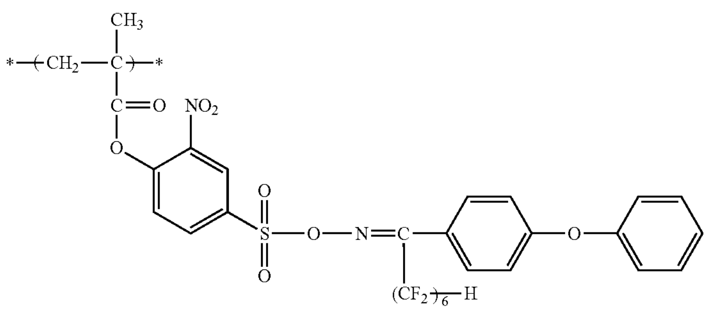
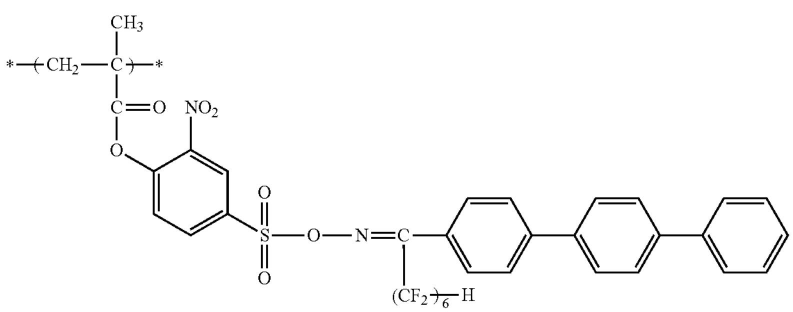
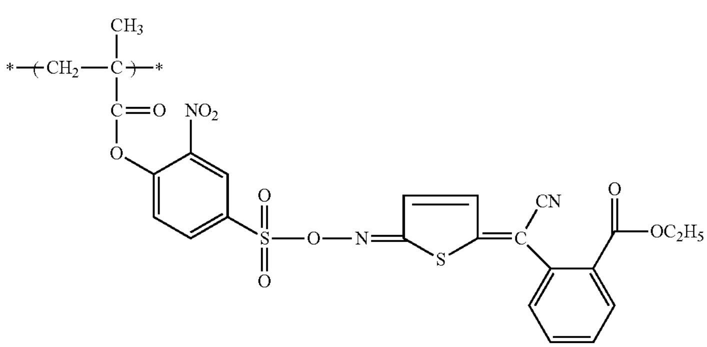

-continued
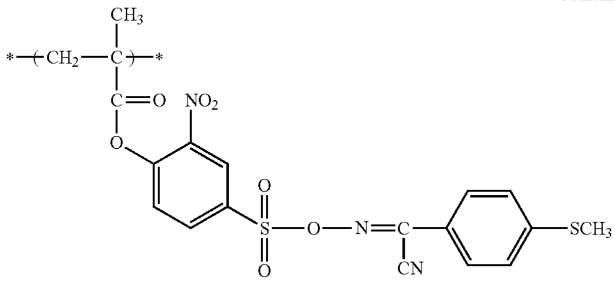
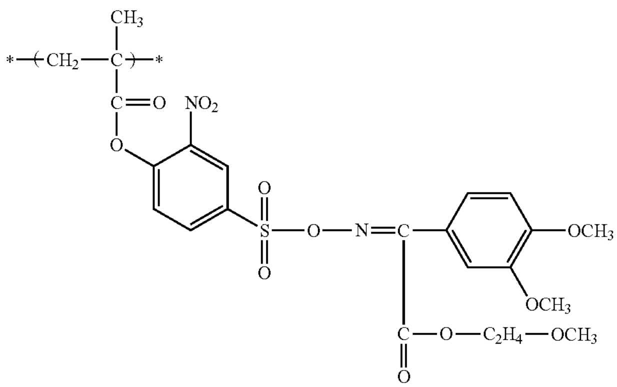
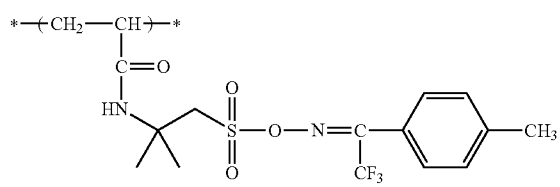
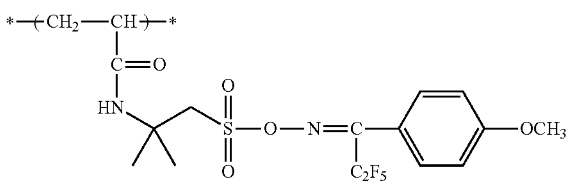
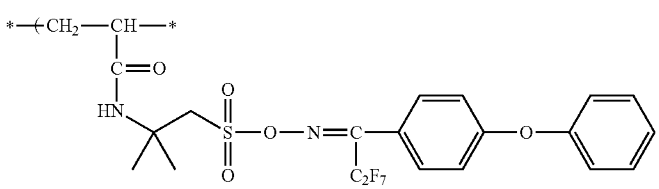
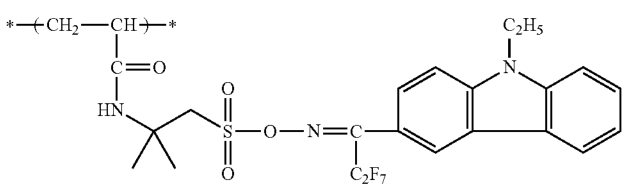
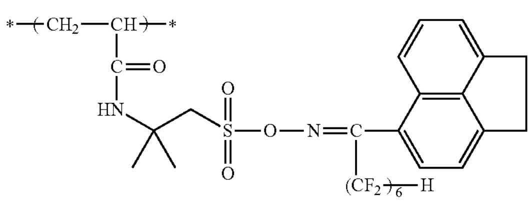
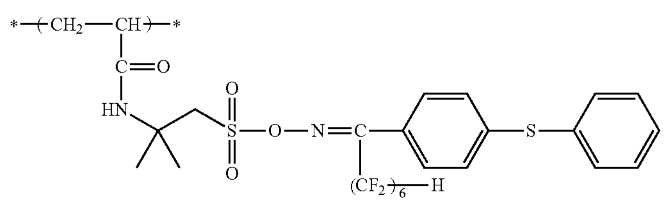
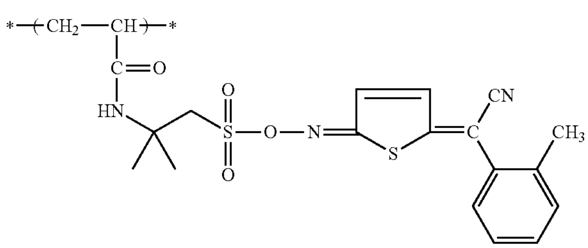
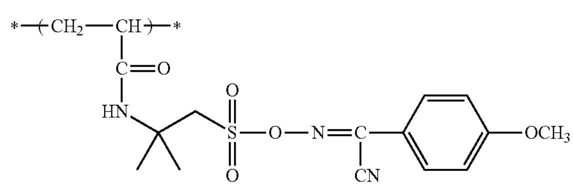

-continued
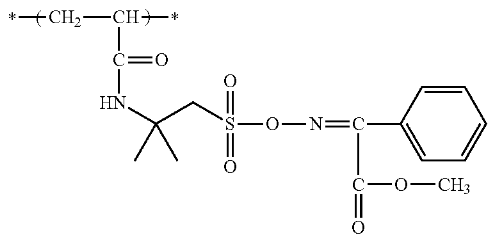
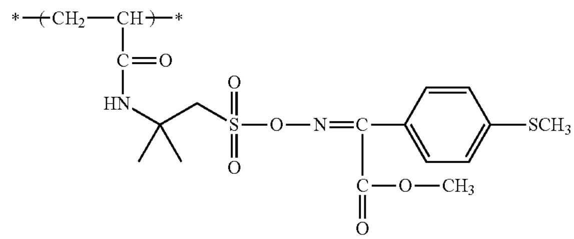
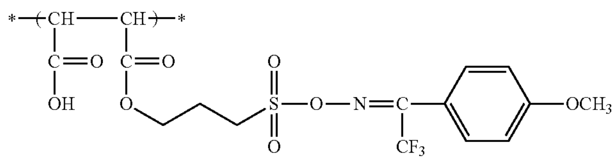
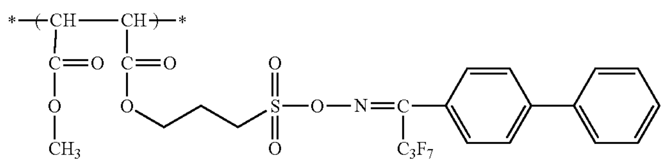
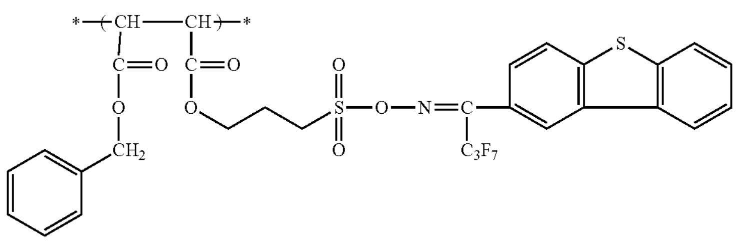
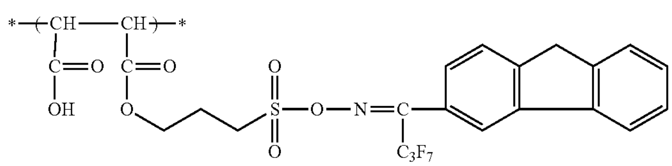
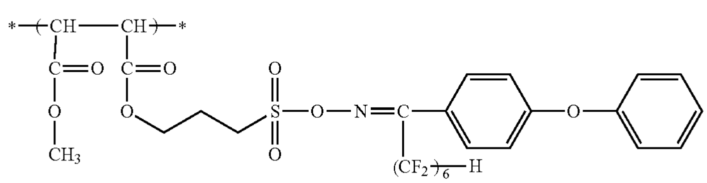
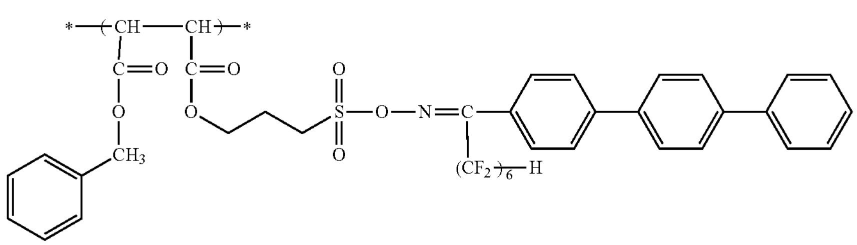
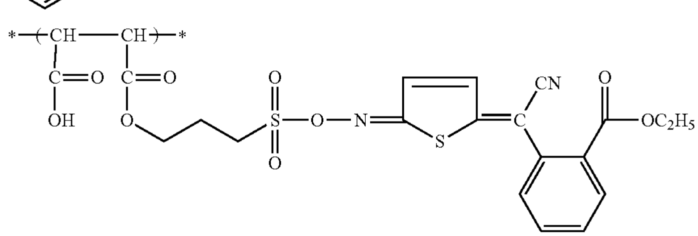

-continued
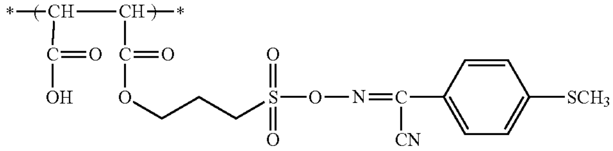
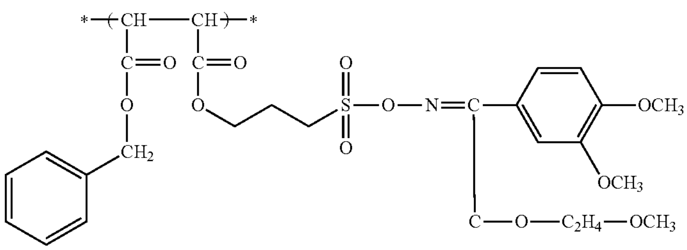
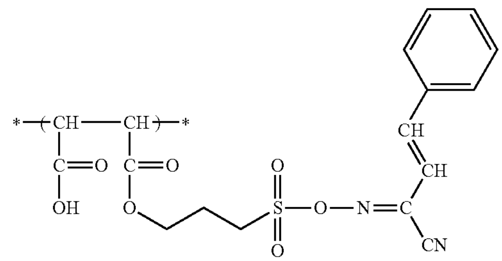
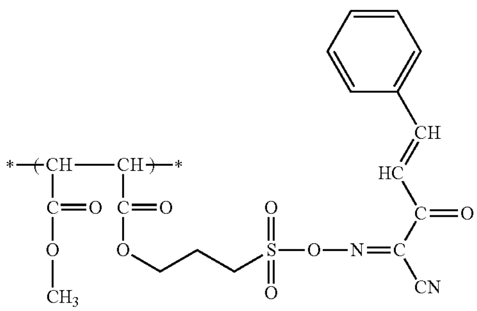
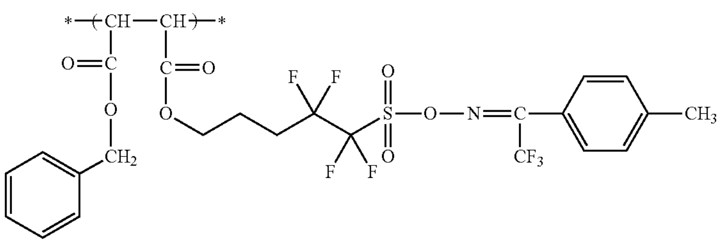
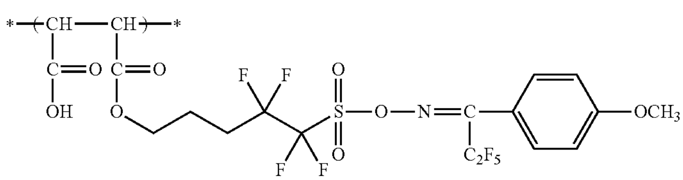
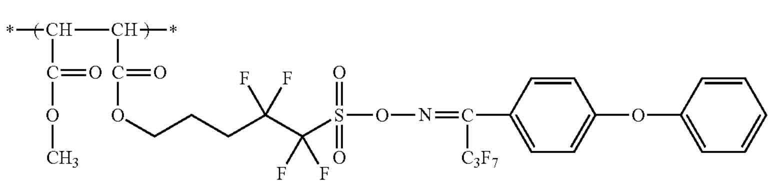
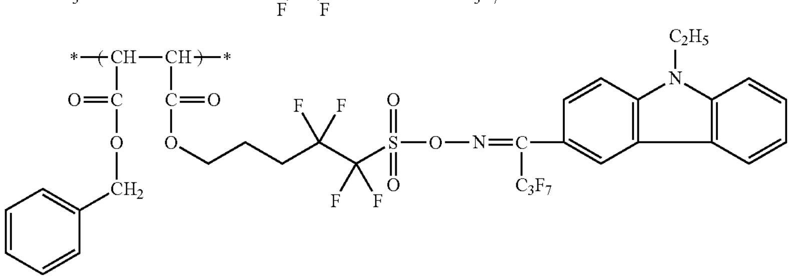

-continued
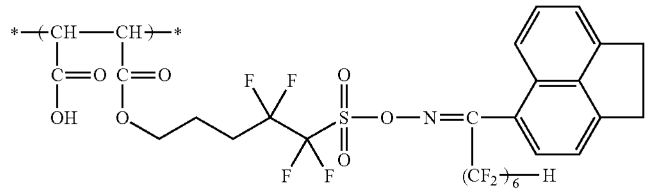
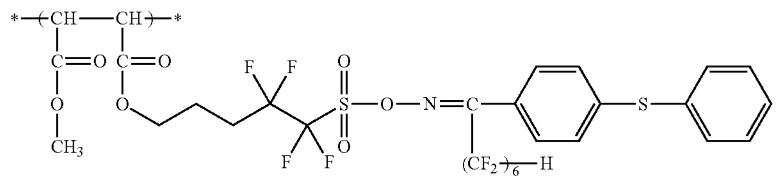
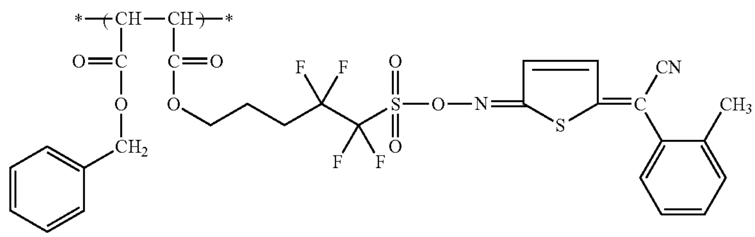
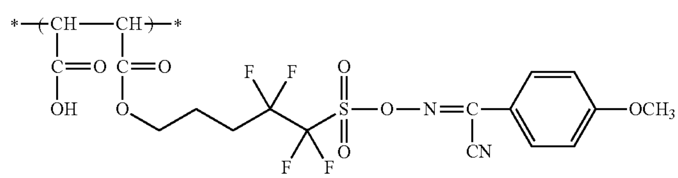
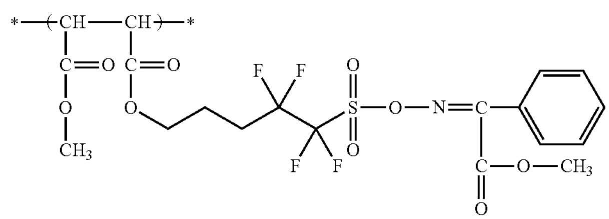
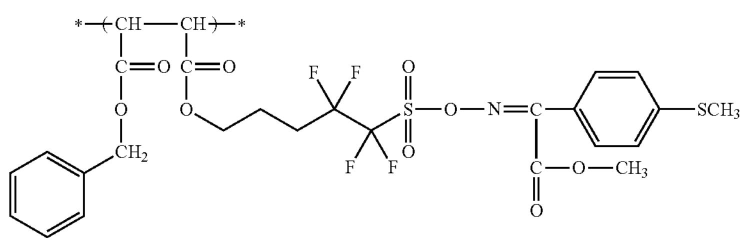
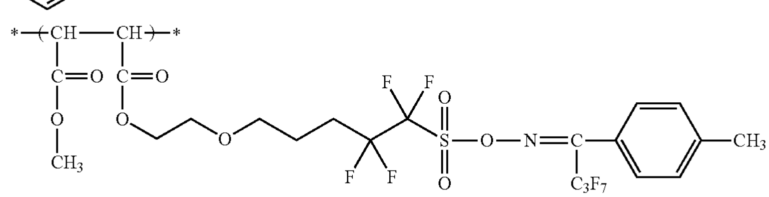
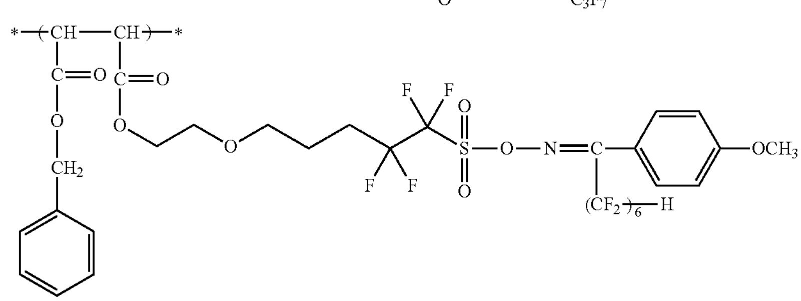

-continued
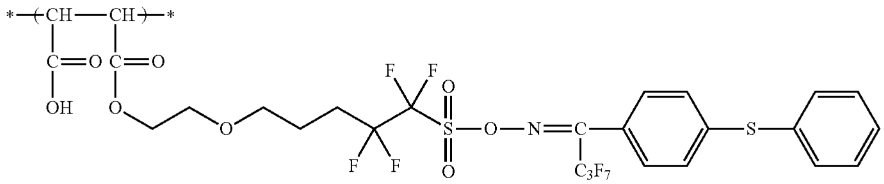
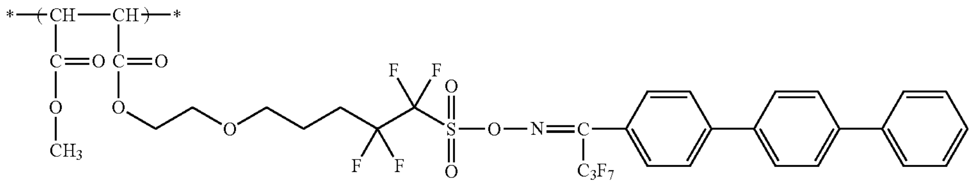
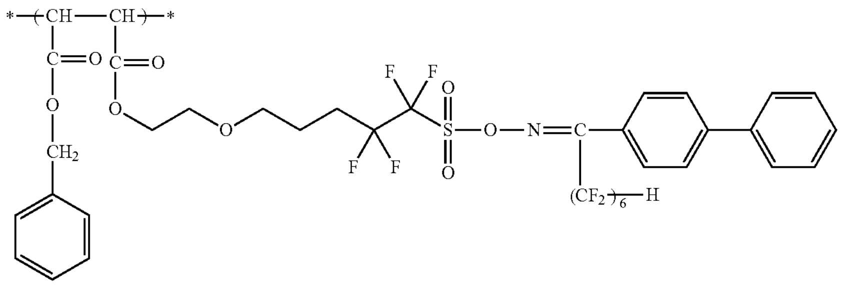
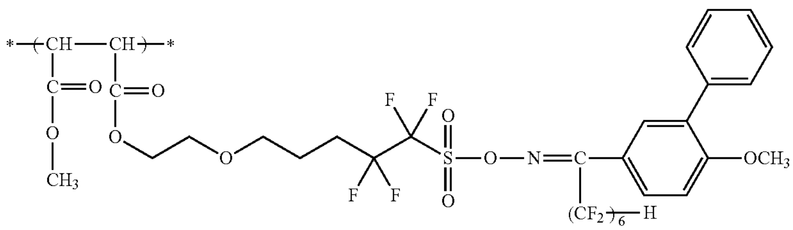
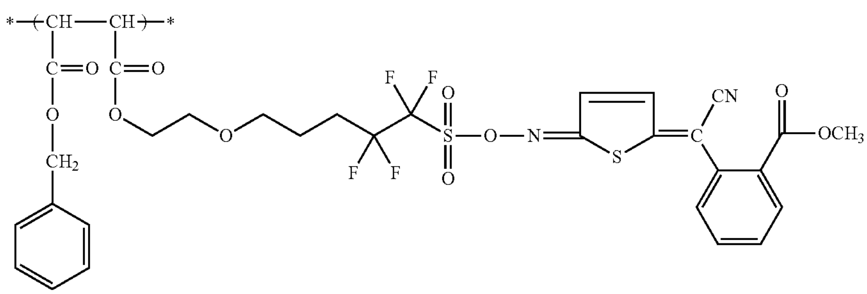
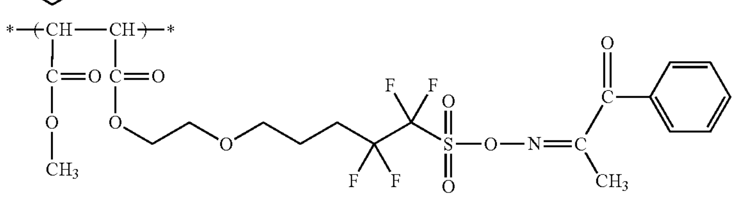
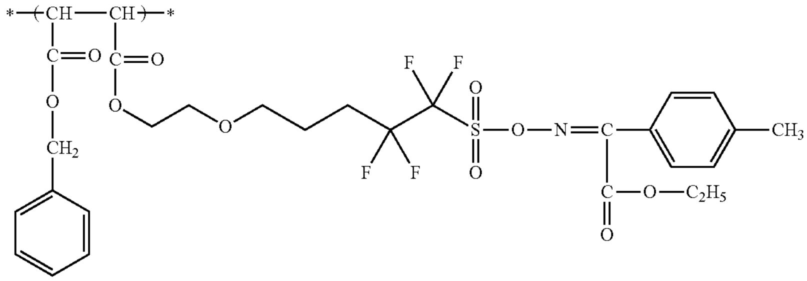

-continued
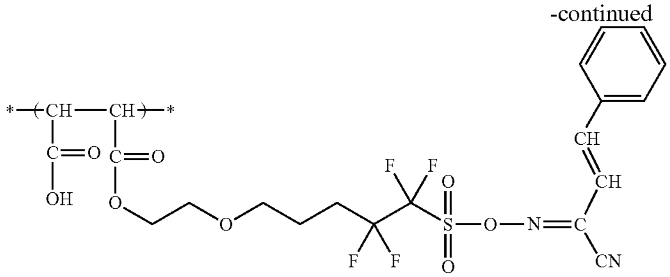
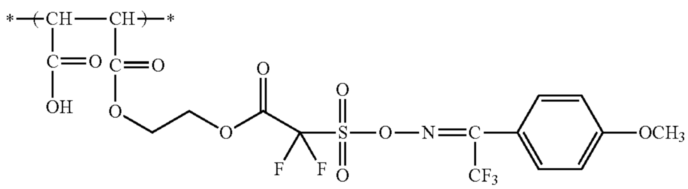
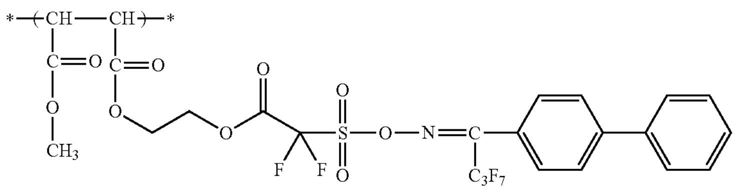
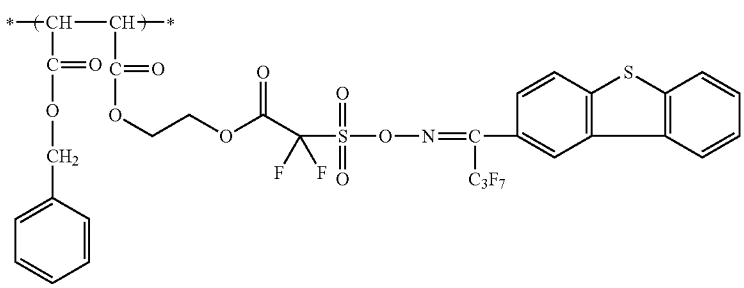
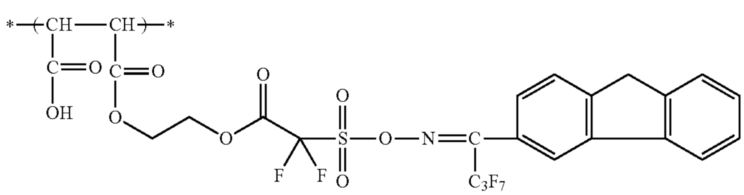
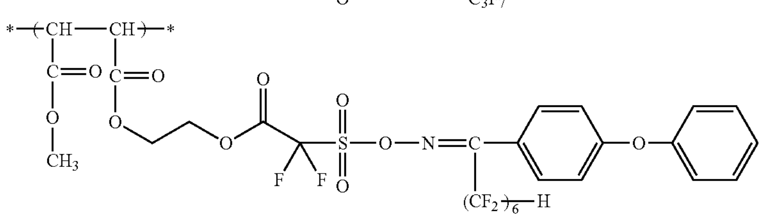
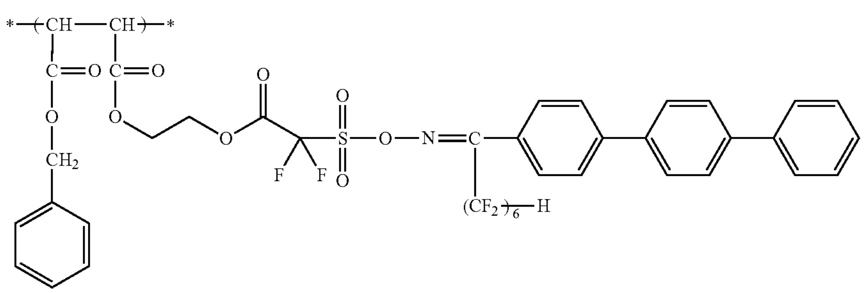

-continued
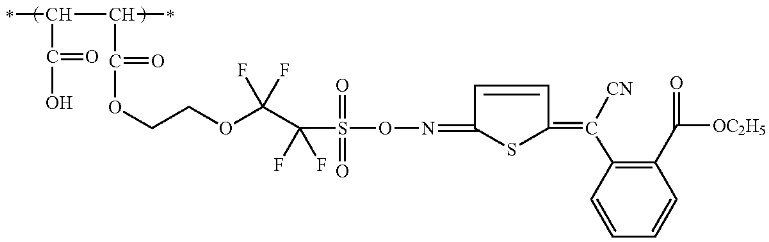
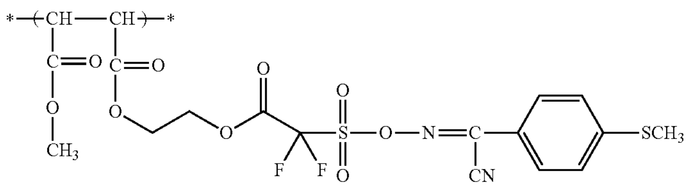
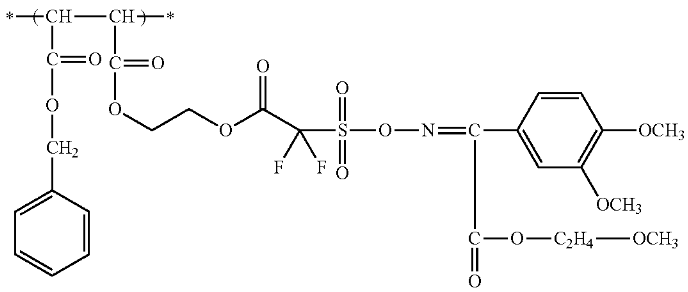
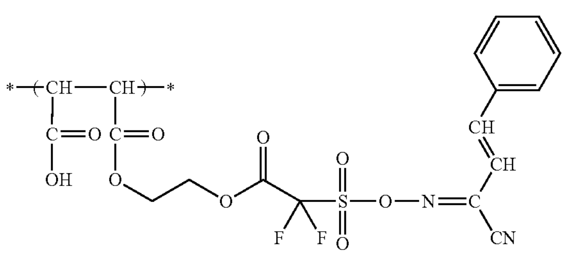
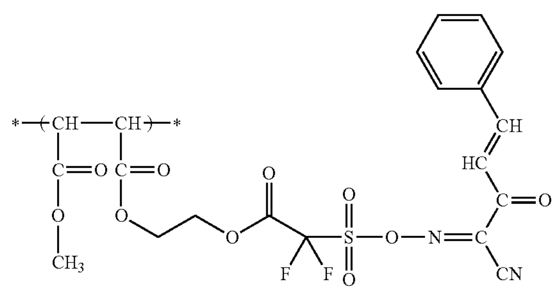
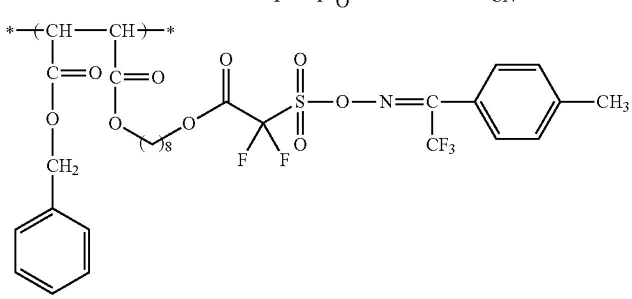
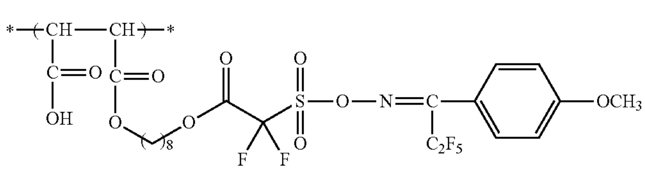
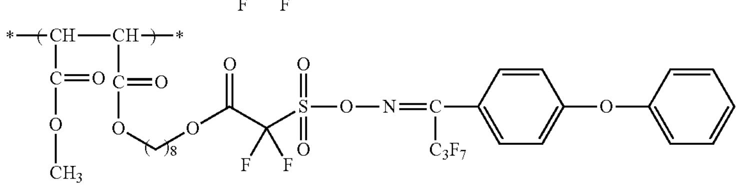

-continued
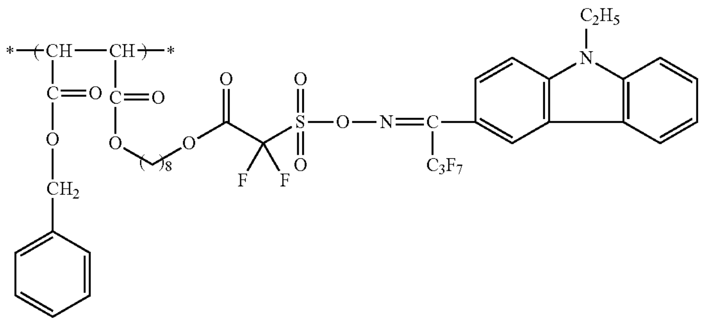
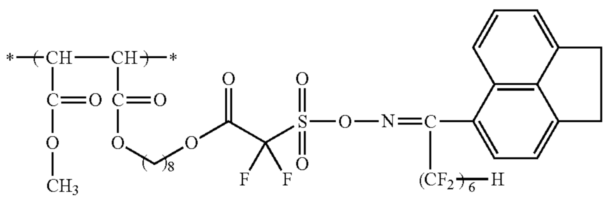
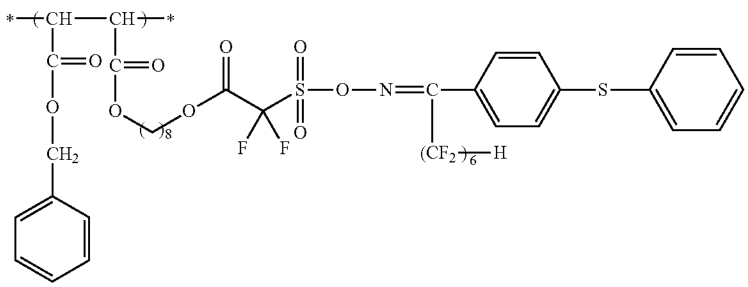
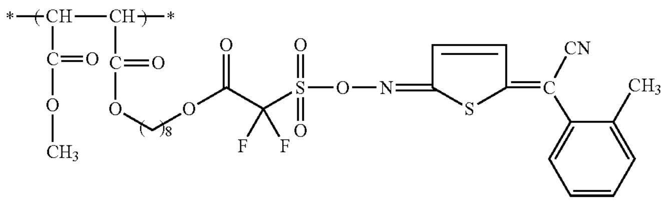
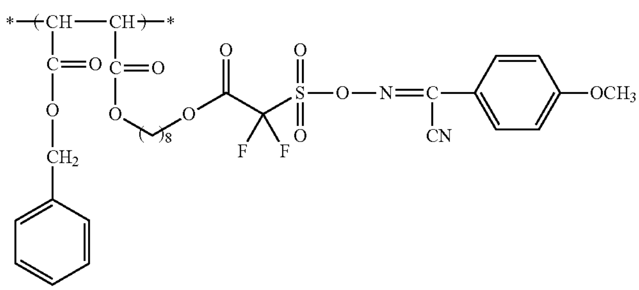
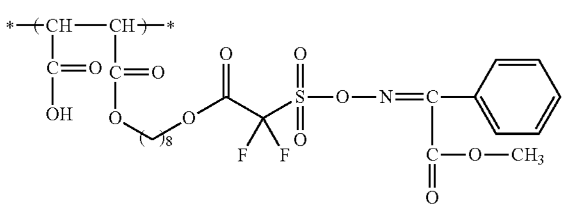
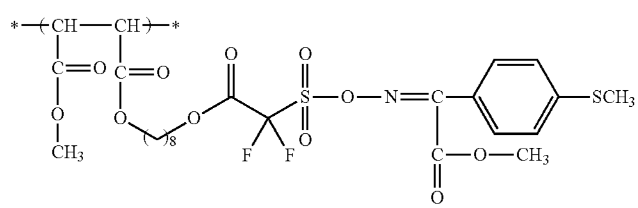
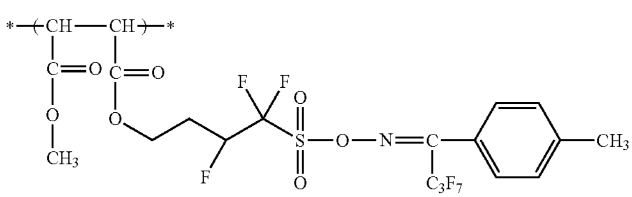

-continued
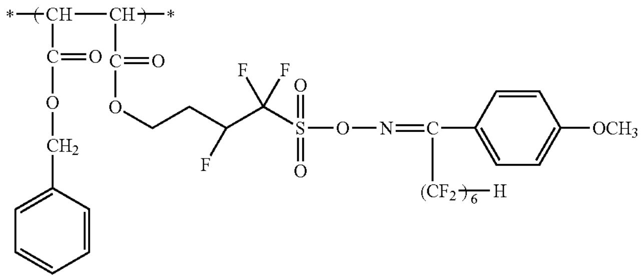
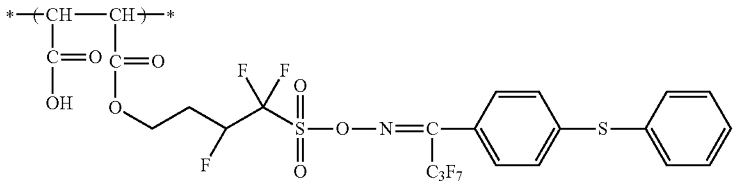
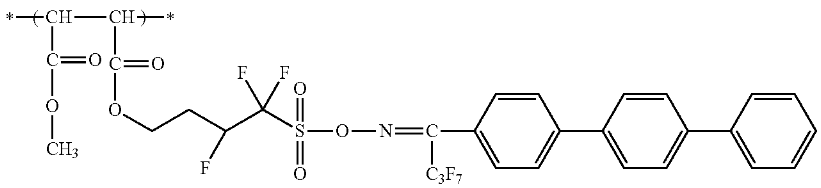
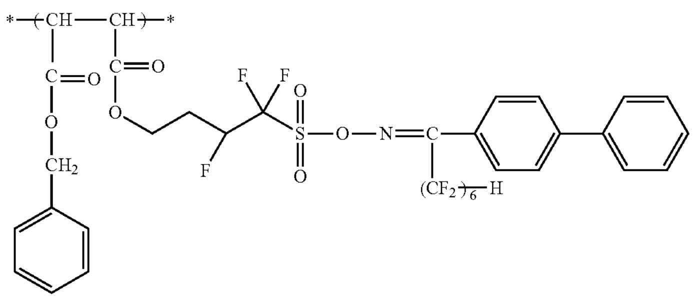
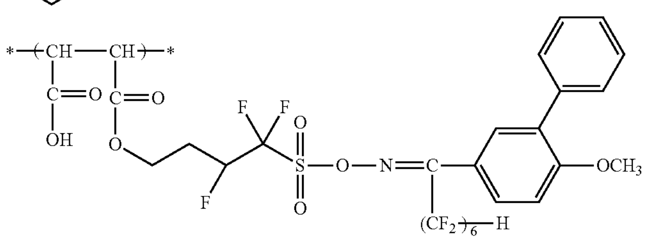
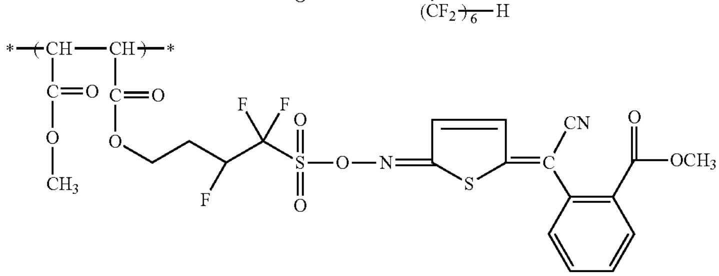
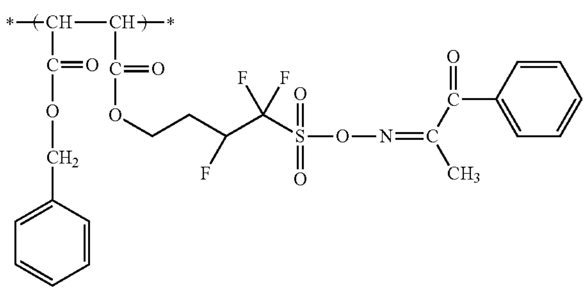

-continued
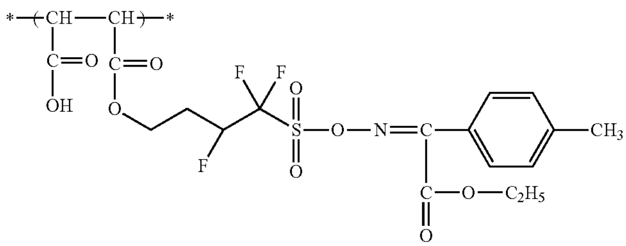
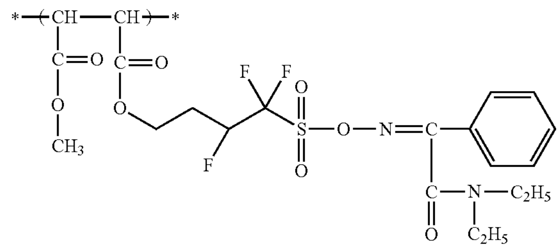
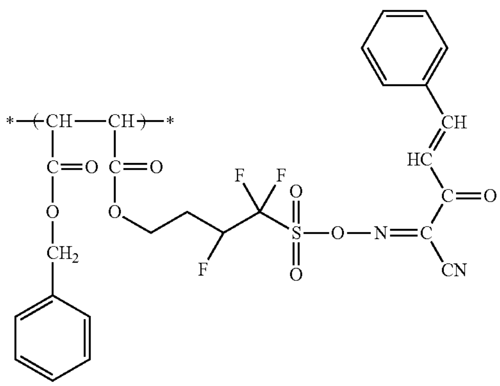
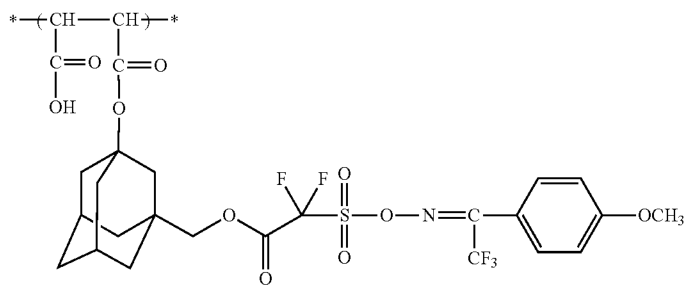
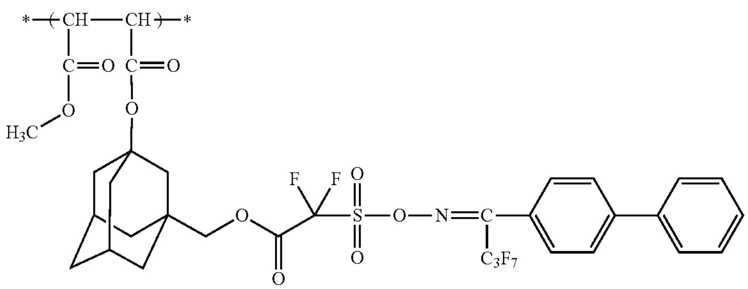
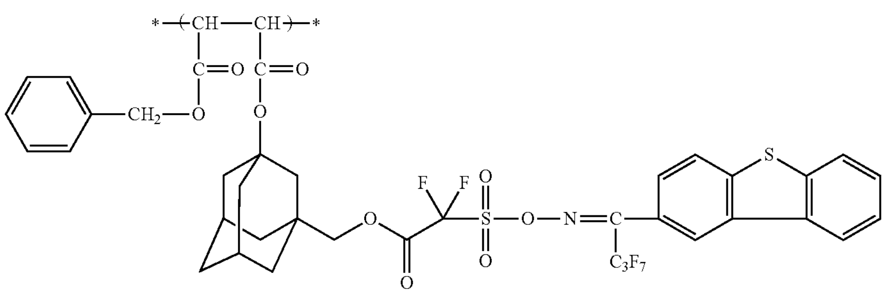
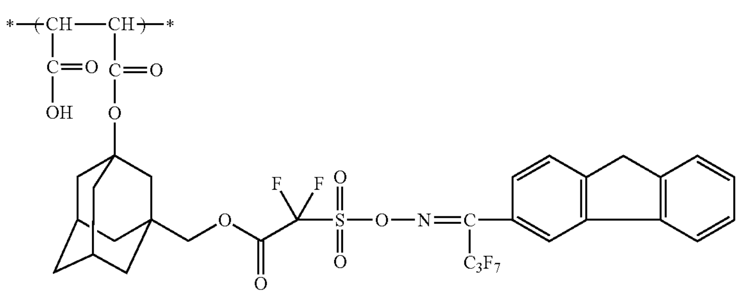

-continued
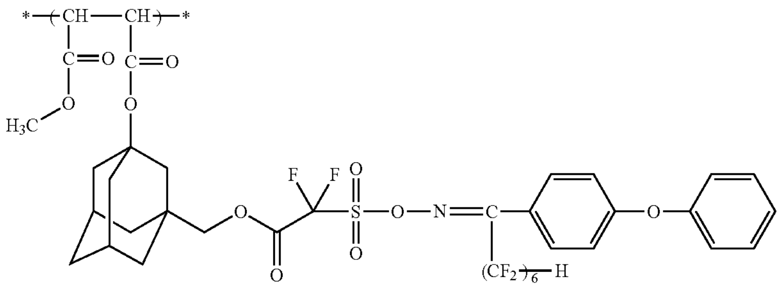
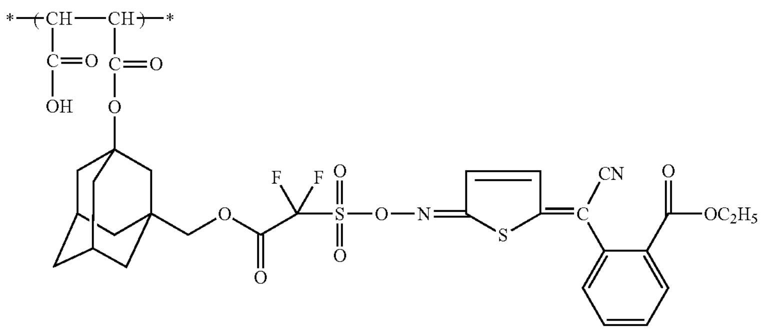
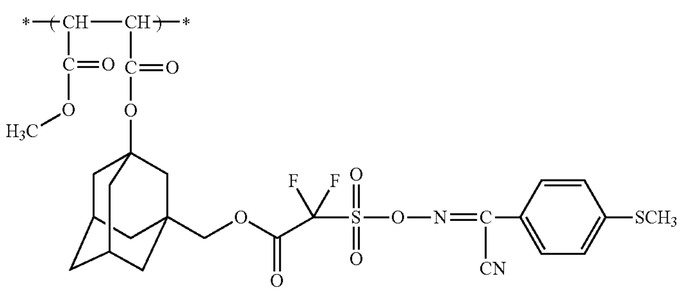
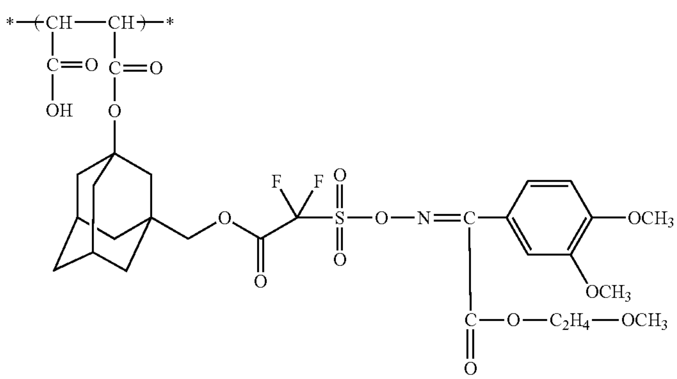
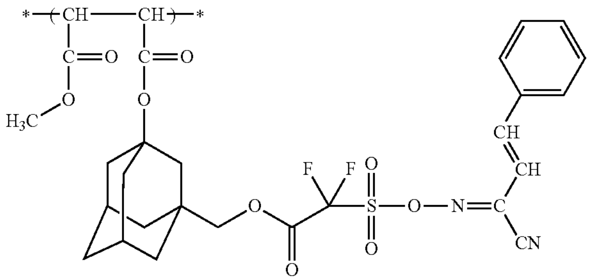

-continued
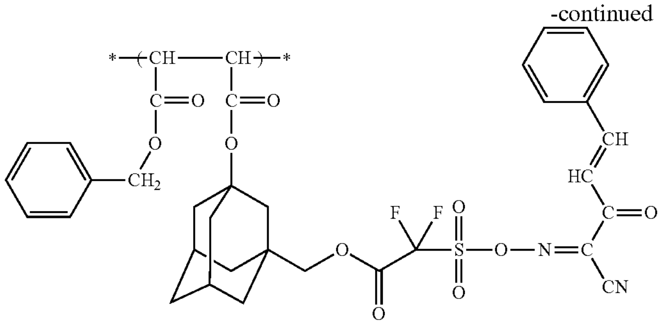
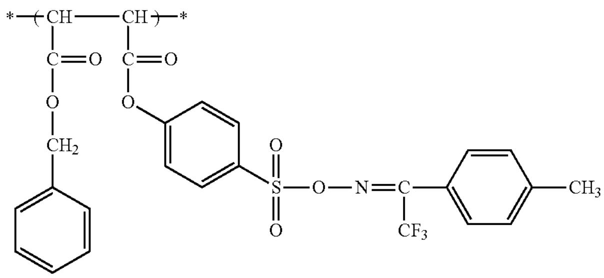
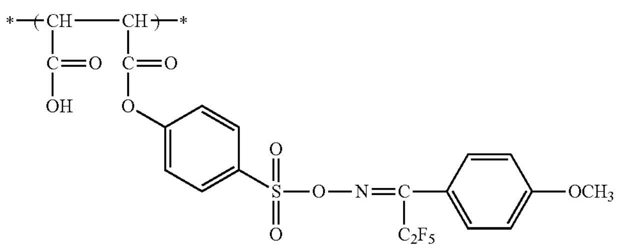
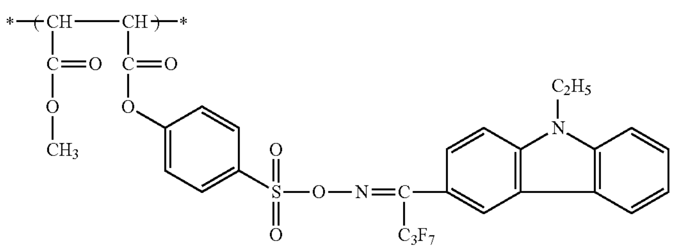
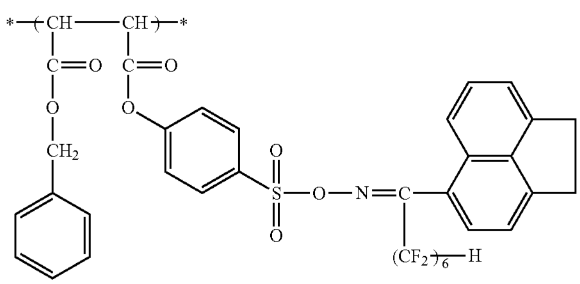
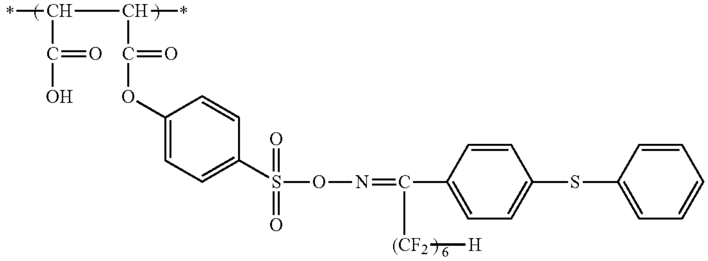

-continued
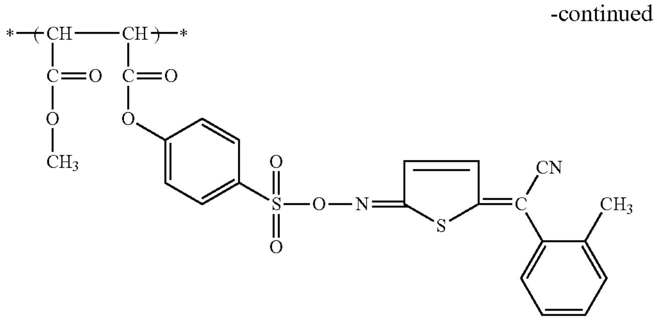
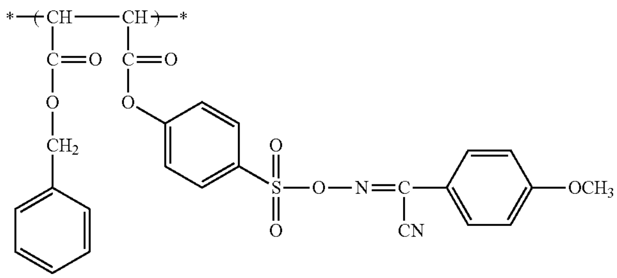
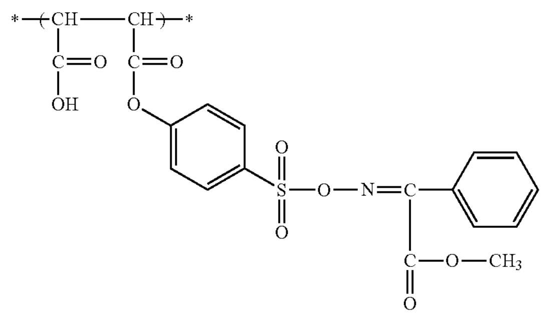
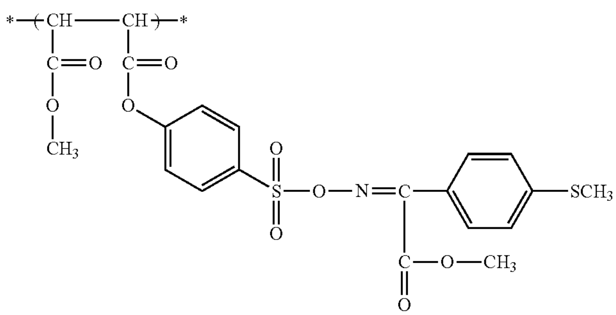
-continued
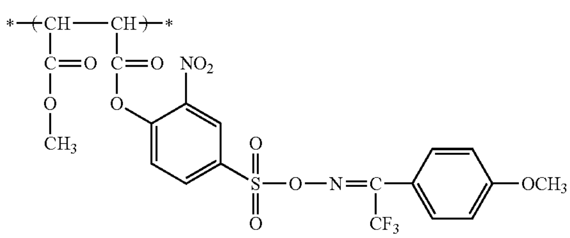
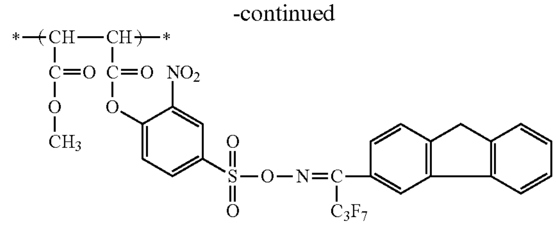
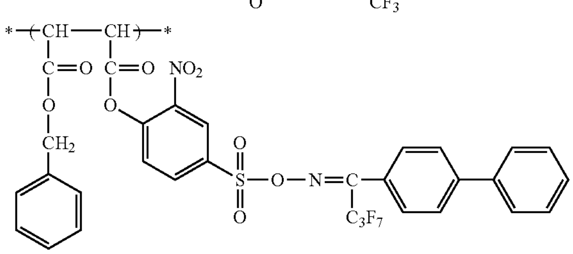
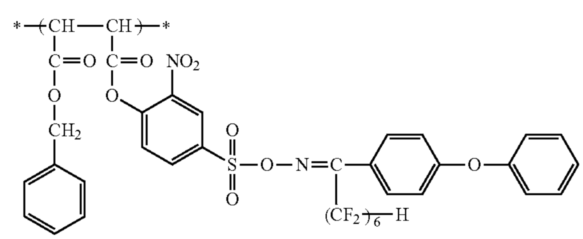
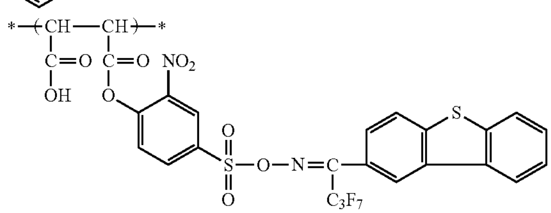
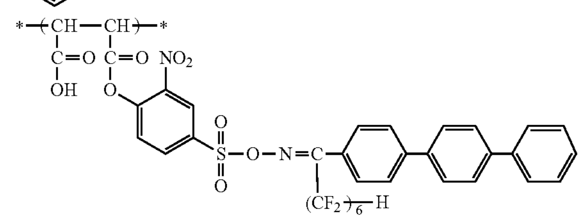

-continued
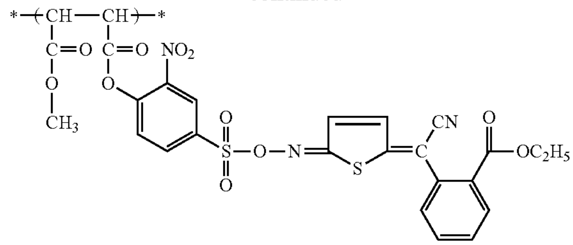
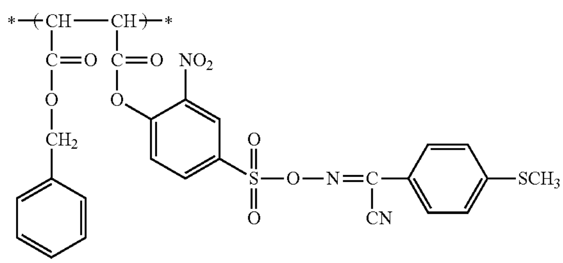
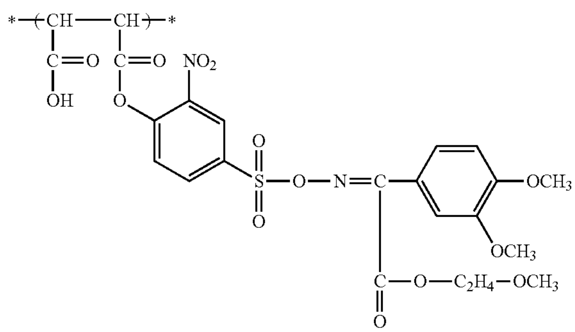
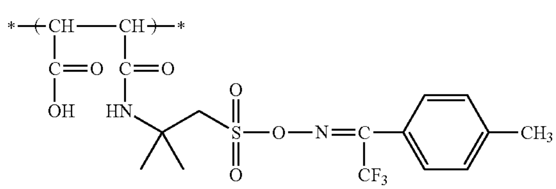
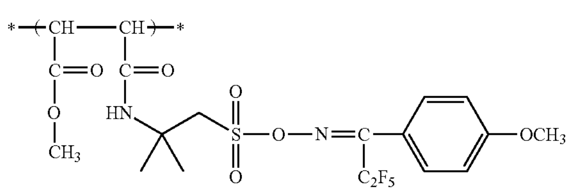
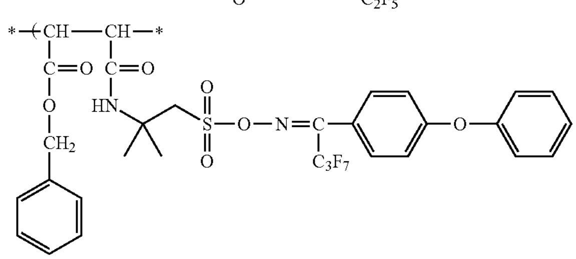
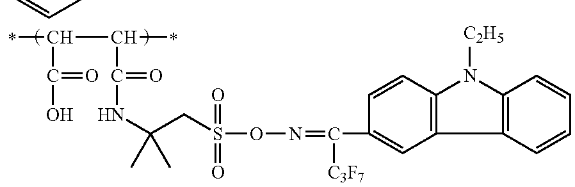
-continued
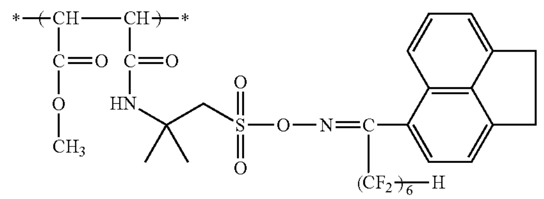
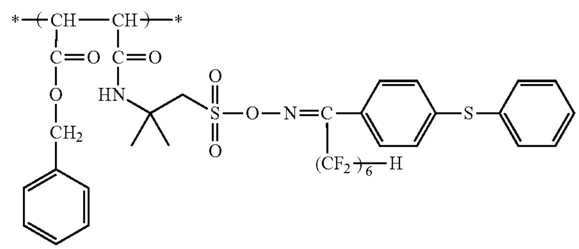
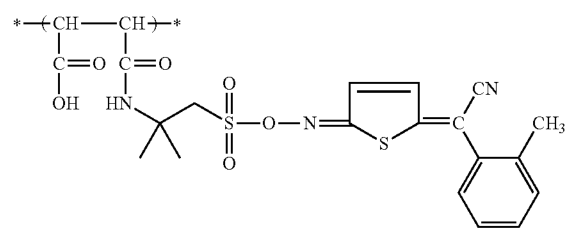
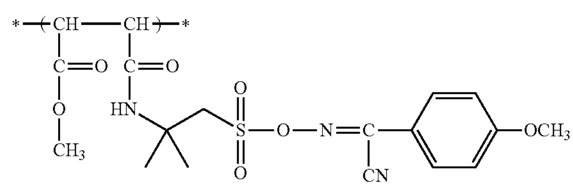
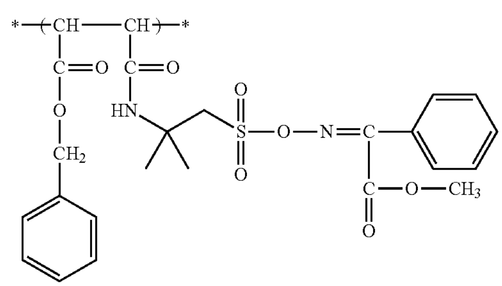
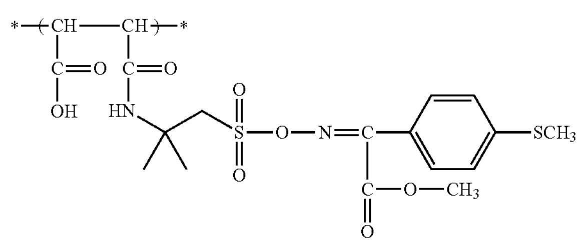
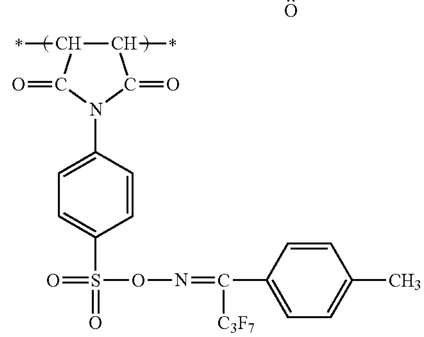

-continued
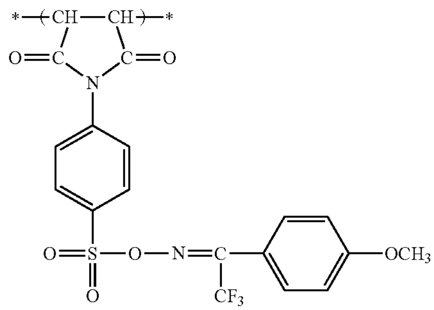
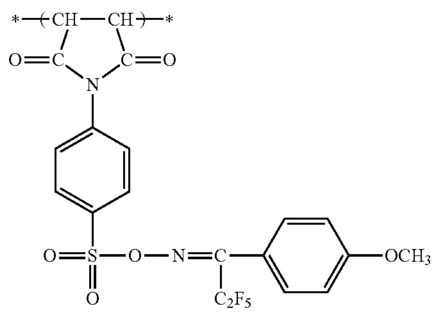
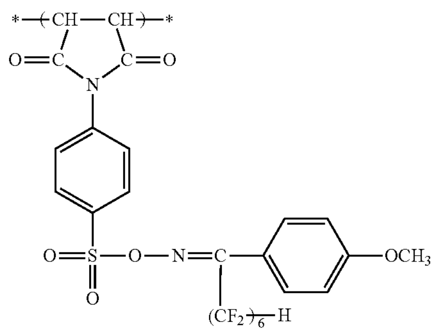
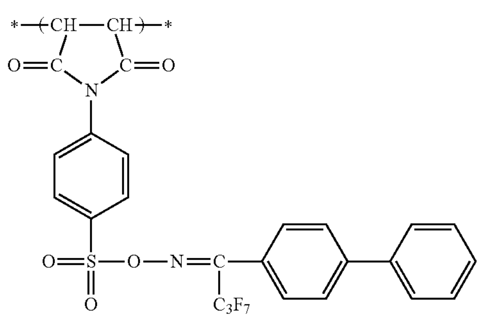
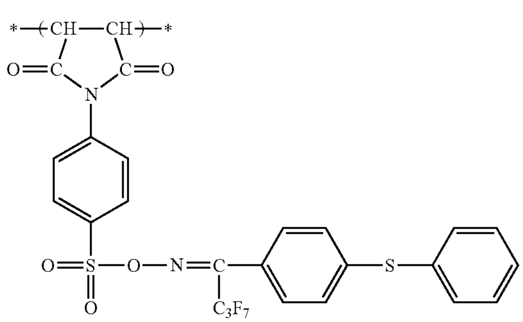
-continued
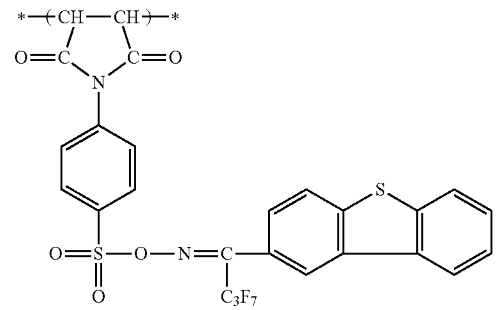
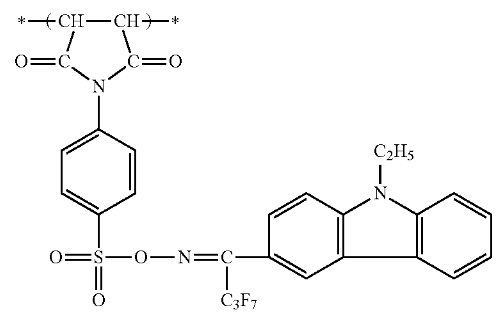
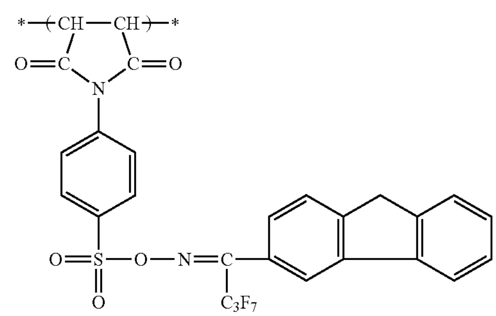
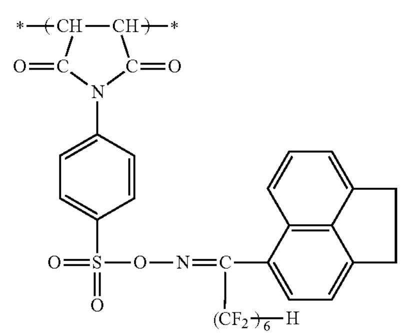
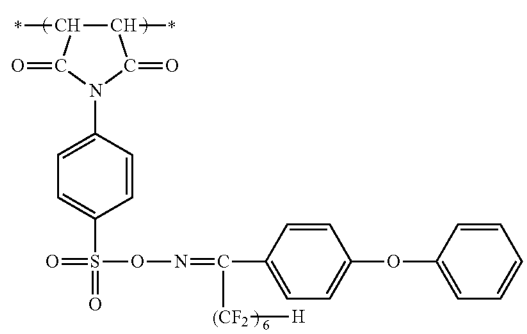

-continued
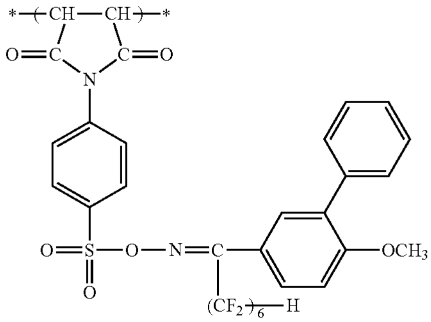
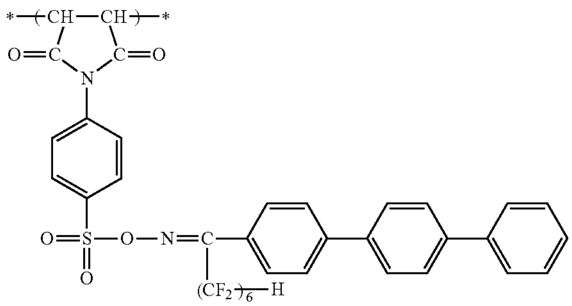
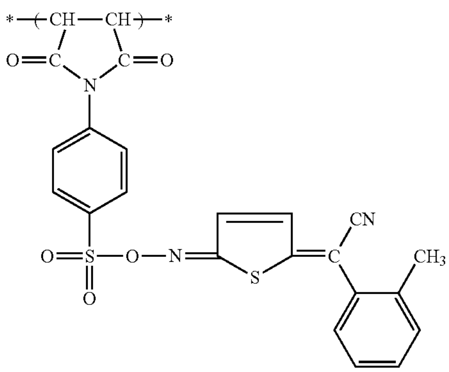
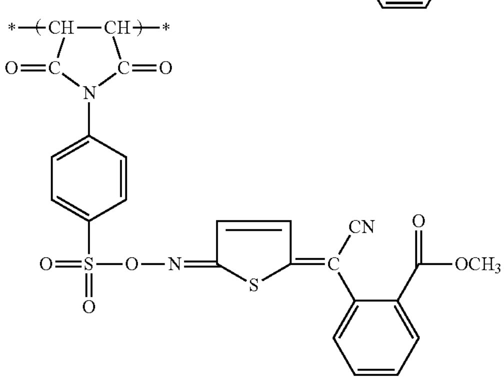
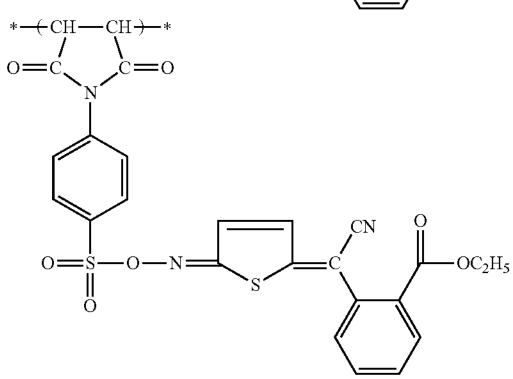
-continued
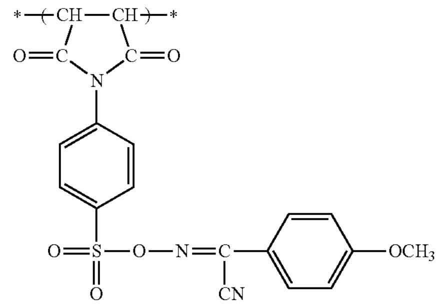
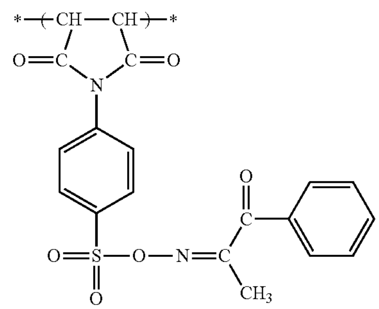
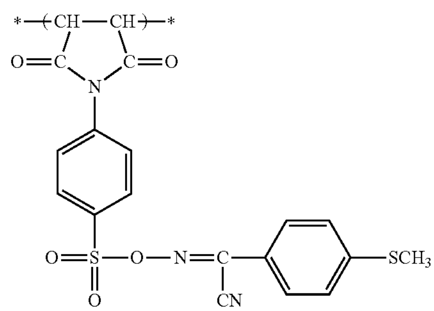
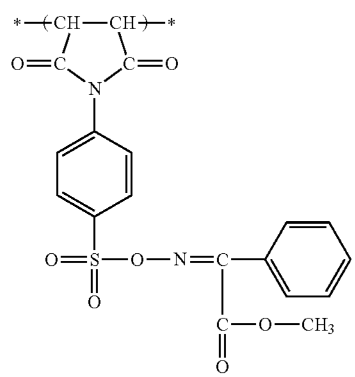
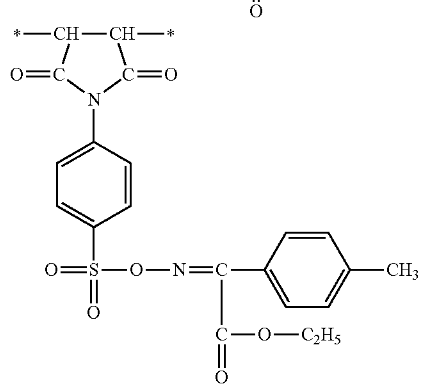

-continued
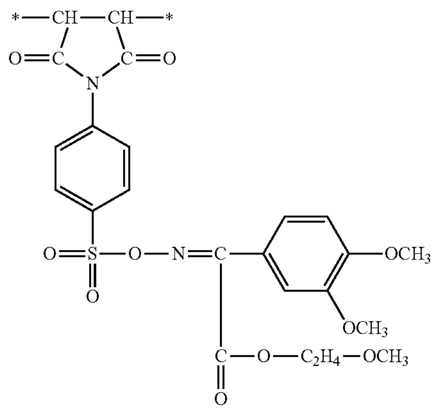
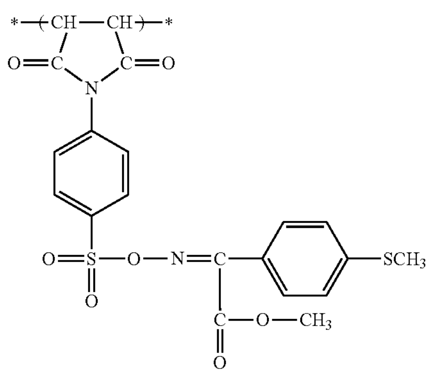
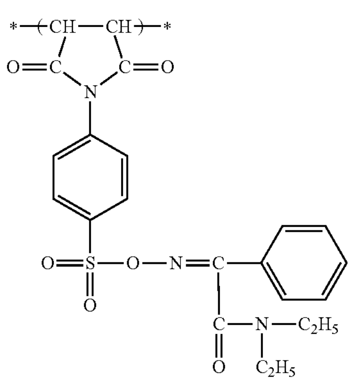
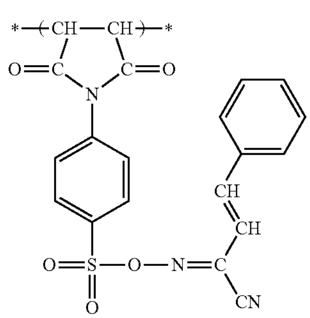
-continued
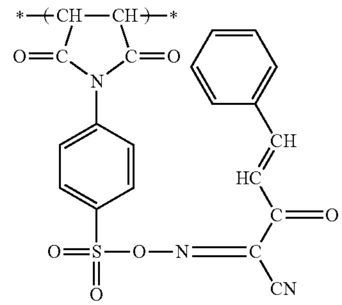
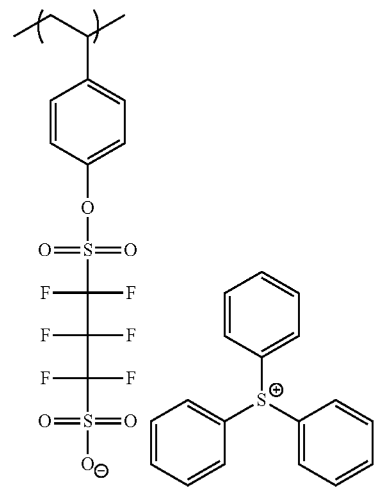
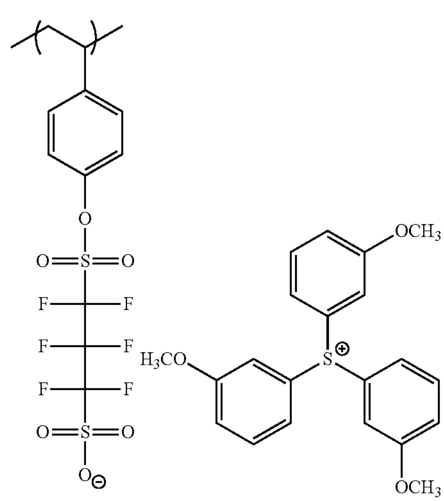

-continued
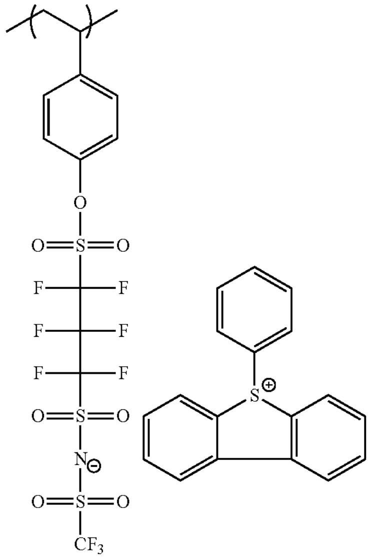
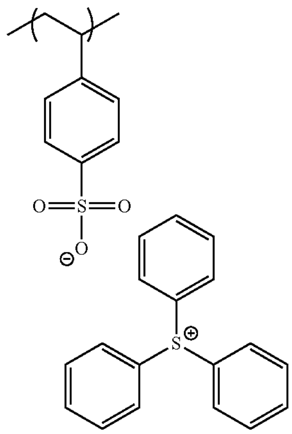
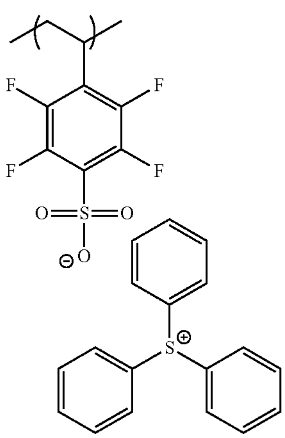
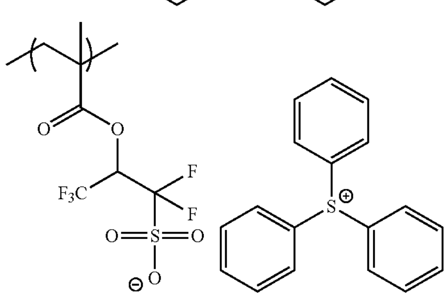
-continued
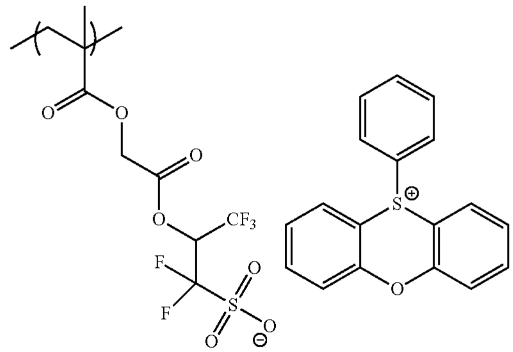
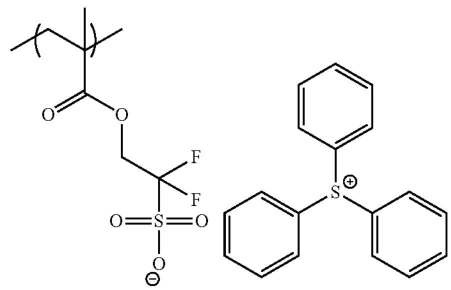
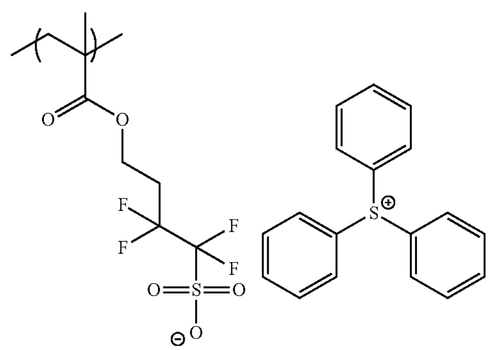
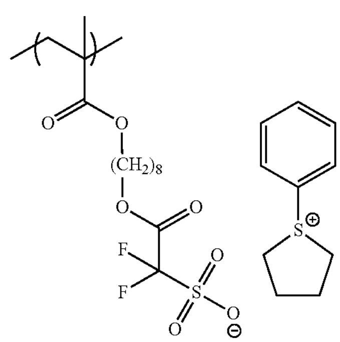

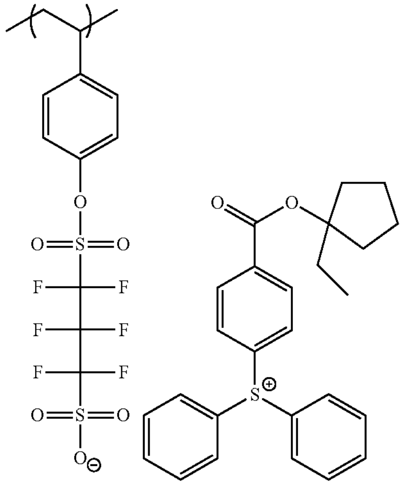
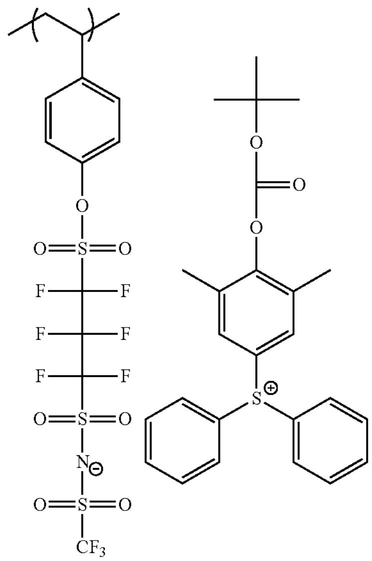
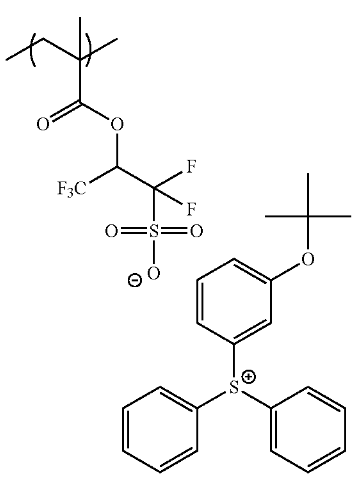
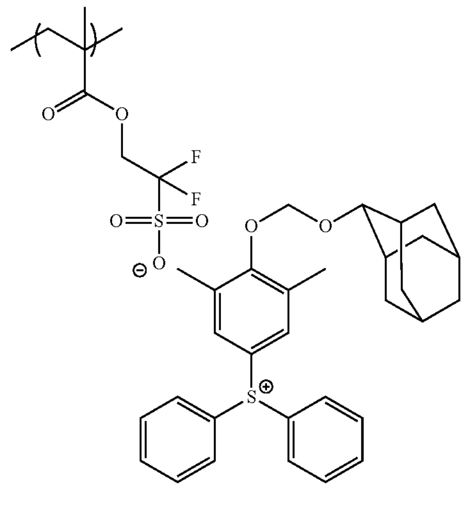
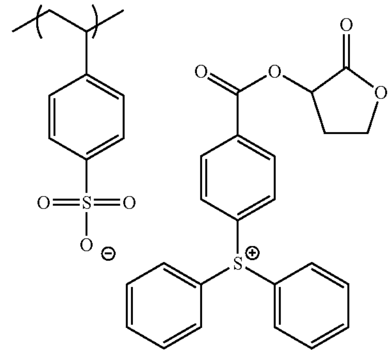
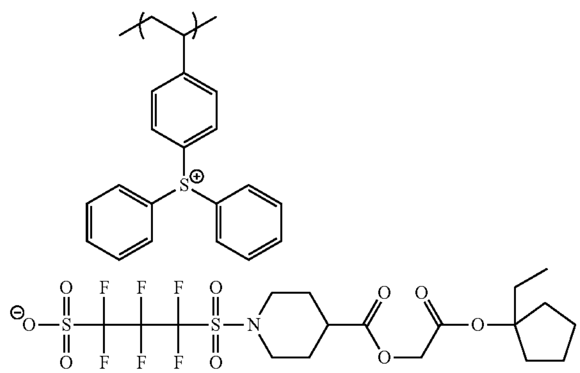
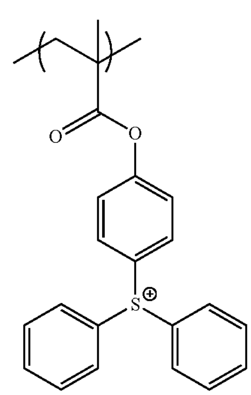

-continued

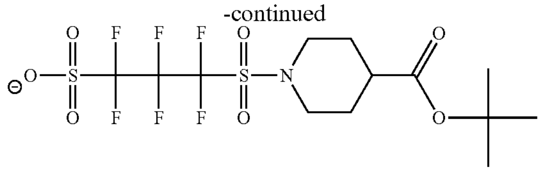

[2] Repeating Unit Having Acid-Decomposable Group

The resin (A) typically further contains a repeating unit having an acid-decomposable group (a group capable of decomposing by the action of an acid to produce a polar group). This repeating unit may have the acid-decomposable group on either one or both of the main chain and the side chain.

The acid-decomposable group preferably has a structure where a polar group is protected by a group capable of decomposing and leaving by the action of an acid. Examples of the polar group include a phenolic hydroxy group, a carboxy group, an alcoholic hydroxy group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the polar group include a carboxy group, an alcoholic hydroxy group, a fluorinated alcohol group (preferably hexafluoroisopropanol), and a sulfonic acid group.

The group preferred as the acid-decomposable group is a group where a hydrogen atom of such a polar group is substituted for by a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$. In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring. Each of $R_{01}$ and $R_{02}$ independently represents a hydrogen atom, an alkyl group, a cycloalkyl group, an aryl group, an aralkyl group or an alkenyl group.

Preferred examples of the acid-decomposable group include a cumyl ester group, an enol ester group, an acetal ester group, a tertiary alkyl ester group, and an alcoholic hydroxyl group. More preferred examples of the acid-decomposable group include a tertiary alkyl ester group and an alcoholic hydroxyl group.

The preferred repeating unit having an acid-decomposable group includes, for example, at least one of the below-described repeating unit (R1), repeating unit (R2) and repeating unit (R3).

<Repeating Unit (R1)>

The repeating unit (R1) has a group capable of decomposing by the action of an acid to produce a carboxyl group. The repeating unit (R1) is represented, for example, by the following formula (AI):

(AI)

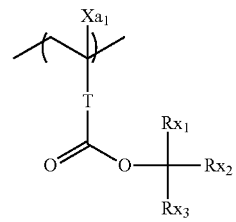

In the formula, $Xa_1$ represents a hydrogen atom, a methyl group which may have a substituent, or a group represented by —$CH_2$—$R_9$, wherein $R_9$ represents a hydroxy group or a monovalent organic group.

T represents a single bond or a divalent linking group.

Each of $Rx_1$ to $Rx_3$ independently represents an alkyl group (linear or branched), a cycloalkyl group (monocyclic or polycyclic), an aryl group or an aralkyl group. Two members out of $Rx_1$ to $Rx_3$ may combine to form a ring (monocyclic or polycyclic).

The repeating unit represented by formula (AI) is decomposed by the action of an acid and converted to a repeating unit represented by the following formula (AI'):

(AI')

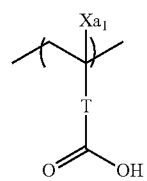

In the formula, each of $Xa_1$ and T has the same meaning as in formula (AI).

The repeating unit represented by formula (AI) is converted to a repeating unit represented by formula (AI'), whereby the dissolution parameter of the resin is changed. The size of this change depends on the configuration of respective groups (particularly, the groups represented by $Rx_1$ to $Rx_3$) in formula (AI) and the content of the repeating unit represented by formula (AI) based on all repeating units in the resin (A).

Typically, $Xa_1$ and T in formula (AI) are not changed before and after the decomposition by the action of an acid. Therefore, these groups can be appropriately selected according to the property required of the repeating unit represented by formula (AI).

$Xa_1$ represents a hydrogen atom, a methyl group which may have a substituent, or a group represented by —$CH_2$—$R_9$, wherein $R_9$ represents a hydroxy group or a monovalent organic group. $R_9$ is, for example, an acyl group or an alkyl group having a carbon number of 5 or less, preferably an alkyl group having a carbon number of 3 or less, more preferably a methyl group. $Xa_1$ is preferably a hydrogen atom, a methyl group, a trifluoromethyl group or a hydroxymethyl group.

Examples of the divalent linking group of T include an alkylene group, an arylene group, a —COO-Rt-group, and an —O-Rt-group, wherein Rt represents an alkylene group or a cycloalkylene group.

T is preferably a single bond or a —COO-Rt-group. The arylene group is preferably a 1,4-phenylene group, a 1,3-phenylene group, a 1,2-phenylene group, or a 1,4-naphthylene group. Rt is preferably an alkylene group having a carbon number of 1 to 5, more preferably a —$CH_2$— group, —$(CH_2)_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Examples of the aryl group of $Rx_1$ to $Rx_3$ include a phenyl group, a 1-naphthyl group, a 2-naphthyl group, a 4-methylphenyl group, and a 4-methoxyphenyl group.

Examples of the aralkyl group of $Rx_1$ to $Rx_3$ include a benzyl group and a 1-naphthylmethyl group.

The ring formed by combining two members out of $Rx_1$ to $Rx_3$ is preferably a monocyclic aliphatic hydrocarbon ring such as cyclopentane ring and cyclohexane ring, or a polycyclic aliphatic hydrocarbon ring such as norbornane ring, tetracyclodecane ring, tetracyclododecane ring and adamantane ring, more preferably a monocyclic aliphatic hydrocarbon ring having a carbon number of 5 to 6.

In particular, an embodiment where $Rx_1$ is a methyl group or an ethyl group and $Rx_2$ and $Rx_3$ are combined to form the above-described ring is preferred.

Each of the groups and rings above may have a substituent. Examples of the substituent include an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6), and the carbon number is preferably 8 or less.

The resin (A) more preferably contains, as the repeating unit represented by formula (AI), at least either one of a repeating unit represented by the following formula (I) and a repeating unit represented by the following formula (II):

(I)

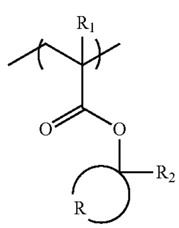

(II)

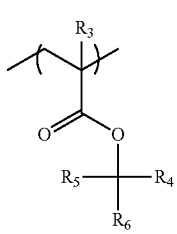

In formulae (I) and (II), each of $R_1$ and $R_3$ independently represents a hydrogen atom, a methyl group which may have a substituent, or a group represented by —$CH_2$—$R_9$, wherein $R_9$ represents a hydroxy group or a monovalent organic group.

Each of $R_2$, $R_4$, $R_5$ and $R_6$ independently represents an alkyl group, a cycloalkyl group, an aryl group or an aralkyl group.

R represents an atomic group necessary for forming an alicyclic structure together with the carbon atom to which $R_2$ is bonded.

$R_1$ is preferably a hydrogen atom, a methyl group, a trifluoromethyl group or a hydroxymethyl group.

The alkyl group in $R_2$ may be linear or branched and may have a substituent.

The cycloalkyl group in $R_2$ may be monocyclic or polycyclic and may have a substituent.

The aryl group in $R_2$ may be monocyclic or polycyclic and may have a substituent. The aryl group is preferably an aryl group having a carbon number of 6 to 18, and examples thereof include a phenyl group, a 1-naphthyl group, a 2-naphthyl group, a 4-methylphenyl group, a 4-methoxyphenyl group, and a 4-biphenyl group.

The aralkyl group in $R_2$ may be monocyclic or polycyclic and may have a substituent. The aralkyl group is preferably an aralkyl group having a carbon number of 7 to 19, and examples thereof include a benzyl group, a 1-naphthylmethyl group, a 2-naphthylmethyl group, and an α-methylbenzyl group.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R is preferably a monocyclic alicyclic structure, and the carbon number thereof is preferably from 3 to 7, more preferably 5 or 6.

$R_3$ is preferably a hydrogen atom or a methyl group, more preferably a methyl group.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The aryl group in $R_4$, $R_5$ and $R_6$ may be monocyclic or polycyclic and may have a substituent. The aryl group is preferably an aryl group having a carbon number of 6 to 18, and examples thereof include a phenyl group, a 1-naphthyl group, a 2-naphthyl group, a 4-methylphenyl group, a 4-methoxyphenyl group, and a 4-biphenyl group.

The aralkyl group in $R_4$, $R_5$ and $R_6$ may be monocyclic or polycyclic and may have a substituent. The aralkyl group is preferably an aralkyl group having a carbon number of 7 to 19, and examples thereof include a benzyl group, a 1-naphthylmethyl group, a 2-naphthylmethyl group, and an α-methylbenzyl group.

The repeating unit represented by formula (I) includes, for example, a repeating unit represented by the following formula (1-a):

(1-a)

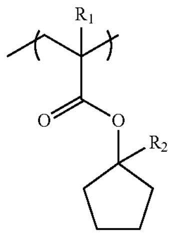

In the formula, each of $R_1$ and $R_2$ has the same meaning as in formula (1).

The repeating unit represented by formula (II) is preferably a repeating unit represented by the following formula (II-1):

(II-1)

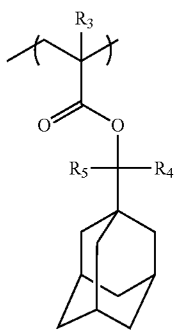

In formula (II-1), $R_3$ to $R_5$ have the same meanings as those in formula (II).

Resin (A) may contain two or more kinds of repeating units (R1). For example, the resin (A) may contain at least two kinds of repeating units represented by formula (I), as a repeating unit represented by formula (AI).

In the case where the resin (A) contains the repeating unit (R1), the content as the total thereof is preferably from 10 to 99 mol %, more preferably from 20 to 90 mol %, still more preferably from 30 to 80 mol %, based on all repeating units in the resin (A).

Specific examples of the repeating unit (R1) are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4, an aryl group having a carbon number of 6 to 18, or an aralkyl group having a carbon number of 7 to 19.

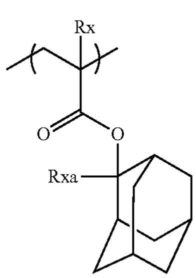

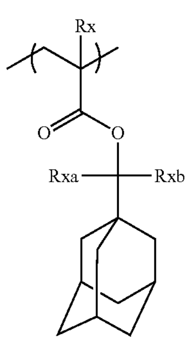

-continued

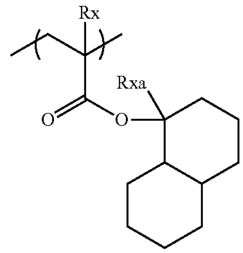

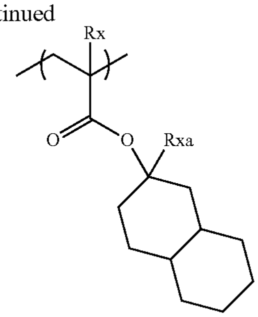

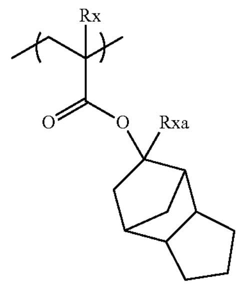

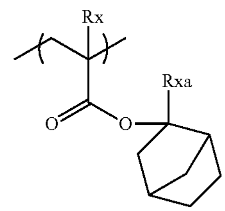

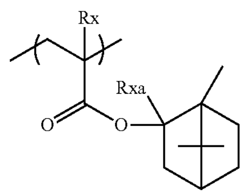

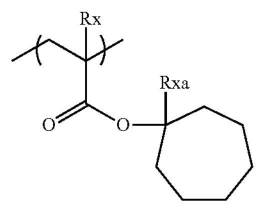

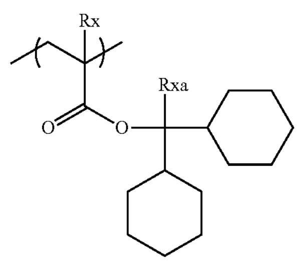

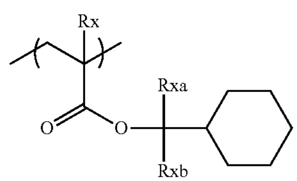

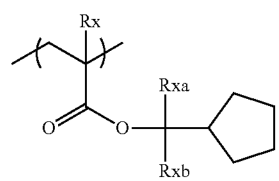

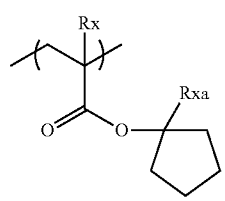

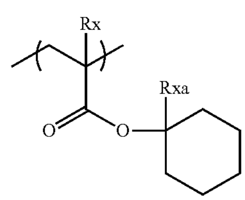

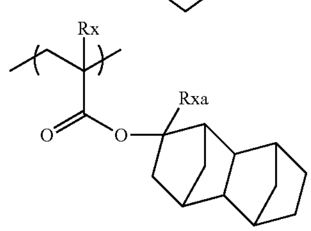

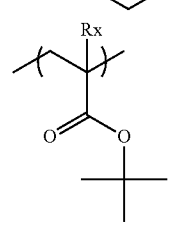

-continued
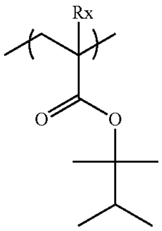
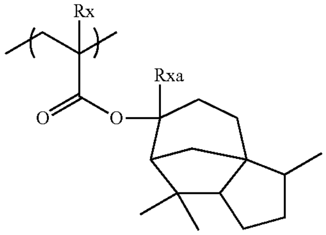
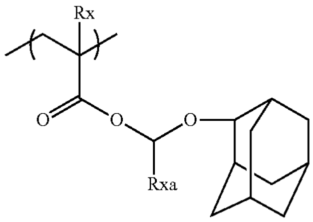
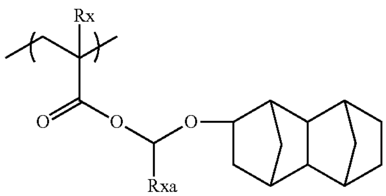
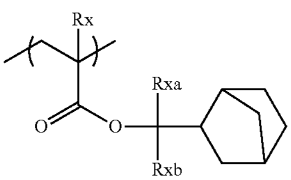
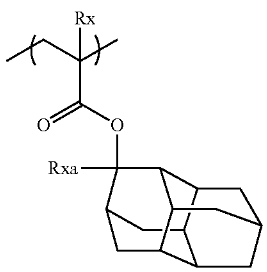
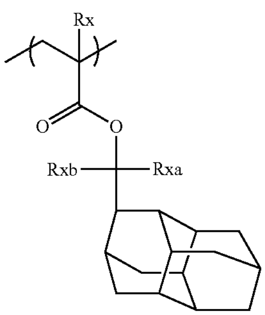
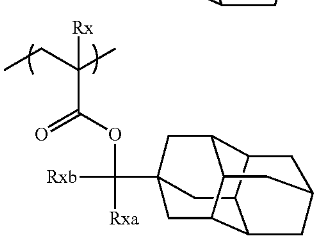
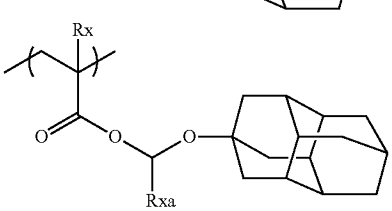
-continued
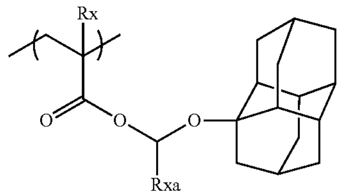
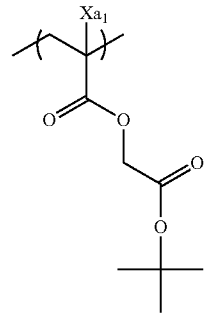
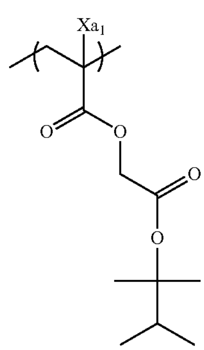
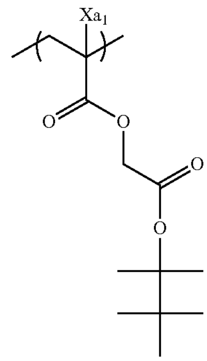
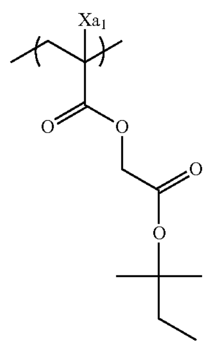
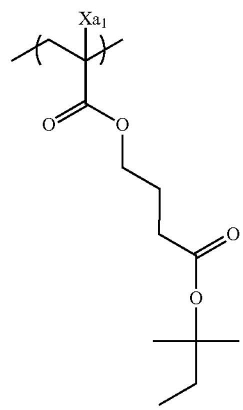
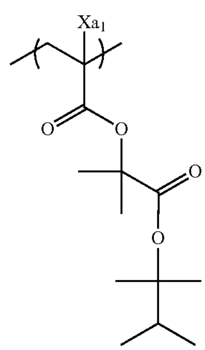
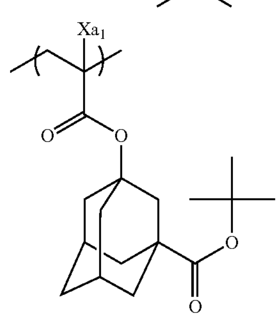

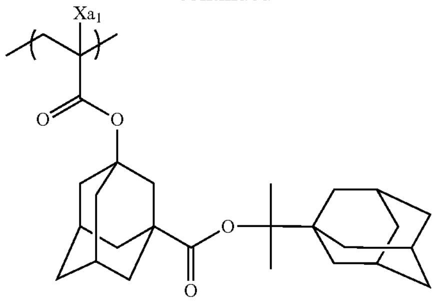
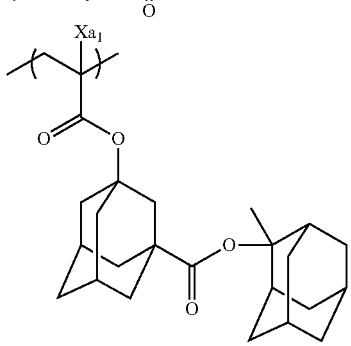
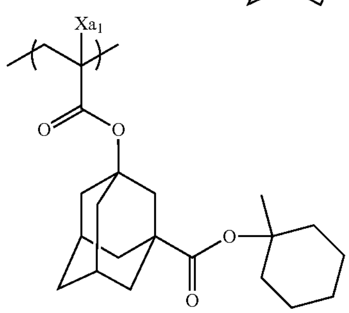
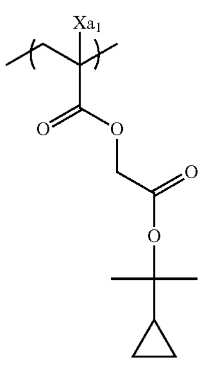
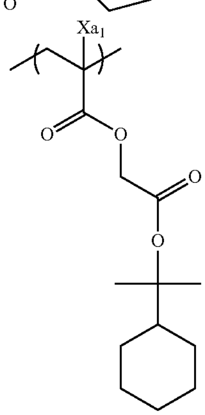
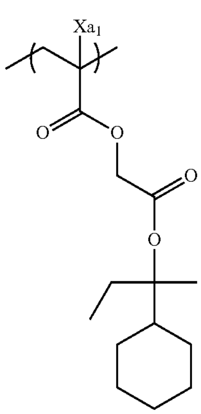
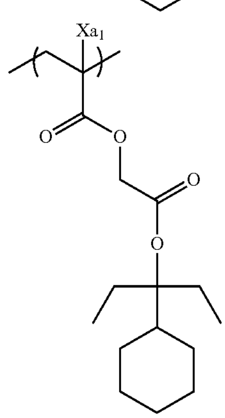
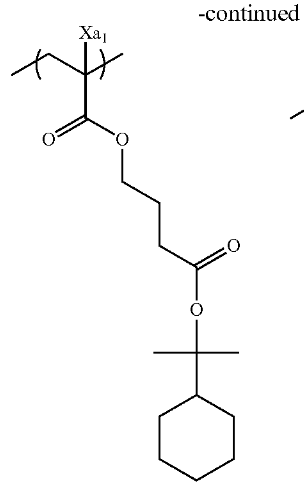
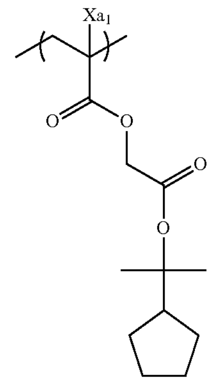
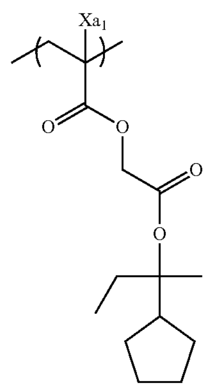
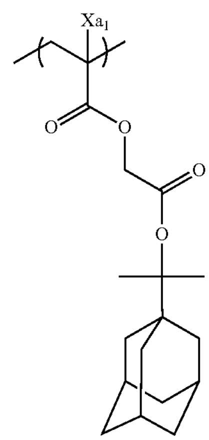
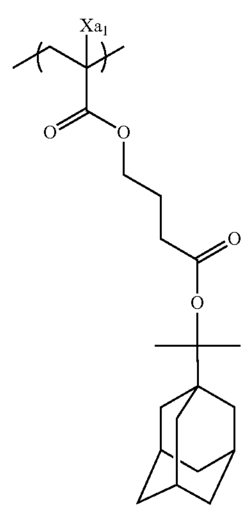
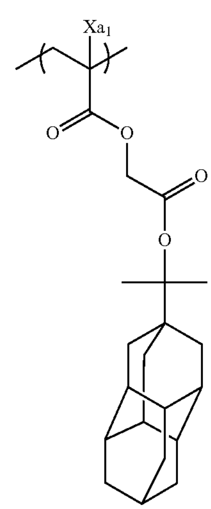

-continued
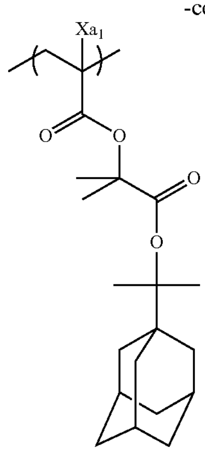
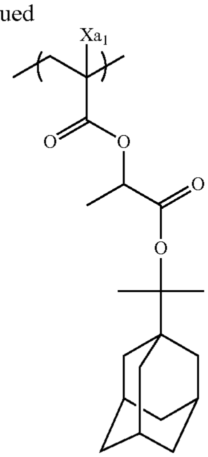
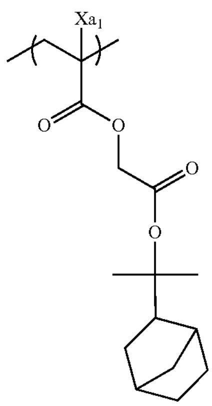
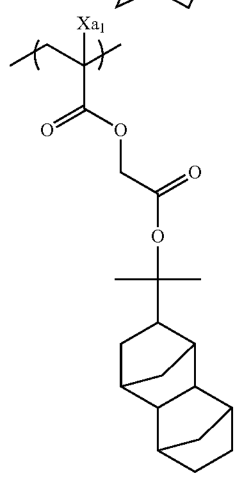
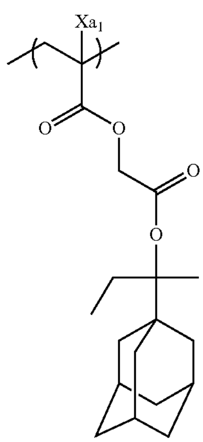
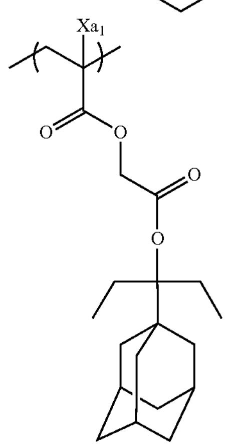
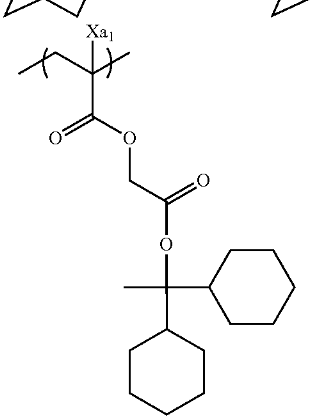
-continued
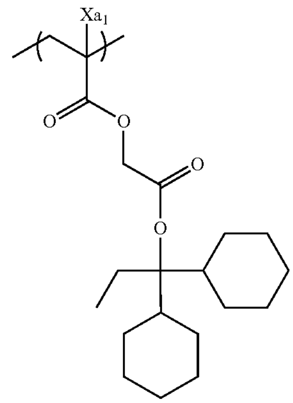
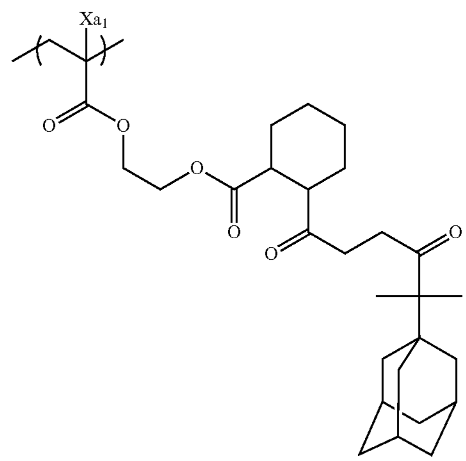
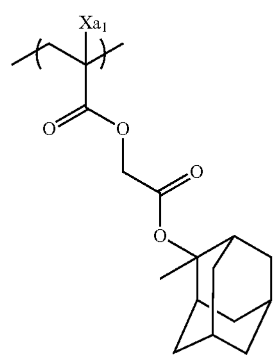
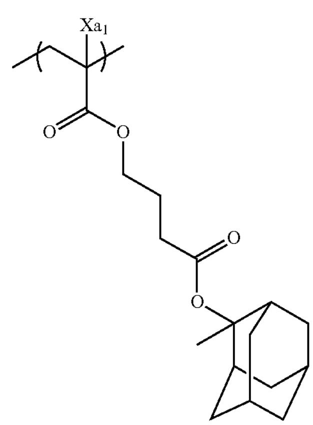

-continued
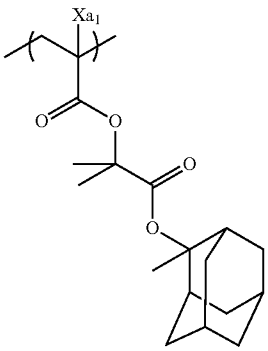
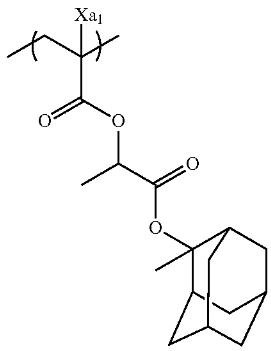
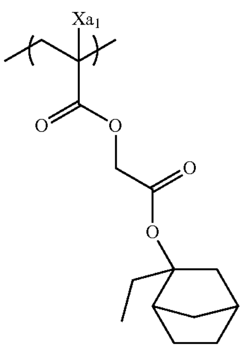
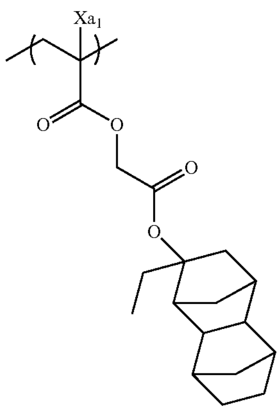
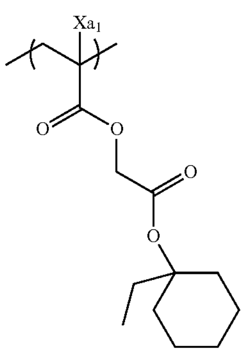
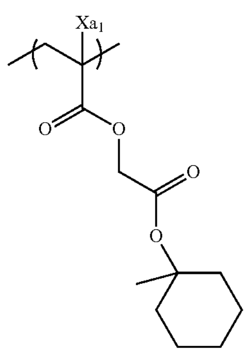
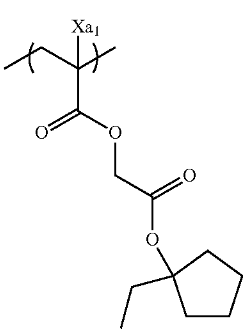
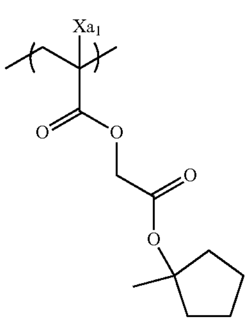
-continued
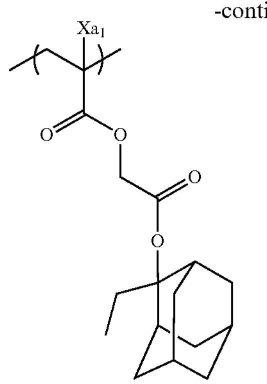
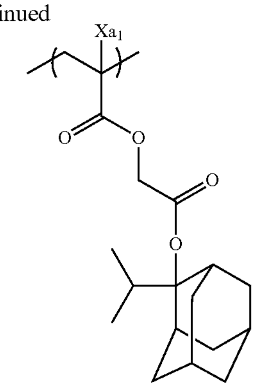
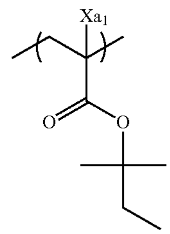
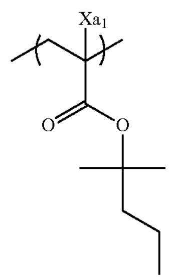
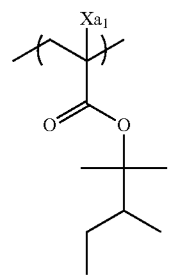
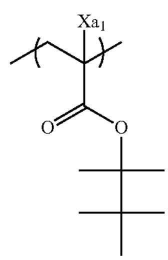
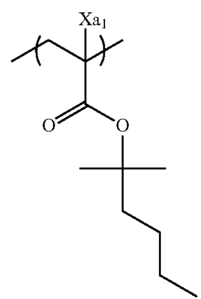
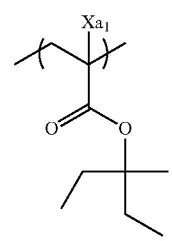
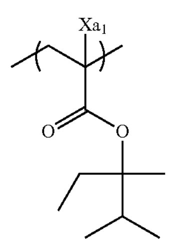
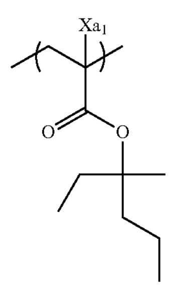
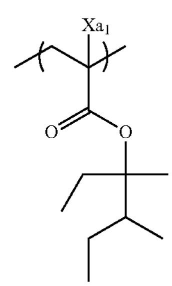
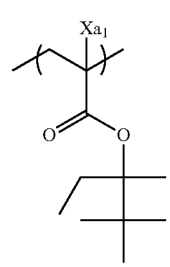
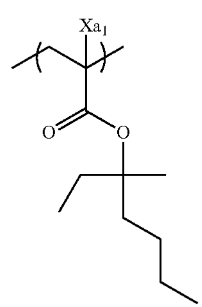
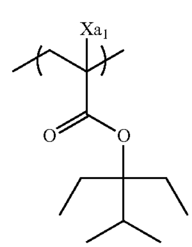

-continued
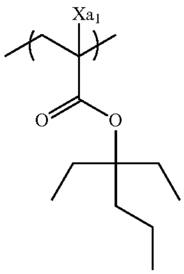
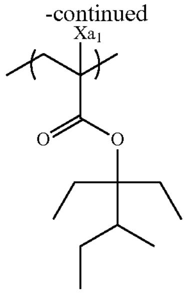
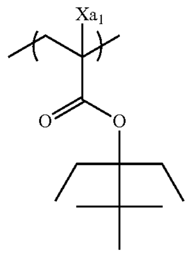
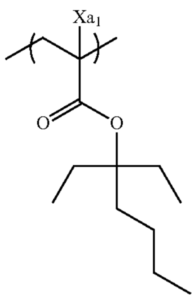
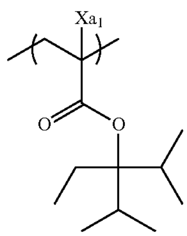
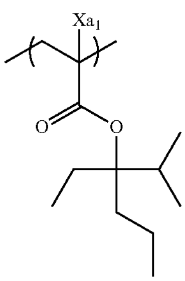
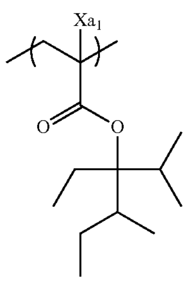
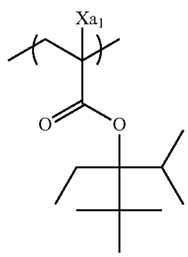
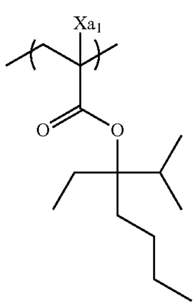
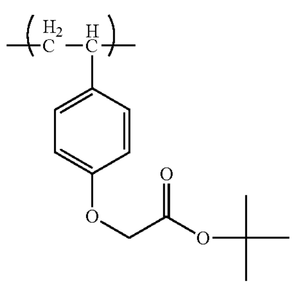
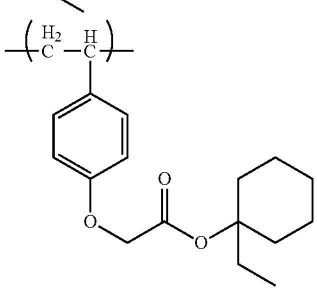
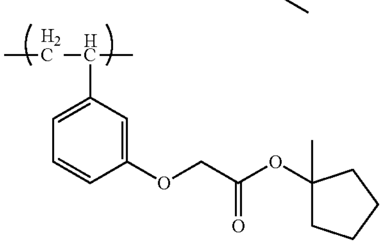
-continued
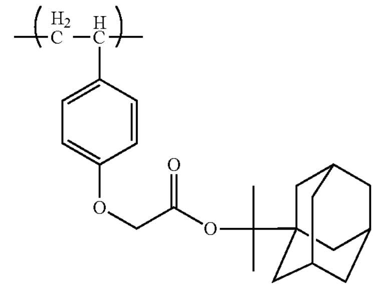
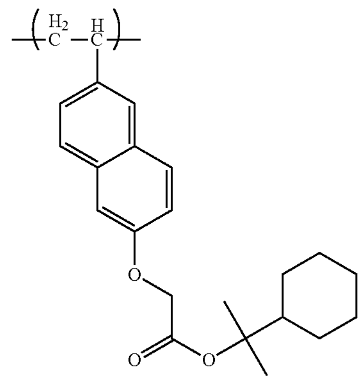
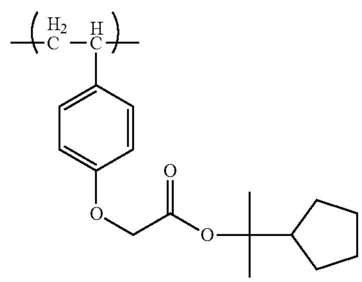
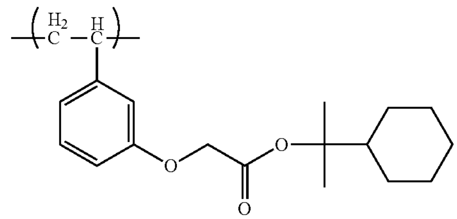
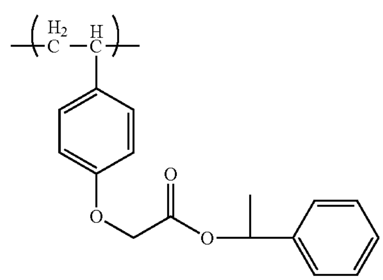
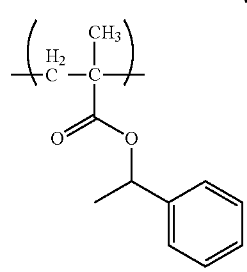

-continued
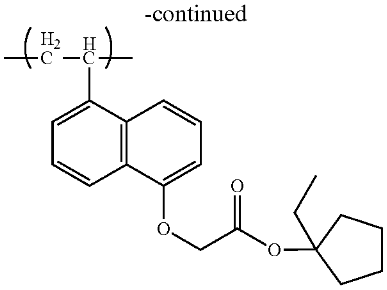
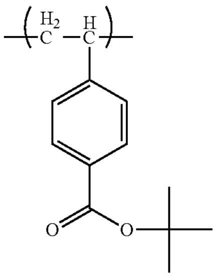
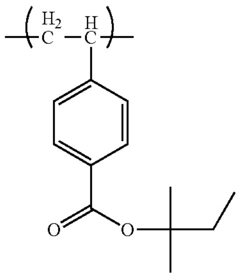
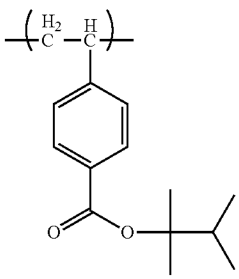
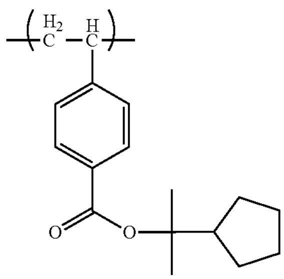
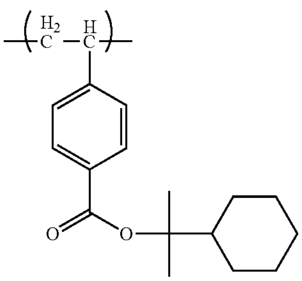
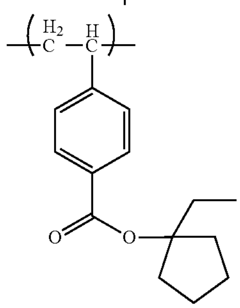
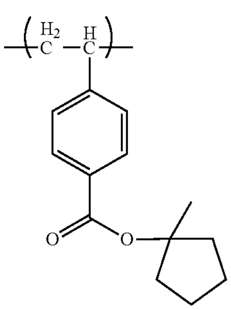
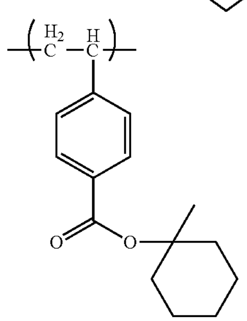
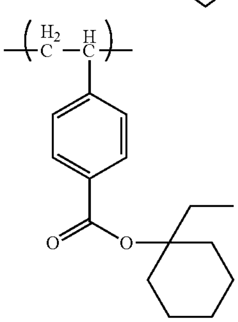
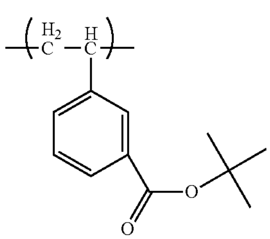
-continued
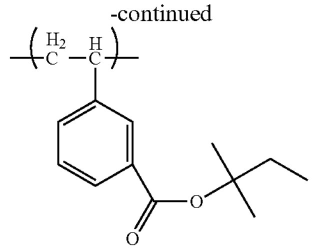
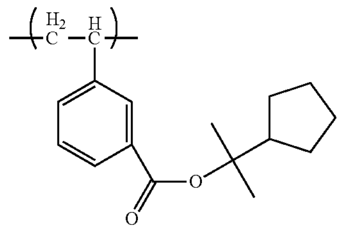
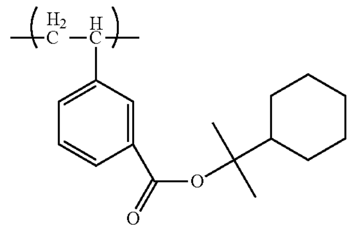
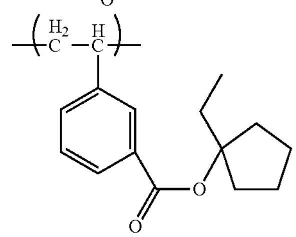
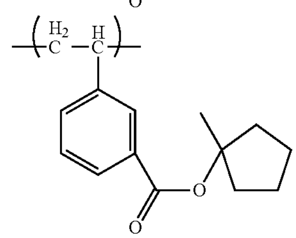
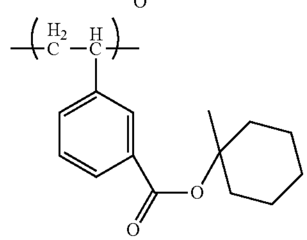
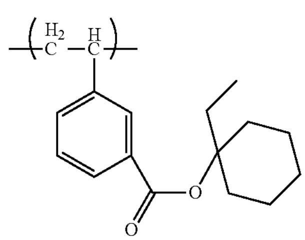
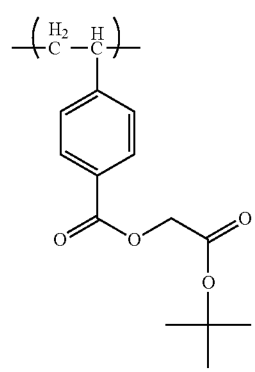

-continued
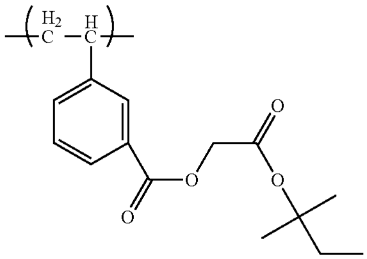
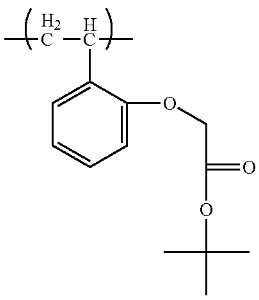
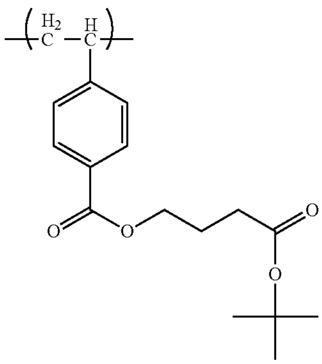
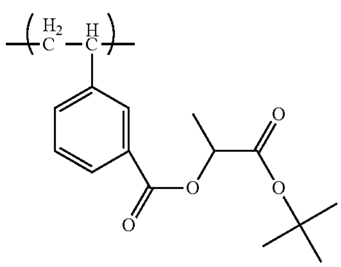
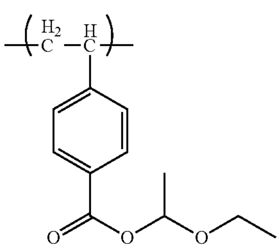
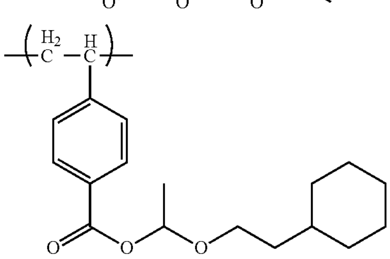
-continued
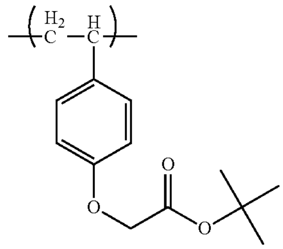
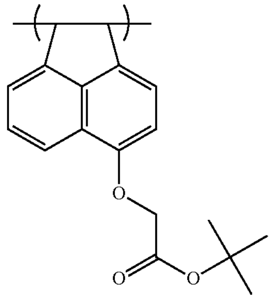
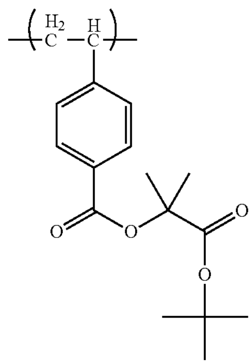
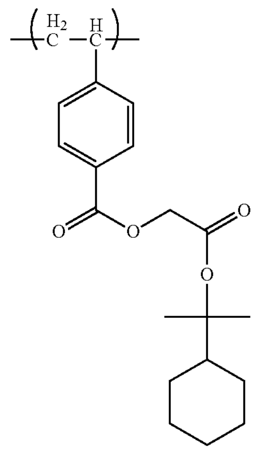
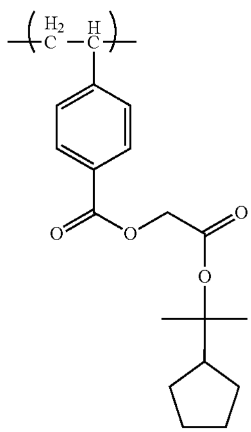
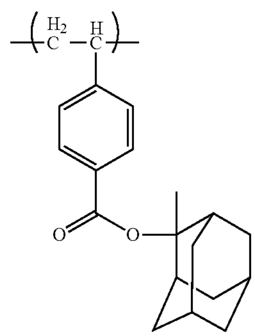
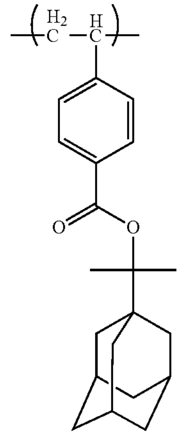
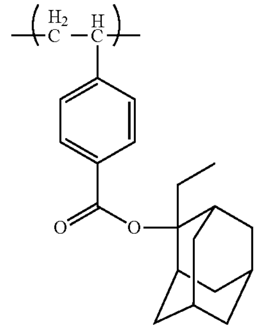

-continued
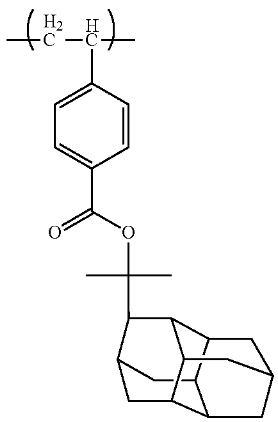
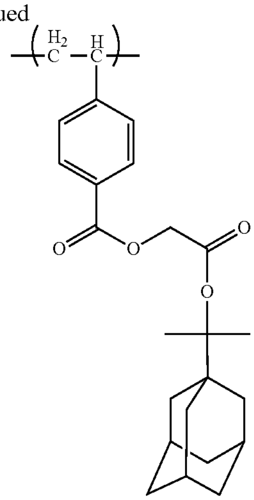
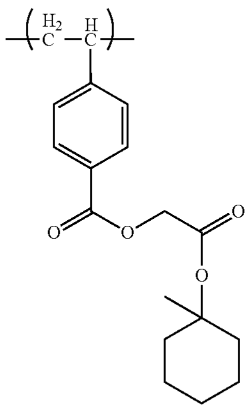
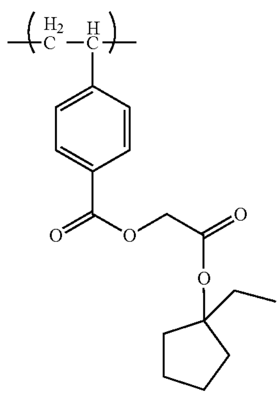
In the case where the resin (A) contains a plurality of repeating units (R1), preferred combinations are illustrated below. In the following formulae, each R independently represents a hydrogen atom or a methyl group.
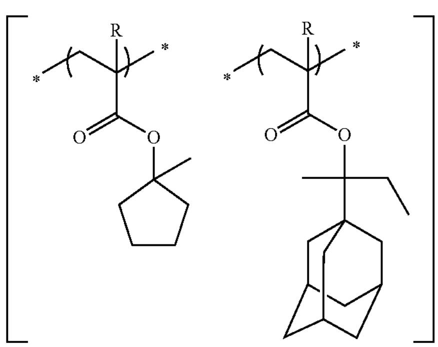
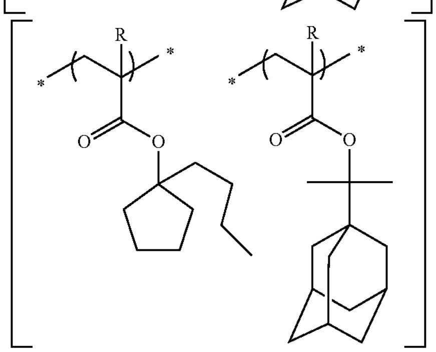
-continued
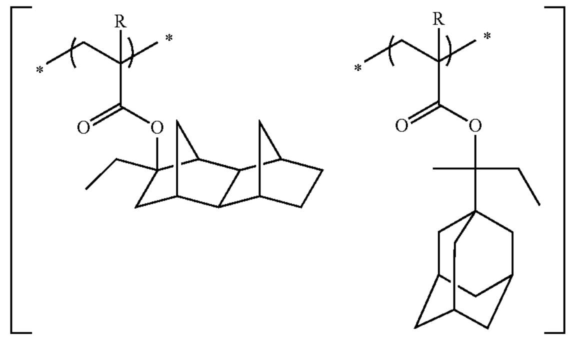
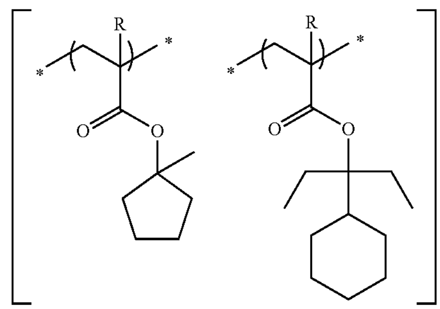
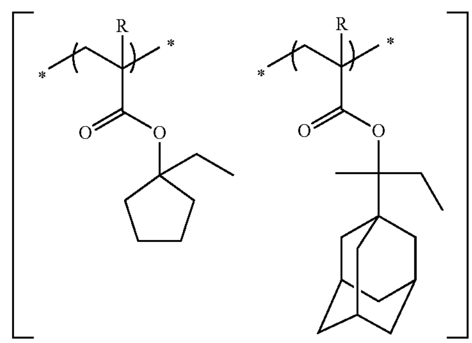
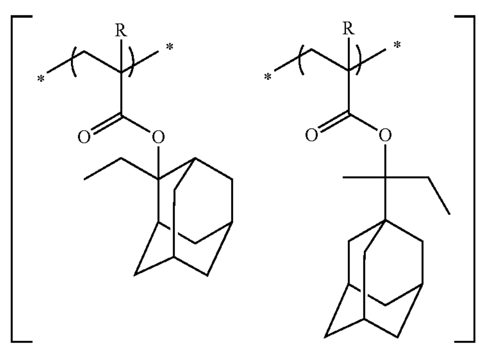
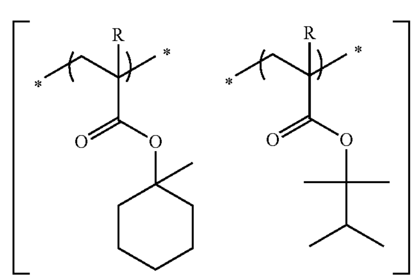

-continued
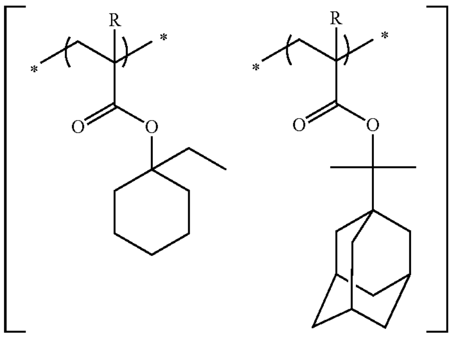
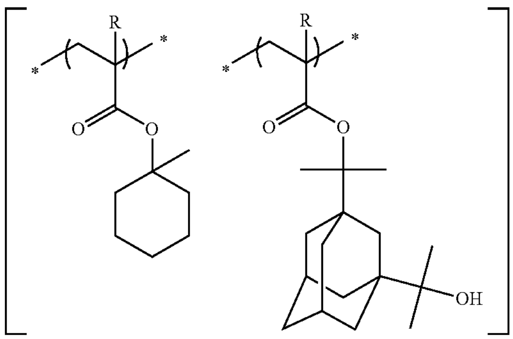
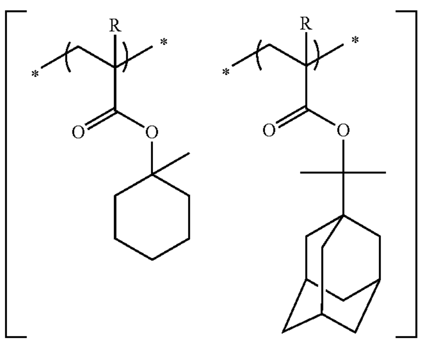
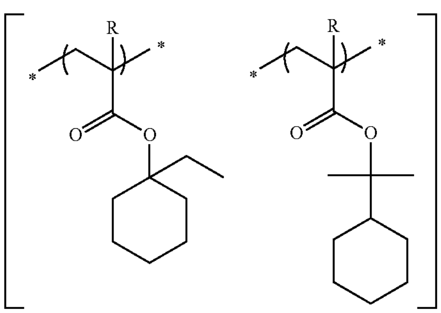
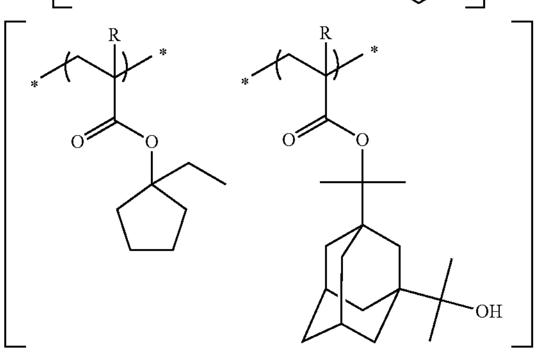
-continued
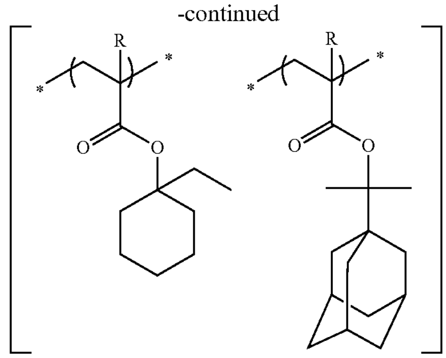
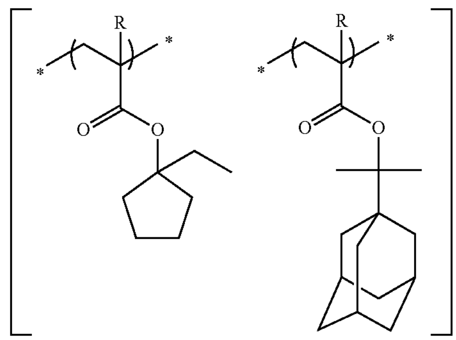
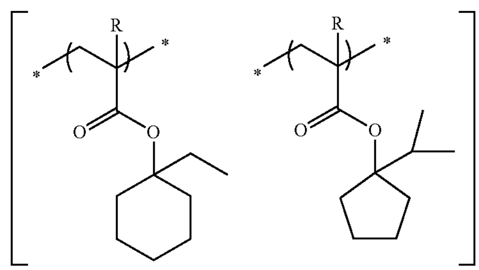
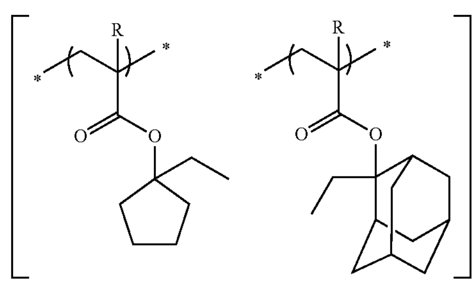
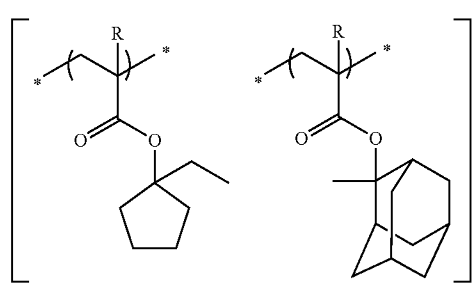

-continued

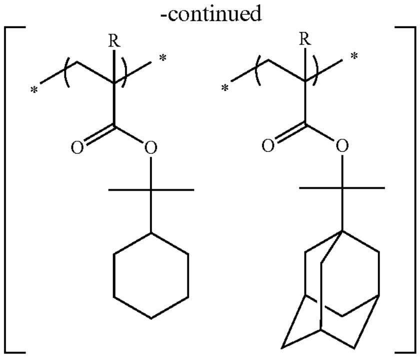

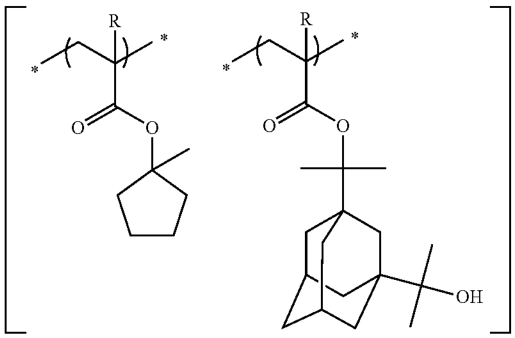

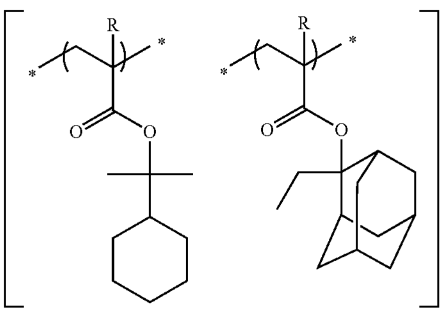

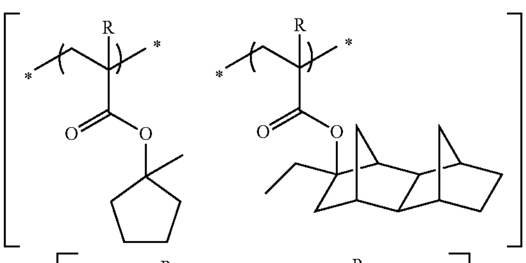

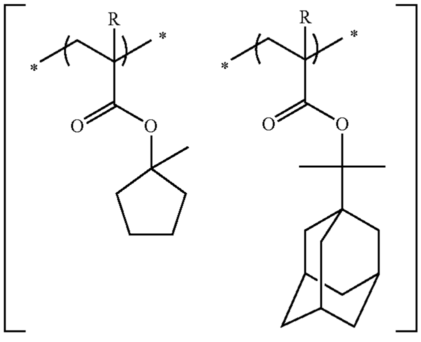

The resin (A) may also contain, as the repeating unit (R1), a repeating unit represented by the following formula (BZ):

(BZ)

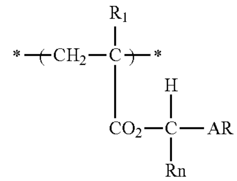

In formula (BZ), AR represents an aryl group, Rn represents an alkyl group, a cycloalkyl group or an aryl group, and Rn and AR may combine with each other to form a non-aromatic ring.

$R_1$ represents a hydrogen atom, an alkyl group, a cycloalkyl group, a halogen atom, a cyano group or an alkyloxycarbonyl group.

The aryl group of AR is preferably an aryl group having a carbon number 6 to 20, such as phenyl group, naphthyl group, anthryl group and fluorene group, more preferably an aryl group having a carbon number of 6 to 15.

When AR is a naphthyl group, an anthryl group or a fluorene group, the bonding position of AR to the carbon atom to which Rn is bonded is not particularly limited. For example, when AR is a naphthyl group, the carbon atom may be bonded to the α-position or β-position of the naphthyl group. When AR is an anthryl group, the carbon atom may be bonded to the 1-position, 2-position or 9-position of the anthryl group.

The aryl group as AR may have one or more substituents. Specific examples of the substituent include a linear or branched alkyl group having a carbon number of 1 to 20, such as methyl group, ethyl group, propyl group, isopropyl group, n-butyl group, isobutyl group, tert-butyl group, pentyl group, hexyl group, octyl group and dodecyl group, an alkoxy group containing such an alkyl group moiety, a cycloalkyl group such as cyclopentyl group and cyclohexyl group, a cycloalkoxy group containing such a cycloalkyl group moiety, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue. The substituent is preferably a linear or branched alkyl group having a carbon number of 1 to 5 or an alkoxy group containing such an alkyl group moiety, more preferably a para-methyl group or a para-methoxy group.

In the case where the aryl group as AR has a plurality of substituents, at least two members of the plurality of substituents may combine with each other to form a ring. The ring is preferably a 5-to 8-membered ring, more preferably a 5-or 6-membered ring. The ring may be a heterocyclic ring containing a heteroatom such as oxygen atom, nitrogen atom and sulfur atom, in the ring members.

Furthermore, this ring may have a substituent. Examples of the substituent are the same as those described later for the further substituent which Rn may have.

In view of the roughness performance, the repeating unit represented by formula (BZ) preferably contains two or more aromatic rings. Usually, the number of aromatic rings contained in the repeating unit is preferably 5 or less, more preferably 3 or less.

Also, in the repeating unit represented by formula (BZ), in view of the roughness performance, AR preferably contains two or more aromatic rings, and it is more preferred that AR is a naphthyl group or a biphenyl group. Usually, the number of aromatic rings contained in AR is preferably 5 or less, more preferably 3 or less.

As described above, Rn represents an alkyl group, a cycloalkyl group or an aryl group.

The alkyl group of Rn may be a linear alkyl group or a branched alkyl group. The alkyl group is preferably an alky group having a carbon number of 1 to 20, such as methyl group, ethyl group, propyl group, isopropyl group, n-butyl group, isobutyl group, tert-butyl group, pentyl group, hexyl group, cyclohexyl group, octyl group and dodecyl group. The alkyl group of Rn is preferably an alkyl group having a carbon number of 1 to 5, more preferably an alkyl group having a carbon number of 1 to 3.

The cycloalkyl group of Rn includes, for example, a cycloalkyl group having a carbon number of 3 to 15, such as cyclopentyl group and cyclohexyl group.

The aryl group of Rn is preferably, for example, an aryl group having a carbon number of 6 to 14, such as phenyl group, xylyl group, toluoyl group, cumenyl group, naphthyl group and anthryl group.

Each of the alkyl group, cycloalkyl group and aryl group as Rn may further have a substituent. Examples of the substituent include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue such as pyrrolidone residue. Among these, an alkoxy group, a hydroxyl group, a halogen atom, a nitro group, an acyl group, an acyloxy group, an acylamino group and a sulfonylamino group are preferred.

As described above, $R_1$ represents a hydrogen atom, an alkyl group, a cycloalkyl group, a halogen atom, a cyano group or an alkyloxycarbonyl group.

Examples of the alkyl group and cycloalkyl group of $R_1$ are the same as those described above for Rn. Each of these alkyl group and cycloalkyl group may have a substituent. Examples of this substituent are the same as those described above for Rn.

In the case where $R_1$ is an alkyl or cycloalkyl group having a substituent, particularly preferred examples of $R_1$ include a trifluoromethyl group, an alkyloxycarbonylmethyl group, an alkylcarbonyloxymethyl group, a hydroxymethyl group and an alkoxymethyl group.

The halogen atom of $R_1$ includes fluorine atom, chlorine atom, bromine atom and iodine atom, with fluorine atom being preferred.

As the alkyl group moiety contained in the alkyloxycarbonyl group or $R_1$, for example, the configuration described above as the alkyl group of $R_1$ may be employed.

Rn and AR preferably combine with each other to form a non-aromatic ring and in this case, particularly the roughness performance can be more improved.

The non-aromatic ring which may be formed by combining Rn and AR with each other is preferably a 5-to 8-membered ring, more preferably a 5-or 6-membered ring.

The non-aromatic ring may be an aliphatic ring or a heterocyclic ring containing a heteroatom such as oxygen atom, nitrogen atom and sulfur atom, as a ring member.

The non-aromatic ring may have a substituent. Examples of the substituent are the same as those described above for the further substituent which Rn may have.

Specific examples of the repeating unit represented by formula (BZ) are illustrated below, but the present invention is not limited thereto.

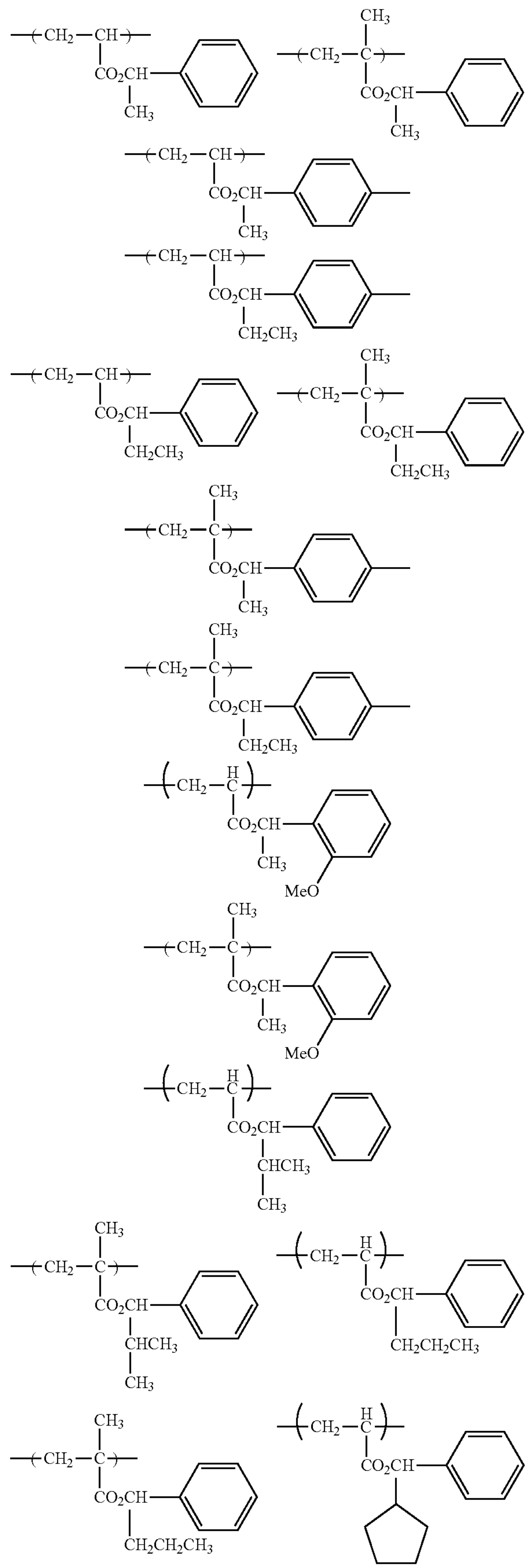

-continued
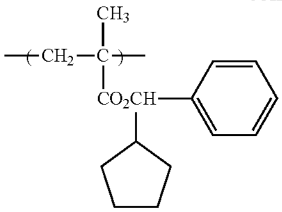
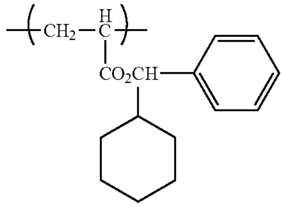
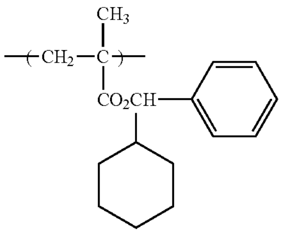
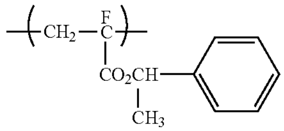
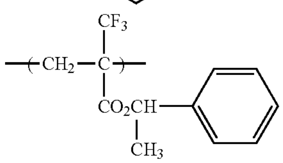
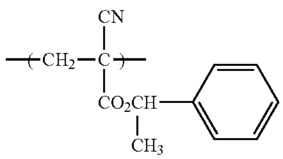
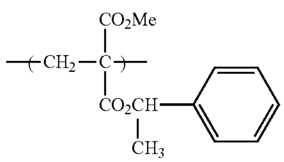
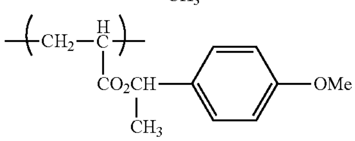
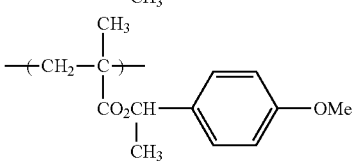
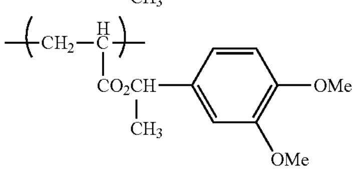
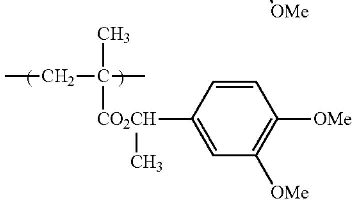
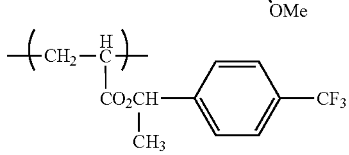
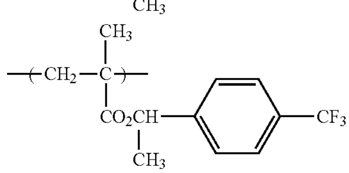
-continued
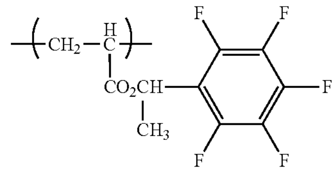
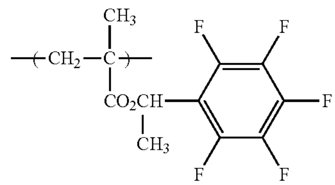
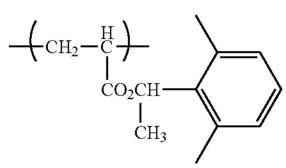
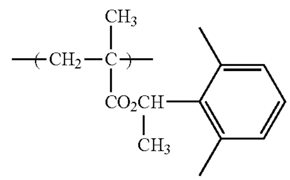
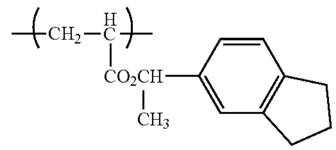
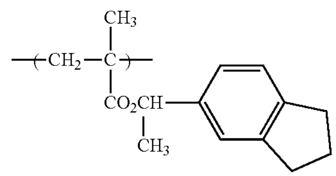
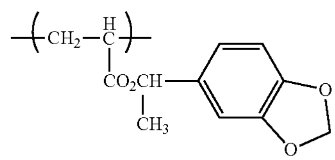
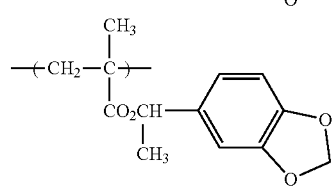
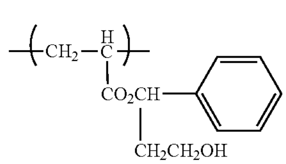
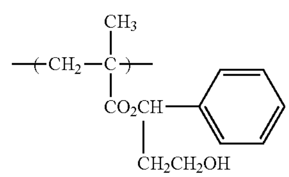
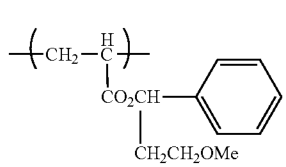
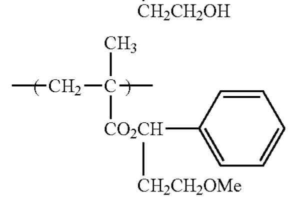
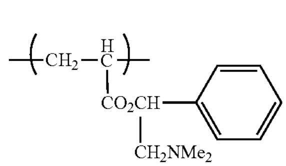
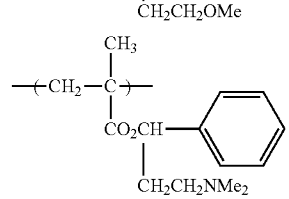

-continued
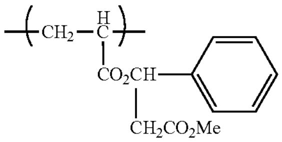
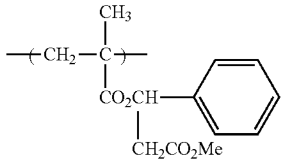
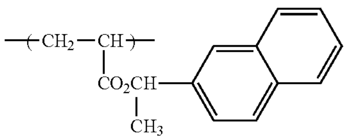
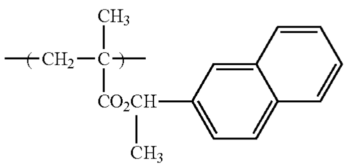
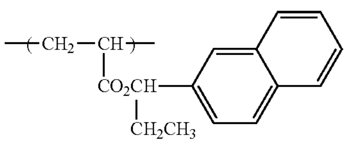
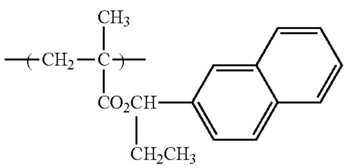
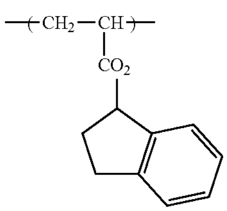
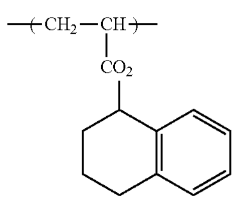
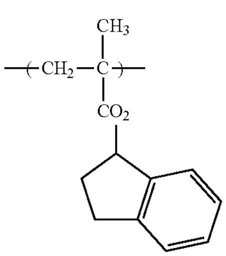
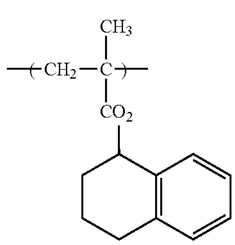
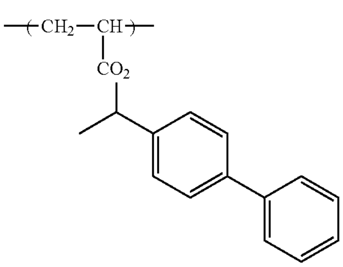
-continued
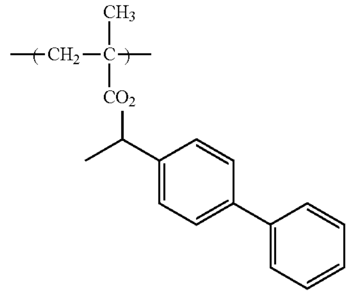
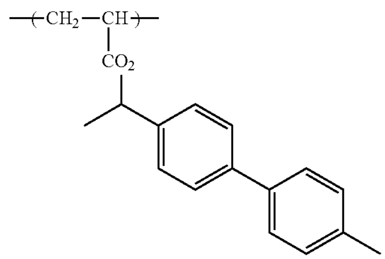
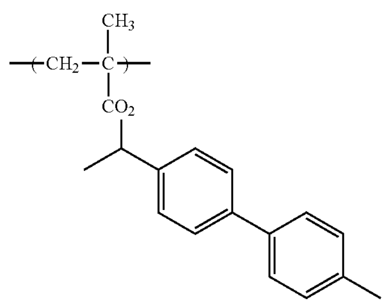
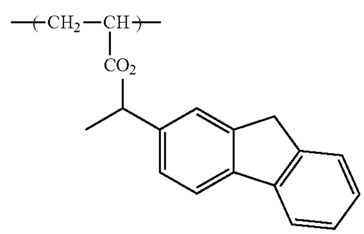
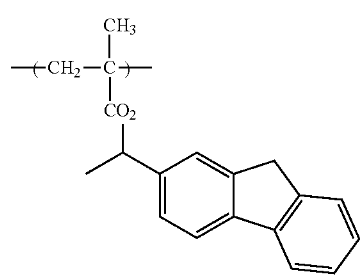
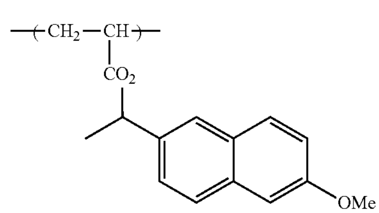

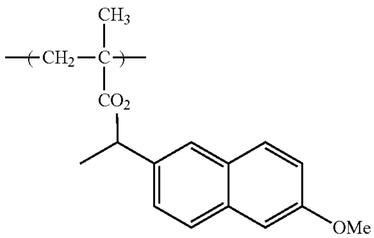
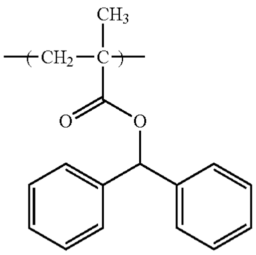
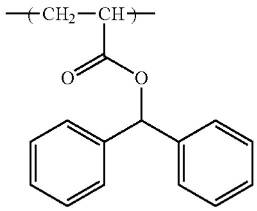
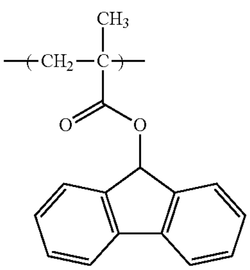
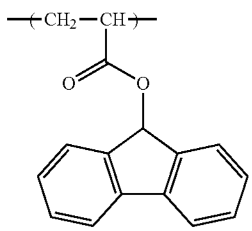
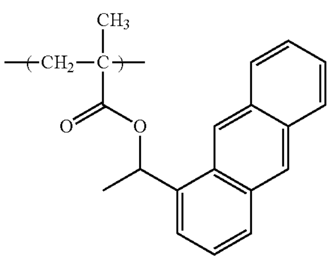
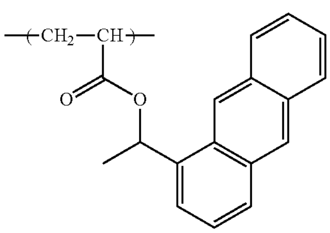
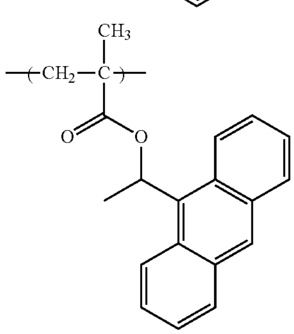
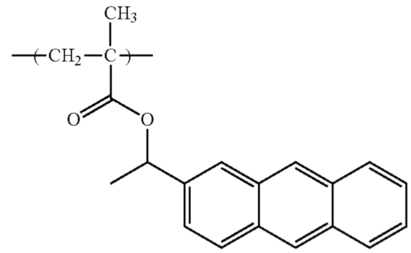
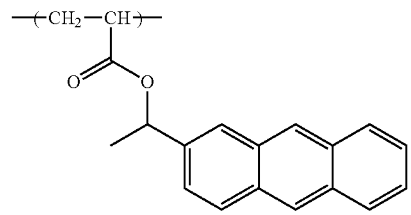
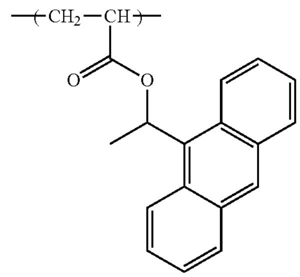
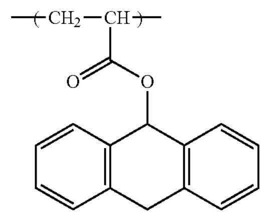
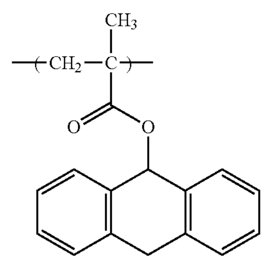
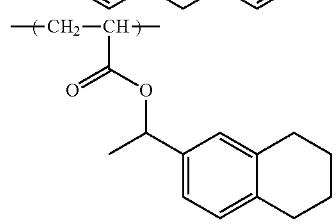
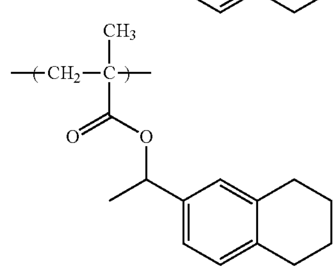
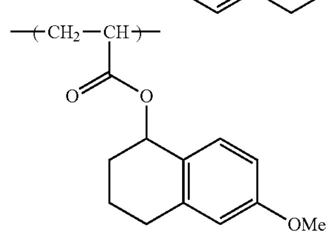

-continued

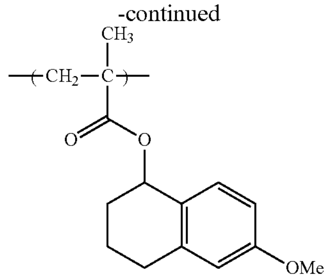

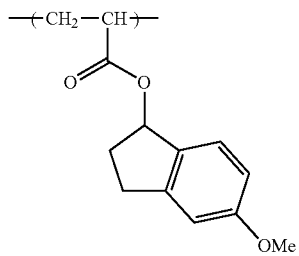

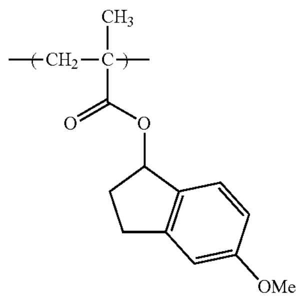

<Repeating Unit (R2)>

The repeating unit (R2) has a group capable of decomposing by the action of an acid to produce a phenolic hydroxyl group. The repeating unit (R2) is represented, for example, by the following formula (VI):

(VI)

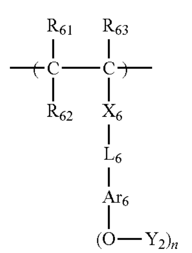

In formula (VI), each of $R_{61}$, $R_{62}$ and $R_{63}$ independently represents a hydrogen atom, an alkyl group, a cycloalkyl group, a halogen atom, a cyano group or an alkoxycarbonyl group. $R_{62}$ may combine with $Ar_6$ to form a ring, and in this case, $R_{62}$ represents a single bond or an alkylene group.

$X_6$ represents a single bond, —COO— or —$CONR_{64}$—, and $R_{64}$ represents a hydrogen atom or an alkyl group.

$L_6$ represents a single bond or an alkylene group.

$Ar_6$ represents a (n+1)-valent aromatic ring group and in the case of combining with $R_{62}$ to form a ring, $Ar_6$ represents a (n+2)-valent aromatic ring group.

$Y_2$ represents, when n≥2, each independently represents, a hydrogen atom or a group capable of leaving by the action of an acid, provided that at least one $Y_2$ represents a group capable of leaving by the action of an acid.

n represents an integer of 1 to 4.

Formula (VI) is described in more detail below.

The alkyl group of $R_{61}$ to $R_{63}$ in formula (VI) is preferably an alkyl group having a carbon number of 20 or less, such as methyl group, ethyl group, propyl group, isopropyl group, n-butyl group, sec-butyl group, hexyl group, 2-ethylhexyl group, octyl group and dodecyl group, which may have a substituent, more preferably an alkyl group having a carbon number of 8 or less.

As the alkyl group contained in the alkoxycarbonyl group, the same as the alkyl group in $R_{61}$ to $R_{63}$ is preferred.

The cycloalkyl group may be either monocyclic or polycyclic and is preferably a monocyclic cycloalkyl group having a carbon number of 3 to 8, such as cyclopropyl group, cyclopentyl group and cyclohexyl group, which may have a substituent.

The halogen atom includes fluorine atom, chlorine atom, bromine atom and iodine atom, with fluorine atom being preferred.

In the case where $R_{62}$ represents an alkylene group, the alkylene group is preferably an alkylene group having a carbon atom of 1 to 8, such as methylene group, ethylene group, propylene group, butylene group, hexylene group and octylene group, which may have a substituent.

Examples of the alkyl group of $R_{64}$ in —$CONR_{64}$— ($R_{64}$ represents a hydrogen atom or an alkyl group) represented by $X_6$ are the same as those of the alkyl group of $R_{61}$ to $R_{63}$.

$X_6$ is preferably a single bond, —COO— or —CONH—, more preferably a single bond or —COO—.

The alkylene group in $L_6$ is preferably an alkylene group having a carbon number of 1 to 8, such as methylene group, ethylene group, propylene group, butylene group, hexylene group and octylene group, which may have a substituent. The ring formed by combining $R_{62}$ and $L_6$ is preferably a 5-or 6-membered ring.

$Ar_6$ represents a (n+1)-valent aromatic ring. The divalent aromatic ring group when n is 1 may have a substituent, and preferred examples of the divalent aromatic ring group include an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

Examples of the substituent which the above-described alkyl group, cycloalkyl group, alkoxycarbonyl group, alkylene group and (n+1)-valent aromatic ring group may have are the same as specific examples of the substituent which each of the groups represented by $R_{51}$ to $R_{53}$ in formula (V) may have.

n is preferably 1 or 2, more preferably 1.

Each of n $Y_2$s independently represents a hydrogen atom or a group capable of leaving by the action of an acid, provided that at least one of n $Y_2$s represents a group capable of leaving by the action of an acid.

Examples of the group $Y_2$ capable of leaving by the action of an acid include —$C(R_{36})(R_{37})(R_{38})$, —C(=O)—O—C $(R_{36})(R_{37})(R_{38})$, —$C(R_{01})(R_{02})(OR_{39})$, —$C(R_{01})(R_{02})$—C(═O)—O—$C(R_{36})(R_{37})(R_{38})$ and —$CH(R_{36})(Ar)$.

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

Ar represents a monovalent aromatic ring group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted with a heteroatom such as oxygen atom.

The monovalent aromatic ring group of $R_{36}$ to $R_{39}$, $R_{01}$, $R_{02}$ and Ar is preferably a monovalent aromatic ring group having a carbon number of 6 to 10, and examples thereof include an aryl group such as phenyl group, naphthyl group and anthryl group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

The group formed by combining an alkylene group and a monovalent aromatic ring group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ with each other may be monocyclic or polycyclic. The monocyclic ring structure is preferably a cycloalkyl structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring structure is preferably a cycloalkyl structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the cycloalkyl structure may be substituted with a heteroatom such as oxygen atom.

Each of the groups above as $R_{36}$ to $R_{39}$, $R_{01}$, $R_{02}$ and Ar may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The carbon number of the substituent is preferably 8 or less.

The group $Y_2$ capable of leaving by the action of an acid is more preferably a structure represented by the following formula (VI-A):

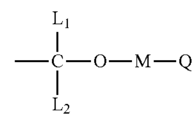

(VI-A)

In the formula, each of $L_1$ and $L_2$ independently represents a hydrogen atom, an alkyl group, a cycloalkyl group, a monovalent aromatic ring group, or a group formed by combining an alkylene group and a monovalent aromatic ring group.

M represents a single bond or a divalent linking group.

Q represents an alkyl group, a cycloalkyl group which may contain a heteroatom, a monovalent aromatic ring group which may contain a heteroatom, an amino group, an ammonium group, a mercapto group, a cyano group or an aldehyde group.

At least two members of Q, M and $L_1$ may combine to form a ring (preferably a 5- or 6-membered ring).

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The monovalent aromatic ring group as $L_1$ and $L_2$ is, for example, an aryl group having a carbon number of 6 to 15, and specific preferred examples thereof include a phenyl group, a tolyl group, a naphthyl group and an anthryl group.

The group formed by combining an alkylene group and a monovalent aromatic ring group as $L_1$ and $L_2$ is, for example, an aralkyl group having a carbon number of 6 to 20, such as benzyl group and phenethyl group.

Examples of the divalent linking group as M include an alkylene group (such as methylene group, ethylene group, propylene group, butylene group, hexylene group and octylene group), a cycloalkylene group (such as cyclopentylene group, cyclohexylene group and adamantylene group), an alkenylene group (such as ethenylene group, propenylene group and butenylene group), a divalent aromatic ring group (such as phenylene group, tolylene group and naphthylene group), —S—, —O—, —CO—, —$SO_2$—, —$N(R_0)$—, and a divalent linking group formed by combining a plurality thereof. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group and an octyl group).

Examples of the alkyl group as Q are the same as those of the alkyl group of $L_1$ and $L_2$.

Examples of the heteroatom-free aliphatic hydrocarbon ring group and the heteroatom-free monovalent aromatic ring group in the cycloalkyl group which may contain a heteroatom and the monovalent aromatic ring group which may contain a heteroatom as Q include the cycloalkyl group and monovalent aromatic ring group described above for $L_1$ and $L_2$, and the carbon number is preferably from 3 to 15.

Examples of the heteroatom-containing cycloalkyl group and the heteroatom-containing monovalent aromatic ring group include a group having a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the heterocyclic structure is not limited thereto as long as it is a structure generally called a heterocyclic ring (a ring composed of carbon and a heteroatom, or a ring composed of a heteroatom).

Examples of the ring which may be formed by combining at least two members of Q, M and $L_1$ include an oxygen atom-containing 5- or 6-membered ring formed by combining at least two members of Q, M and $L_1$ and thereby forming, for example, a propylene group or a butylene group.

In formula (VI-A), each of the groups represented by $L_1$, $L_2$, M and Q may have a substituent, and examples of the substituent include those described above as the substituent which $R_{36}$ to $R_{39}$, $R_{01}$, $R_{02}$ and Ar may have. The carbon number of the substituent is preferably 8 or less.

The group represented by -M-Q is preferably a group having a carbon number of 1 to 30, more preferably a group having a carbon number of 5 to 20.

As specific preferred examples of the repeating unit (R2), specific examples of the repeating unit represented by formula (VI) are illustrated below, but the present invention is not limited thereto.

(VI-1)

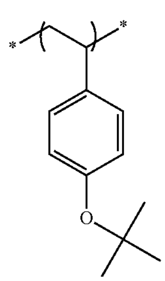

(VI-2)

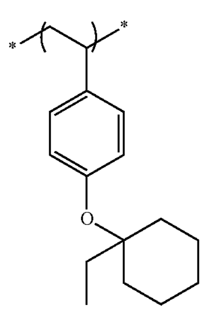

-continued (VI-3)

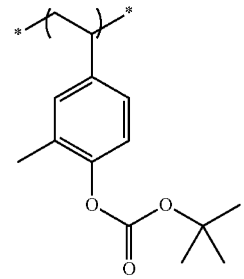

(VI-4)

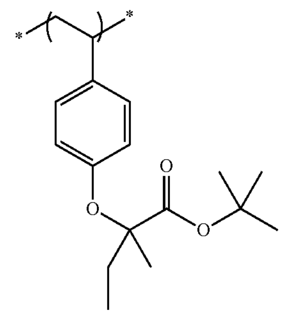

(VI-5)

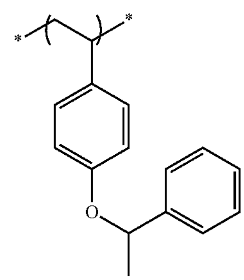

(VI-6)

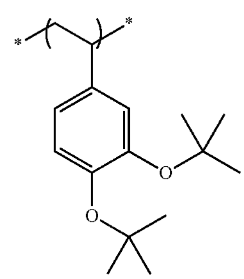

(VI-7)

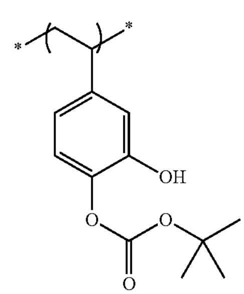

-continued
(VI-8)
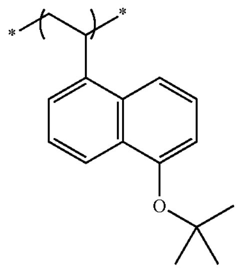
(VI-9)
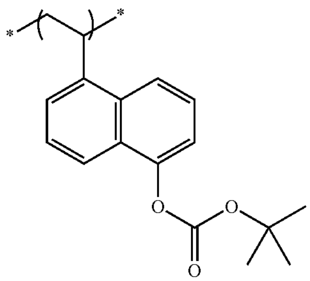
(VI-10)
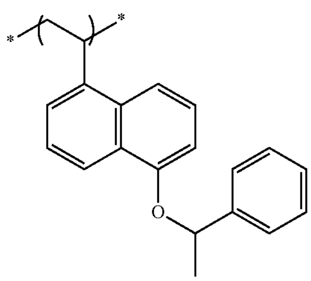
(VI-11)
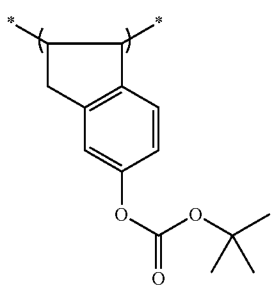
(VI-12)
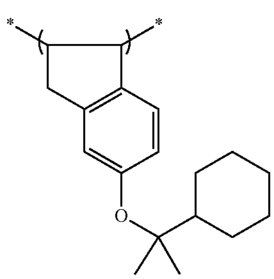
(VI-13)
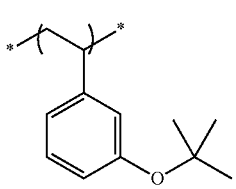
-continued
(VI-14)
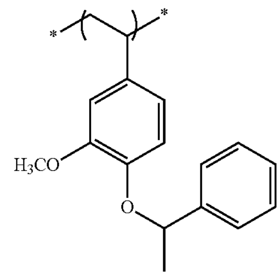
(VI-15)
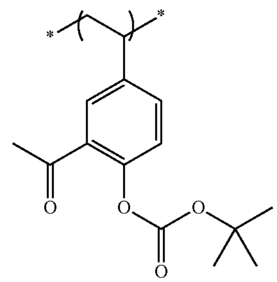
(VI-16)
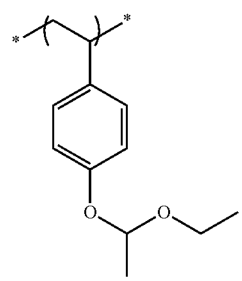
(VI-17)
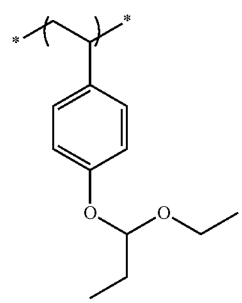
(VI-18)
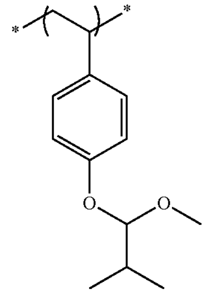

-continued
(VI-19)
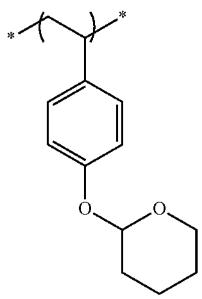
(VI-20)
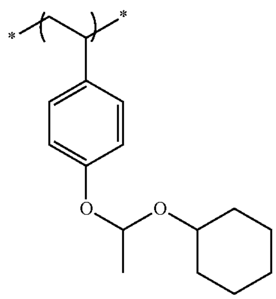
(VI-21)
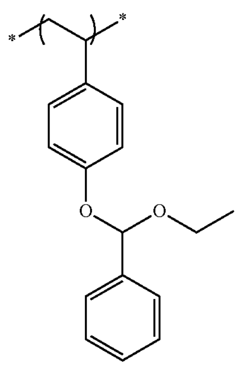
(VI-22)
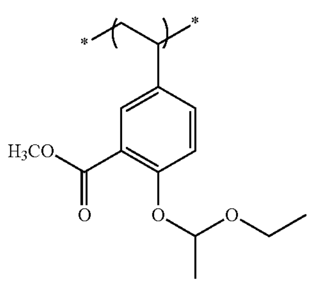
(VI-23)
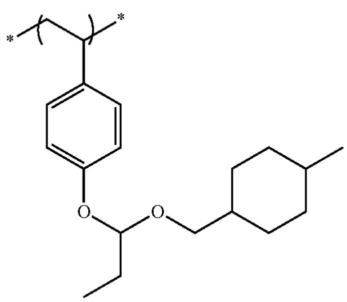
-continued
(VI-24)
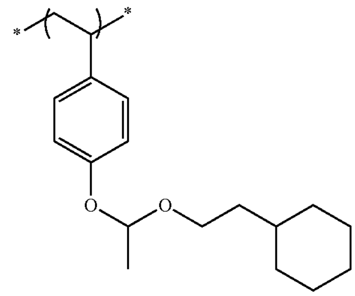
(VI-25)
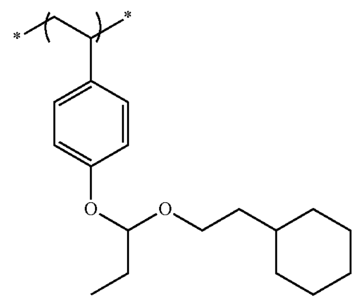
(VI-26)
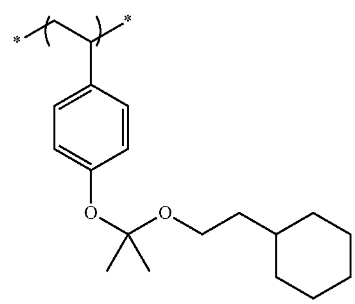
(VI-27)
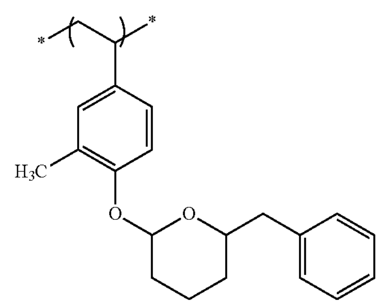
(VI-28)
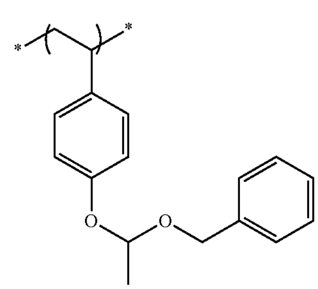

-continued
(VI-29)
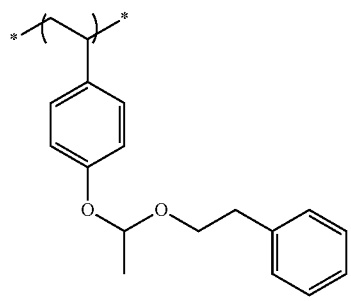
(VI-30)
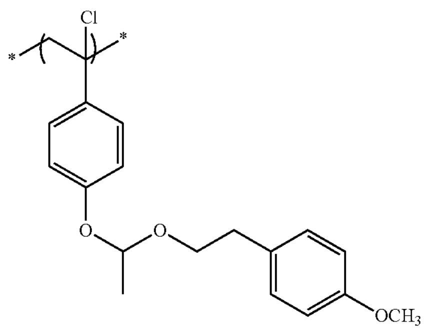
(VI-31)
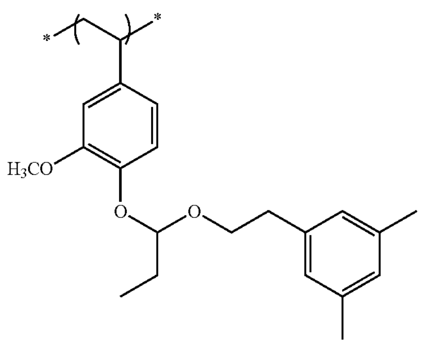
(VI-32)
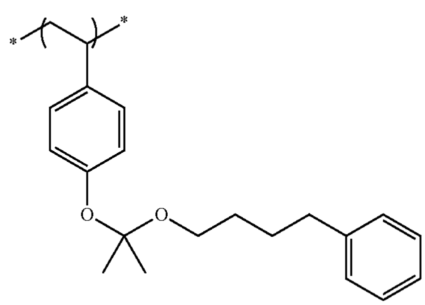
(VI-33)
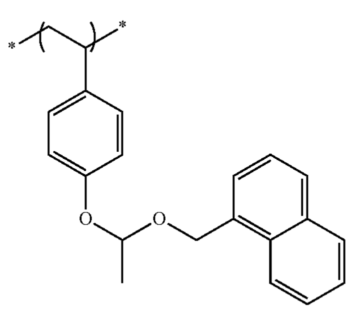
-continued
(VI-34)
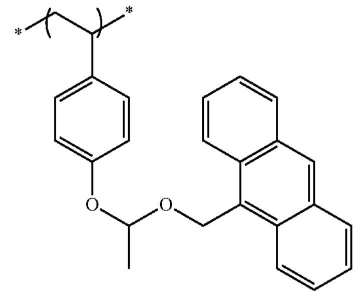
(VI-35)
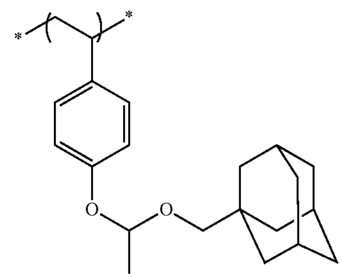
(VI-36)
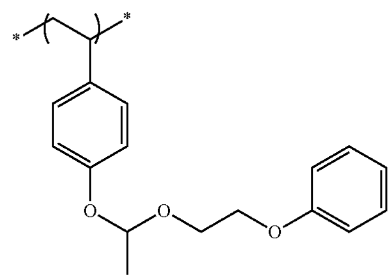
(VI-37)
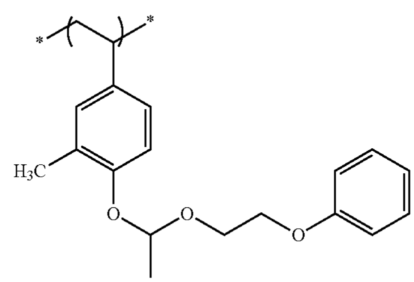
(VI-38)
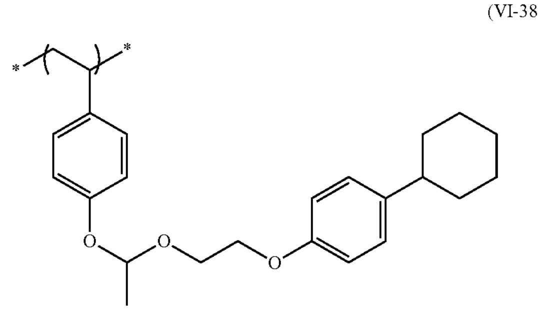

-continued
(VI-39)
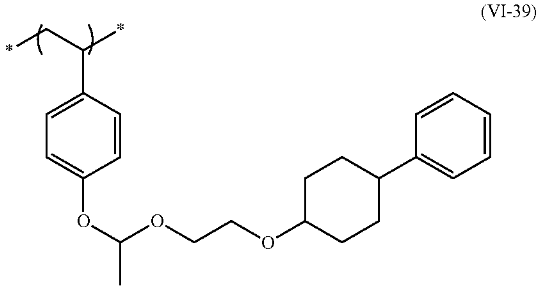
(VI-40)
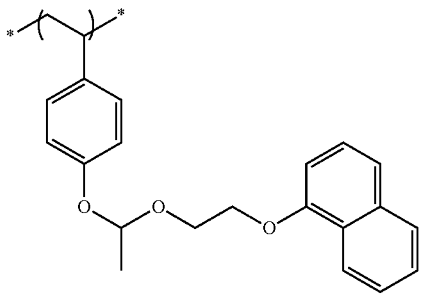
(VI-41)
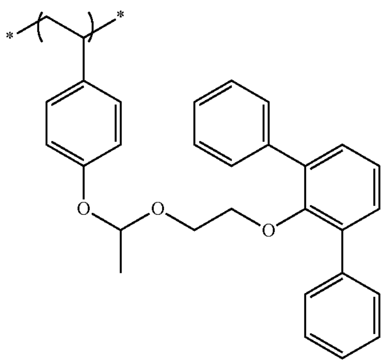
(VI-42)
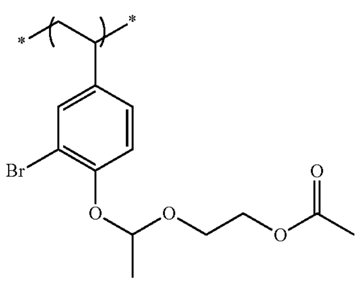
(VI-43)
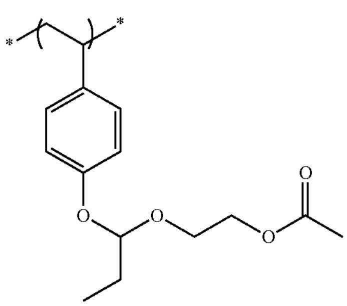
-continued
(VI-44)
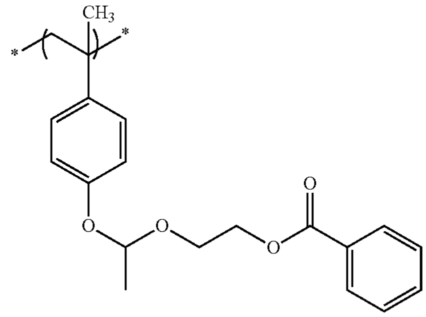
(VI-45)
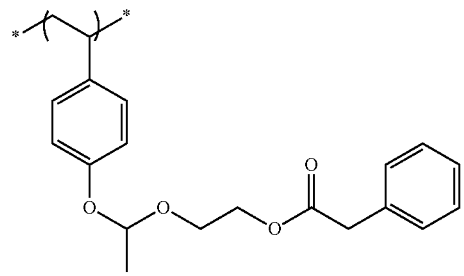
(VI-46)
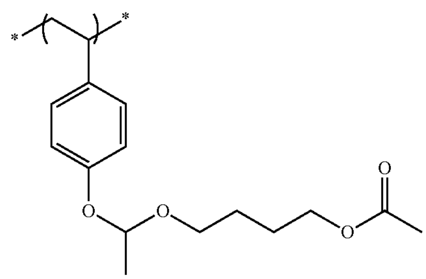
(VI-47)
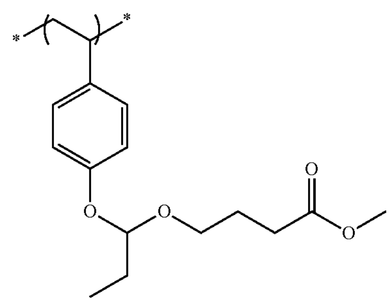
(VI-48)
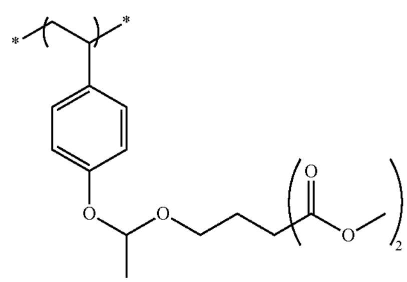

-continued
(VI-49)
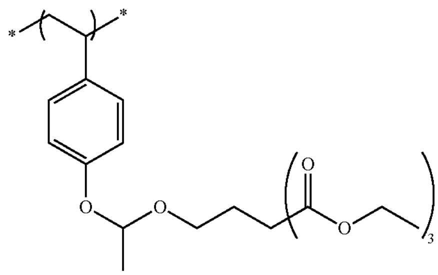
(VI-50)
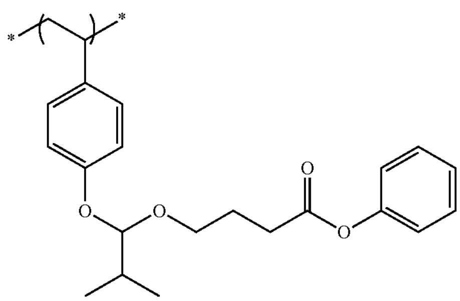
(VI-51)
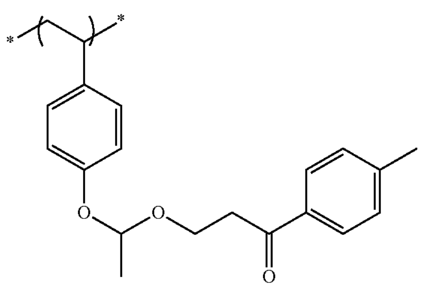
(VI-52)
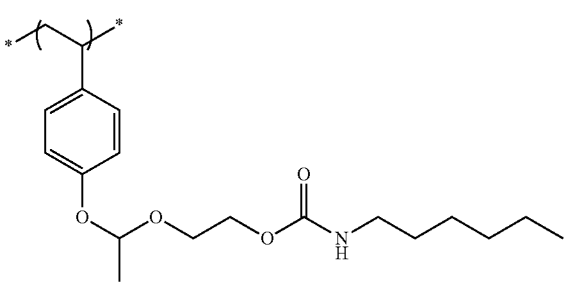
(VI-53)
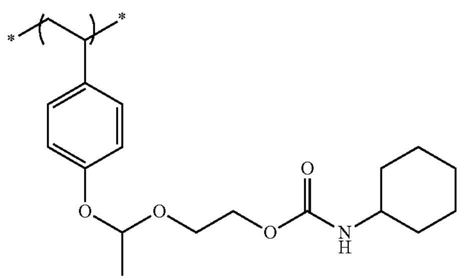
-continued
(VI-54)
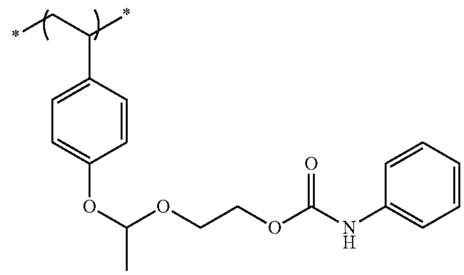
(VI-55)
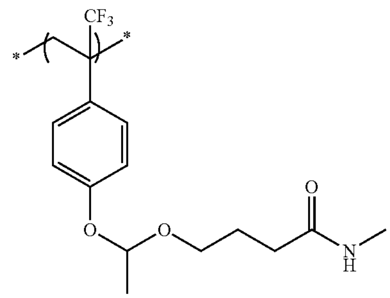
(VI-56)
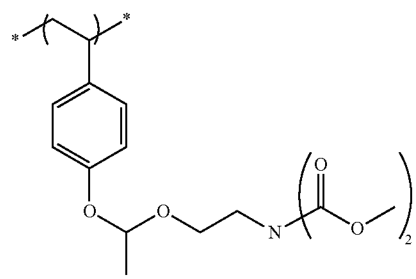
(VI-57)
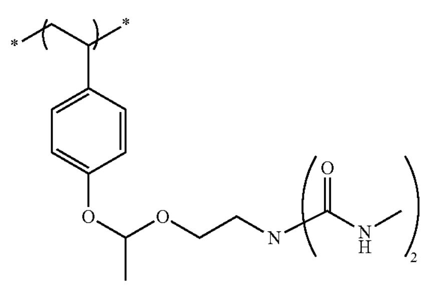
(VI-58)
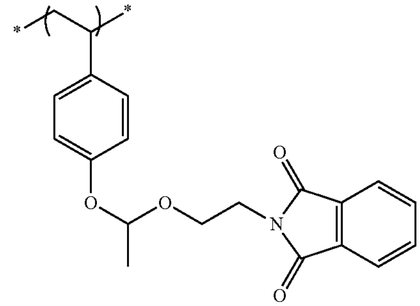

(VI-59)
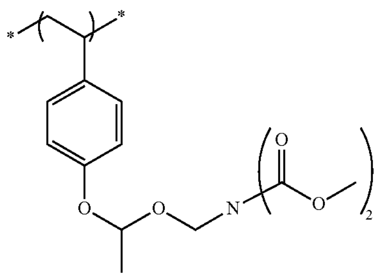
(VI-60)
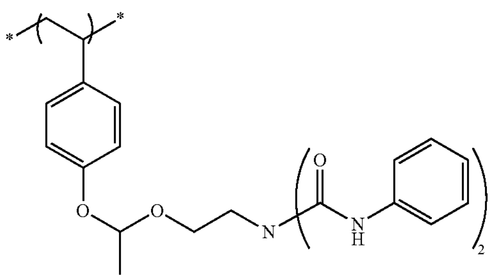
(VI-61)
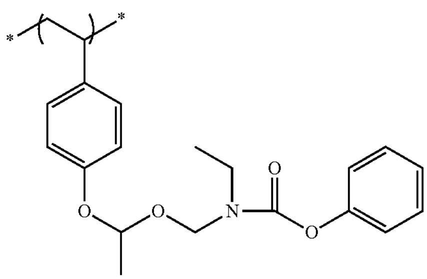
(VI-62)
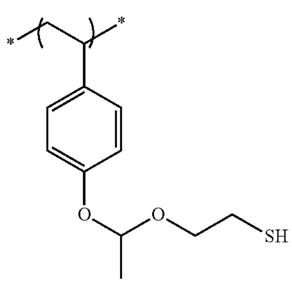
(VI-63)
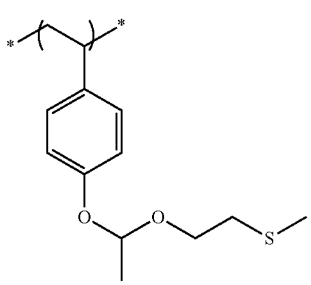
(VI-64)
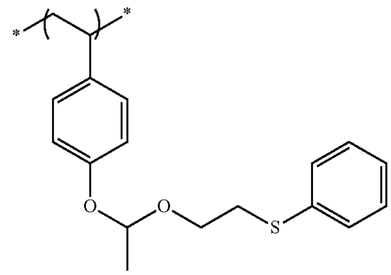
(VI-65)
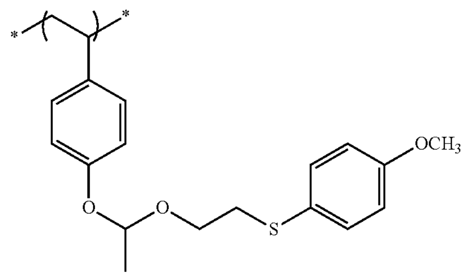
(VI-66)
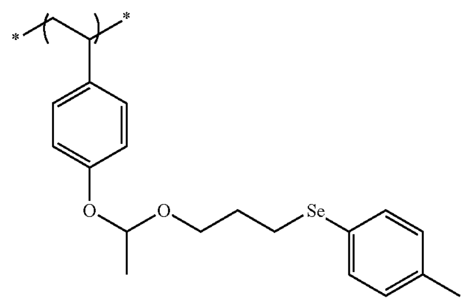
(VI-67)
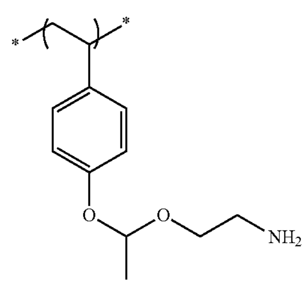
(VI-68)
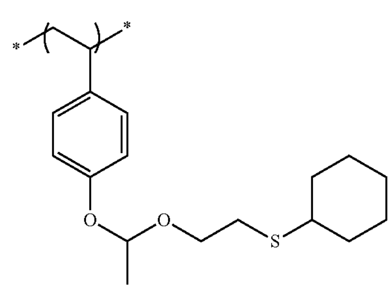

-continued
(VI-69)
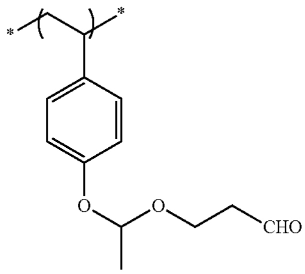
(VI-70)
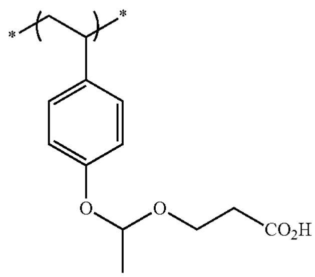
(VI-71)
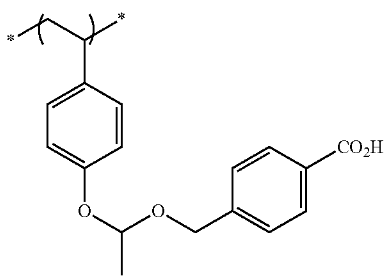
(VI-72)
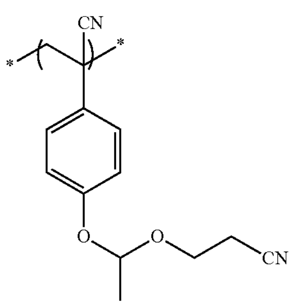
(VI-73)
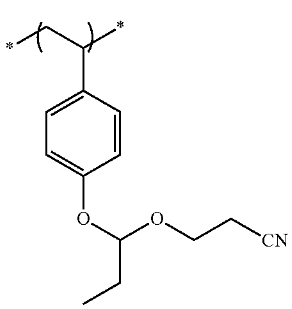
-continued
(VI-74)
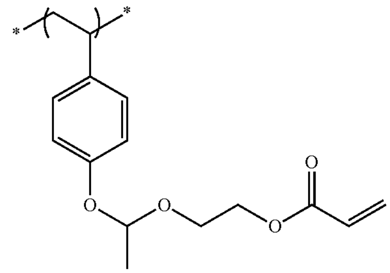
(VI-75)
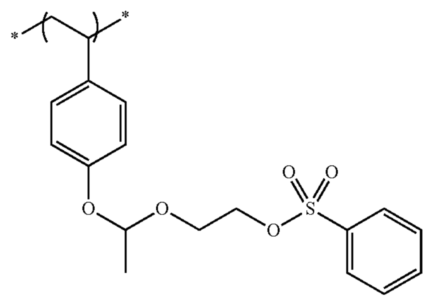
(VI-76)
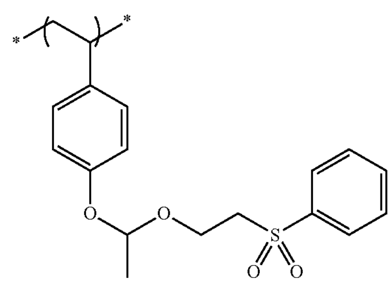
(VI-77)
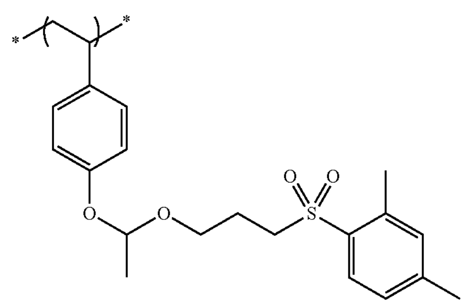
(VI-78)
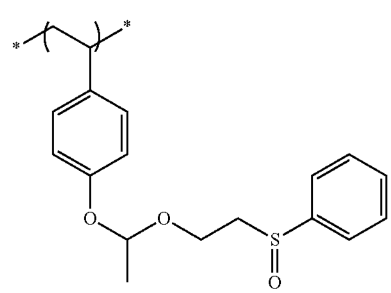

-continued
(VI-79)
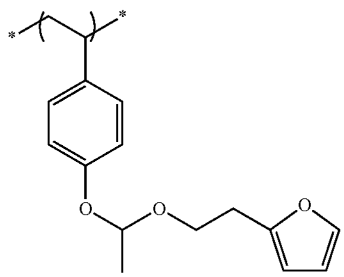
(VI-80)
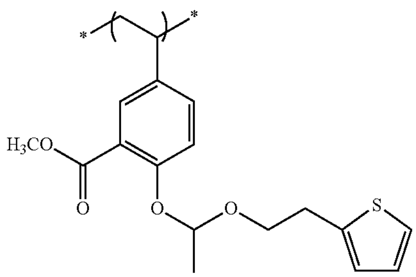
(VI-81)
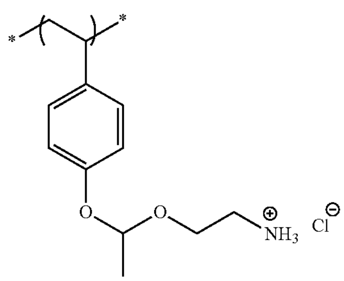
(VI-82)
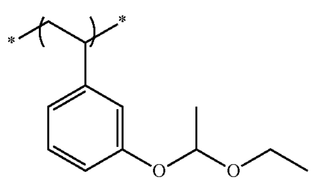
(VI-83)
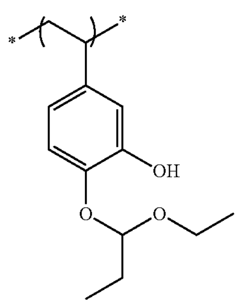
(VI-84)
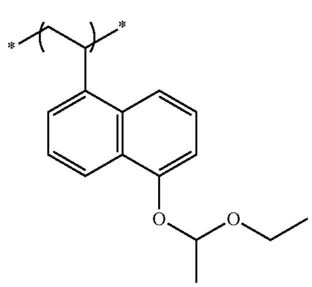
-continued
(VI-85)
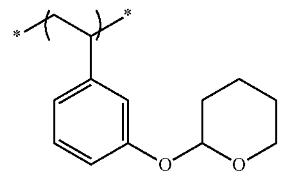
(VI-86)
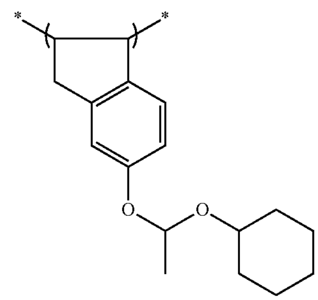
(VI-87)
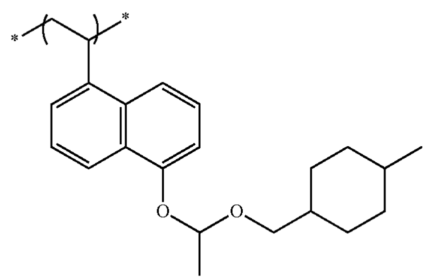
(VI-88)
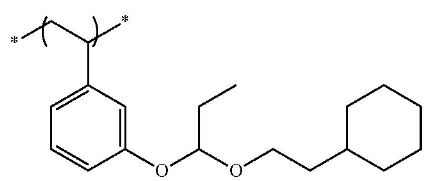
(VI-89)
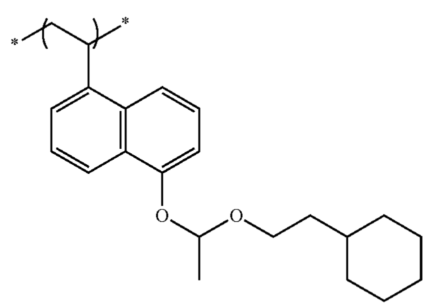
(VI-90)
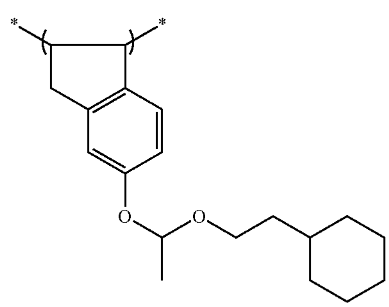

-continued
(VI-91)
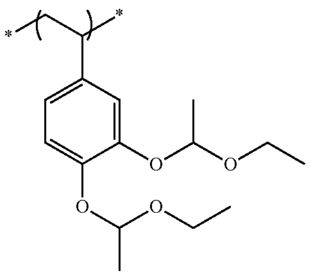
(VI-92)
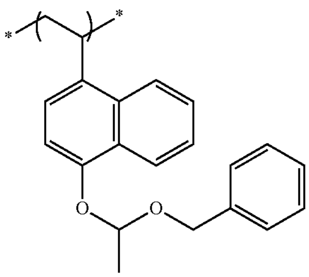
(VI-93)
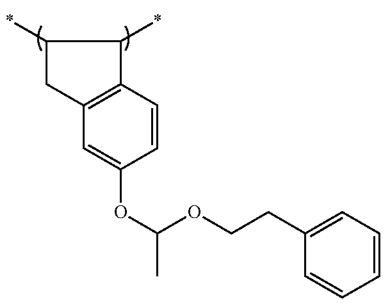
(VI-94)
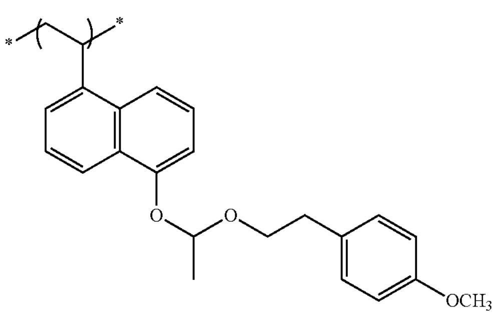
(VI-95)
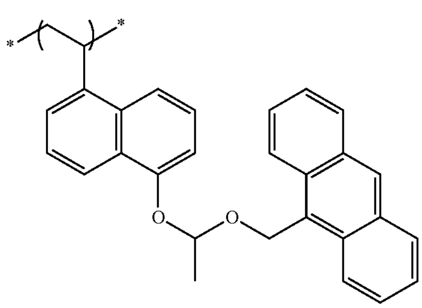
-continued
(VI-96)
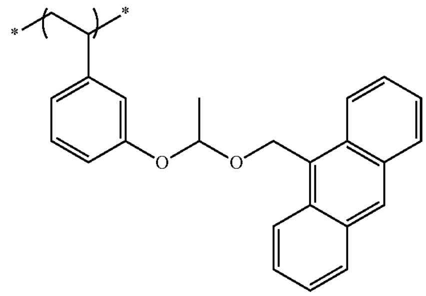
(VI-97)
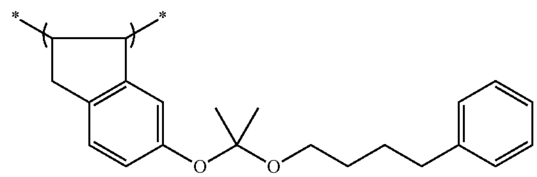
(VI-98)
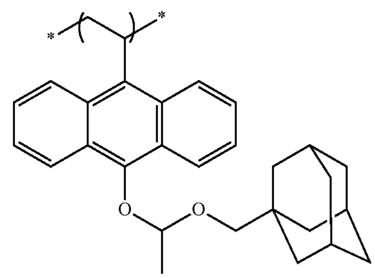
(VI-99)
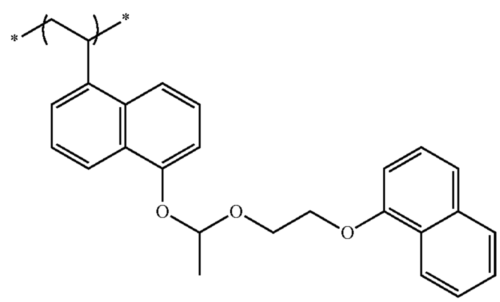
(VI-100)
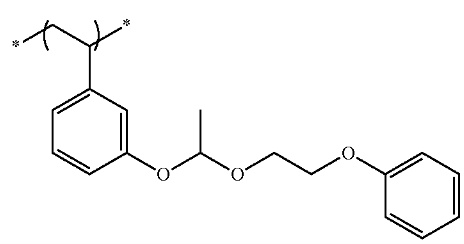
(VI-101)
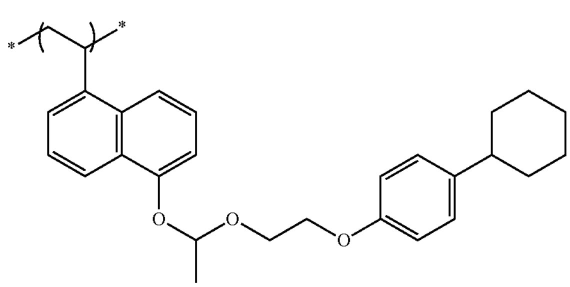

-continued
(VI-102)
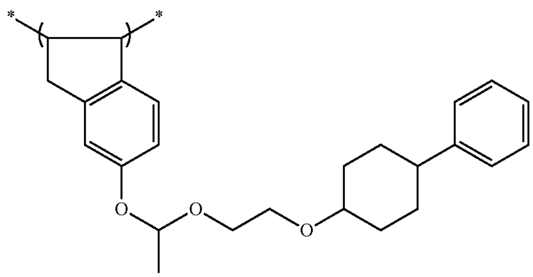
(VI-103)
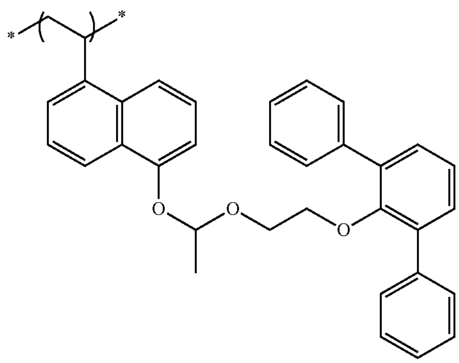
(VI-104)
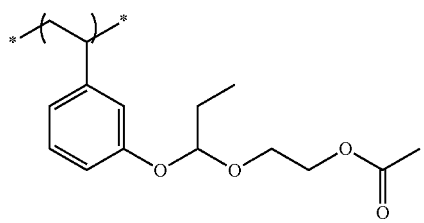
(VI-105)
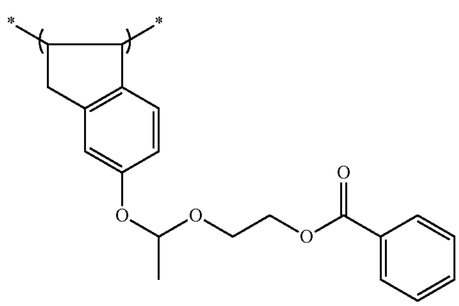
(VI-106)
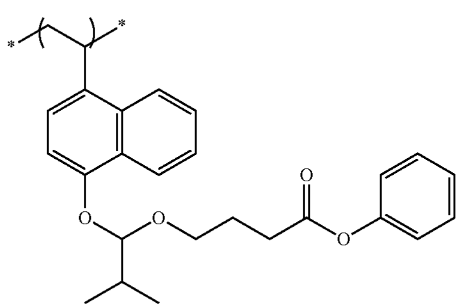
-continued
(VI-107)
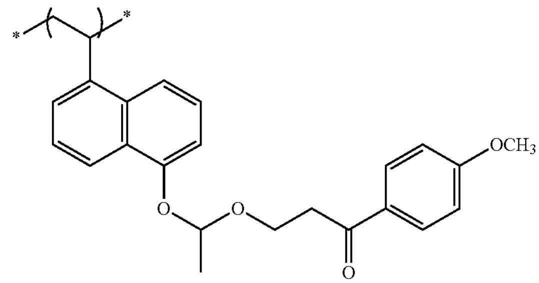
(VI-108)
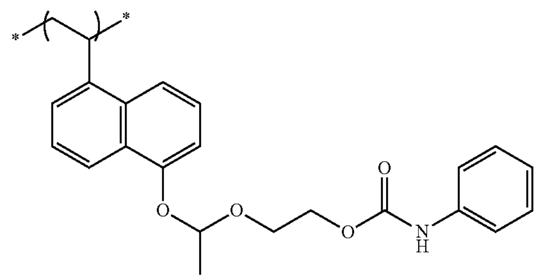
(VI-109)
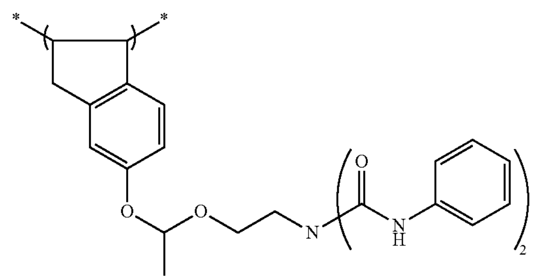
(VI-110)
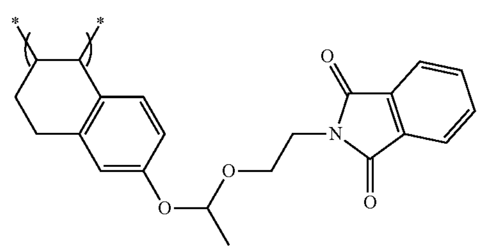
(VI-111)
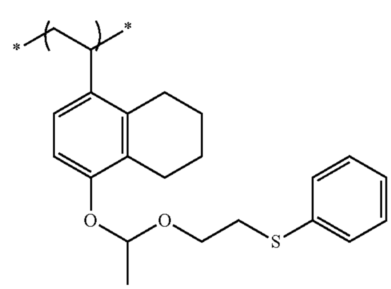

(VI-112)
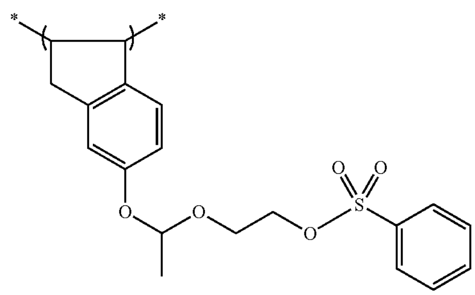
(VI-113)
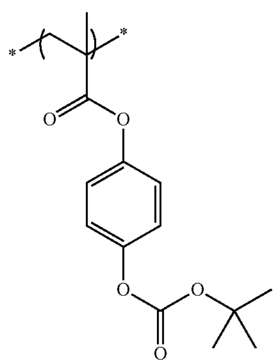
(VI-114)
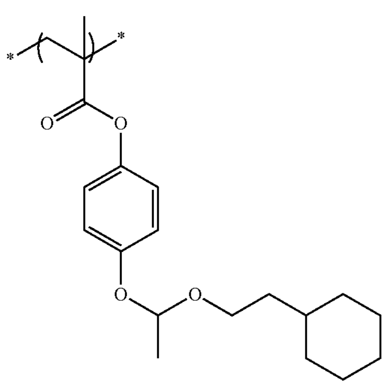
(VI-115)
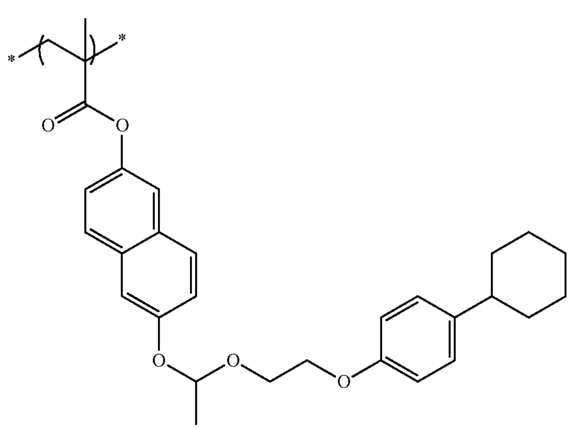
(VI-116)
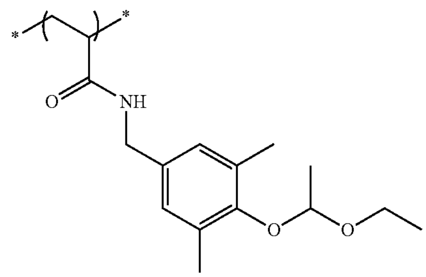
(VI-117)
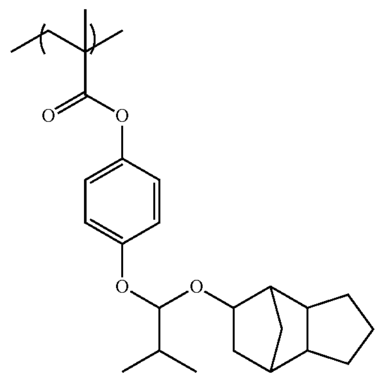
(VI-118)
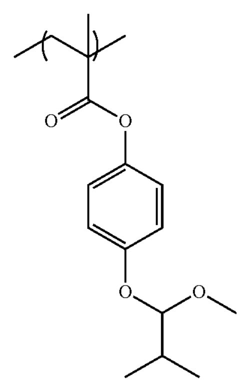
(VI-119)
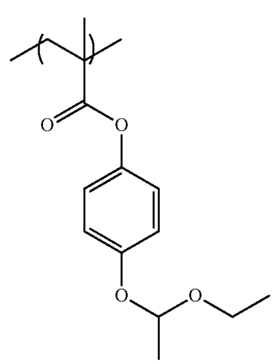

-continued
(VI-120)
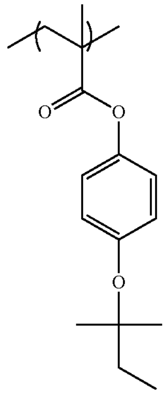
(VI-121)
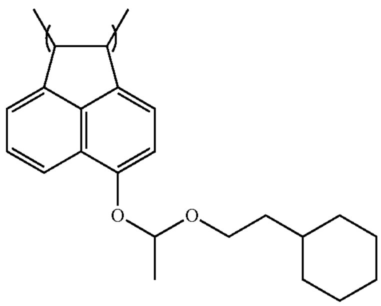
(VI-122)
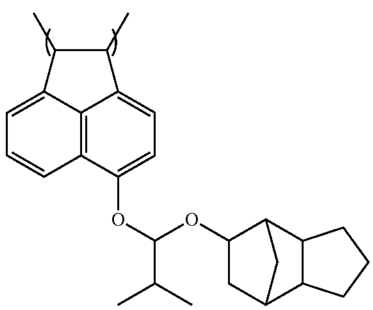
(VI-123)
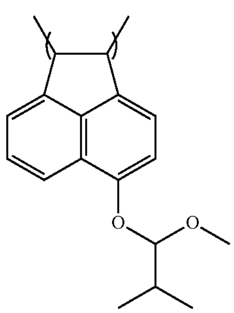
(VI-124)
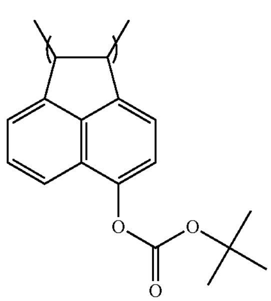
-continued
(VI-125)
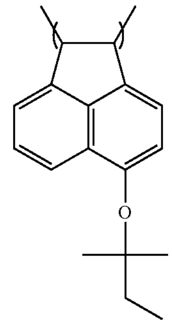
(VI-126)
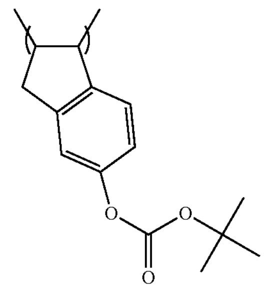
(VI-127)
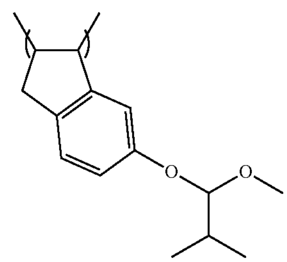
(VI-128)
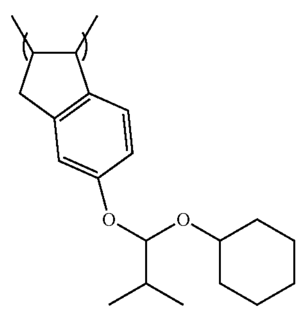
(VI-129)
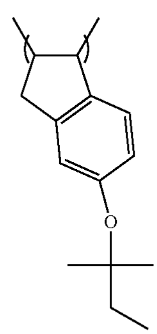

-continued (VI-130)

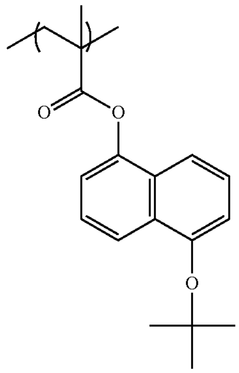

(VI-131)

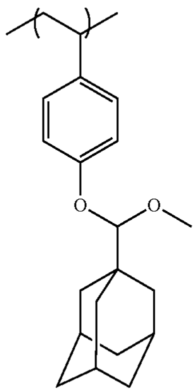

(VI-132)

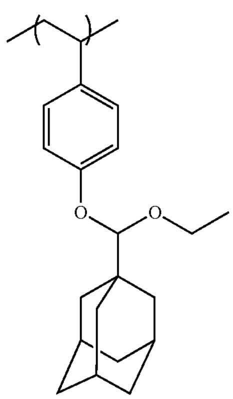

(VI-133)

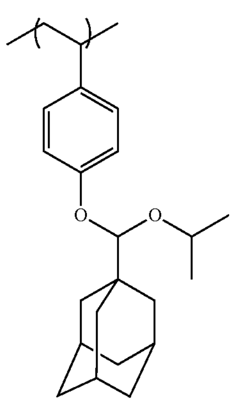

-continued (VI-134)

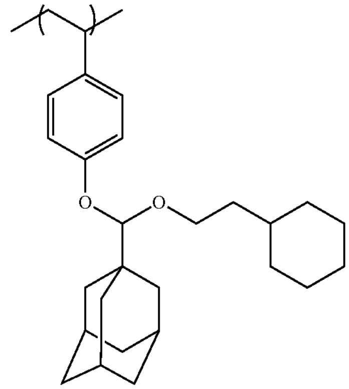

The repeating unit represented by formula (VI) is a repeating unit in which a phenolic hydroxyl group is produced resulting from decomposition of an acid-decomposable group, but in this case, there is a tendency that the solubility of the resin in the exposed area for an organic solvent is less likely to become sufficiently low, and in view of resolution, addition of the repeating unit is not preferred in some cases. This tendency emerges more prominently in a repeating unit derived from hydroxystyrenes (that is, in formula (VI), when both $X_6$ and $L_6$ are a single bond). The reason therefor is not clearly known but is presumed to be because, for example, a phenolic hydroxyl group is present in the vicinity of the main chain. On this account, in the present invention, the content of the repeating unit in which a phenolic hydroxyl group is produced resulting from decomposition of an acid-decomposable group (for example, the repeating unit represented by formula (VI), preferably the repeating unit represented by formula (VI) where both $X_6$ and $L_6$ are a single bond) is preferably 4 mol % or less, more preferably 2 mol % or less, and most preferably 0 mol % (namely, the repeating unit is not contained), based on all repeating units in the resin (A).

<Repeating Unit (R3)>

The repeating unit (R3) is a repeating unit having a group capable of decomposing by the action of an acid to produce an alcoholic hydroxy group. In the case where the resin (A) contains such a repeating unit, the change in polarity of the resin (A) due to decomposition of the acid-decomposable group is large, and the dissolution contrast for an organic solvent-containing developer is more enhanced. Also, in this case, reduction in the film thickness during post-exposure baking (PEB) can be more suppressed. In addition, in this case, whichever of an alkali developer and an organic solvent-containing developer is used, the resolution can be more enhanced.

The pKa of the alcoholic hydroxy group produced resulting from decomposition of the group above by the action of an acid is, for example, 12 or more, typically from 12 to 20. If this pKa is excessively small, the stability of the composition containing the resin (A) may be decreased to cause a large fluctuation in the resist performance with aging. The "pKa" as used herein is a value computed using "ACD/pKa DB" produced by Fujitsu Ltd. based on default settings without customization.

The repeating unit (R3) preferably has two or more groups capable of decomposing by the action of an acid to produce an alcoholic hydroxy group. When this configuration is employed, the dissolution contrast for an organic solvent-containing developer can be more enhanced.

The repeating unit (R3) is preferably represented by at least one formula selected from the group consisting of the following formulae (I-1) to (I-10). This repeating unit is more preferably represented by at least one formula selected from the group consisting of the following formulae (I-1) to (I-3), still more preferably represented by the following formula (I-1).

(I-1)

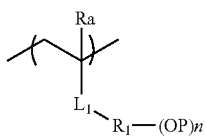

(I-2)

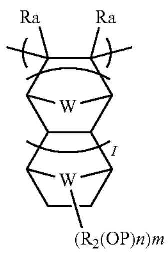

(I-3)

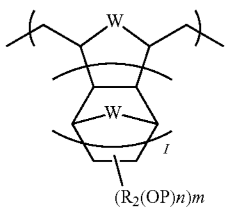

(I-4)

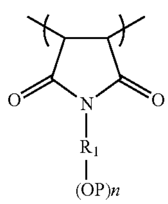

(I-5)

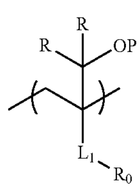

(I-6)

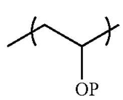

(I-7)

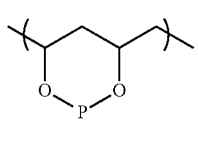

(I-8)

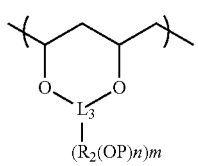

-continued (I-9)

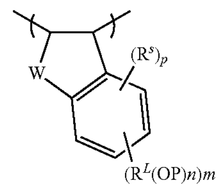

(I-10)

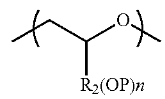

In the formulae, each Ra independently represents a hydrogen atom, an alkyl group or a group represented by —$CH_2$—O—$Ra_2$, wherein $Ra_2$ represents a hydrogen atom, an alkyl group or an acyl group.

$R_1$ represents a (n+1)-valent organic group.

$R_2$ represents, when m≥2, each independently represents, a single bond or a (n+1)-valent organic group.

Each OP independently represents the above-described group capable of decomposing by the action of an acid to produce an alcoholic hydroxy group, and when n≥2 and/or m≥2, two or more OP's may combine with each other to form a ring.

W represents a methylene group, an oxygen atom or a sulfur atom, n and m represent an integer of 1 or more. Incidentally, in the case where $R_2$ in formula (I-2), (I-3) or (I-8) represents a single bond, n is 1.

l represents an integer of 0 or more.

$L_1$ represents a linking group represented by —COO—, —OCO—, —CONH—, —O—, —Ar—, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents a (m+2)-valent linking group.

$R^L$ represents, when m≥2, each independently represents, a (n+1)-valent linking group.

$R^S$ represents, when p≥2, each independently represents, a substituent, and when p≥2, the plurality of $R^S$s may combine with each other to form a ring.

p represents an integer of 0 to 3.

Ra represents a hydrogen atom, an alkyl group or a group represented by —$CH_2$—O—$Ra_2$. Ra is preferably a hydrogen atom or an alkyl group having a carbon number of 1 to 10, more preferably a hydrogen atom or a methyl group.

W represents a methylene group, an oxygen atom or a sulfur atom. W is preferably a methylene group or an oxygen atom.

$R_1$ represents a (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or a (n+1)-valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ are a chain hydrocarbon group, the chain hydrocarbon group may be a linear or branched-chain hydrocarbon group. The carbon number of the chain hydrocarbon group is preferably from 1 to 8. For example, when $R_1$ and/or $R_2$ are an alkylene group, $R_1$ and/or $R_2$ are preferably a methylene group, an ethylene group, an n-propylene group, an isopropylene group, an n-butylene group, an isobutylene group or a sec-butylene group.

In the case where $R_1$ and/or $R_2$ are an alicyclic hydrocarbon group, the alicyclic hydrocarbon group may be monocyclic or polycyclic. The alicylcic hydrocarbon group has, for example, a monocyclo, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(═O)—], a sulfonyl group [—S(═O)$_2$—], a sulfinyl group [—S(═O)—] or an imino group [—N(R)—] (wherein R is a hydrogen atom or an alkyl group).

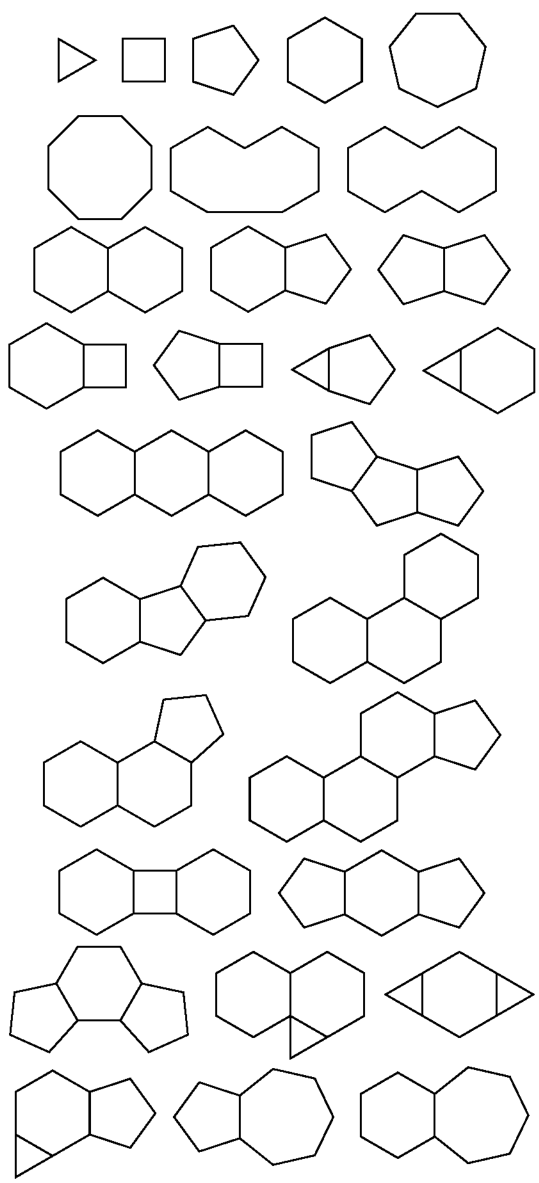

-continued

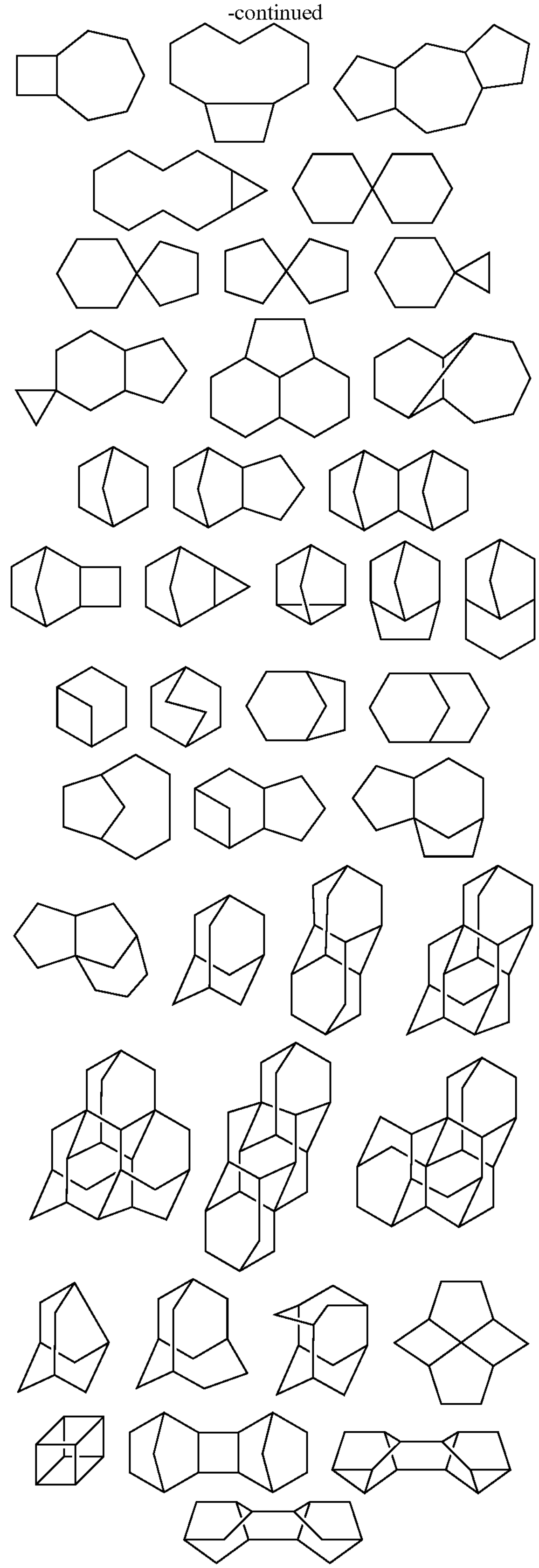

For example, when $R_1$ and/or $R_2$ are a cycloalkylene group, $R_1$ and/or $R_2$ are preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ and/or $R_2$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom and an alkoxy group.

$L_1$ represents a linking group represented by —COO—, —OCO—, —CONH—, —O—, —Ar—, $—SO_3—$ or $—SO_2NH—$, wherein Ar represents a divalent aromatic ring group. $L_1$ is preferably a linking group represented by —COO—, —CONH— or —Ar—, more preferably a linking group represented by —COO— or —CONH—.

R represents a hydrogen atom or an alkyl group. The alkyl group may be a linear or branched-chain alkyl group. The carbon number of this alkyl group is preferably from 1 to 6, more preferably from 1 to 3. R is preferably a hydrogen atom or a methyl group, more preferably a hydrogen atom.

$R_0$ represents a hydrogen atom or an organic group. Examples of the organic group include an alkyl group, a cycloalkyl group, an aryl group, an alkynyl group and an alkenyl group. $R_0$ is preferably a hydrogen atom or an alkyl group, more preferably a hydrogen atom or a methyl group.

$L_3$ represents a (m+2)-valent linking group. That is, $L_3$ represents a trivalent or higher valent linking group. Examples of such a linking group include corresponding groups in specific examples illustrated later.

$R^L$ represents a (n+1)-valent linking group. That is, $R^L$ represents a divalent or higher valent linking group. Examples of such a linking group include an alkylene group, a cycloalkylene group, and corresponding groups in specific examples illustrated later. $R^L$ may combine with another $R^L$ or with $R^S$ to form a ring structure.

$R^S$ represents a substituent. Examples of the substituent include an alkyl group, an alkenyl group, an alkynyl group, an aryl group, an alkoxy group, an acyloxy group, an alkoxycarbonyl group and a halogen atom.

n is an integer of 1 or more. n is preferably an integer of 1 to 3, more preferably 1 or 2. Also, when n is an integer of 2 or more, the dissolution contrast for an organic solvent-containing developer can be more enhanced and in turn, the limiting resolution and roughness characteristics can be more improved.

m is an integer of 1 or more. m is preferably an integer of 1 to 3, more preferably 1 or 2.

l an integer of 0 or more. l is preferably 0 or 1.

p is an integer of 0 to 3.

Specific examples of the repeating unit having a group capable of decomposing by the action of an acid to produce an alcoholic hydroxy group are illustrated below. In specific examples, Ra and OP have the same meanings as in formulae (I-1) to (I-3). In the case where a plurality of OP's are combined to form a ring, the corresponding ring structure is conveniently denoted by "O—P—O".

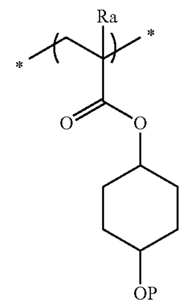
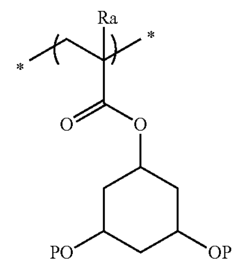
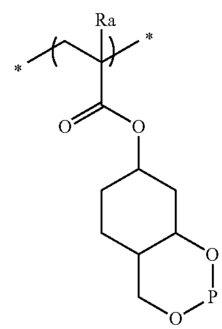
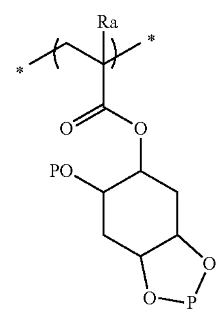
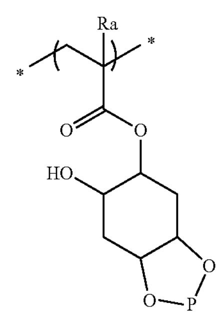
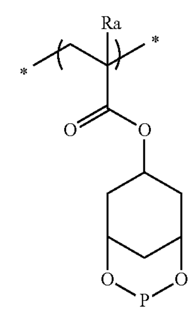
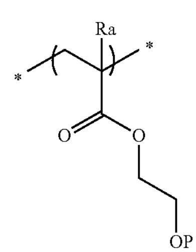
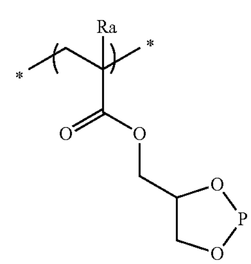
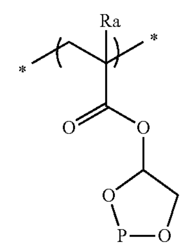
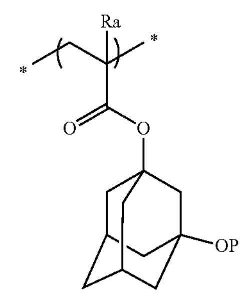

-continued
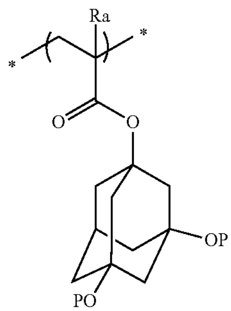
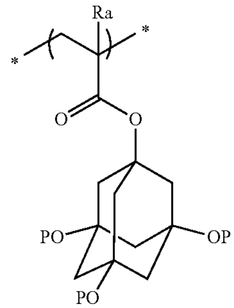
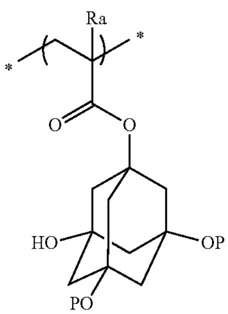
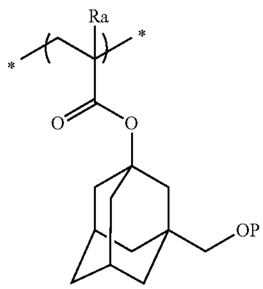
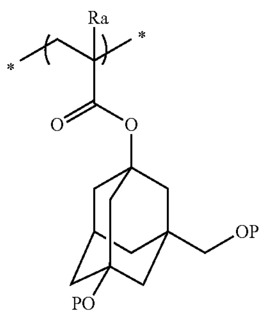
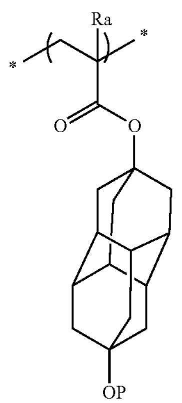
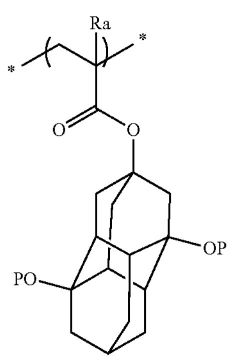
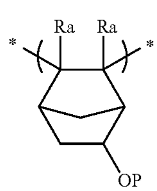
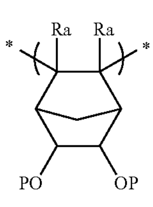
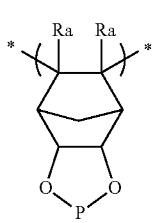
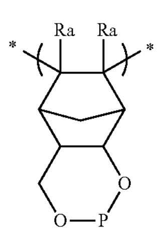
-continued
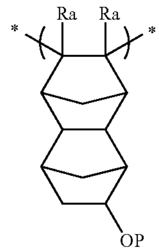
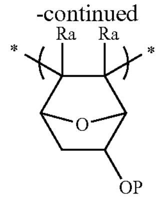
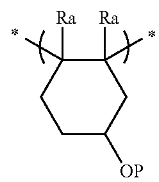
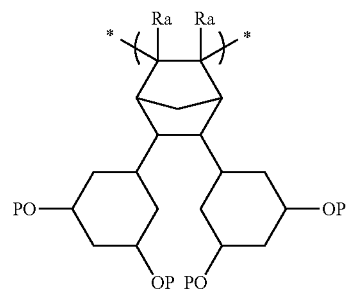
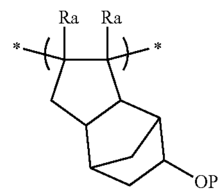
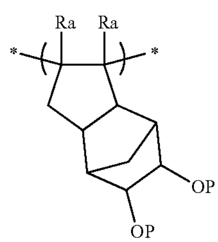
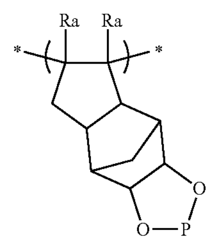
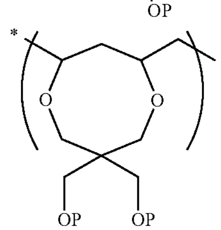
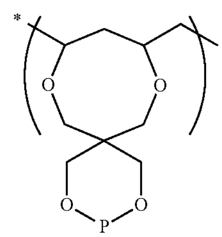
The group capable of decomposing by the action of an acid to produce an alcoholic hydroxy group is preferably represented by at least one formula selected from the group consisting of the following formulae (II-1) to (II-4):
(II-1)
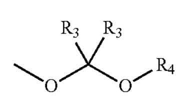
(II-2)
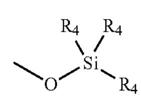
(II-3)
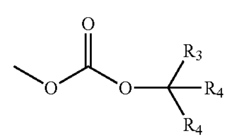
(II-4)
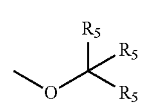

In the formulae, each $R_3$ independently represents a hydrogen atom or a monovalent organic group. $R_3$s may combine with each other to form a ring.

Each $R_4$ independently represents a monovalent organic group. $R_4$s may combine with each other to form a ring. $R_3$ and $R_4$ may combine with each other to form a ring.

Each $R_5$ independently represents a hydrogen atom, an alkyl group, a cycloalkyl group, an aryl group, an alkenyl group or an alkynyl group. At least two $R_5$s may combine with each other to form a ring, provided that when one or two of three $R_5$s are a hydrogen atom, at least one of the remaining $R_5$s represents an aryl group, an alkenyl group or an alkynyl group.

The group capable of decomposing by the action of an acid to produce an alcoholic hydroxy group is also preferably represented by at least one formula selected from the group consisting of the following formulae (II-5) to (II-9):

(II-5)

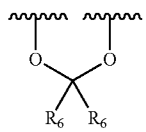

(II-6)

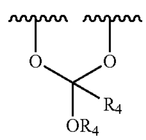

(II-7)

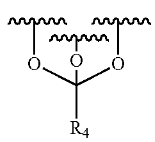

(II-8)

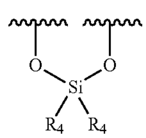

(II-9)

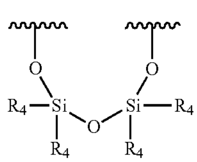

In the formulae, $R_4$ has the same meaning as in formulae (II-1) to (II-3).

Each $R_6$ independently represents a hydrogen atom or a monovalent organic group. $R_6$s may combine with each other to form a ring.

The group capable of decomposing by the action of an acid to produce an alcoholic hydroxy group is more preferably represented by at least one formula selected from formulae (II-1) to (II-3), still more preferably represented by formula (II-1) or (II-3), yet still more preferably represented by formula (II-1).

$R_3$ represents a hydrogen atom or a monovalent organic group as described above. $R_3$ is preferably a hydrogen atom, an alkyl group or a cycloalkyl group, more preferably a hydrogen atom or an alkyl group.

The alkyl group of $R_3$ may be a linear or branched-chain alkyl group. The carbon number of the alkyl group of $R_3$ is preferably from 1 to 10, more preferably from 1 to 3. Examples of the alkyl group of $R_3$ include a methyl group, an ethyl group, an n-propyl group, an isopropyl group and an n-butyl group.

The cycloalkyl group of $R_3$ may be monocyclic or polycyclic. The carbon number of the cycloalkyl group of $R_3$ is preferably from 3 to 10, more preferably from 4 to 8. Examples of the cycloalkyl group of $R_3$ include a cyclopropyl group, a cyclobutyl group, a cyclopentyl group, a cyclohexyl group, a norbornyl group and an adamantyl group.

In formula (II-1), at least either one $R_3$ is preferably a monovalent organic group. When such a configuration is employed, particularly high sensitivity can be achieved.

$R_4$ represents a monovalent organic group. $R_4$ is preferably an alkyl group or a cycloalkyl group, more preferably an alkyl group. These alkyl group and cycloalkyl group may have a substituent.

The alkyl group of $R_4$ preferably has no substituent or has one or more aryl groups and/or one or more silyl groups as the substituent. The carbon number of the unsubstituted alkyl group is preferably from 1 to 20. The carbon number of the alkyl group moiety in the alkyl group substituted with one or more aryl groups is preferably from 1 to 25. The carbon number of the alkyl group moiety in the alkyl group substituted with one or more silyl groups is preferably from 1 to 30. Also, in the case where the cycloalkyl group of $R_4$ does not have a substituent, the carbon number thereof is preferably from 3 to 20.

$R_5$ represents a hydrogen atom, an alkyl group, a cycloalkyl group, an aryl group, an alkenyl group or an alkynyl group. However, when one or two of three $R_5$s are a hydrogen atom, at least one of the remaining $R_5$s represents an aryl group, an alkenyl group or an alkynyl group. $R_5$ is preferably a hydrogen atom or an alkyl group. The alkyl group may or may not have a substituent. When the alkyl group does not have a substituent, the carbon number thereof is preferably from 1 to 6, more preferably from 1 to 3.

$R_6$ represents a hydrogen atom or a monovalent organic group as described above. $R_6$ is preferably a hydrogen atom, an alkyl group or a cycloalkyl group, more preferably a hydrogen atom or an alkyl group, still more preferably a hydrogen atom or an alkyl group having no substituent. $R_6$ is preferably a hydrogen atom or an alkyl group having a carbon number of 1 to 10, more preferably a hydrogen atom or an alkyl group having a carbon number of 1 to 10 and having no substituent.

Examples of the alkyl group and cycloalkyl group of $R_4$, $R_5$ and $R_6$ are the same as those described for $R_3$ above.

Specific examples of the group capable of decomposing by the action of an acid to produce an alcoholic hydroxyl group are illustrated below.

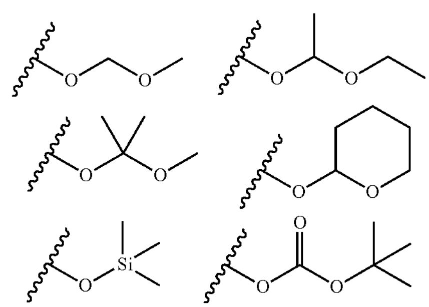

-continued
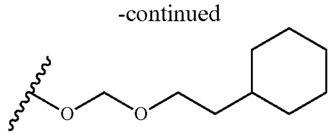
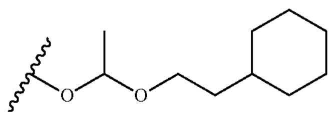
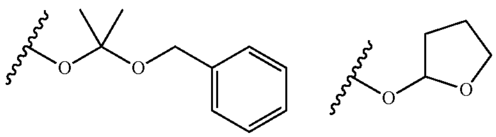
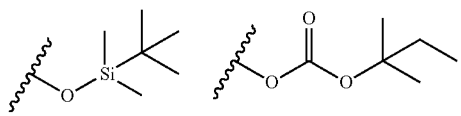
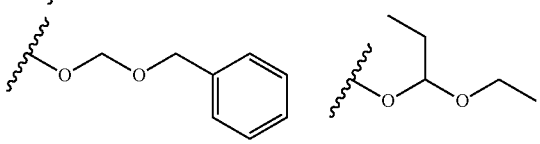
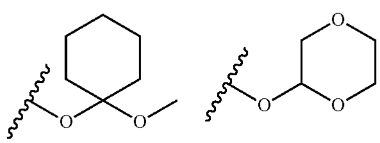
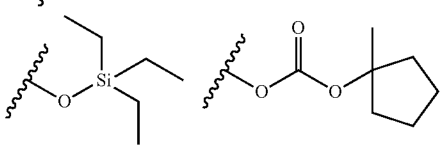
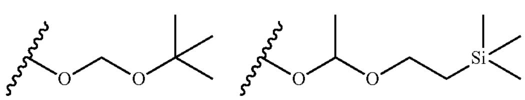
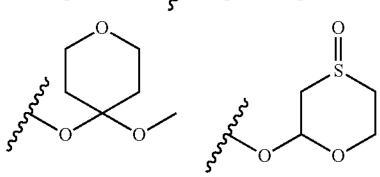
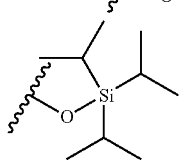
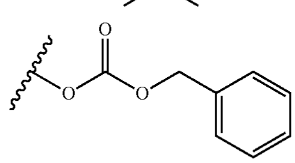
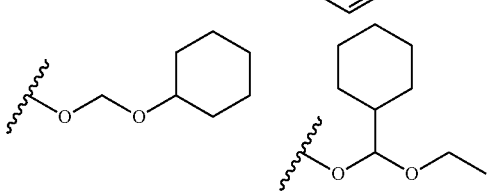
-continued
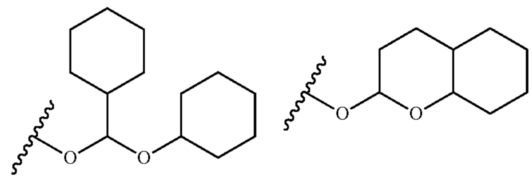
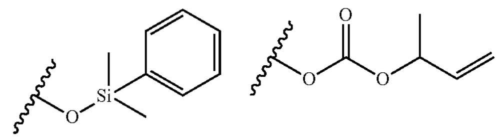
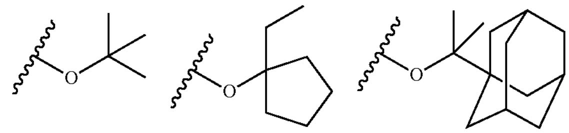
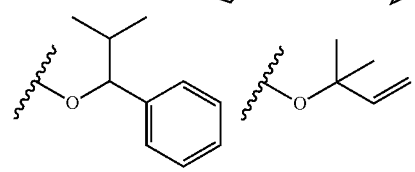
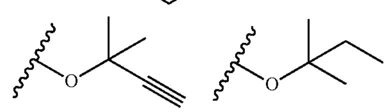
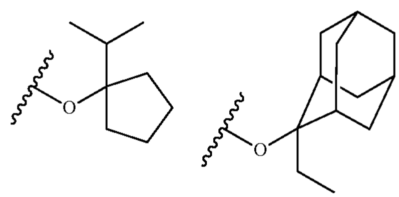
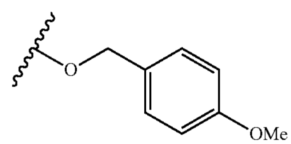
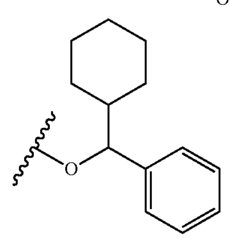
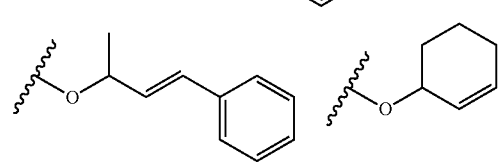
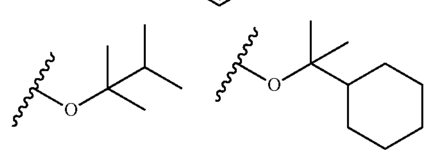
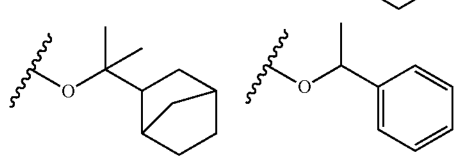

-continued
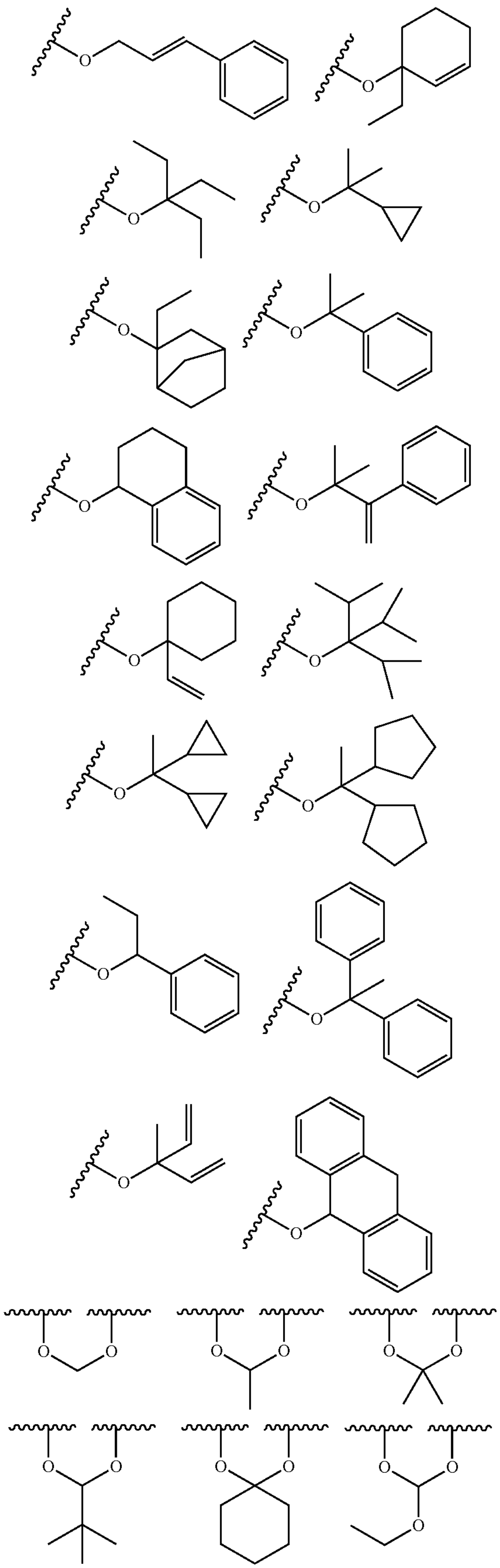
-continued
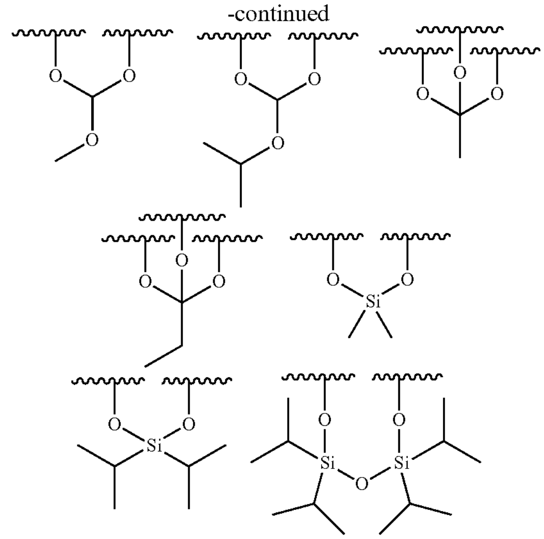
Specific examples of the repeating unit having a group capable of decomposing by the action of an acid to produce an alcoholic hydroxy group are illustrated below. In specific examples, $Xa_1$ represents a hydrogen atom, $CH_3$, $CF_3$ or $CH_2OH$.
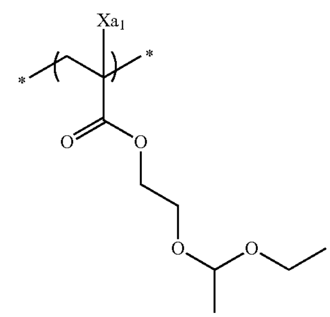
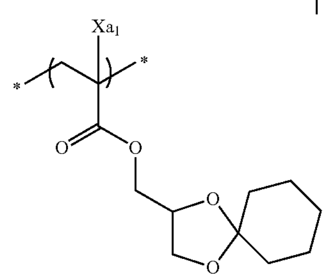
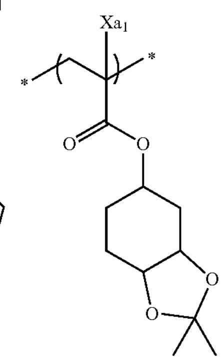
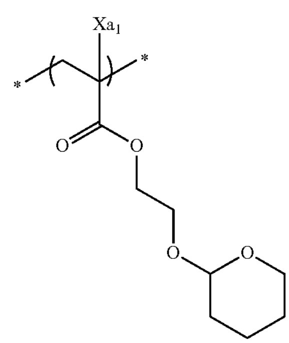

-continued
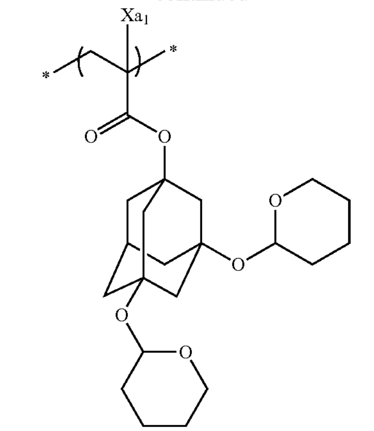
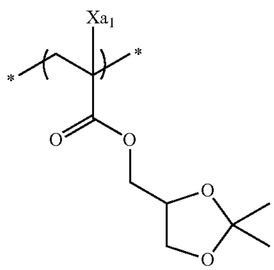
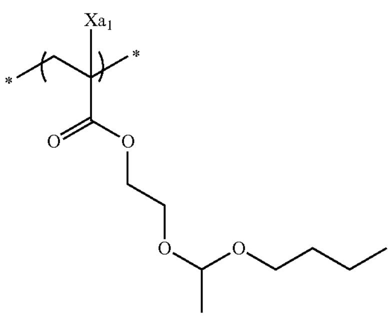
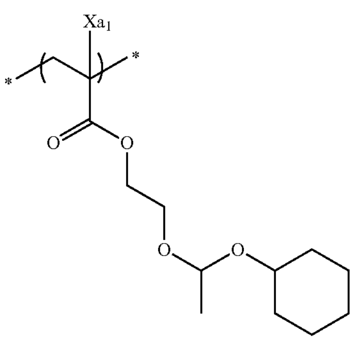
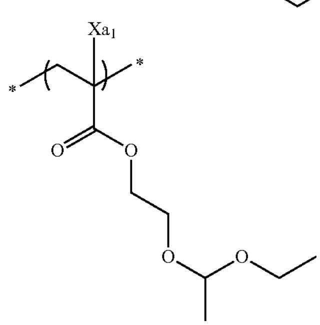
-continued
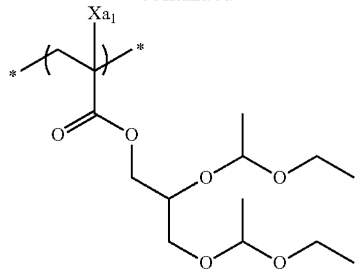
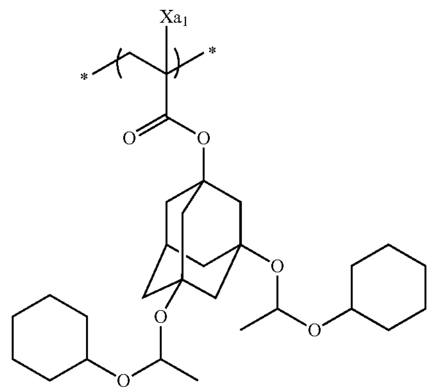
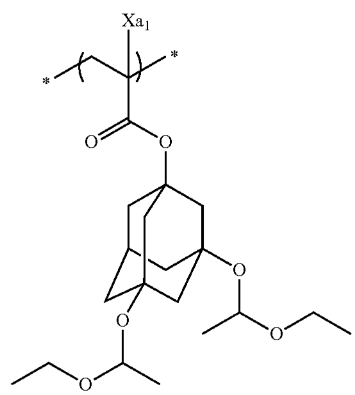
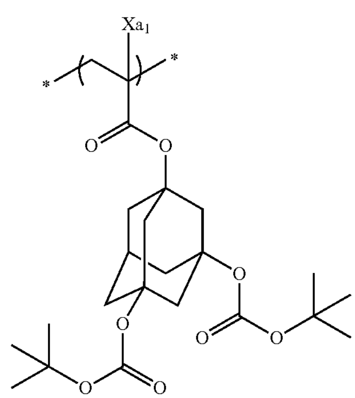

-continued

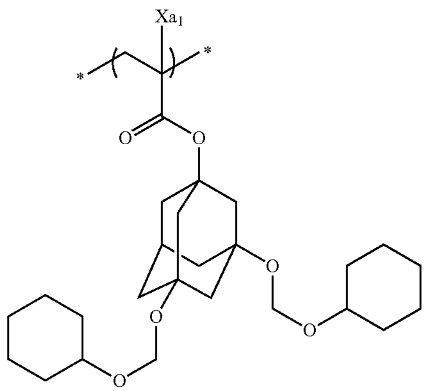

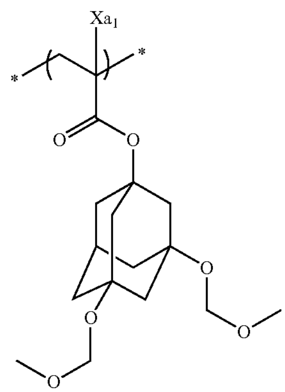

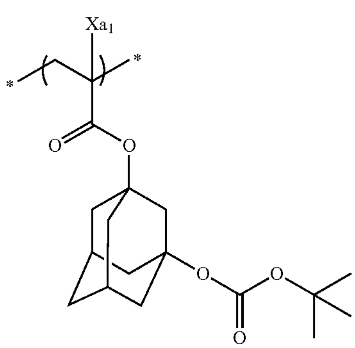

The resin (A) may contain two or more kinds of repeating units (R3) having a group capable of decomposing by the action of an acid to produce an alcoholic hydroxyl group. When such a configuration is employed, the reactivity and/or developability can be finely adjusted and various performance can be easily optimized.

In the case where the resin (A) contains the repeating unit (R3), the content as the total thereof is preferably from 10 to 99 mol %, more preferably from 30 to 90 mol %, still more preferably from 50 to 80 mol %, based on all repeating units in the resin (A).

In addition, specific examples of the repeating unit having an acid-decomposable group also include repeating units illustrated below.

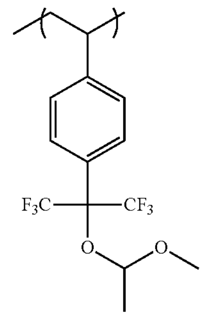

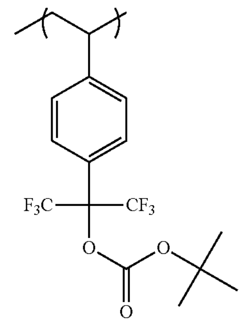

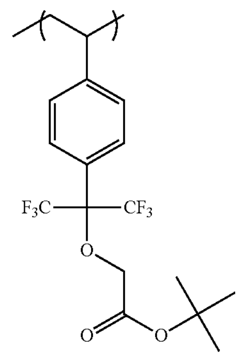

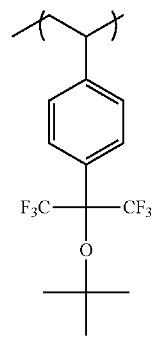

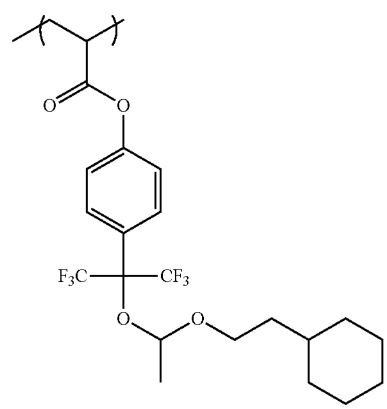

The content of the repeating unit having an acid-decomposable group is preferably from 10 to 99 mol %, more preferably from 20 to 90 mol %, still more preferably from 30 to 80 mol %, based on all repeating units in the resin (A).

[3] Other Repeating Units

The resin (A) may further contain other repeating units. Such a repeating unit includes, for example, the following repeating units (3A), (3B) and (3C).

(3A) Repeating unit having a polar group

The resin (A) may further contain (3A) a repeating unit having a polar group. By containing this repeating unit, for example, the sensitivity of the composition containing the resin (A) can be more enhanced.

The "polar group" which can be contained in the repeating unit (3A) includes, for example, the following (1) to (4). In the following, the "electronegativity" means a Pauling's value.

(1) a Functional Group Containing a Structure where an Oxygen Atom and an Atom with the Electronegativity Difference from Oxygen Atom being 1.1 or More are Bonded Through a Single Bond Examples of this polar group include a group containing a structure represented by O—H, such as hydroxy group.

(2) A Functional Group Containing a Structure where a Nitrogen Atom and an Atom with the Electronegativity Difference from Nitrogen Atom being 0.6 or More are Bonded Through a Single Bond Examples of this polar group include a group containing a structure represented by N—H, such as amino group.

(3) A Functional Group Containing a Structure where Two Atoms Differing in the Electronegativity by 0.5 or More are Bonded Through a Double Bond or a Triple Bond Examples of this polar group include a group containing a structure represented by C═N, C═O, N═O, S═O or C≡N.

(4) A Functional Group Having an Ionic Moiety

Examples of this polar group include a group having a moiety represented by $N^+$ or $S^+$.

The "polar group" which can be contained in the repeating unit (3A) is, for example, at least one selected from the group consisting of (I) a hydroxy group, (II) a cyano group, (III) a lactone group, (IV) a carboxylic acid group or a sulfonic acid group, (V) an amide group, a sulfonamide group or a group corresponding to a derivative thereof, (VI) an ammonium group or a sulfonium group, and a group formed by combining two or more thereof In particular, the polar group is preferably an alcoholic hydroxy group, a cyano group, a lactone group, or a group containing a cyanolactone structure.

When a repeating unit having an alcoholic hydroxy group is further incorporated into the resin (A), the exposure latitude (EL) of a composition containing the resin (A) can be more enhanced.

When a repeating unit having a cyano group is further incorporated into the resin (A), the sensitivity of a composition containing the resin (A) can be more enhanced.

When a repeating unit having a lactone group is further incorporated into the resin (A), the dissolution contrast for an organic solvent-containing developer can be more enhanced. Also, when the repeating unit is incorporated, a composition containing the resin (A) can be more improved in the dry etching resistance, coatability and adherence to substrate.

When a repeating unit having a group containing a cyano group-containing lactone structure is further incorporated into the resin (A), the dissolution contrast for an organic solvent-containing developer can be more enhanced. Also, when the repeating unit is incorporated, a composition containing the resin (A) can be more improved in the sensitivity, dry etching resistance, coatability and adherence to substrate. In addition, when the repeating unit is incorporated, a single repeating unit can play functions attributable to a cyano group and a lactone group, respectively, and the latitude in designing the resin (A) can be more broadened.

Specific examples of the structure which can be contained in the "polar group" are illustrated below. In the following specific examples, $X^-$ indicates a counter anion.

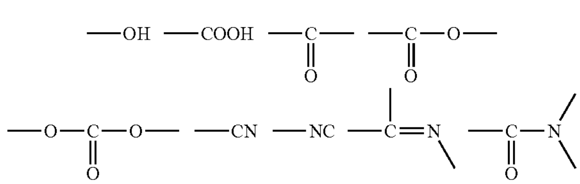

-continued

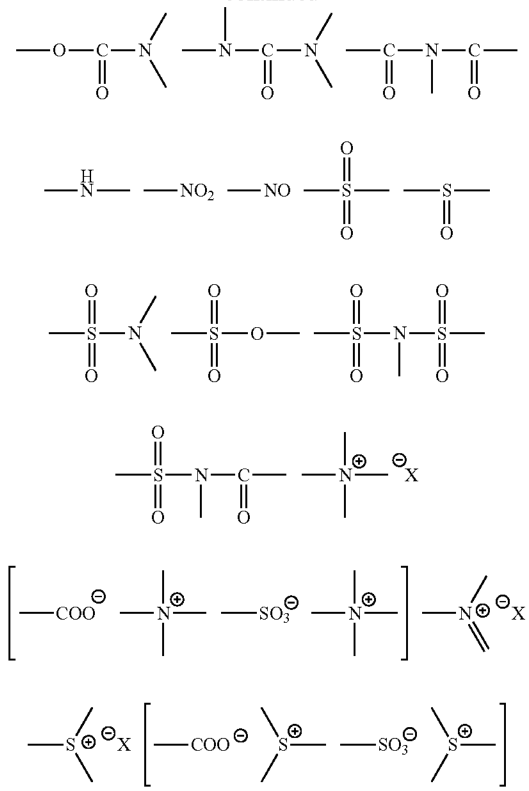

The preferred repeating unit (3A) includes, for example, a repeating unit where in the repeating unit (R2), "a group capable of decomposing by the action of an acid to produce an alcoholic hydroxy group" is replaced by "an alcoholic hydroxy group".

This repeating unit (3A) preferably has a structure where in each of formulae (I-1) to (I-10), "OP" is replaced by "OH". That is, the repeating unit is preferably represented by at least one formula selected from the group consisting of the following formulae (I-1H) to (I-10H). In particular, the repeating unit (3A) is more preferably represented by at least one formula selected from the group consisting of the following formulae (I-1H) to (I-3H), still more preferably represented by the following formula (I-1H).

(I-1H)

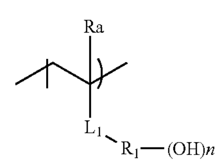

(I-2H)

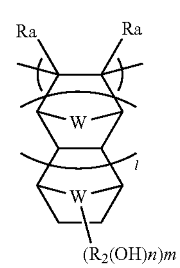

-continued (I-3H)

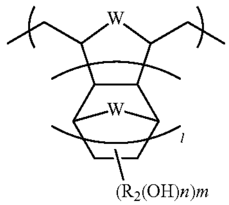

(I-4H)

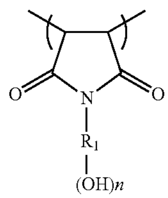

(I-5H)

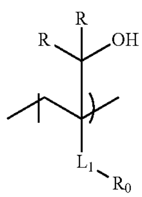

(I-6H)

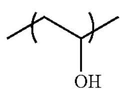

(I-7H)

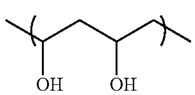

(I-8H)

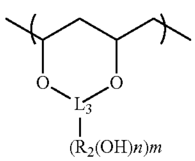

(I-9H)

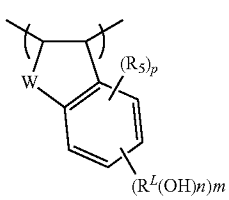

(I-10H)

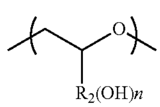

In the formulae, Ra, $R_1$, $R_2$, W, n, m, l, $L_1$, R, $R_0$, $L_3$, $R^L$, $R^S$ and p have the same meanings as in formulae (I-1) to (I-10).

When a repeating unit having a group capable of decomposing by the action of an acid to produce an alcoholic hydroxy group and a repeating unit represented by at least one formula selected from the group consisting of formulae (I-1H) to (I-10H) are used in combination, for example, thanks to suppression of acid diffusion by the alcoholic hydroxy group and increase in the sensitivity by the group capable of decomposing by the action of an acid to produce an alcoholic hydroxy group, the exposure latitude (EL) can be improved without deteriorating other performances.

The content of the repeating unit (A) where in the repeating unit (R2), "a group capable of decomposing by the action of an acid to produce an alcoholic hydroxy group" is replaced by "an alcoholic hydroxy group", is preferably from 5 to 99 mol %, more preferably from 10 to 90 mol %, still more preferably from 20 to 80 mol %, based on all repeating units in the resin (A).

Specific examples of the repeating unit represented by any one of formulae (I-1H) to (I-10H) are illustrated below. In specific examples, Ra has the same meaning as in formulae (I-1H) to (I-10H).

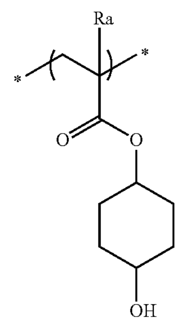

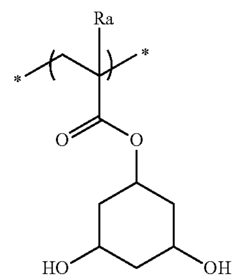

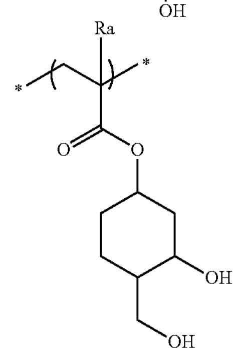

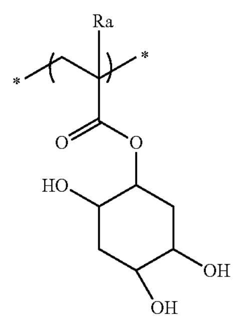

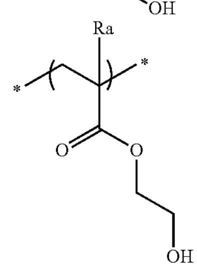

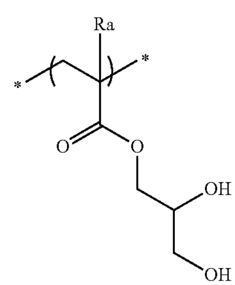

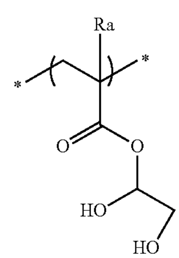

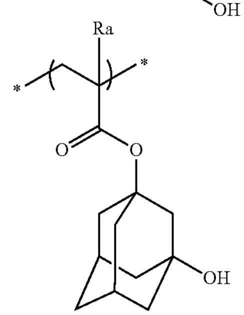

-continued

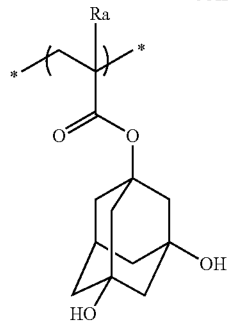

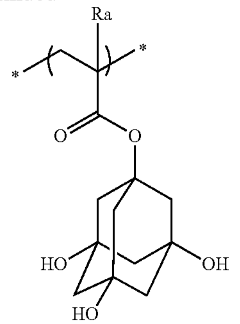

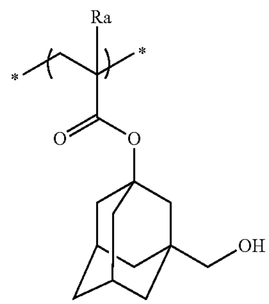

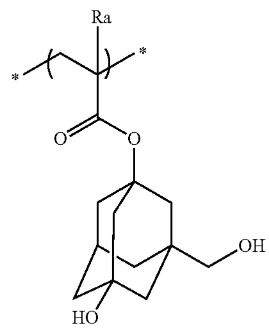

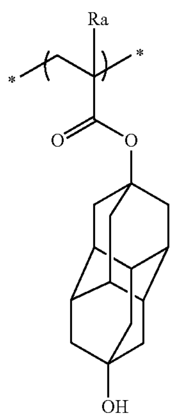

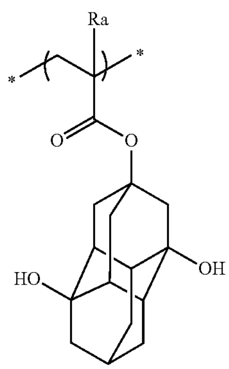

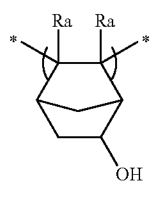

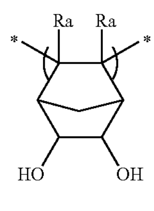

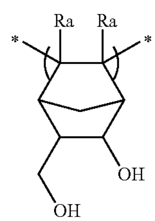

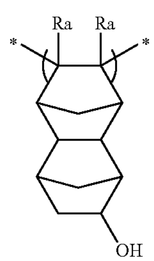

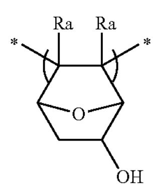

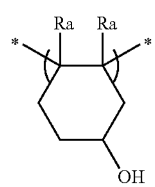

-continued

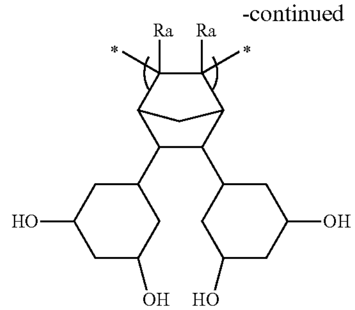

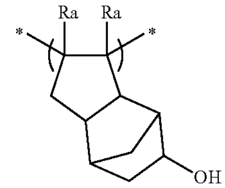

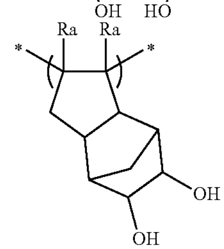

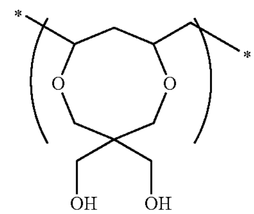

Other preferred examples of the repeating unit (3A) include a repeating unit having a hydroxy group or a cyano group. Thanks to this repeating unit, adherence to substrate and affinity for developer are enhanced.

The repeating unit having a hydroxy group or a cyano group is preferably a repeating unit having an alicyclic hydrocarbon structure substituted with a hydroxy group or a cyano group and preferably has no acid-decomposable group. The alicyclic hydrocarbon structure in the alicyclic hydrocarbon structure substituted with a hydroxy group or a cyano group is preferably an adamantyl group, a diamantyl group or a norbornane group. The alicyclic hydrocarbon structure substituted with a hydroxy group or a cyano group is preferably a partial structure represented by the following formulae (VIIa) to (VIId):

(VIIa)

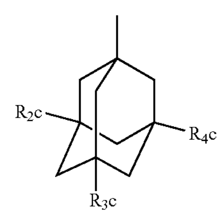

(VIIb)

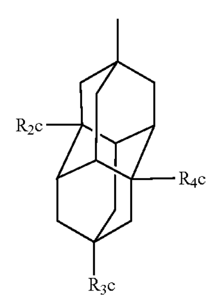

(VIIc)

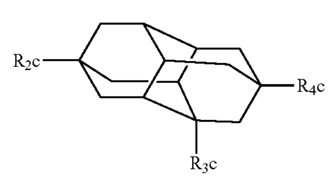

-continued (VIId)

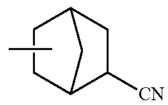

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxy group with the remaining being a hydrogen atom is preferred. In formula (Vila), it is more preferred that two members out of $R_2c$ to $R_4c$ are a hydroxy group and the remaining is a hydrogen atom.

The repeating unit having a partial structure represented by formulae (VIIa) to (VIId) includes repeating units represented by the following formulae (AIIa) to (AIId):

(AIIa)

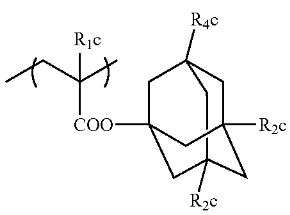

(AIIb)

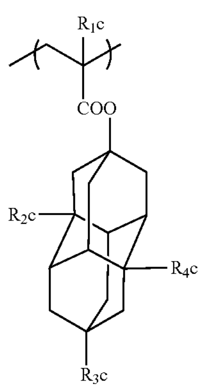

(AIIc)

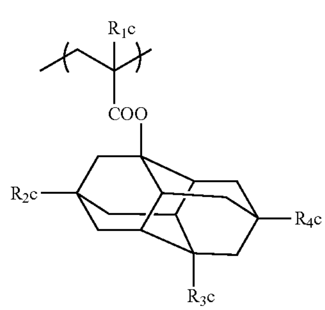

(AIId)

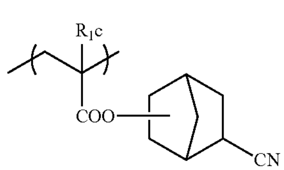

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having a hydroxy group or a cyano group is preferably from 5 to 70 mol %, more preferably from 5 to 60 mol %, still more preferably from 10 to 50 mol %, based on all repeating units in the resin (A).

Specific examples of the repeating unit having a hydroxy group or a cyano group are illustrated below, but the present invention is not limited thereto.

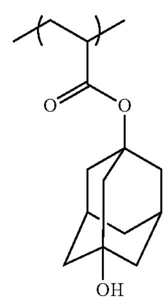

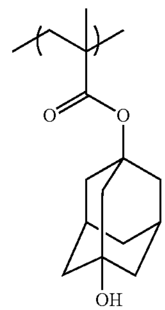

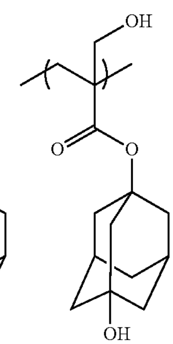

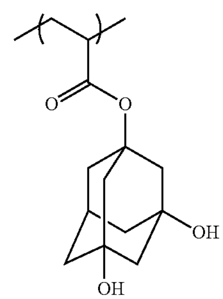

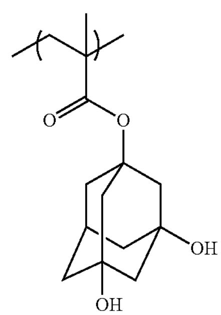

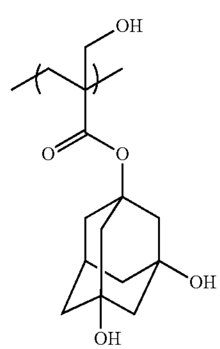

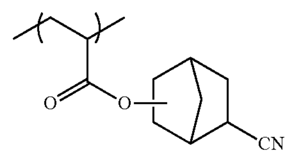

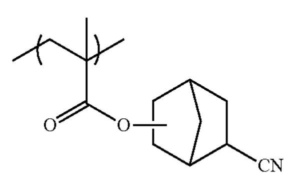

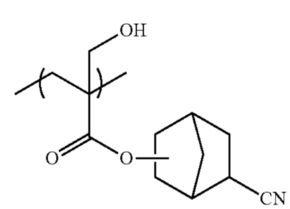

-continued

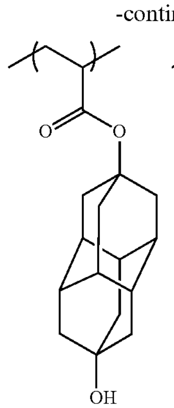
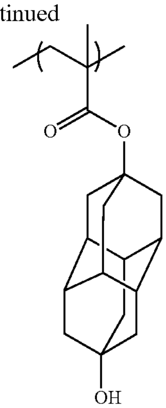
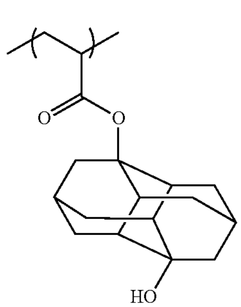
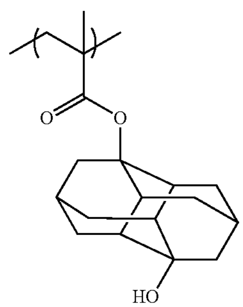

Other preferred examples of the repeating unit (3A) include a repeating unit having a lactone structure.

The repeating unit having a lactone structure is more preferably a repeating unit represented by the following formula (AII):

(AII)

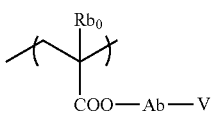

In formula (AII), $Rb_0$ represents a hydrogen atom, a halogen atom or an alkyl group (preferably having a carbon number of 1 to 4) which may have a substituent.

Preferred examples of the substituent which the alkyl group of $Rb_0$ may have include a hydroxyl group and a halogen atom. The halogen atom of $Rb_0$ includes fluorine atom, chlorine atom, bromine atom and iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by a combination thereof. Ab is preferably a single bond or a divalent linking group represented by $-Ab_1-CO_2-$.

$Ab_1$ is a linear or branched alkylene group or a monocyclic or polycyclic cycloalkylene group, preferably a methylene group, an ethylene group, a cyclohexylene group, an adamantylene group or a norbornylene group.

V represents a group having a lactone structure.

As the group having a lactone structure, any group may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-8), (LC1-13) and (LC1-14).

LC1-1

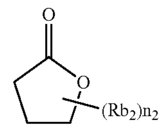

LC1-2

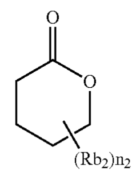

LC1-3

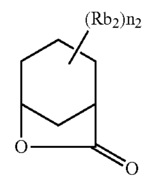

LC1-4

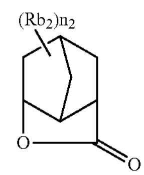

LC1-5

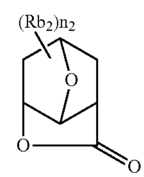

LC1-6

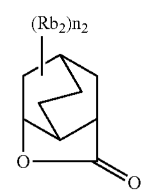

LC1-7

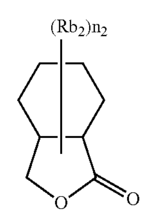

LC1-8

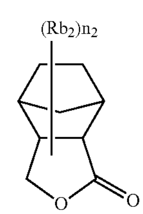

-continued

LC1-9

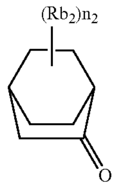

LC1-10

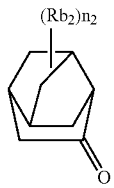

LC1-11

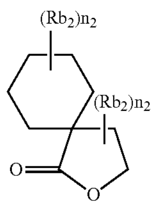

LC1-12

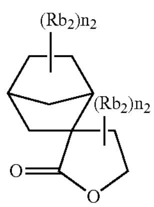

LC1-13

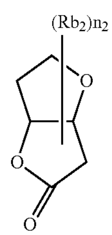

LC1-14

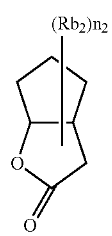

LC1-15

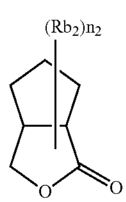

LC1-16

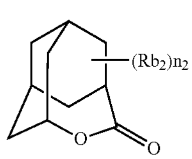

-continued

LC1-17

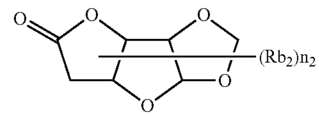

The lactone structure moiety may or may not have a substituent ($Rb_2$). Preferred examples of the substituent ($Rb_2$) include an alkyl group having a carbon number of 1 to 8, a monovalent cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is 2 or more, each substituent ($Rb_2$) may be the same as or different from every other substituents ($Rb_2$) and also, the plurality of substituents ($Rb_2$) may combine together to form a ring.

The repeating unit having a lactone group usually has an optical isomer, and any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The resin (A) may or may not contain the repeating unit having a lactone structure, but in the case of containing the repeating unit having a lactone structure, the content of the repeating unit in the resin (A) is preferably from 1 to 70 mol %, more preferably from 3 to 65 mol %, still more preferably from 5 to 60 mol %, based on all repeating units.

Specific examples of the repeating unit having a lactone structure in the resin (A) are illustrated below, but the present invention is not limited thereto. In the formulae, Rx represents H, $CH_3$, $CH_2OH$ or $CF_3$.

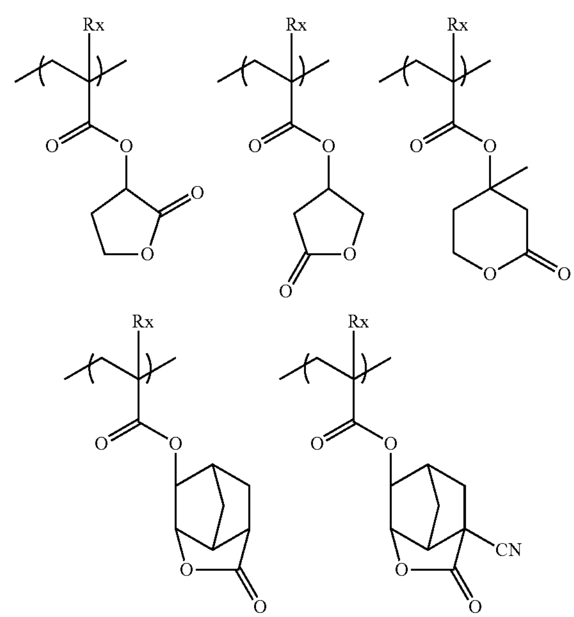

-continued

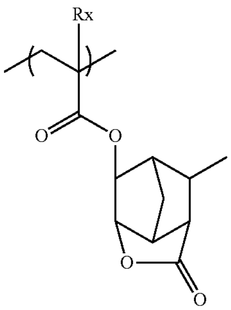

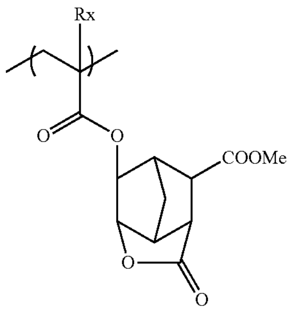

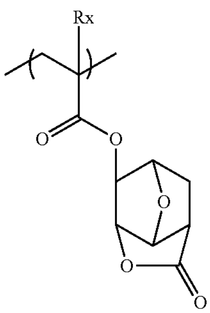

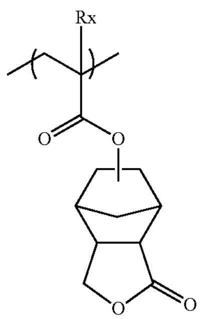

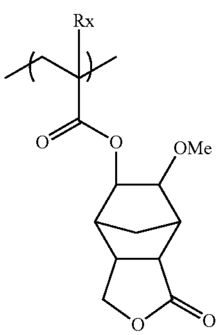

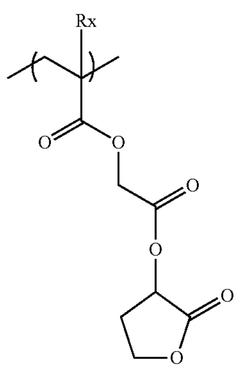

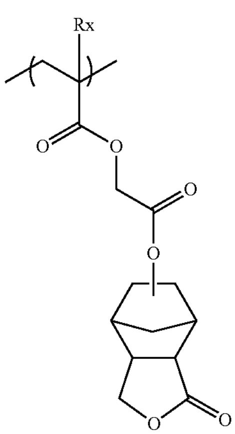

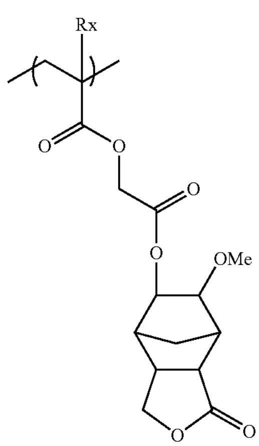

-continued

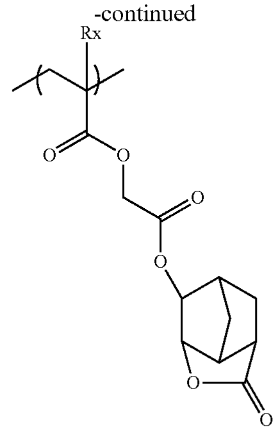

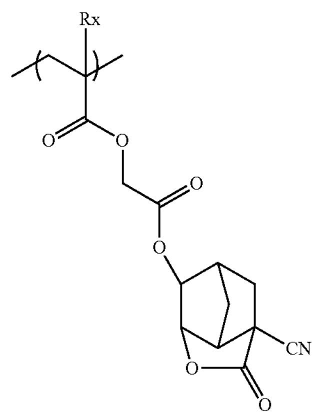

Other preferred examples of the repeating unit (3A) include a repeating unit having an acid group such as phenolic hydroxyl group, carboxylic acid group, sulfonic acid group, fluorinated alcohol group (for example, hexafluoroisopropanol group), sulfonamide group, sulfonylimide group, (alkylsulfonyl)(alkylcarbonyl)methylene group, (alkylsulfonyl)(alkylcarbonyl)imide group, bis(alkylcarbonyl)methylene group, bis(alkylcarbonyl)imide group, bis(alkylsulfonyl)methylene group, bis(alkylsulfonyl)imide group, tris(alkylcarbonyl)methylene group and tris(alkylsulfonyl)methylene group. It is more preferred for this repeating unit (3A) to have a carboxy group, and suitable examples include a repeating unit derived from a methacrylic acid, a repeating unit derived from an acrylic acid, a repeating unit having a carboxy group through a linking group, and repeating units illustrated below.

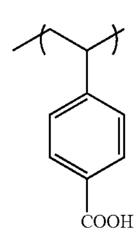

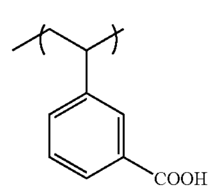

By virtue of containing a repeating unit having the group above, the resolution increases in usage of forming contact holes. As this repeating unit (3A), all of a repeating unit where the group is directly bonded to the main chain of the resin (A), such as repeating unit by an acrylic acid or a methacrylic acid, a repeating unit where the group is bonded to the main chain of the resin (A) through a linking group, and a repeating unit where the group is introduced into the polymer chain terminal by using a polymerization initiator or chain transfer agent having the group at the polymerization, are preferred. The linking group may have a monocyclic or polycyclic hydrocarbon structure. In particular, a repeating unit derived from an acrylic acid or a methacrylic acid is preferred.

Specific examples of the repeating unit having the group above are illustrated below, but the present invention is not limited thereto.

In specific examples, Rx represents H, $CH_3$, $CH_2OH$ or $CF_3$

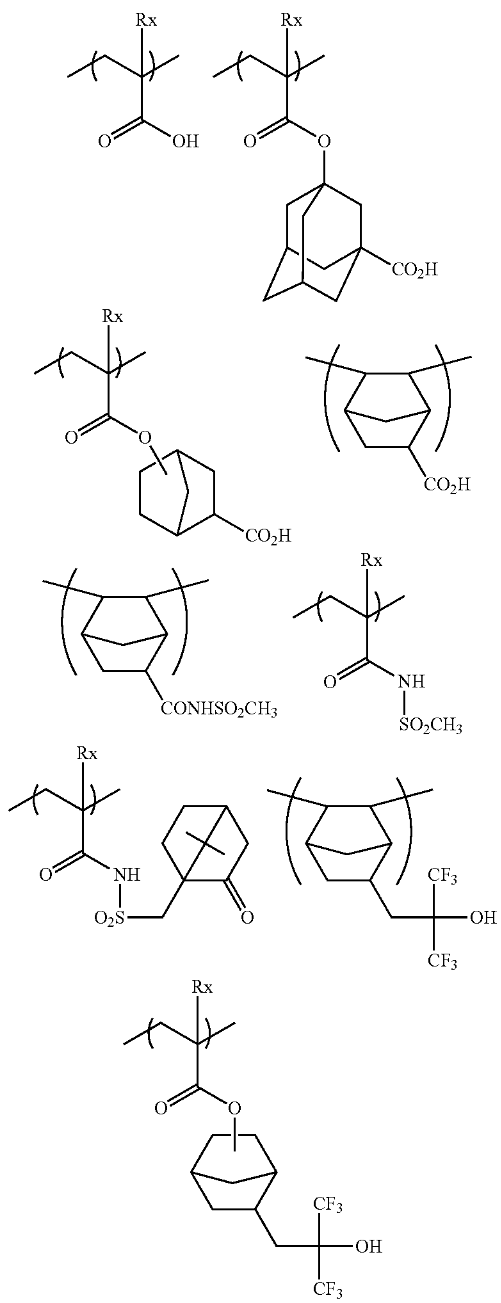

-continued

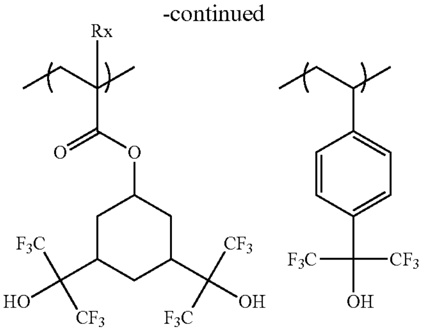

The repeating unit having a phenolic hydroxyl group includes a repeating unit represented by the following formula (I):

(I)

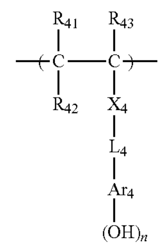

In the formula, each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ to form a ring and in this case, $R_{42}$ represents a single bond or an alkylene group.

$X_4$ represents a single bond, —COO— or —$CONR_{64}$—, and $R_{64}$ represents a hydrogen atom or an alkyl group.

$L_4$ represents a single bond or an alkylene group.

$Ar_4$ represents a (n+1)-valent aromatic ring group, and in the case of combining with $R_{42}$ to form a ring, $Ar_4$ represents a (n+2)-valent aromatic ring group.

n represents an integer of 1 to 4.

Specific examples of the alkyl group, cycloalkyl group, halogen atom and alkoxycarbonyl group of $R_{41}$, $R_{42}$ and $R_{43}$ in formula (I) and the substituent which these groups may have are the same as specific examples described above for respective groups represented by $R_{51}$, $R_{52}$ and $R_{53}$ in formula (V).

$Ar_4$ represents a (n+1)-valent aromatic ring group. The divalent aromatic ring group when n is 1 may have a substituent, and preferred examples of the divalent aromatic ring group include an arylene group having a carbon number of 6 to 18, such as phenylene group, tolylene group, naphthylene group and anthracenylene group, and an aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific preferred examples of the (n+1)-valent aromatic ring group when n is an integer of 2 or more include groups formed by removing arbitrary (n−1) hydrogen atoms from the above-described specific examples of the divalent aromatic ring group.

The (n+1)-valent aromatic ring group may further have a substituent.

Examples of the substituent which the above-described alkyl group, cycloalkyl group, alkoxycarbonyl group, alkylene group and (n+1)-valent aromatic ring group may have include the alkyl group described for $R_{51}$ to $R_{53}$ in formula (V), an alkoxy group such as methoxy group, ethoxy group, hydroxyethoxy group, propoxy group, hydroxypropoxy group and butoxy group, and an aryl group such as phenyl group.

Examples of the alkyl group of $R_{64}$ in —$CONR_{64}$— ($R_{64}$ represents a hydrogen atom or an alkyl group) represented by $X_4$ are the same as those of the alkyl group of $R_{61}$ to $R_{63}$.

$X_4$ is preferably a single bond, —COO— or —CONH—, more preferably a single bond or —COO—.

The alkylene group in $L_4$ is preferably an alkylene group having a carbon number of 1 to 8, such as methylene group, ethylene group, propylene group, butylene group, hexylene group and octylene group, which may have a substituent.

$Ar_4$ is preferably an aromatic ring group having a carbon number of 6 to 18, which may have a substituent, more preferably a benzene ring group, a naphthalene ring group or a biphenylene ring group.

The repeating unit (b) preferably has a hydroxystyrene structure, that is, $Ar_4$ is preferably a benzene ring group.

Specific examples of the repeating unit represented by formula (I) are illustrated below, but the present invention is not limited thereto. In the formulae, a represents 1 or 2.

(B-1)

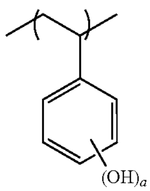

(B-2)

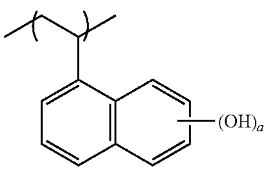

(B-3)

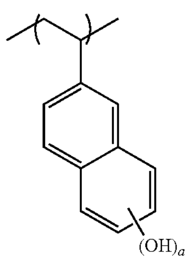

(B-4)

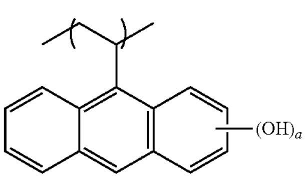

-continued (B-5)

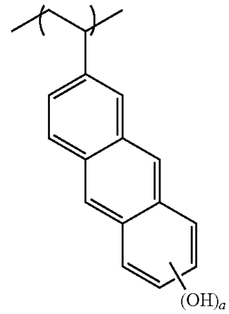

(B-6)

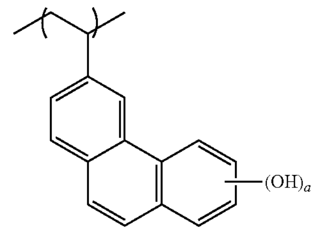

(B-7)

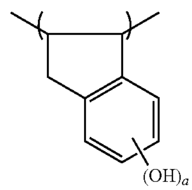

(B-8)

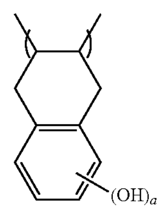

(B-9)

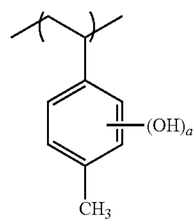

(B-10)

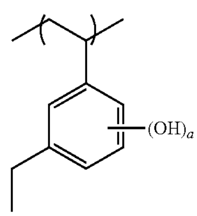

(B-11)

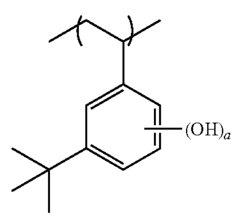

-continued
(B-12)
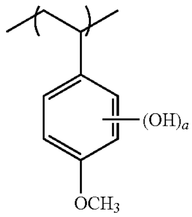
(B-13)
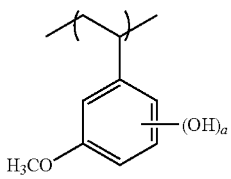
(B-14)
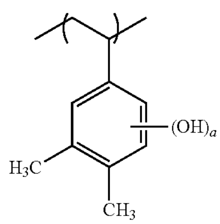
(B-15)
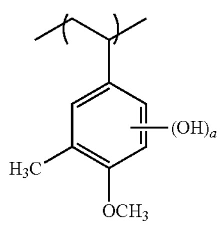
(B-16)
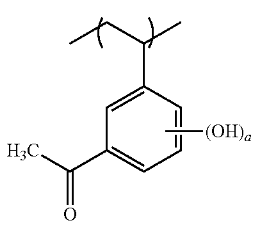
(B-17)
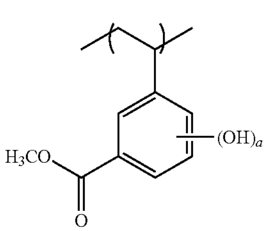
(B-18)
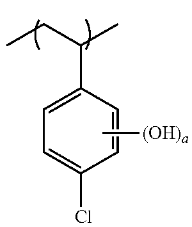
-continued
(B-19)
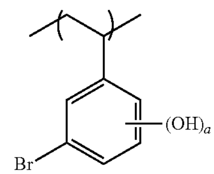
(B-20)
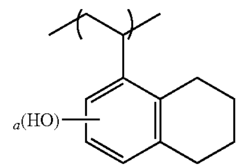
(B-21)
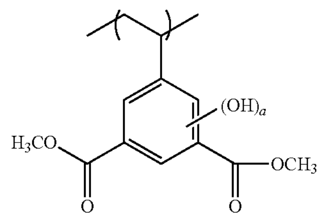
(B-22)
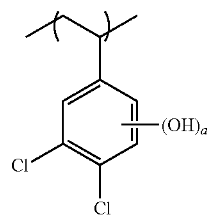
(B-23)
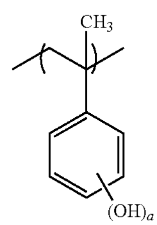
(B-24)
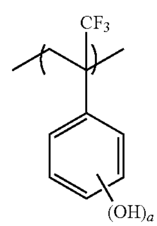
(B-25)
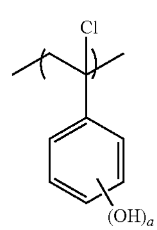

-continued (B-26)

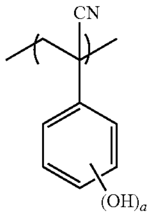

(B-27)

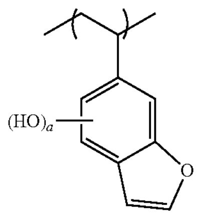

(B-28)

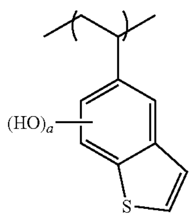

(B-29)

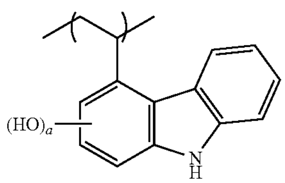

(B-30)

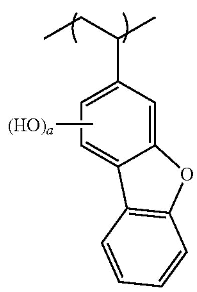

(B-31)

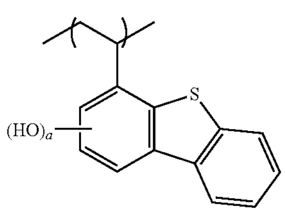

(B-32)

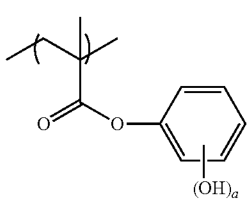

-continued (B-33)

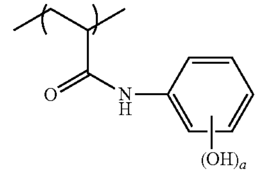

(B-34)

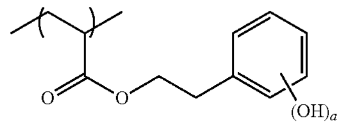

(B-35)

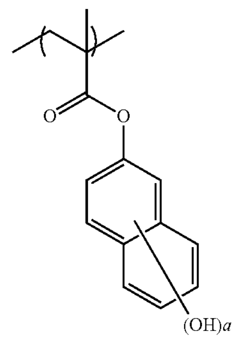

(B-36)

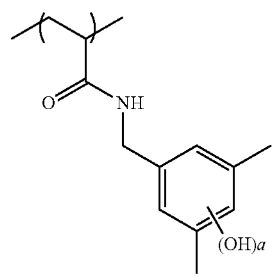

(B-37)

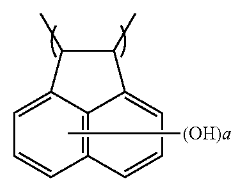

(B-38)

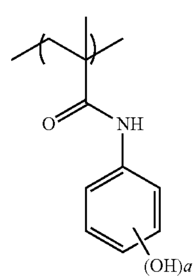

The resin (A) may contain two or more kinds of repeating units (3A).

The resin (A) may or may not contain the repeating unit (3A), but in the case containing the repeating unit (3A), the content thereof is preferably from 1 to 70 mol %, more preferably from 3 to 60 mol %, still more preferably from 5 to 60 mol %, based on all repeating units in the resin (A).

The phenolic hydroxyl group-containing repeating unit like the repeating unit represented by formula (I) tends to increase the solubility of the resin (A) for an organic solvent and in view of resolution, addition of the repeating unit is not preferred in some cases. This tendency emerges more prominently in a repeating unit derived from hydroxystyrenes (that is, in formula (I), when both $X_4$ and $L_4$ are a single bond). The reason therefor is not clearly known but is presumed to be because, for example, a phenolic hydroxyl group is present in the vicinity of the main chain. On this account, in the present invention, the content of the repeating unit represented by formula (I) (preferably the repeating unit represented by formula (I) where both $X_4$ and $L_4$ are a single bond) is preferably 4 mol % or less, more preferably 2 mol % or less, and most preferably 0 mol % (namely, the repeating unit is not contained), based on all repeating units in the resin (A).

(3B) Repeating Unit Having a Polar Group-Free Alicyclic Hydrocarbon Structure and not Exhibiting Acid Decomposability The resin (A) may further contain (3B) a repeating unit having a polar group-free alicyclic hydrocarbon structure and not exhibiting acid decomposability. The repeating unit (3B) includes, for example, a repeating unit represented by formula (IV):

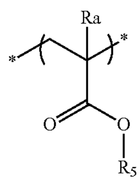

(IV)

In formula (IV), $R_5$ represents a hydrocarbon group having at least one cyclic structure and having neither a hydroxyl group nor a cyano group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,$0^{2,6}$]decanyl group. Among these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain the repeating unit (3B), but in the case of containing the repeating unit (3B), the content thereof is preferably from 1 to 40 mol %, more preferably from 1 to 20 mol %, based on all repeating units in the resin (A).

Specific examples of the repeating unit (3B) are illustrated below, but the present invention is not limited thereto. In the formulae, Ra represents H, $CH_3$, $CH_2OH$ or $CF_3$.

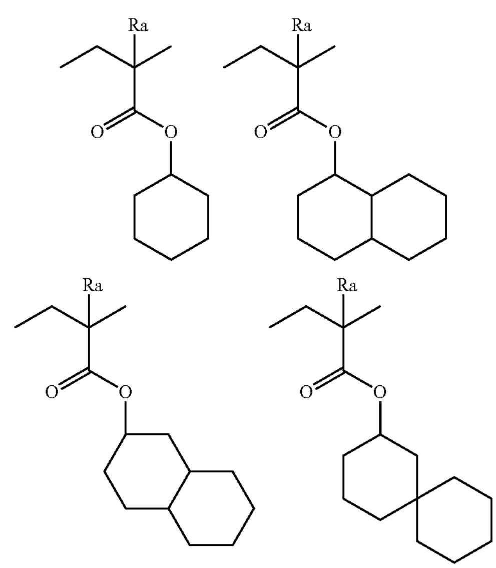

-continued

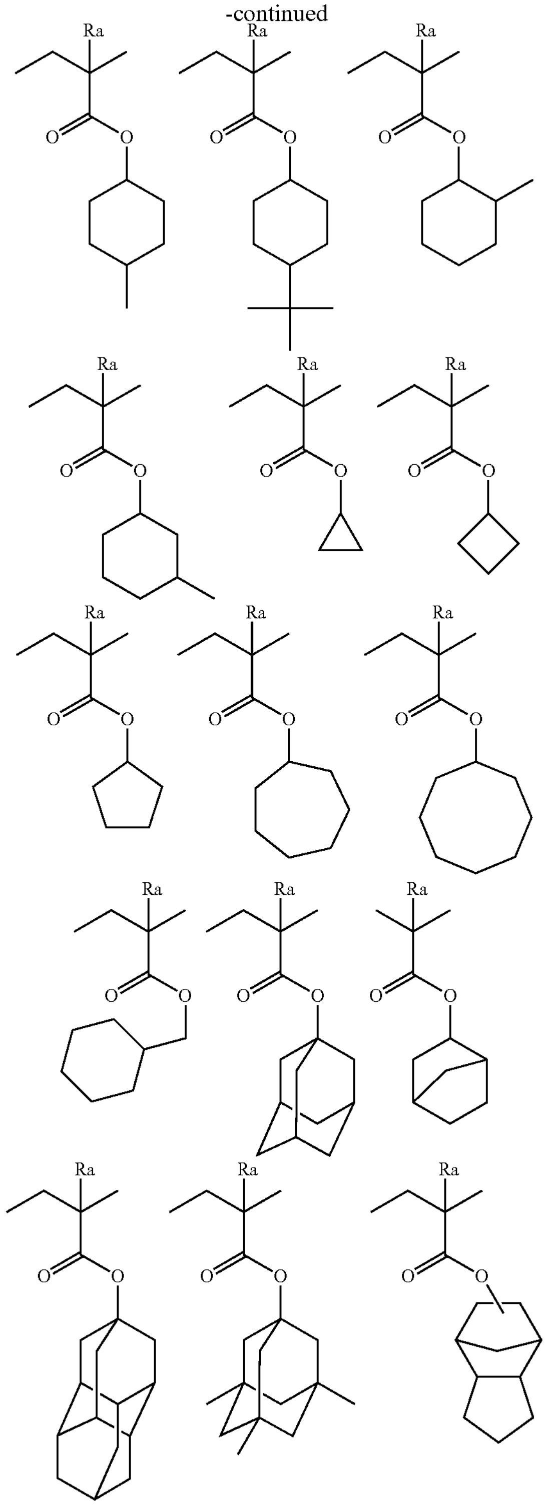

(3C) Other Repeating Units

The resin (A) may contain, in addition to the above-described repeating structural units, various repeating structural units for the purpose of controlling the dry etching resistance, suitability for standard developer, adherence to substrate, resist profile, internal filter characteristics by absorption of out-of-band light (leaked light generated in the ultraviolet region at a wavelength of 100 to 400 nm) of EUV light (hereinafter, sometimes referred to as internal filter characteristics), and properties generally required of a resist, such as resolution, heat resistance and sensitivity.

Examples of such a repeating unit include a repeating unit corresponding to a compound having one addition-polymerizable unsaturated bond selected from acrylic acid esters, methacrylic acid esters, acrylamides, methacrylamides, allyl compounds, vinyl ethers and vinyl esters.

The other repeating units (3C) also include an aromatic ring-containing repeating unit (this repeating unit is different from the repeating unit (R), the repeating unit having an acid-decomposable group, and the repeating unit (3A)).

The resin (A) may or may not contain the other repeating units (3C), but in the case of containing the repeating unit (3C), the content thereof is preferably from 10 to 50 mol %, more preferably from 1 to 40 mol %, based on all repeating units in the resin (A).

Specific examples of the other repeating units (3C) are illustrated below, but the present invention is not limited thereto. In the formulae, Ra represents H, $CH_3$, $CH_2OH$ or $CF_3$.

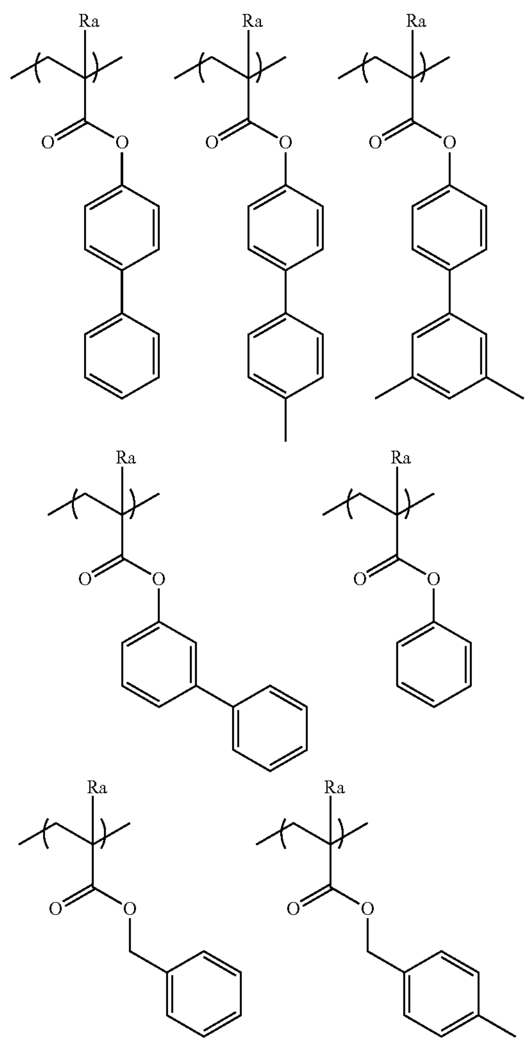

-continued

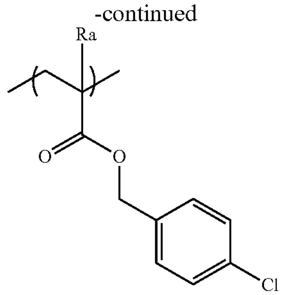

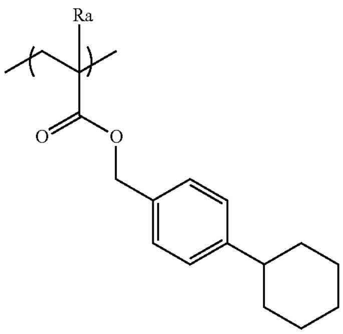

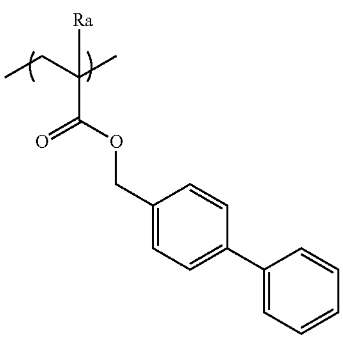

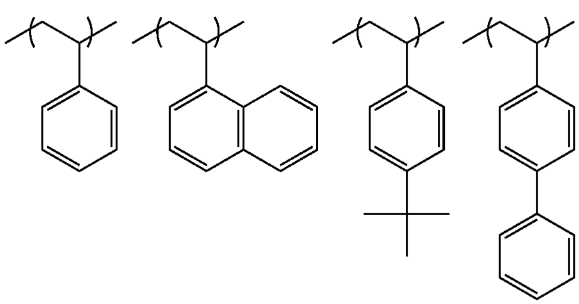

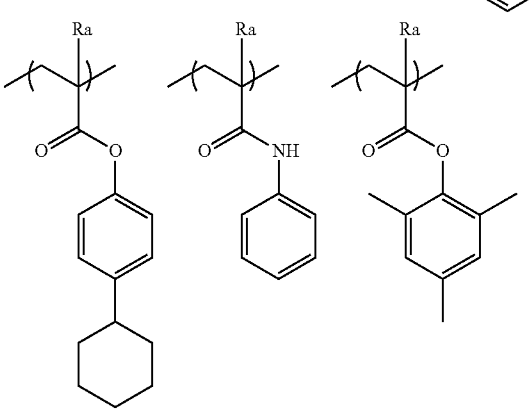

-continued

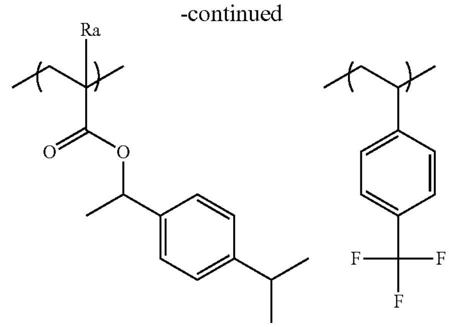

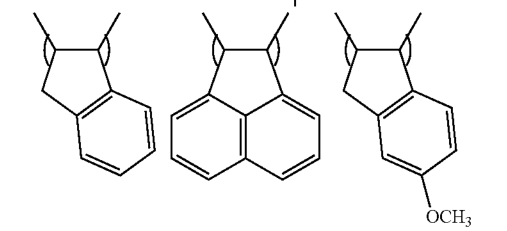

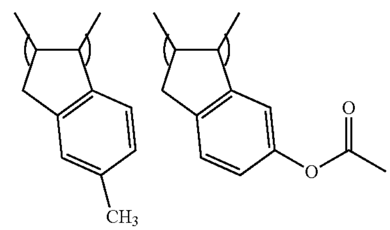

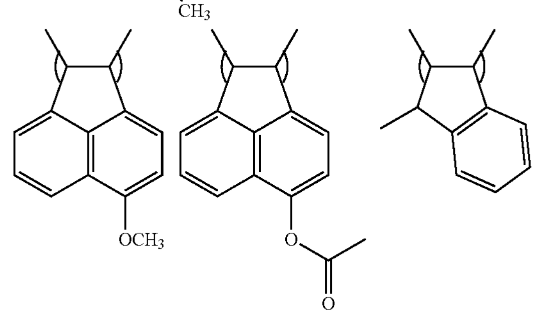

Thanks to these repeating units, the performance required of the resin (A) for use in the composition of the present invention, particularly (1) solubility for the coating solvent, (2) film-forming property (glass transition point), (3) developability for an organic solvent, (4) film loss (selection of hydrophilic, hydrophobic or polar group), (5) adherence of unexposed area to substrate, (6) dry etching resistance, (7) internal filter characteristics, and the like can be subtly controlled.

In addition, an addition-polymerizable unsaturated compound copolymerizable with the monomers corresponding to the above-described various repeating structural units may be copolymerized.

In the resin (A), the molar ratio of respective repeating structural units contained is appropriately set to control the dry etching resistance of composition, the suitability for standard developer, the adherence to substrate, the resist profile, the internal filter characteristics, the resolution, the heat resistance, the sensitivity, and the like.

In the exposure using an electron beam or an extreme ultraviolet ray, the resin (A) is preferably a resin containing an aromatic ring-containing repeating unit so as to sufficiently release secondary electrons in the exposed area and obtain high sensitivity. With respect to the EUV exposure, the above-described out-of-band light worsens the surface roughness of the resist film, as a result, reduction in the resolution and deterioration of the LWR performance are readily caused due to bridge pattern or disconnection of pattern. Accordingly, in view of high resolution and high LWR performance, it is preferred to use a resin having an aromatic ring that functions as an internal filter by absorbing out-of-band light. On this account, the resin (A) preferably contains an aromatic ring-containing repeating unit other than the repeating unit (R), in an amount of 5 to 100 mol %, more preferably from 10 to 100 mol %, based on all repeating units except for the repeating unit (R).

The resin (A) can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is pored in a solvent, and the desired polymer is collected by a method for powder or solid recovery or the like. The concentration during the reaction is from 5 to 50 mass %, preferably from 10 to 30 mass %. The reaction temperature is usually from 10 to 150° C., preferably from 30 to 120° C., more preferably from 60 to 100° C.

The weight average molecular weight of the resin above is, in terms of polystyrene by GPC, preferably from 1,000 to 200,000, more preferably from 2,000 to 20,000, still more preferably from 3,000 to 15,000, yet still more preferably from 3,000 to 10,000. By setting the weight average molecular weight to be from 1,000 to 200,000, deterioration of the heat resistance and dry etching resistance can be prevented and at the same time, the film-forming property can be prevented from deteriorating due to reduction in the developability or increase in the viscosity.

The polydispersity (molecular weight distribution) is usually from 1 to 3, preferably from 1 to 2.6, more preferably from 1 to 2. Generally, as the molecular weight distribution is narrower, the resin is excellent in the resolution, pattern profile and roughness characteristics.

As for the resin above, one kind be used alone, or a plurality of kinds may be used in combination.

In one embodiment of the present invention, the blending ratio of the resin in the entire composition is preferably from 30 to 99.5 mass %, more preferably from 60 to 95 mass %, based on the entire solid content. (In this specification, mass ratio is equal to weight ratio.)

A resin other than the above-described resin may be used in combination as long as the effects of the present invention are not impaired. For example, together with the resin containing the repeating unit (R), a resin not containing the repeating unit (R) (excluding the later-described hydrophobic resin) may be used in combination. In this case, the mass ratio between the total amount of the former and the total amount of the latter is preferably 50/50 or more, more preferably 70/30 or more. Incidentally, in such a case, the resin not containing the repeating unit (R) typically contains the above-described repeating unit having an acid-decomposable group.

[B] Solvent

The composition according to the present invention contains a solvent. The solvent preferably contains at least either one of (S1) a propylene glycol monoalkyl ether carboxylate and (S2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate. The solvent may further contain a component other than the components (S1) and (S2).

The present inventors have found that when such a solvent and the above-described resin are used in combination, coatability of the composition is enhanced and at the same time, a pattern reduced in the number of development defects can be formed. The reason therefor is not necessarily clarified, but the present inventors consider that these effects are obtained because the resin above is well-balanced in solubility, boiling point and viscosity and this makes it possible to reduce, for example, unevenness of the film thickness of the composition film or generation of a precipitate during spin coating.

The component (S1) is preferably at least one selected from the group consisting of propylene glycol monomethyl ether acetate, propylene glycol monomethyl ether propionate and propylene glycol monoethyl ether acetate, more preferably propylene glycol monomethyl ether acetate.

As the component (S2), the following is preferred.

The propylene glycol monoalkyl ether is preferably propylene glycol monomethyl ether or propylene glycol monoethyl ether.

The lactic acid ester is preferably ethyl lactate, butyl lactate or propyl lactate The acetic acid ester is preferably methyl acetate, ethyl acetate, butyl acetate, isobutyl acetate, propyl acetate, isoamyl acetate, methyl formate, ethyl formate, butyl formate, propyl formate or 3-methoxybutyl acetate.

The alkoxypropionic acid ester is preferably methyl 3-methoxypropionate (MMP) or ethyl 3-ethoxypropionate (EEP).

The chain ketone is preferably 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone or methyl amyl ketone.

The cyclic ketone is preferably methylcyclohexanone, isophorone or cyclohexanone.

The lactone is preferably γ-butyrolactone.

The alkylene carbonate is preferably propylene carbonate.

The component (S2) is more preferably propylene glycol monomethyl ether, ethyl lactate, ethyl 3-ethoxypropionate, methyl amyl ketone, cyclohexanone, butyl acetate, pentyl acetate, γ-butyrolactone or propylene carbonate.

As the component (S2), a compound having a flash point (hereinafter, sometimes referred to as fp) of 37° C. or more is preferably used. Such a component (S2) is preferably propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), γ-butyrolactone (fp: 101° C.) or propylene carbonate (fp: 132° C.), more preferably propylene glycol monoethyl ether, ethyl lactate, pentyl acetate or cyclohexanone, still more preferably propylene glycol monoethyl ether or ethyl lactate. The "flash point" as used herein means the value described in the reagent catalogue of Tokyo Chemical Industry Co., Ltd., or SIGMA-ALDRICH CORPORATION.

The solvent preferably contains the component (S1). The solvent is more preferably composed of substantially only the component (S1) or is a mixed solvent of the component (S1) and other components. In the latter case, the solvent still more preferably both the component (S1) and the component (S2).

The mass ratio between the component (S1) and the component (S2) is preferably from 100:0 to 15:85, more preferably from 100:0 to 40:60, yet still more preferably from 100:0 to 60:40. In other words, it is preferred that the solvent is composed of only the component (S1) or the solvent contains both the component (S1) and the component (S2) and the mass ratio therebetween is as follows. That is, in the latter case, the mass ratio of the component (S1) to the component (S2) is preferably 15/85 or more, more preferably 40/60 or more, still more preferably 60/40 or more. When such a configuration is employed, the number of development defects can be more reduced.

In this connection, when the solvent contains both the component (S1) and the component (S2), the mass ratio of the component (S1) to the component (S2) is, for example, 99/1 or less.

As described above, the solvent may further contain a component other than the components (S1) and (S2). In this case, the content of the component other than the components (S1) and (S2) is preferably from 5 to 30 mass % based on the entire amount of the solvent.

The content of the solvent in the composition is preferably determined such that the solid content concentration of all components becomes from 2 to 30 mass %, more preferably from 3 to 20 mass %. By determining the content as such, the coatability of the composition can be more enhanced.

[C] Acid Generator

The composition of the present invention may further contain an acid generator other than the resins above. The acid generator is not particularly limited but is preferably a compound represented by the following formula (ZI'), (ZII') or (ZIII'):

(ZI')

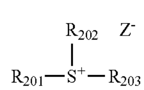

(ZII')

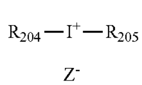

-continued (ZIII')

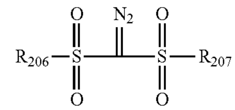

In formula (ZI'), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. The group formed by combining two members out of $R_{201}$ to $R_{203}$ includes an alkylene group (e.g., butylene group, pentylene group).

$Z^-$ represents a non-nucleophilic anion.

Examples of $Z^-$ include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion, and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples of the substituent include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group or ring structure in each group may further have an alkyl group (preferably having a carbon number of 1 to 15) as a substituent.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Other examples of $Z^-$ include fluorinated phosphorus, fluorinated boron and fluorinated antimony.

$Z^-$ is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (more preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

As regards the acid strength, the pKa of the acid generated is preferably −1 or less from the standpoint of enhancing the sensitivity.

Examples of the organic group of $R_{201}$, $R_{202}$ and $R_{203}$ include an aryl group (preferably having a carbon number of 6 to 15), a linear or branched alkyl group (preferably having a carbon number of 1 to 10), and a cycloalkyl group (preferably having a carbon number of 3 to 15).

At least one of $R_{201}$, $R_{202}$ and $R_{203}$ is preferably an aryl group, and it is more preferred that those three members all are an aryl group. The aryl group may be, for example, a phenyl group or a naphthyl group and may be also a heteroaryl group such as indole residue and pyrrole residue. This aryl group may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

Also, two members selected from $R_{201}$, $R_{202}$ and $R_{203}$ may combine through a single bond or a linking group. Examples of the linking group include, but are not limited to, an alkylene group (preferably having a carbon number of 1 to 3), —O—, —S—, —CO— and —$SO_2$—.

Preferred structures where at least one of $R_{201}$, $R_{202}$ and $R_{203}$ is not an aryl group include cation structures such as compounds described in paragraphs 0047 and 0048 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formulae (ZII') and (ZIII'), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI') above.

The aryl group, alkyl group and cycloalkyl group of $R_{204}$ to $R_{207}$ may have a substituent. Examples of the substituent include those which the aryl group, alkyl group and cycloalkyl group of $R_{201}$ to $R_{203}$ in the compound (Zit) above may have.

$Z^-$ represents a non-nucleophilic anion, and examples thereof are the same as those of the non-nucleophilic anion of $Z^-$ in formula (ZI').

The acid generator further includes compounds represented by the following formulae (ZIV'), (ZV') and (ZVI'):

(ZIV')

$$Ar_3—SO_2—SO_2—Ar_4$$

(ZV')

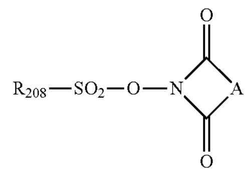

(ZVI')

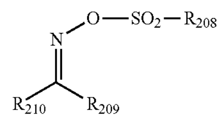

In formulae (ZIV') to (ZVI'), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Out of the acid generators, particularly preferred examples are illustrated below.

(z1)

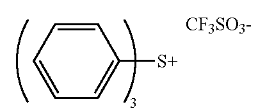

(z2)

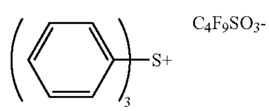

(z3)

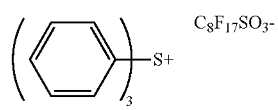

(z4)

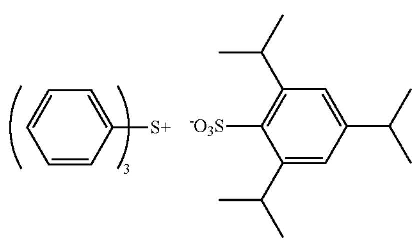

(z5)

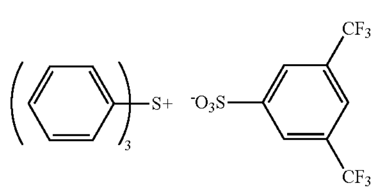

-continued
(z6)
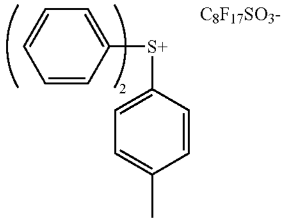
(z7)
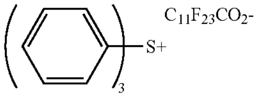
(z8)
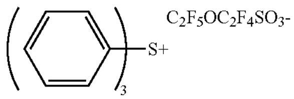
(z9)
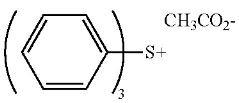
(z10)
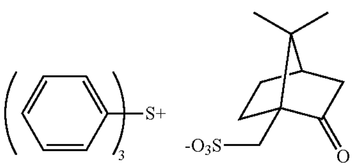
(z11)
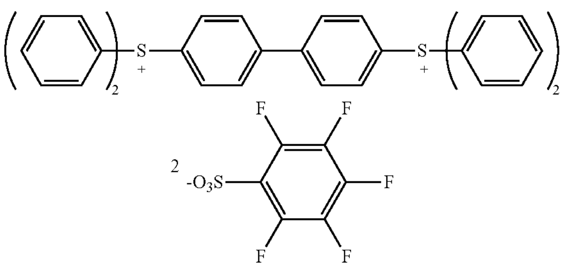
(z12)
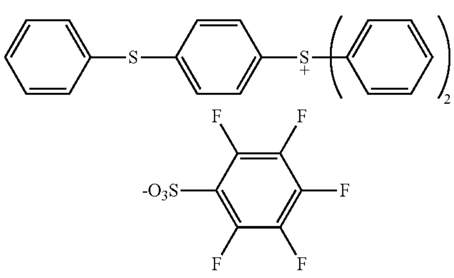
(z13)
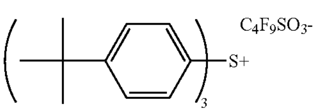
(z14)
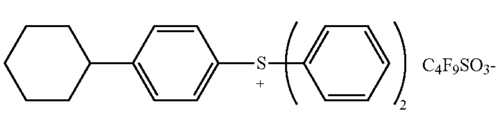
(z15)
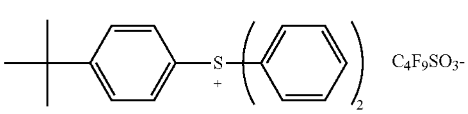
-continued
(z16)
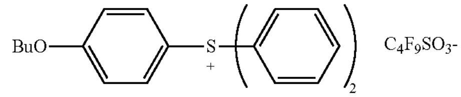
(z17)
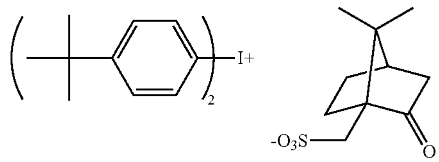
(z18)
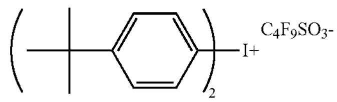
(z19)
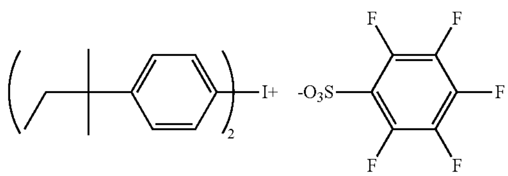
(z20)
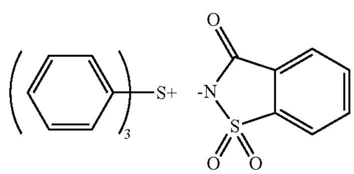
(z21)
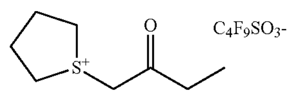
(z22)
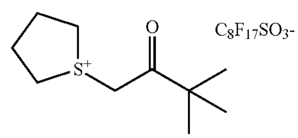
(z23)
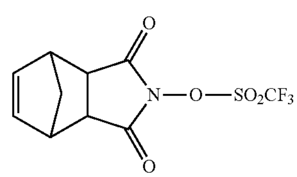
(z24)
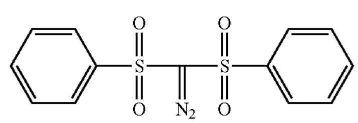
(z25)
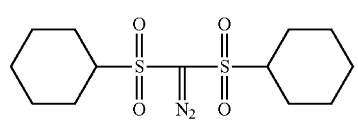
(z26)
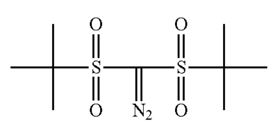

-continued
(z27)
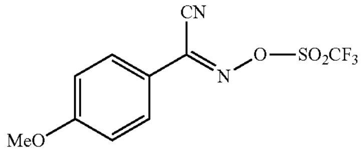
(z28)
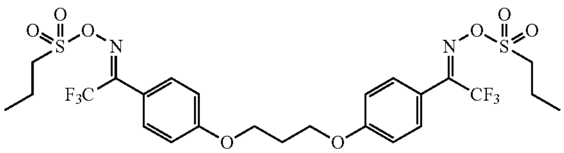
(z29)
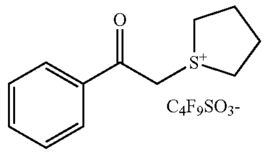
(z30)
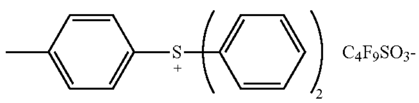
(z31)
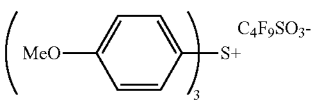
(z32)
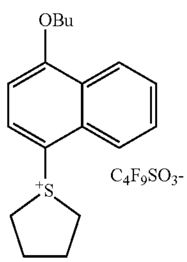
(z33)
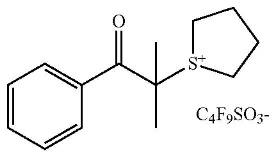
(z34)
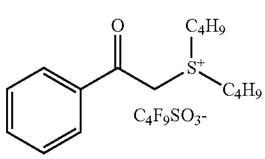
(z35)
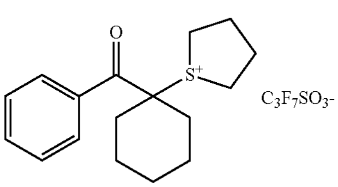
-continued
(z36)
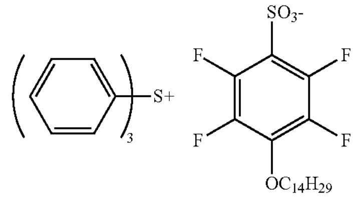
(z37)
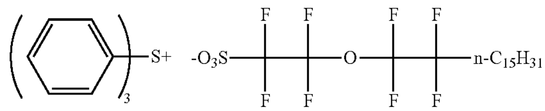
(z38)
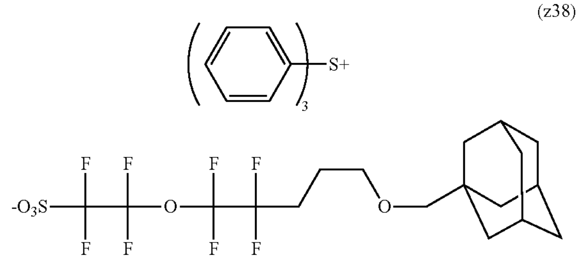
(z39)
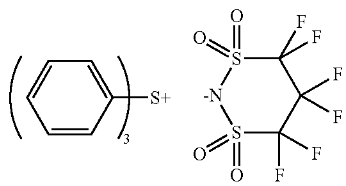
(z40)
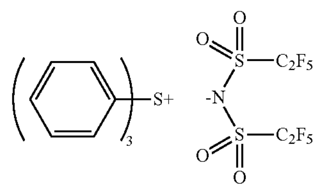
(z41)
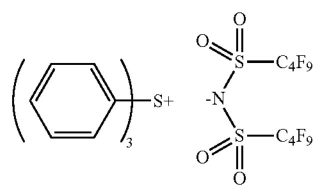
(z42)
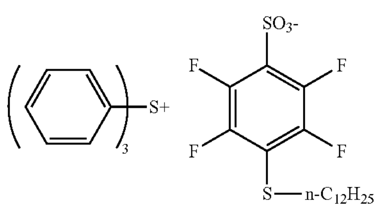
(z43)
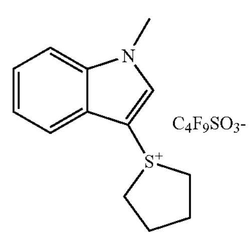

-continued
(z44)
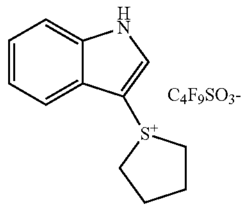
(z45)
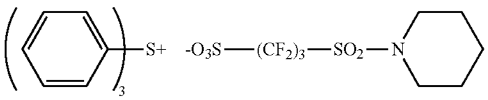
(z46)
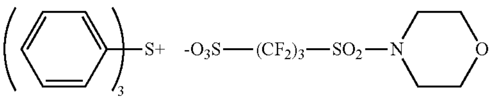
(z47)
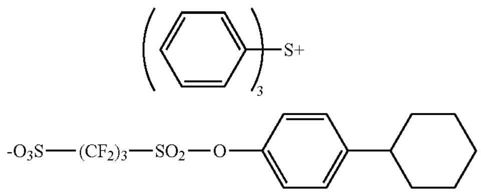
(z48)
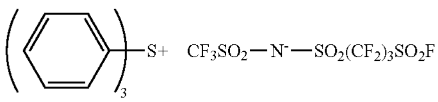
(z49)
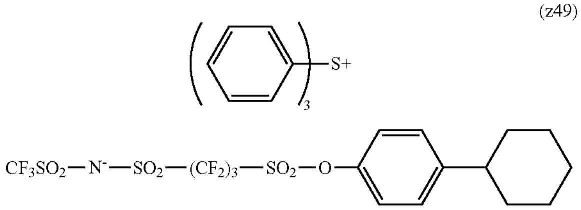
(z50)
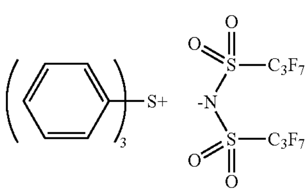
(z51)
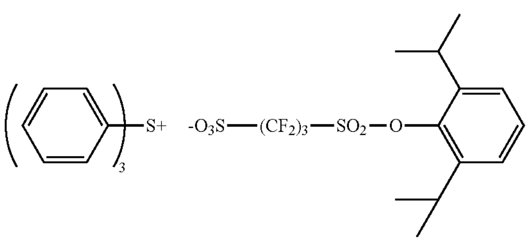
(z52)
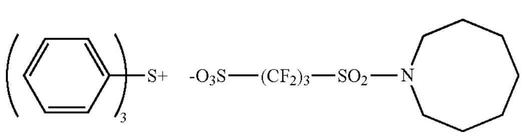
-continued
(z53)
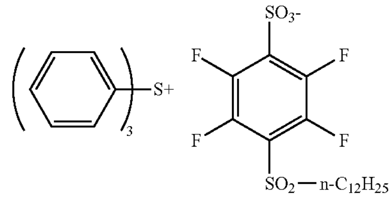
(z54)
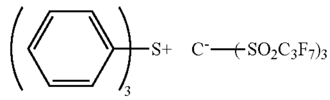
(z55)
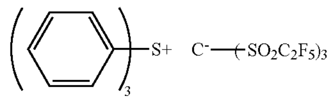
(z56)
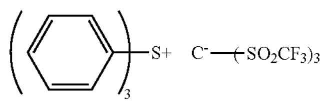
(z57)
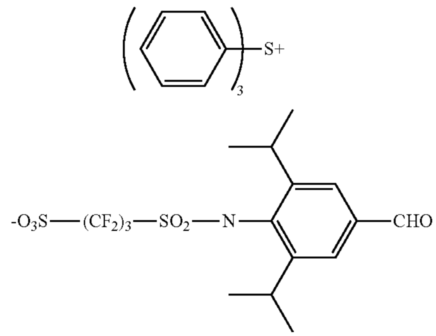
(z58)
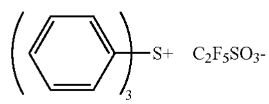
(z59)
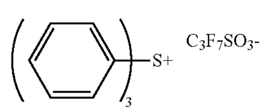
(z60)
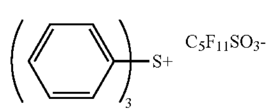
(z61)
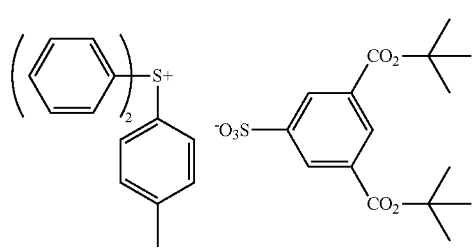

-continued (z62)

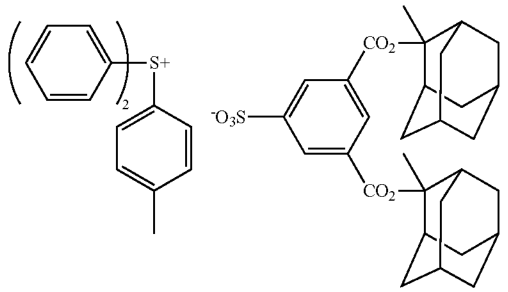

(z63)

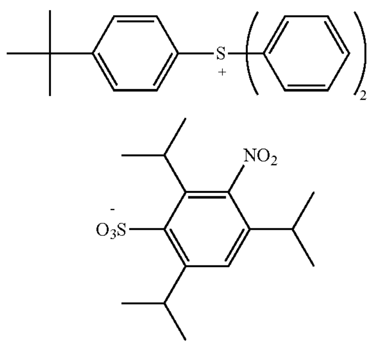

(z64)

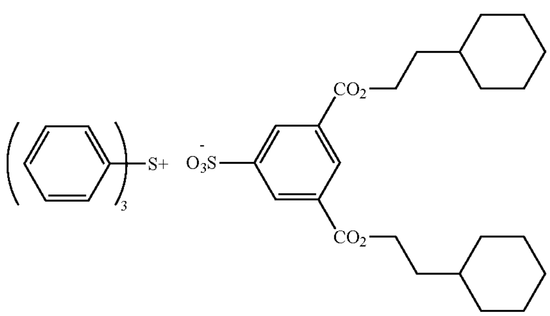

(z65)

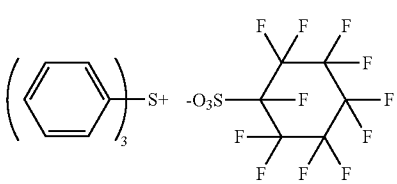

(z66)

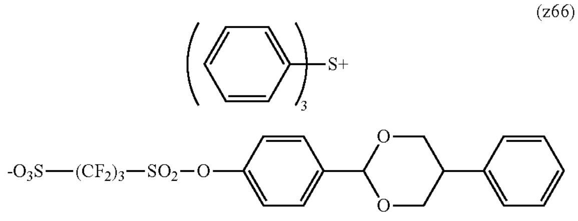

(z67)

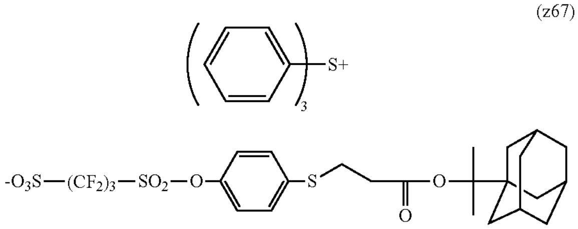

-continued (z68)

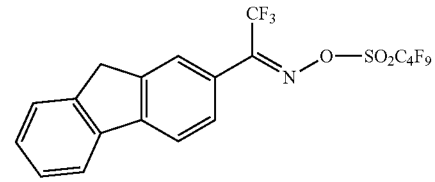

(z69)

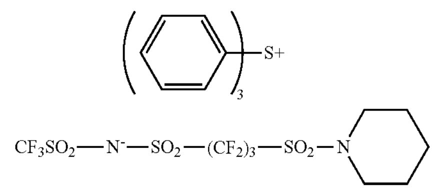

(z70)

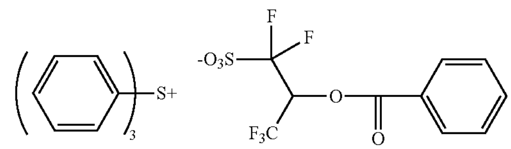

As for the acid generator, one kind of an acid generator may be used alone, or two or more kinds of acid generators may be used in combination.

The electron beam-sensitive or extreme ultraviolet-sensitive resin composition for use in the present invention may or may not contain an acid generator, but in the case of containing an acid generator, the content of the acid generator in the composition is preferably from 0.1 to 20 mass %, more preferably from 0.5 to 10 mass %, still more preferably from 1 to 7 mass %, based on the entire solid content of the composition.

[D] Basic Compound

The composition of the present invention may further contain a basic compound. The basic compound is preferably a compound having a structure represented by the following formulae (A) to (E):

(A0

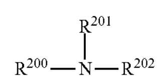

(B)

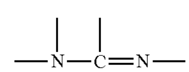

(C)

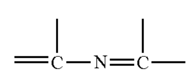

(D)

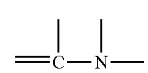

(E)

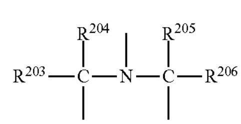

In formulae (A) and (E), each of $R^{200}$, $R^{201}$ and $R^{202}$ independently represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring.

Each of $R^{203}$, $R^{204}$, $R^{205}$ and $R^{206}$ independently represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20. This alkyl group is more preferably unsubstituted.

Preferred basic compounds include guanidine, aminopyrrolidine, pyrazole, pyrazoline, piperazine, aminomorpholine, aminoalkylmorpholine and piperidine. More preferred basic compounds include a compound having an imidazole structure, a diazabicyclo structure, an onium hydroxide structure, an onium carboxylate structure, a trialkylamine structure, an aniline structure or a pyridine structure; an alkylamine derivative having a hydroxy group and/or an ether bond; and an aniline derivative having a hydroxy group and/or an ether bond.

Examples of the compound having an imidazole structure include imidazole, 2,4,5-triphenylimidazole, benzimidazole and 2-phenylbenzimidazole.

Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene.

Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide.

Examples of the compound having an onium carboxylate structure include a compound having an onium hydroxide structure containing a carboxylate as the anion. Examples of the carboxylate include acetate, adamantane-1-carboxylate and perfluoroalkyl carboxylate.

Examples of the compound having a trialkylamine structure include tri(n-butyl)amine and tri(n-octyl)amine.

The aniline compound includes 2,6-diisopropylaniline, N,N-dimethylaniline, N,N-dibutylaniline and N,N-dihexylaniline.

The alkylamine derivative having a hydroxy group and/or an ether bond includes ethanolamine, diethanolamine, triethanolamine, N-phenyldiethanolamine and tris(methoxyethoxyethyl)amine.

Examples of the aniline derivative having a hydroxy group and/or an ether bond include N,N-bis(hydroxyethyl)aniline.

Preferred basic compounds further include an amine compound having a phenoxy group, an ammonium salt compound having a phenoxy group, an amine compound having a sulfonic acid ester group, and an ammonium salt compound having a sulfonic acid ester group.

In these compounds, at least one alkyl group is preferably bonded to the nitrogen atom. Also, an oxygen atom is preferably contained in the chain of the alkyl group to form an oxyalkylene group. The number of oxyalkylene groups within the molecule is preferably 1 or more, more preferably from 3 to 9, still more preferably from 4 to 6. Among these oxyalkylene groups, groups represented by —$CH_2CH_2O$—, —$CH(CH_3)CH_2O$— and —$CH_2CH_2CH_2O$— are particularly preferred.

Specific examples of these compounds include Compounds (C1-1) to (C3-3) illustrated in [0066] of U.S. Patent Application Publication 2007/0224539A.

The composition of the present invention may contain, as the basic compound, a low molecular compound having a nitrogen atom and having a group capable of leaving by the action of an acid (hereinafter, sometimes referred to as "low molecular compound (D)" or "component (D)").

The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the compound (D) is preferably from 100 to 1,000, more preferably from 100 to 700, still more preferably from 100 to 500.

The compound (D) is preferably an amine derivative having on the nitrogen atom a group capable of leaving by the action of an acid.

The compound (D) may have a protective group-containing carbamate group on the nitrogen atom. The protective group constituting the carbamate group can be represented, for example, by the following formula (d-1):

(d-1)

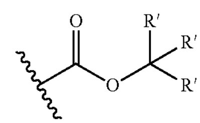

In formula (d-1), each R' independently represents a hydrogen atom, a linear or branched alkyl group, a cycloalkyl group, an aryl group, an aralkyl group or an alkoxyalkyl group. Each R' may combine with another R' to form a ring.

R' is preferably a linear or branched alkyl group, a cycloalkyl group or an aryl group, more preferably a linear or branched alkyl group or a cycloalkyl group.

Specific examples of such a group are illustrated below.

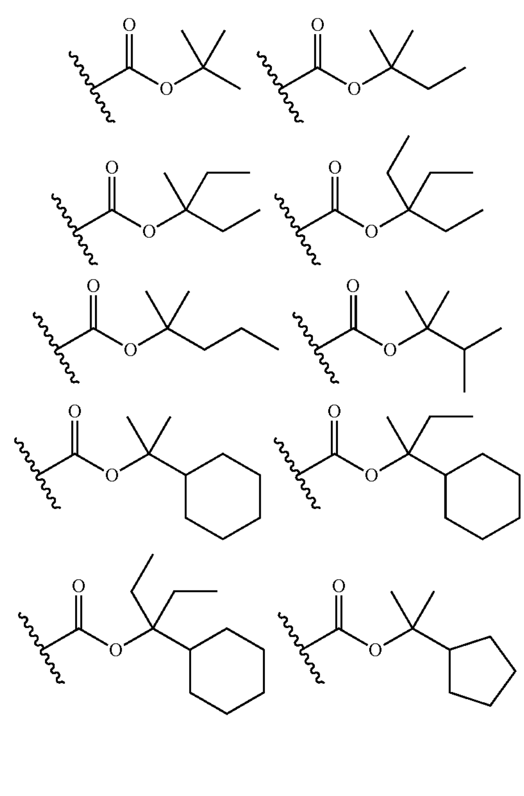

-continued

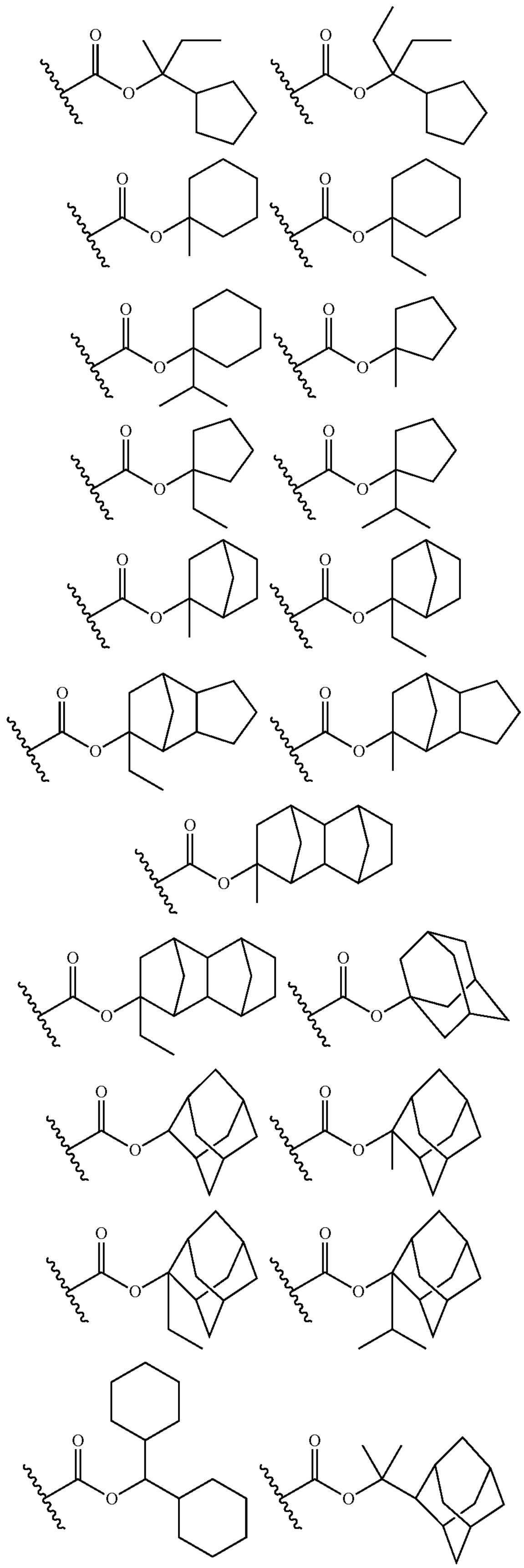

-continued

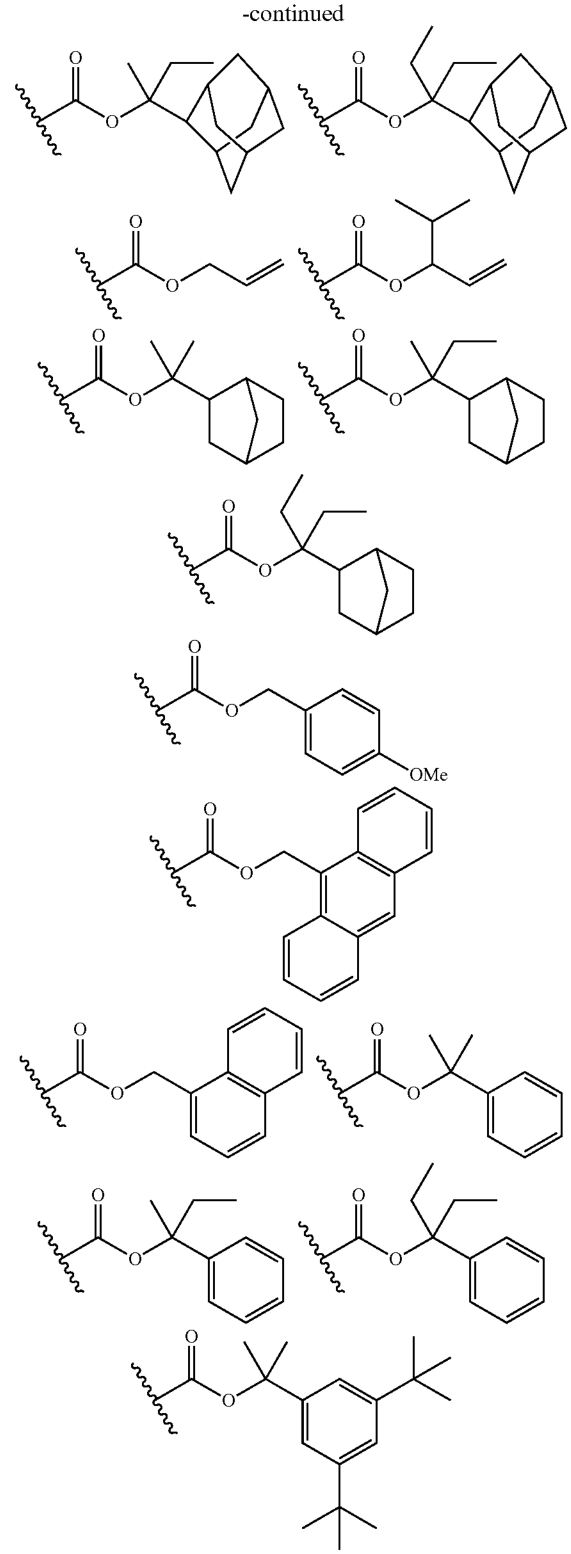

The compound (D) may be also composed by arbitrarily combining various basic compounds described above with the structure represented by formula (d-1).

The compound (D) is more preferably a compound having a structure represented by the following formula (F).

Incidentally, the compound (D) may be a compound corresponding to various basic compounds described above as long as it is a low molecular compound having a group capable of leaving by the action of an acid.

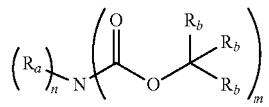

(F)

In formula (F), Ra represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group, an aralkyl group or an alkoxyalkyl group, provided that when one or more Rb in —C(Rb)(Rb)(Rb) are a hydrogen atom, at least one of remaining Rb is a cyclopropyl group, a 1-alkoxyalkyl group or an aryl group.

At least two Rb's may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (F), the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group or a halogen atom. The same applies to the alkoxyalkyl group represented by Rb.

Examples of the alkyl group, cycloalkyl group, aryl group and aralkyl group (each of these alkyl group, cycloalkyl group, aryl group and aralkyl group may be substituted with the above-described functional group, an alkoxy group or a halogen atom) of Ra and/or Rb include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl group such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl group or aromatic compound-derived group; a group where the group derived from a linear or branched alkane or the group derived from a cycloalkane is substituted with one or more kinds of or one or more groups of aromatic compound-derived group such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1 S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived group, cycloalkane-derived group, aromatic compound-derived group, heterocyclic compound-derived group, and functional group such as hydroxyl group, cyano group, amino group, pyrrolidino group, piperidino group, morpholino group and oxo group.

Specific examples of the compound (D) particularly preferred in the present invention are illustrated below, but the present invention is not limited thereto.

(D-1)

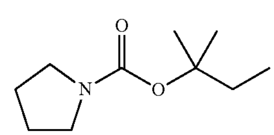

(D-2)

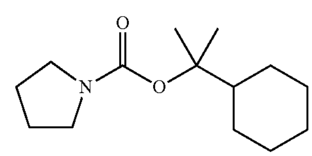

(D-3)

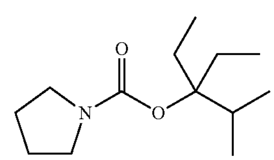

(D-4)

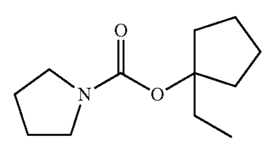

(D-5)

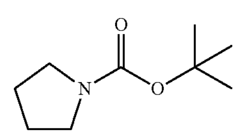

(D-6)
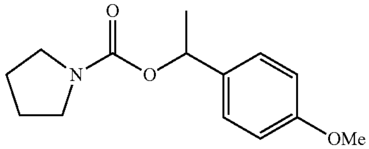
(D-7)
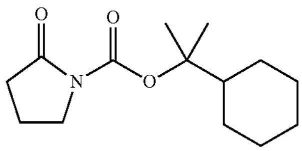
(D-8)
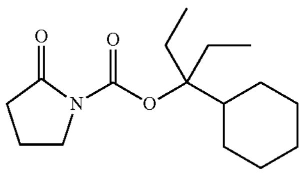
(D-9)
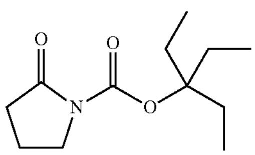
(D-10)
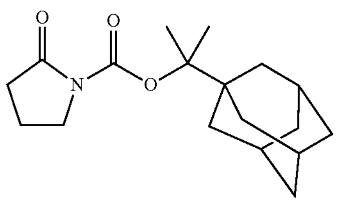
(D-11)
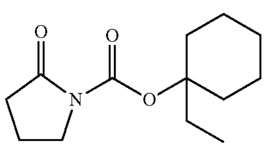
(D-12)
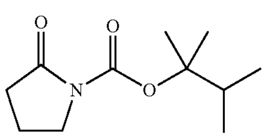
(D-13)
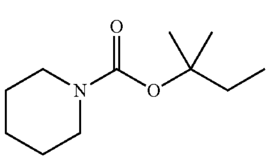
(D-14)
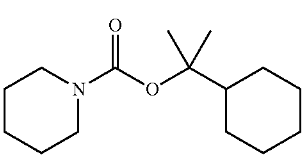
(D-15)
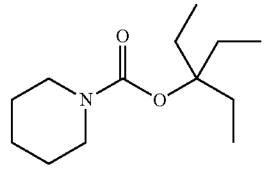
(D-16)
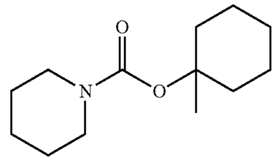
(D-17)
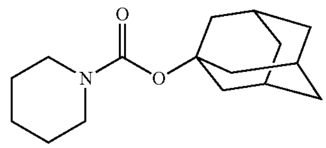
(D-18)
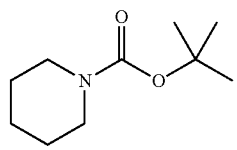
(D-19)
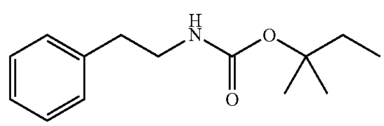
(D-20)
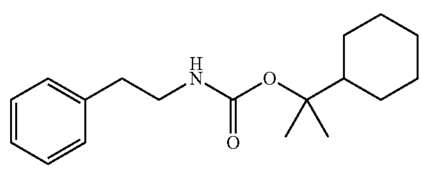
(D-21)
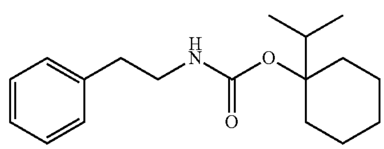
(D-22)
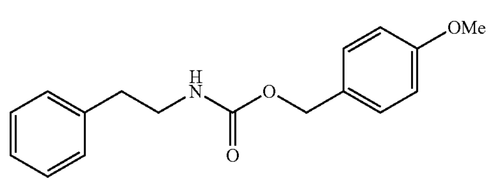
(D-23)
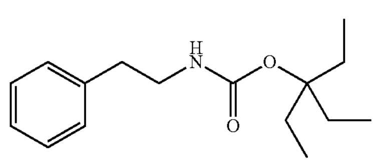

(D-24)
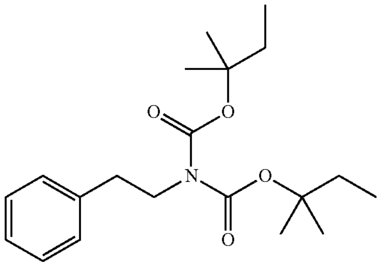
(D-25)
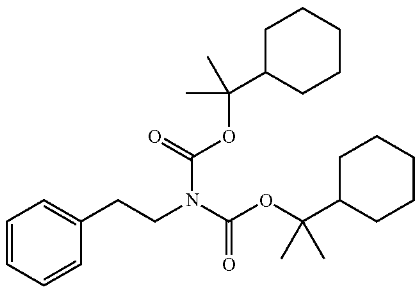
(D-26)
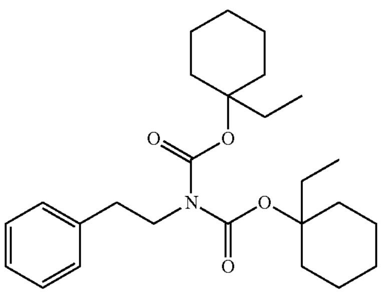
(D-27)
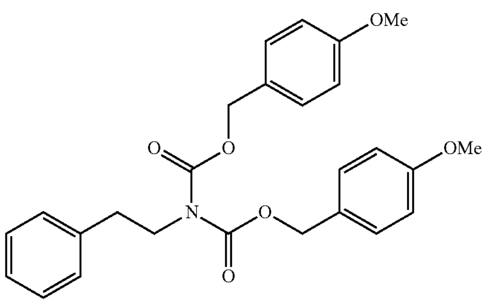
(D-28)
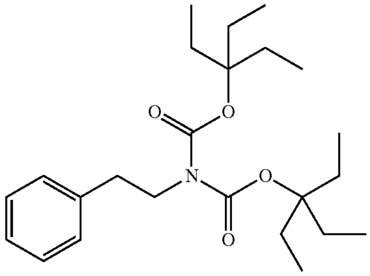
(D-29)
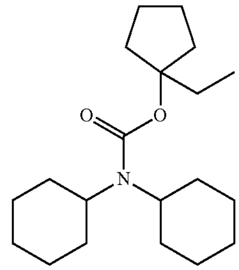
(D-30)
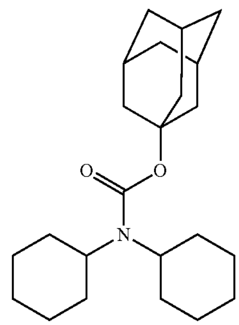
(D-31)
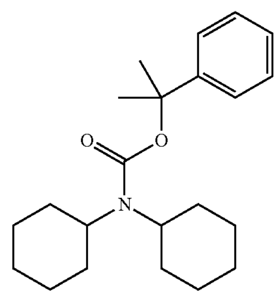
(D-32)
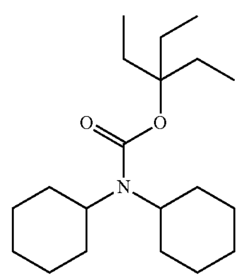
(D-33)
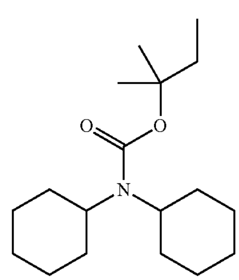

-continued
(D-34)
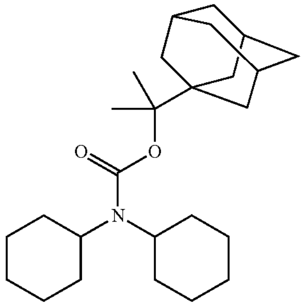
(D-35)
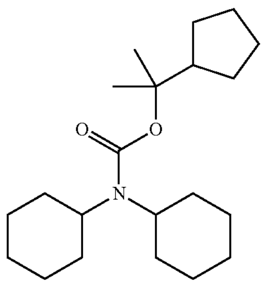
(D-36)
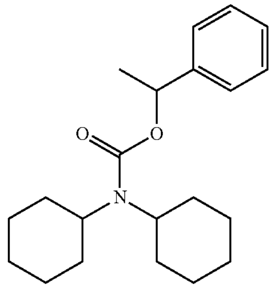
(D-37)
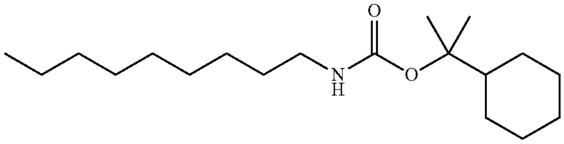
(D-38)
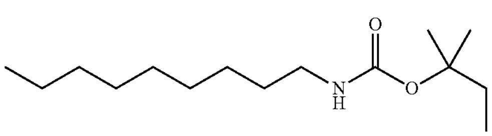
(D-39)
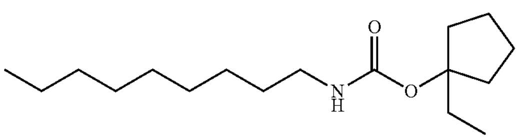
(D-40)
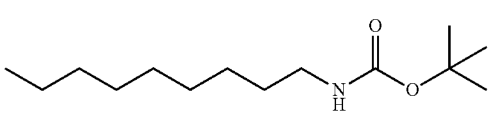
-continued
(D-41)
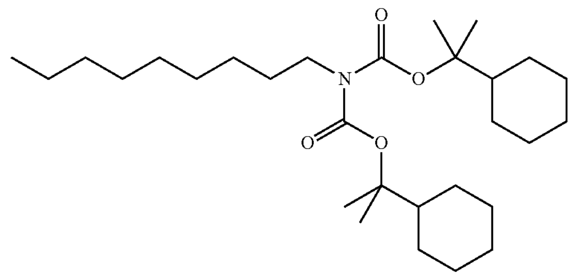
(D-42)
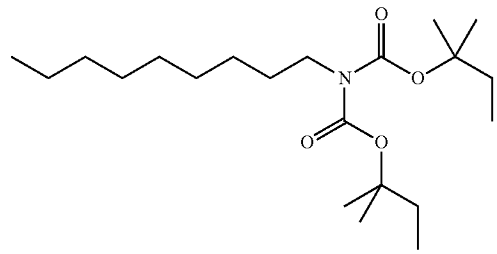
(D-43)
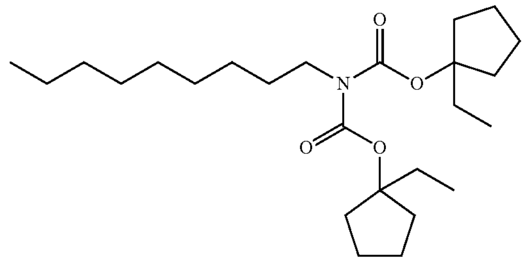
(D-44)
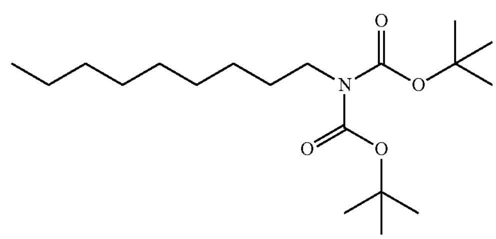
(D-45)
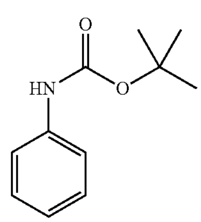
(D-46)
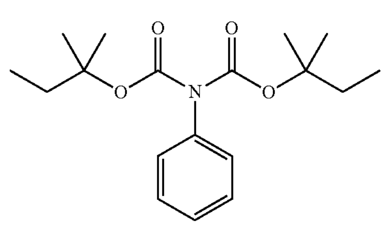

-continued (D-47)

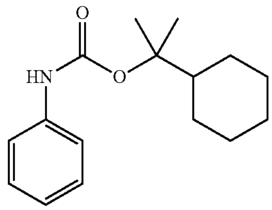

(D-48)

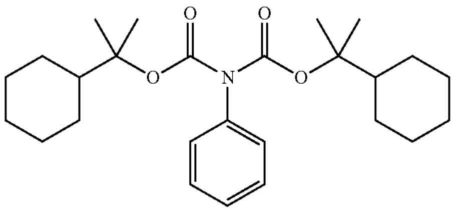

(D-49)

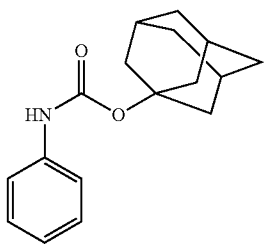

(D-50)

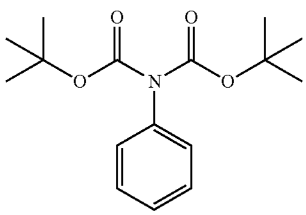

(D-51)

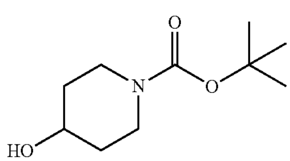

(D-52)

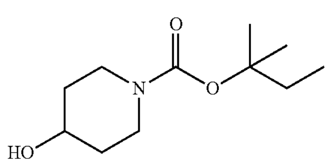

(D-53)

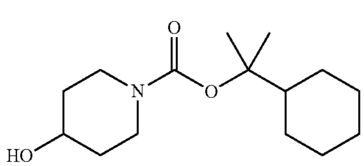

(D-54)

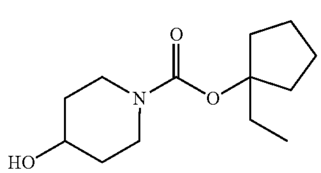

-continued (D-55)

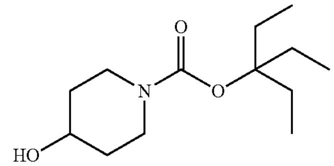

The compound represented by formula (A) can be easily synthesized from a commercially available amine by the method described, for example, in *Protective Groups in Organic Synthesis,* 4th edition. A most general method is a method of causing a dicarbonic acid ester or a haloformic acid ester to act on a commercially available amine to obtain the compound. In the formulae, X represents a halogen atom, and definitions and specific examples of Ra and Rb are the same as those in formula (F).

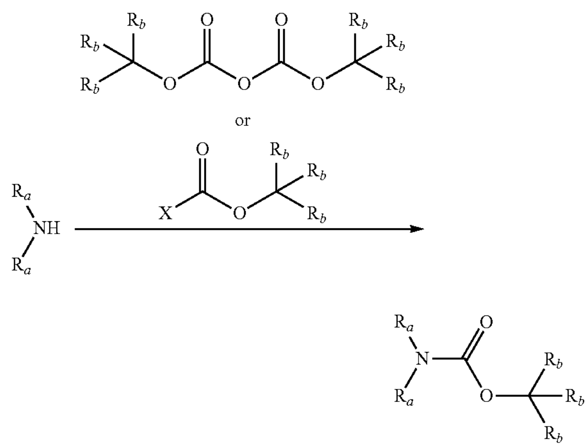

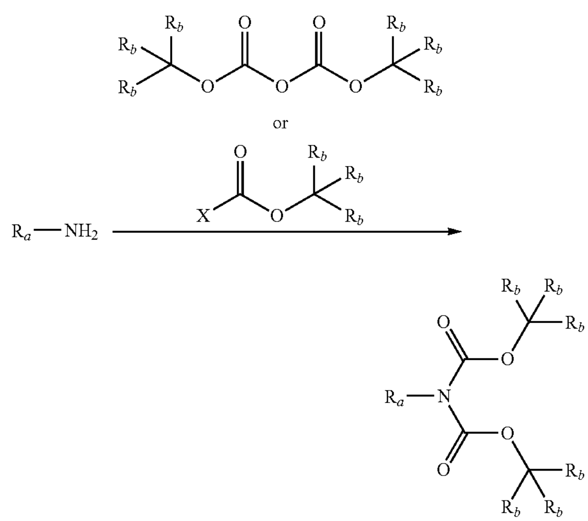

As for the basic compound (including the compound (D)), one kind may be used alone, or two or more kinds may be used in combination.

The total amount of the basic compound used is preferably from 0.001 to 20 mass %, more preferably from 0.001 to 10 mass %, still more preferably from 0.01 to 5 mass %, based on the entire solid content of the composition.

The molar ratio of the total amount of the acid generator to the total amount of the basic compound is preferably from 2.5 to 300, more preferably from 5.0 to 200, still more preferably from 7.0 to 150. If this molar ratio is excessively small, the sensitivity and/or resolution may be reduced, whereas if the molar ratio above is excessively large, thickening of the pattern may be caused between exposure and heating (post baking).

[E] Hydrophobic Resin

The composition of the present invention may further contain a hydrophobic resin. When a hydrophobic resin is contained, the hydrophobic resin is unevenly distributed to the surface layer of the composition film and in the case of using water as the immersion medium, the receding contact angle of the film for the immersion liquid can be increased. In turn, the followability of the immersion liquid to the film can be enhanced.

The receding contact angle of the film after baking and before exposure is preferably from 60 to 90°, more preferably 65° or more, still more preferably 70° or more, yet still more preferably 75° or more, at a temperature of 23±3° C. and a humidity of 45±5%.

The hydrophobic resin is, as described above, unevenly distributed to the interface but unlike a surfactant, need not have necessarily a hydrophilic group in the molecule and may not contribute to uniform mixing of polar/nonpolar substances.

In the immersion exposure step, the immersion liquid must move on a wafer following the movement of an exposure head that is scanning the wafer at a high speed and forming an exposure pattern. Therefore, the contact angle of the immersion liquid with the resist film in a dynamic state is important, and the electron beam-sensitive or extreme ultraviolet-sensitive resin composition is required to have a performance of allowing a liquid droplet to follow the high-speed scanning of an exposure head with no remaining.

The hydrophobic resin (HR) is preferably a resin having at least either a fluorine atom or a silicon atom. The fluorine atom or silicon atom in the hydrophobic resin (HR) may be present in the main chain of the resin or may be substituted on the side chain. By virtue of the hydrophobic resin containing at least either a fluorine atom or a silicon atom, hydrophobicity (water followability) on the film surface is increased and the development residue (scum) is decreased.

The hydrophobic resin (HR) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being substituted for by a fluorine atom and may further have other substituents.

The fluorine atom-containing cycloalkyl group is a monocyclic or polycyclic cycloalkyl group with at least one hydrogen atom being substituted for by a fluorine atom and may further have other substituents.

The fluorine atom-containing aryl group includes an aryl group (e.g., phenyl group, naphthyl group) with at least one hydrogen atom being substituted for by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto:

(F2)

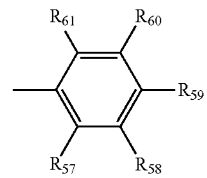

(F3)

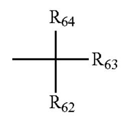

(F4)

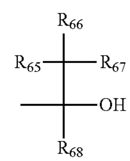

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted for by a fluorine atom. It is preferred that all of $R_{57}$ to $R_{61}$ and all of $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

Suitable repeating units having a fluorine atom include the followings.

(C-Ia)

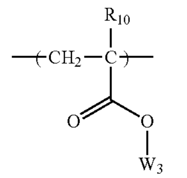

(C-Ib)

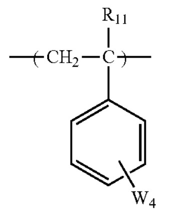

(C-Ic)

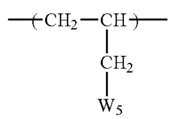

(C-Id)

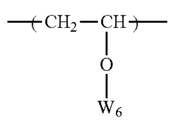

In the formulae, each of $R_{10}$ and $R_{11}$ independently represents a hydrogen atom, a fluorine atom, or an alkyl group (preferably a linear or branched alkyl group having a carbon number of 1 to 4; the alkyl group having a substituent includes, in particular, a fluorinated alkyl group).

Each of $W_3$ to $W_6$ independently represents an organic group having at least one or more fluorine atoms, and the organic group specifically includes the groups represented by formulae (F2) to (F4).

In addition, the hydrophobic resin may contain a unit shown below as the repeating unit having a fluorine atom:

(C-II)

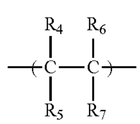

(C-III)

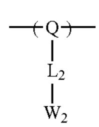

In the formulae, each of $R_4$ to $R_7$ independently represents a hydrogen atom, a fluorine atom, or an alkyl group (preferably a linear or branched alkyl group having a carbon number of 1 to 4; and the alkyl group having a substituent includes, in particular, a fluorinated alkyl group).

However, at least one of $R_4$ to $R_7$ represents a fluorine atom. $R_4$ and $R_5$, or $R_6$ and $R_7$ may form a ring.

$W_2$ represents an organic group having at least one fluorine atom, and the organic group specifically includes the atomic groups of (F2) to (F4) above.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group, and a cyclooctyl group. Examples of the polycyclic structure include a group having a bicyclo, tricyclo or tetracyclo structure with a carbon number of 5 or more. A cycloalkyl group having a carbon number of 6 to 20 is preferred, and examples thereof include an adamantyl group, a norbornyl group, a dicyclopentyl group, a tricyclodecanyl group, and a tetracyclododecyl group. A part of carbon atoms in the cycloalkyl group may be substituted with a heteroatom such as oxygen atom.

$L_2$ represents a single bond or a divalent linking group. The divalent linking group is a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or an alkyl group), —$NHSO_2$—, or a divalent linking group formed by combining a plurality thereof.

The hydrophobic resin (HR) may contain a silicon atom. The resin is preferably a resin having, as the silicon atom-containing partial structure, an alkylsilyl structure (preferably a trialkylsilyl group) or a cyclic siloxane structure.

Specific examples of the alkylsilyl structure and cyclic siloxane structure include groups represented by the following formulae (CS-1) to (CS-3):

(CS-1)

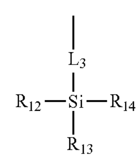

(CS-2)

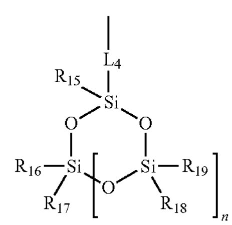

(CS-3)

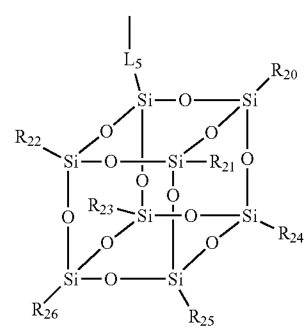

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a single group or a combination of two or more groups selected from the group consisting of an alkylene group, a phenylene group, an ether group, a thioether group, a carbonyl group, an ester group, an amide group, a urethane group and a urea group.

n represents an integer of 1 to 5. n is preferably an integer of 2 to 4.
Specific examples of the repeating unit containing a fluorine atom or a silicon atom are illustrated below. In specific examples, $X_i$ represents a hydrogen atom, —$CH_3$, —F or —$CF_3$, and $X_2$ represents —F or —$CF_3$.
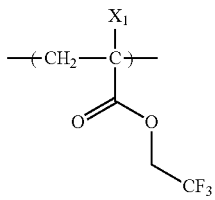
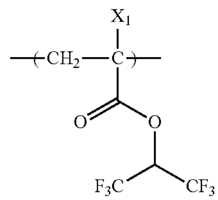
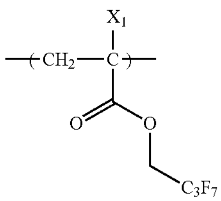
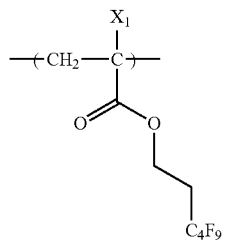
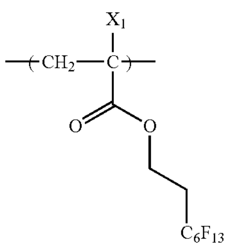
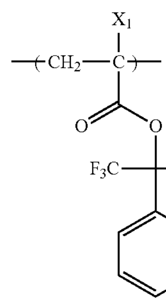
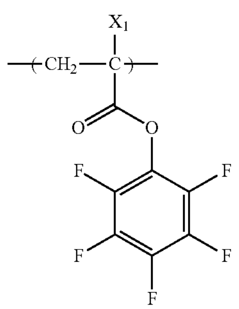
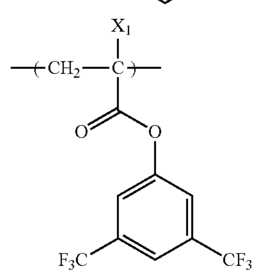
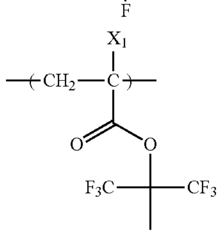
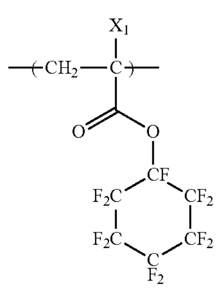
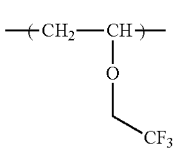
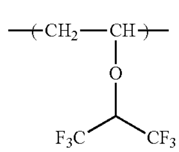
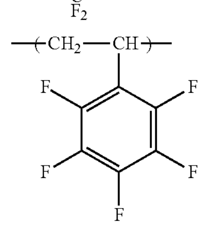
-continued
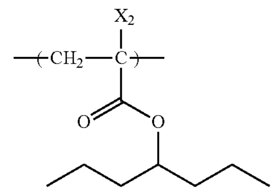
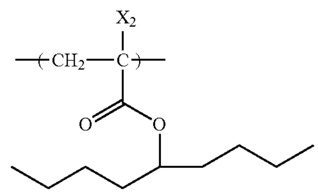
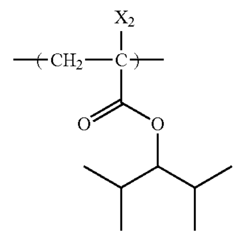
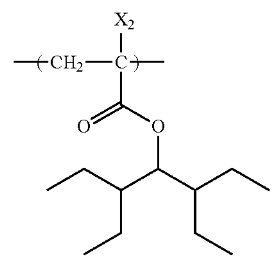
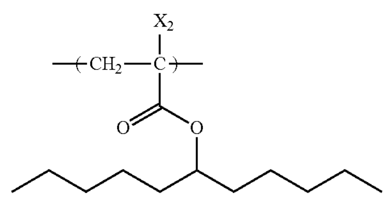
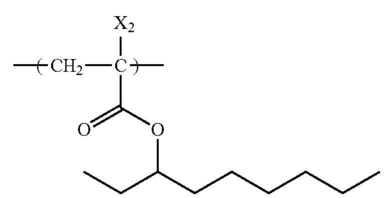
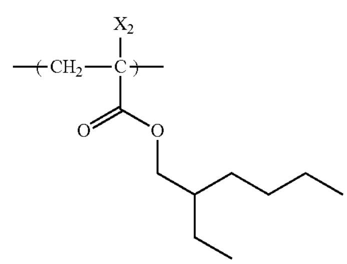
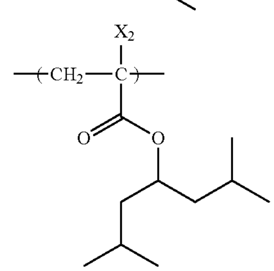

-continued
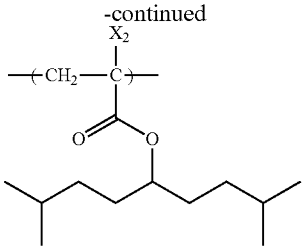
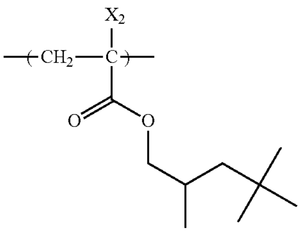
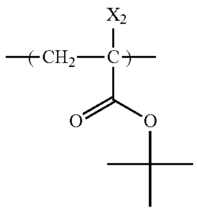
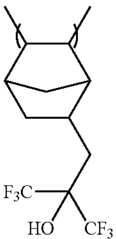
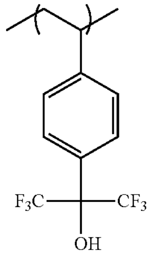
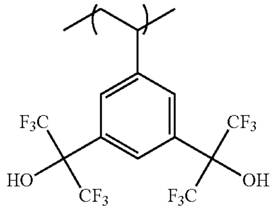
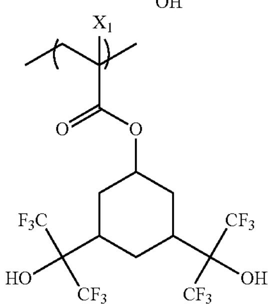
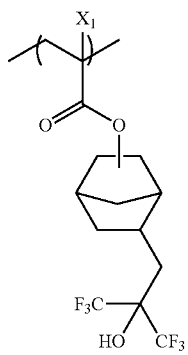
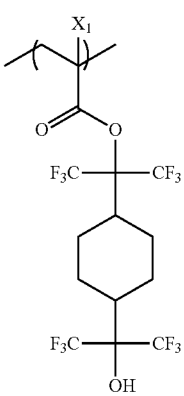
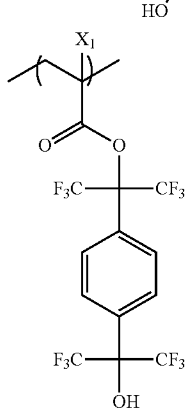
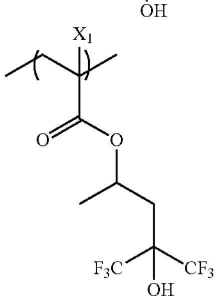
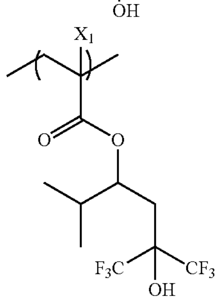
-continued
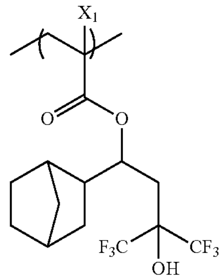
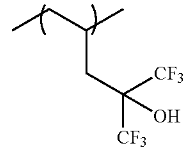
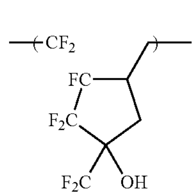
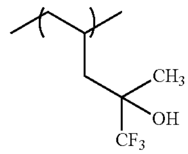
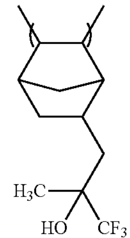
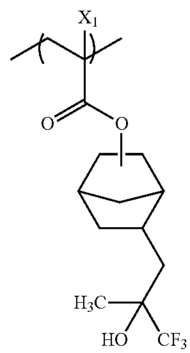
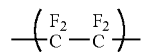
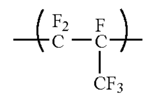
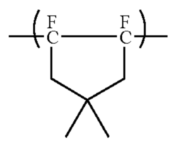
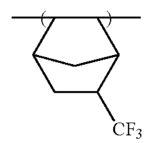
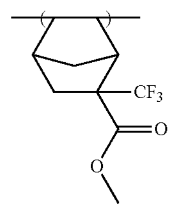
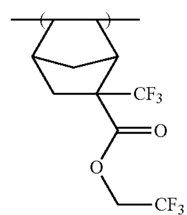
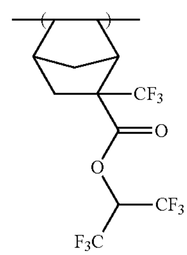
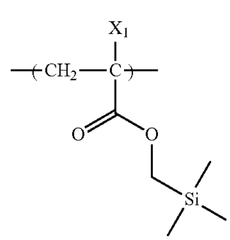
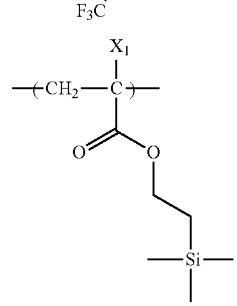

-continued

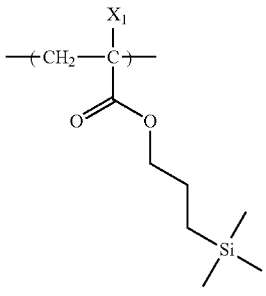

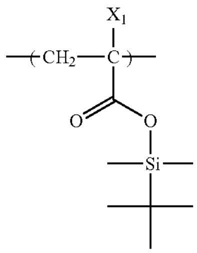

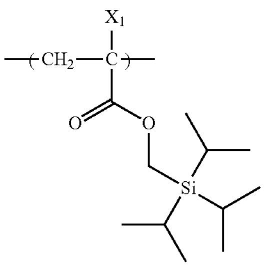

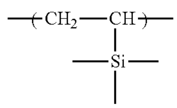

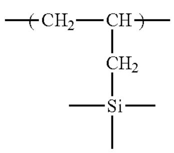

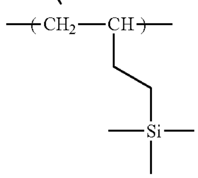

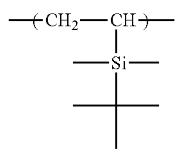

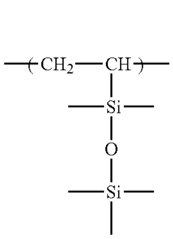

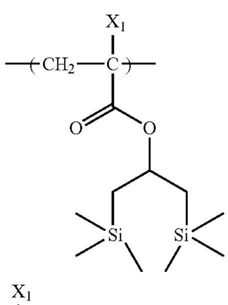

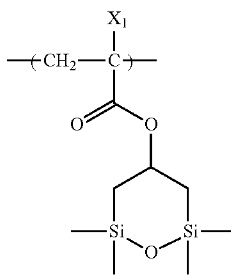

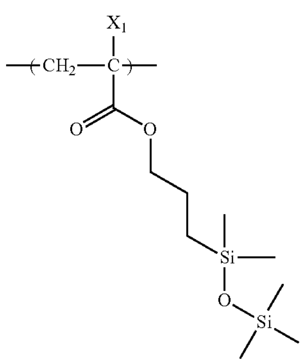

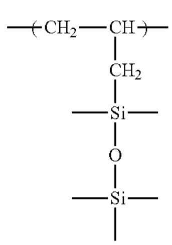

-continued

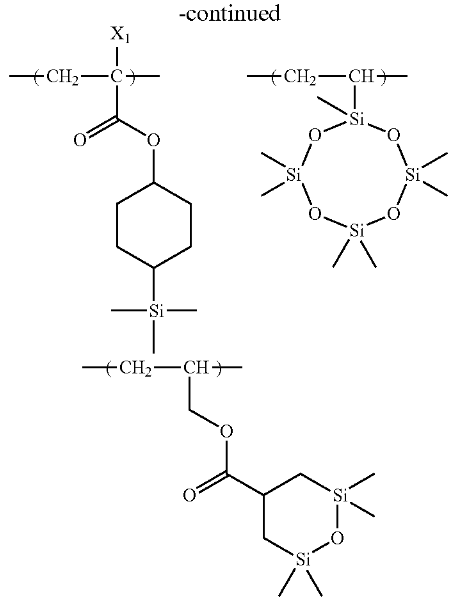

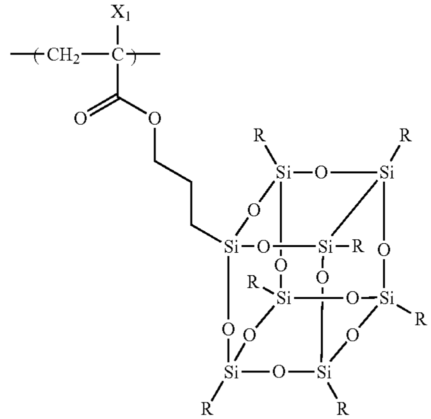

R = $CH_3$, $C_2H_5$, $C_3H_7$, $C_4H_9$

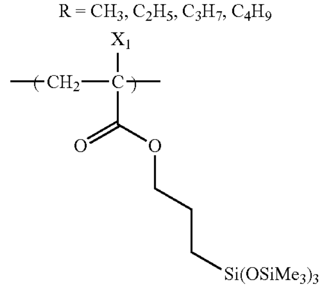

Furthermore, the hydrophobic resin (HR) may contain at least one group selected from the following (x) and (z):

(x) a polar group, and (z) a group capable of decomposing by the action of an acid.

Examples of the polar group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred polar groups include a fluorinated alcohol group (preferably hexafluoroisopropanol), a sulfonimide group and a bis(alkylcarbonyl)methylene group.

The repeating unit having (x) a polar group includes, for example, a repeating unit where the polar group is directly bonded to the main chain of the resin, such as repeating unit by an acrylic acid or a methacrylic acid, and a repeating unit where the polar group is bonded to the main chain of the resin through a linking group, and the polar group may be also introduced into the terminal of the polymer chain by using a polar group-containing polymerization initiator or chain transfer agent at the polymerization. All of these cases are preferred.

The content of the repeating unit having (x) a polar group is preferably from 1 to 50 mol %, more preferably from 3 to 35 mol %, still more preferably from 5 to 20 mol %, based on all repeating units in the hydrophobic resin.

Specific examples of the repeating unit having (x) a polar group are illustrated below. In specific examples, Rx represents H, $CH_3$, $CH_2OH$ or $CF_3$.

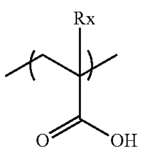
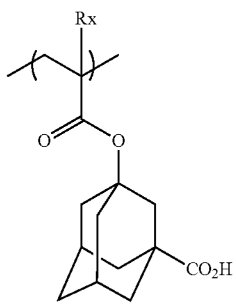
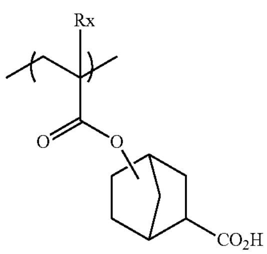
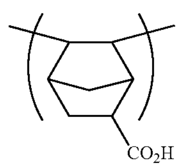
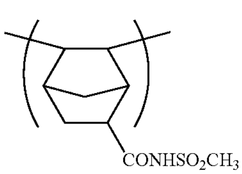
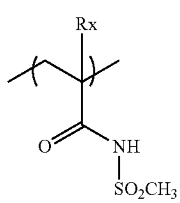
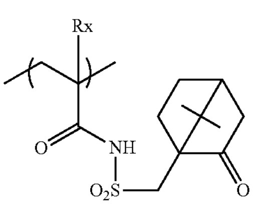
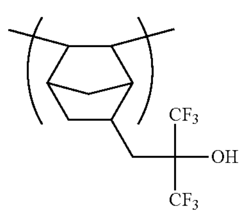

-continued

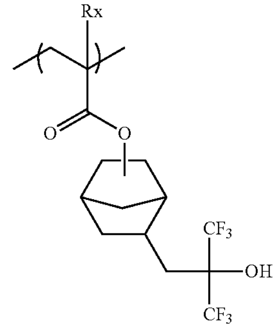
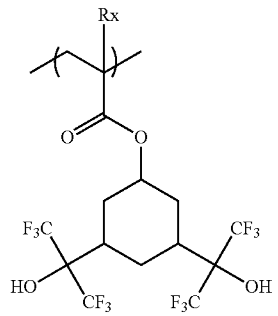
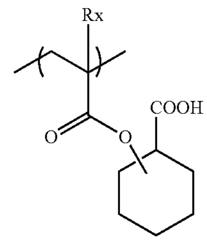
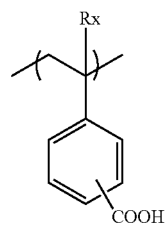
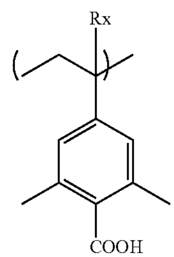
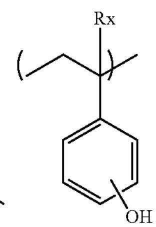
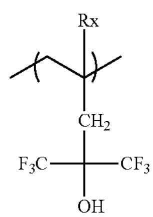
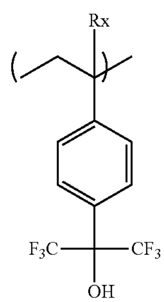
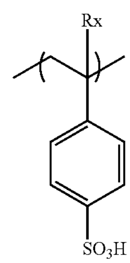
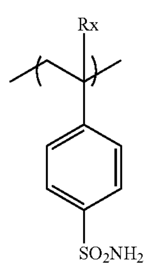
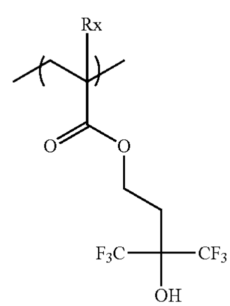

-continued

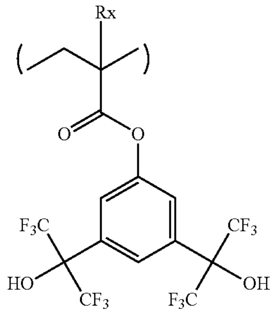

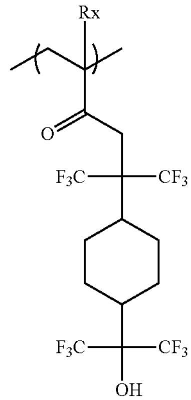

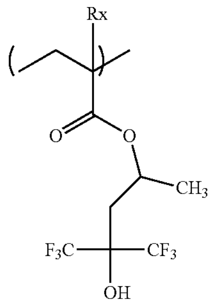

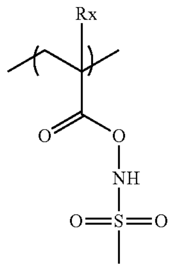

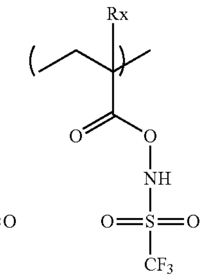

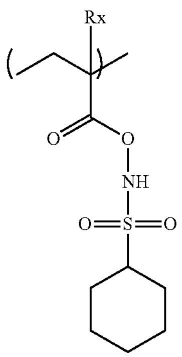

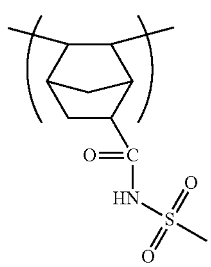

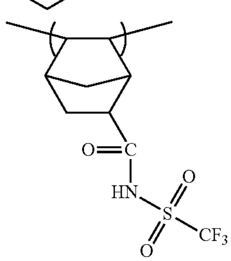

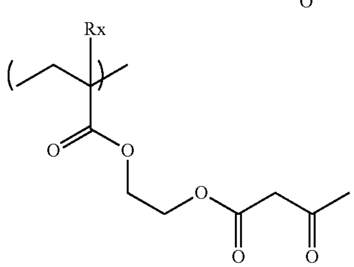

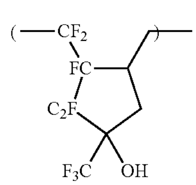

Examples of the repeating unit having (z) a group capable of decomposing by the action of an acid, contained in the hydrophobic resin (HR), are the same as those of the repeating unit having an acid-decomposable group described for the acid-decomposable resin.

In the hydrophobic resin (HR), the content of the repeating unit having (z) a group capable of decomposing by the action of an acid is preferably from 1 to 80 mol %, more preferably from 10 to 80 mol %, still more preferably from 20 to 60 mol %, based on all repeating units in the hydrophobic resin.

The hydrophobic resin (HR) may further contain a repeating unit represented by the following formula (VI):

(VI)

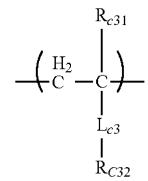

In formula (VI), $R_{c31}$ represents a hydrogen atom, an alkyl group which may be substituted with fluorine, a cyano group or a —$CH_2$—O—$R_{ac2}$ group, wherein $R_{ac2}$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. Each of these groups may be substituted with a fluorine atom or a silicon atom.

$L_{c3}$ represents a single bond or a divalent linking group.

The alkyl group of $R_{c32}$ in formula (VI) is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably a phenyl group or a naphthyl group, which are an aryl group having a carbon number of 6 to 20, and these groups may have a substituent.

$R_{c32}$ is preferably an unsubstituted alkyl group or a fluorine atom-substituted alkyl group.

The divalent linking group of $L_{c3}$ is preferably an alkylene group (preferably having a carbon number of 1 to 5), an oxy group, a phenylene group or an ester bond (a group represented by —COO—).

The hydrophobic resin (HR) may contain, as the repeating unit represented by formula (VI), a repeating unit represented by the following formula (VII) or (VIII):

(VII)

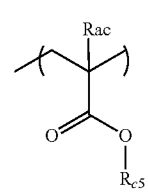

-continued (VIII)

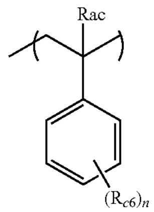

In formula (VII), $R_{c5}$ represents a hydrocarbon group having at least one cyclic structure and having neither a hydroxy group nor a cyano group.

In formulae (VII) and (VIII), Rac represents a hydrogen atom, an alkyl group which may be substituted with a fluorine atom, a cyano group or a —$CH_2$—O—$Rac_2$ group, wherein $Rac_2$ represents a hydrogen atom, an alkyl group or an acyl group. Rac is preferably a hydrogen atom, a methyl group, a hydroxymethyl group or a trifluoromethyl group, more preferably a hydrogen atom or a methyl group.

The cyclic structure contained in $R_{c5}$ includes a monocyclic hydrocarbon group and a polycyclic hydrocarbon group. Examples of the monocyclic hydrocarbon group include a cycloalkyl group having a carbon number of 3 to 12, and a cycloalkenyl group having a carbon number of 3 to 12. The monocyclic hydrocarbon group is preferably a monocyclic hydrocarbon group having a carbon number of 3 to 7.

The polycyclic hydrocarbon group includes a ring assembly hydrocarbon group and a crosslinked cyclic hydrocarbon group. The crosslinked cyclic hydrocarbon ring includes, for example, a bicyclic hydrocarbon ring, a tricyclic hydrocarbon ring and a tetracyclic hydrocarbon ring. The crosslinked cyclic hydrocarbon ring also includes a condensed cyclic hydrocarbon ring (for example, a condensed ring formed by fusing a plurality of 5- to 8-membered cycloalkane rings). Preferred crosslinked cyclic hydrocarbon rings include a norbornyl group and an adamantyl group.

These alicyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

In formula (VIII), $R_{c6}$ represents an alkyl group, a cycloalkyl group, an alkenyl group, a cycloalkenyl group, an alkoxycarbonyl group or an alkylcarbonyloxy group. Each of these groups may be substituted with a fluorine atom or a silicon atom.

The alkyl group of $R_{c6}$ is preferably a linear or branched alkyl group having a carbon number of 1 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The alkoxycarbonyl group is preferably an alkoxycarbonyl group having a carbon number of 2 to 20.

The alkylcarbonyloxy group is preferably an alkylcarbonyloxy group having a carbon number of 2 to 20.

n represents an integer of 0 to 5. When n is 2 or more, each $R_{c6}$ may be the same as or different from every other $R_{c6}$.

$R_{c6}$ is preferably an unsubstituted alkyl group or an alkyl group substituted with a fluorine atom, more preferably a trifluoromethyl group or a tert-butyl group.

It is also preferred that the hydrophobic resin (HR) further contains a repeating unit represented by the following formula (CII-AB):

(CII-AB)

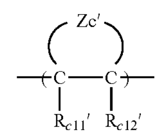

In formula (CII-AB), each of $R_{c11}$' and $R_{c12}$' independently represents a hydrogen atom, a cyano group, a halogen atom or an alkyl group.

$Z_c$' represents an atomic group for forming an alicyclic structure containing two carbon atoms (C—C) to which $Z_c$' is bonded.

Formula (CII-AB) is preferably the following formula (CII-AB1) or (CII-AB2):

CII-AB1

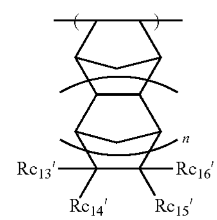

CII-AB2

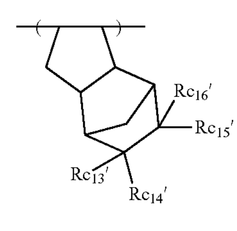

In formulae (CII-AB1) and (CII-AB2), each of $Rc_{13}$' to $Rc_{16}$' independently represents a hydrogen atom, a halogen atom, an alkyl group or a cycloalkyl group.

Also, at least two members out of $Rc_{13}'$ to $Rc_{16}'$ may combine to form a ring.
n represents 0 or 1.
Specific examples of the repeating unit represented by formula (VI) or (CII-AB) are illustrated below, but the present invention is not limited thereto. In the formulae, Ra represents H, $CH_3$, $CH_2OH$, $CF_3$ or CN.
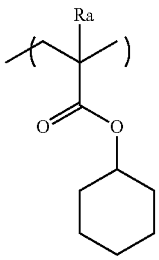
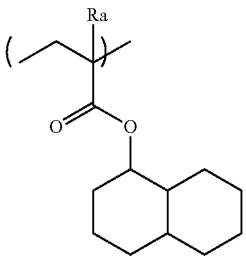
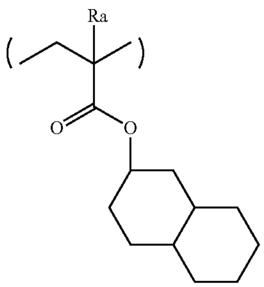
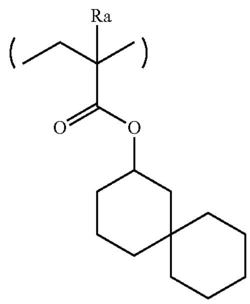
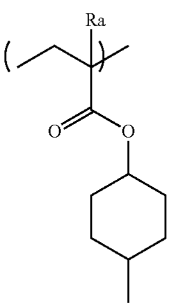
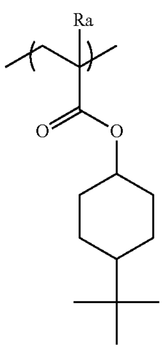
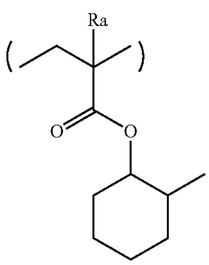
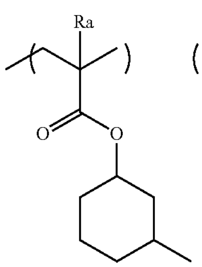
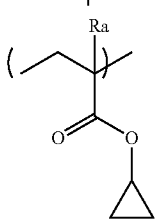
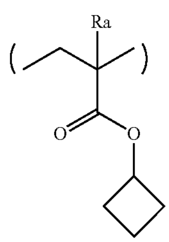
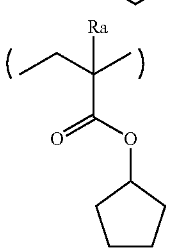
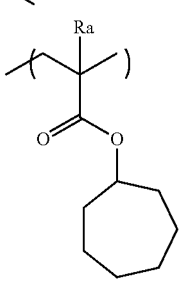
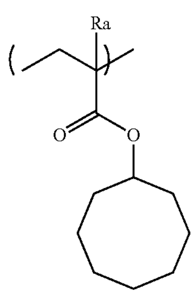
-continued
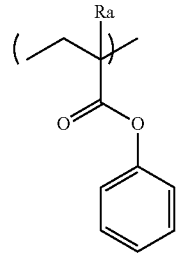
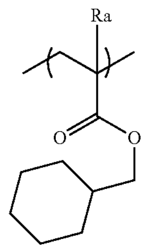
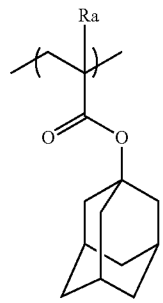
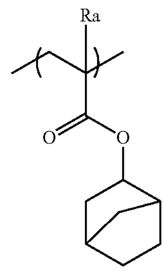
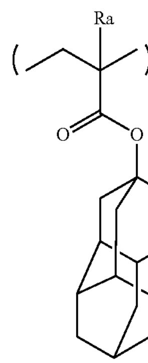
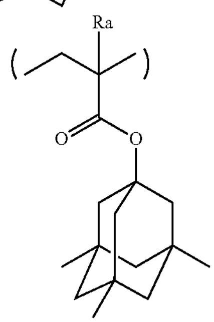
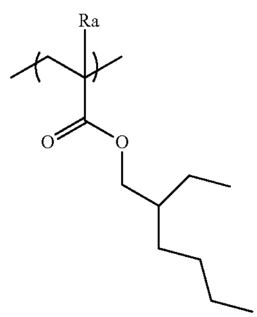
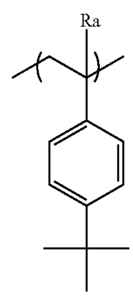
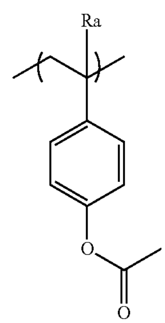
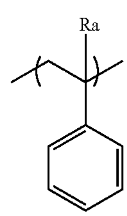
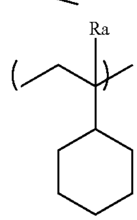
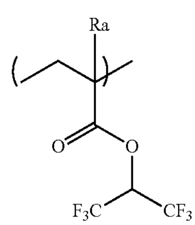
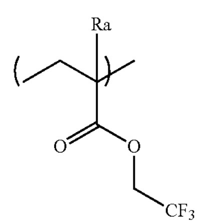
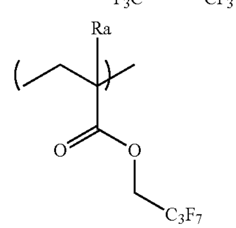

-continued
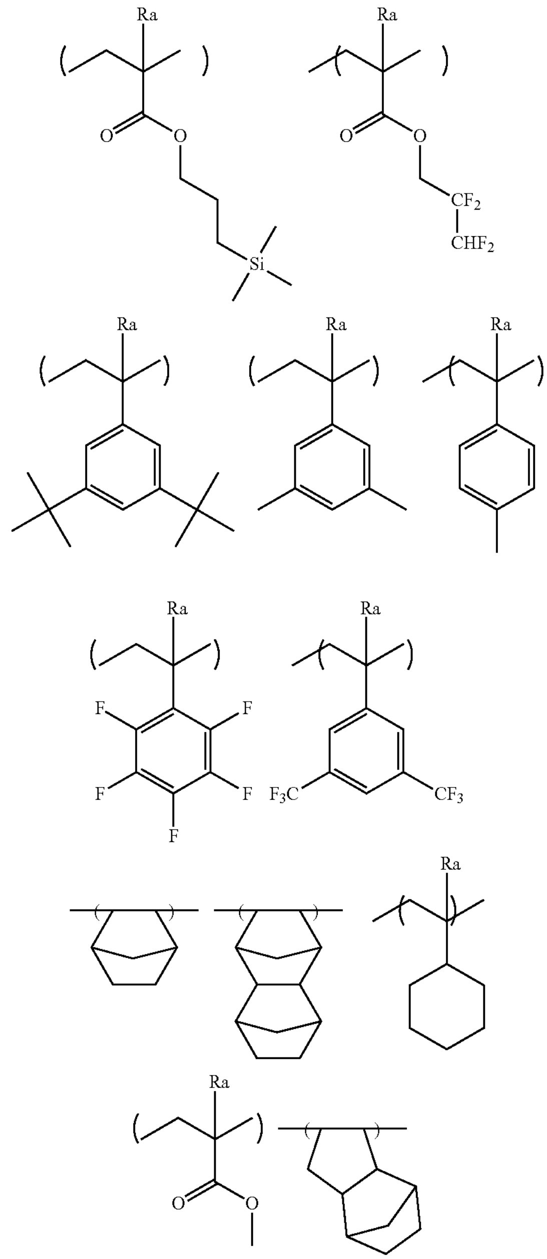
Specific examples of the hydrophobic resin (HR) are illustrated below. Also, the molar ratio of repeating units (corresponding to repeating units starting from the left), weight average molecular weight and polydispersity of each resin are shown in Tables 1 to 3 later.
(HR-1)
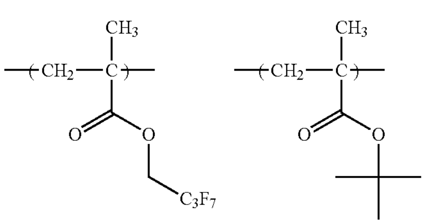
-continued
(HR-2)
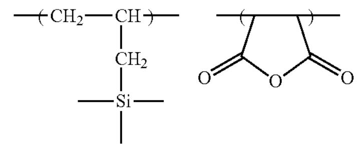
(HR-3)
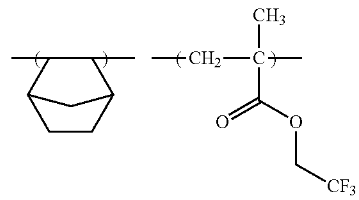
(HR-4)
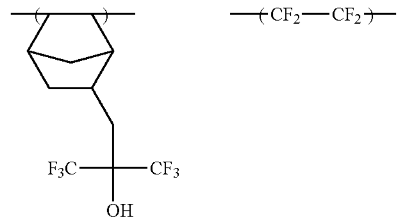
(HR-5)
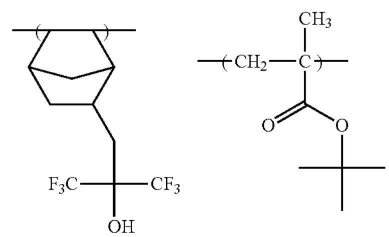
(HR-6)
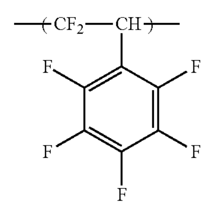
(HR-7)
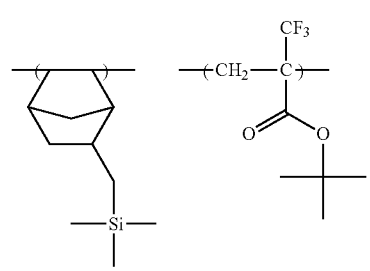
(HR-8)
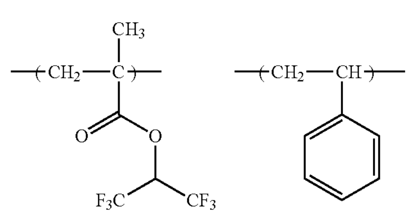

-continued
(HR-9)
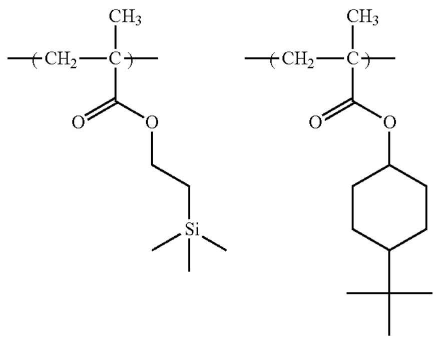
(HR-10)
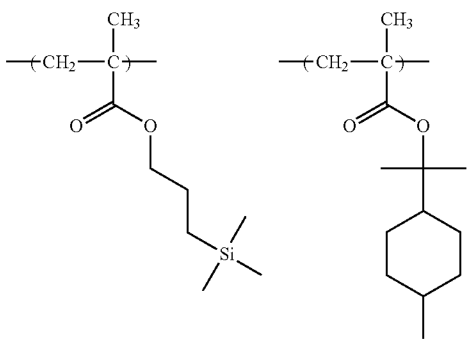
(HR-11)
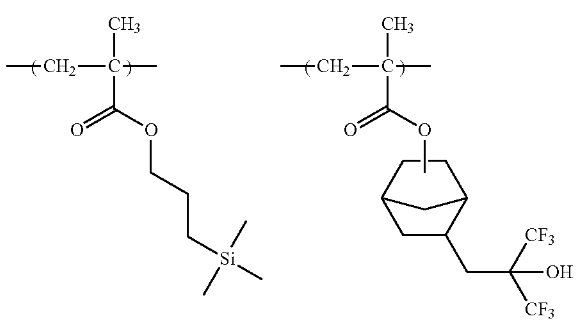
(HR-12)
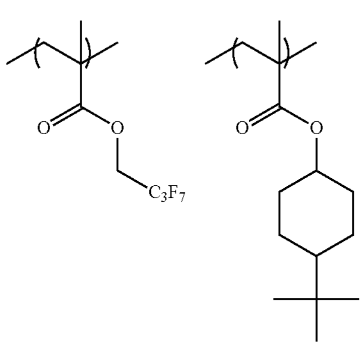
-continued
(HR-13)
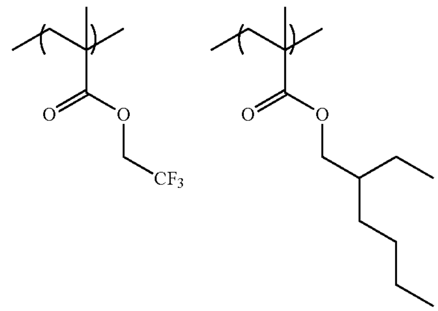
(HR-14)
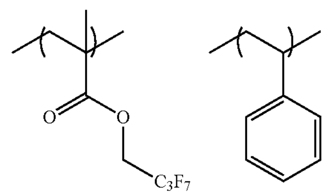
(HR-15)
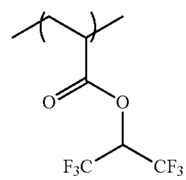
(HR-16)
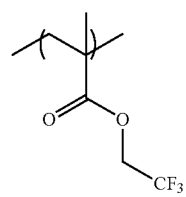
(HR-17)
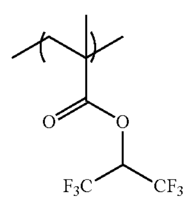
(HR-18)
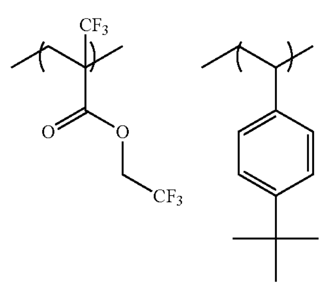

-continued
(HR-19)
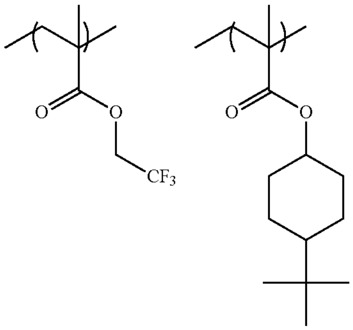
(HR-20)
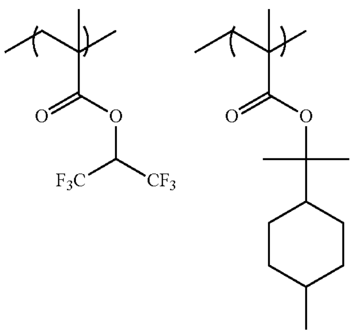
(HR-21)
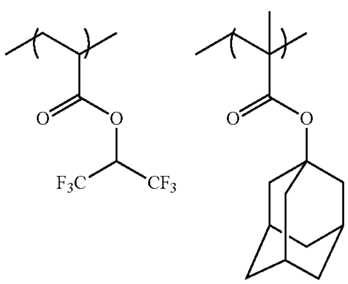
(HR-22)
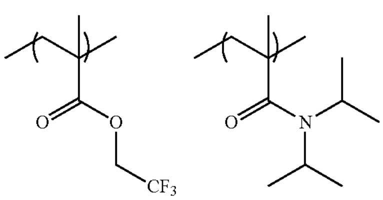
(HR-23)
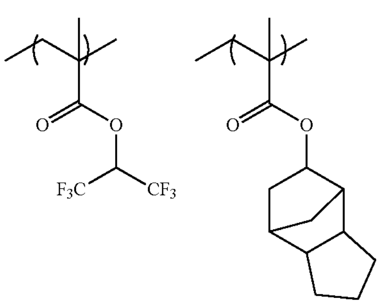
-continued
(HR-24)
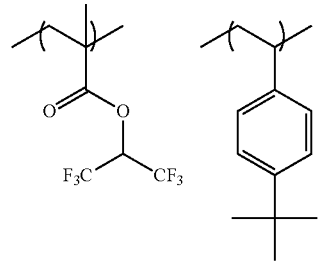
(HR-25)
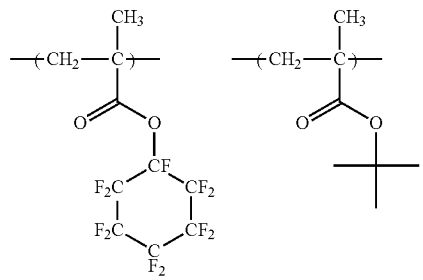
(HR-26)
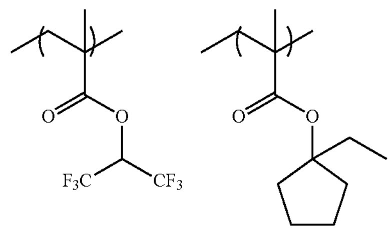
(HR-27)
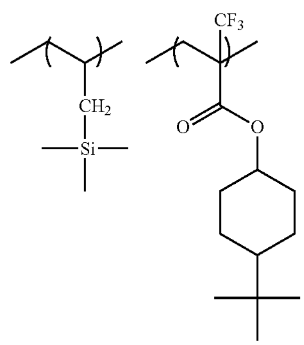
(HR-28)
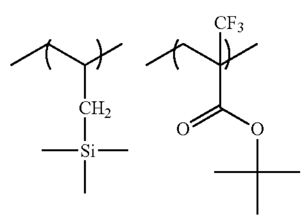
(HR-29)
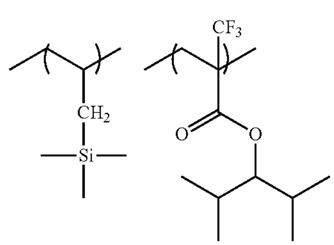

-continued
(HR-30)
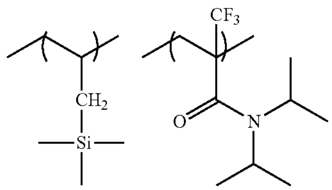
(HR-31)
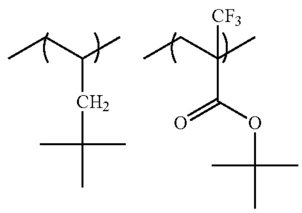
(HR-32)
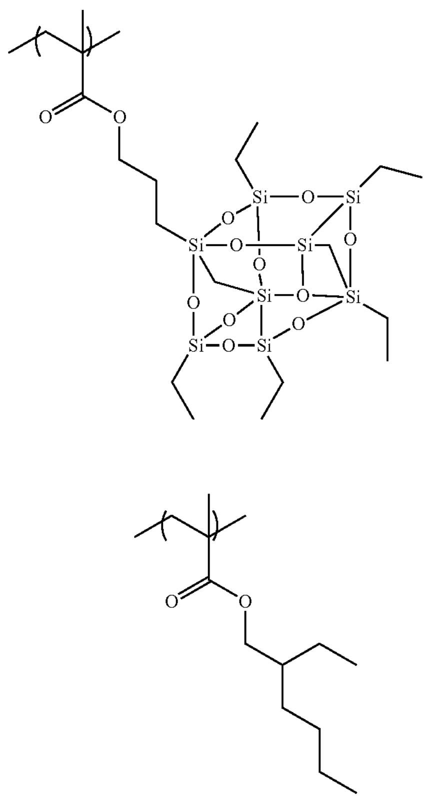
(HR-33)
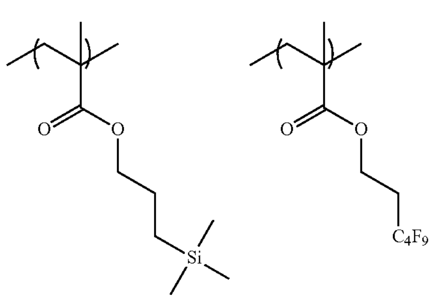
-continued
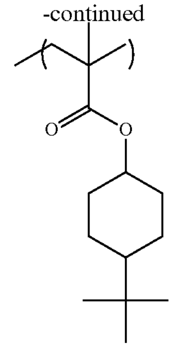
(HR-34)
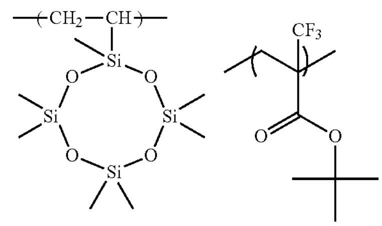
(HR-35)
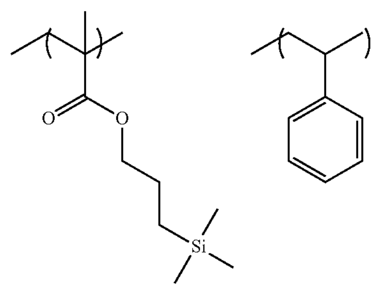
(HR-36)
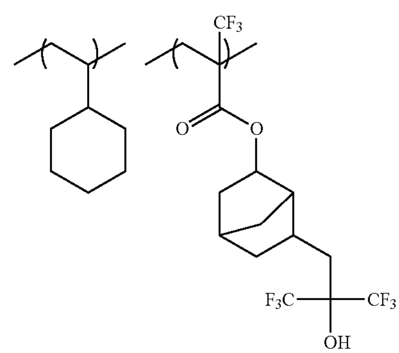
(HR-37)
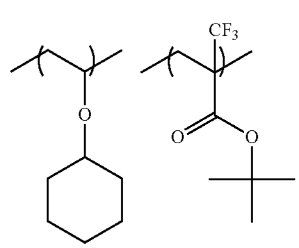

-continued
(HR-38)
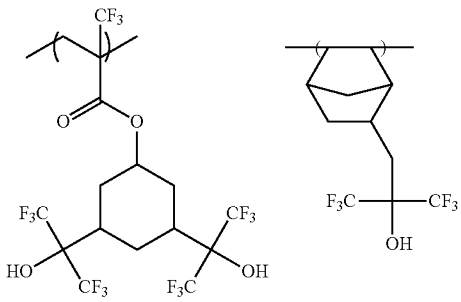
(HR-39)
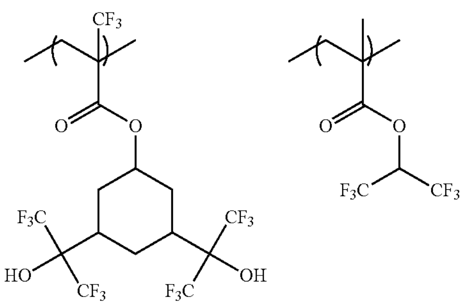
(HR-40)
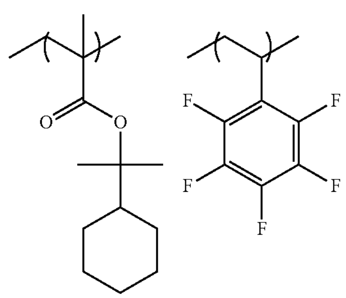
(HR-41)
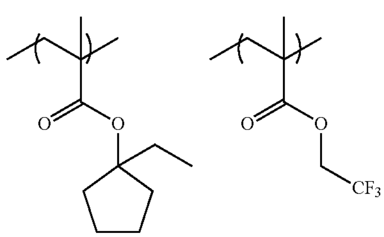
(HR-42)
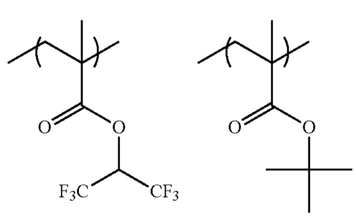
-continued
(HR-43)
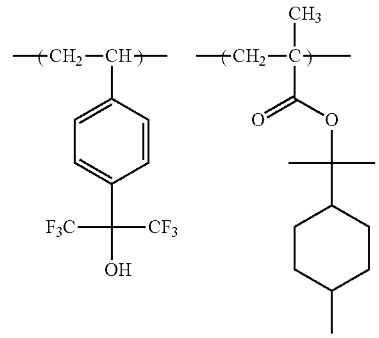
(HR-44)
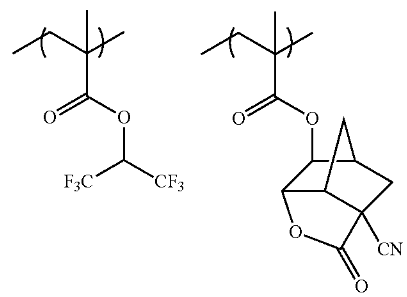
(HR-45)
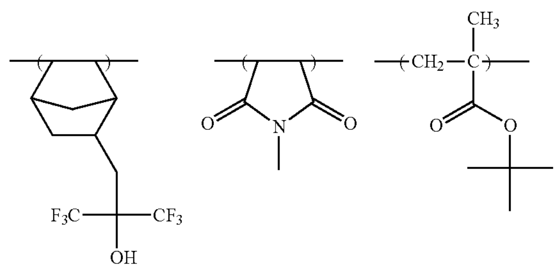
(HR-46)
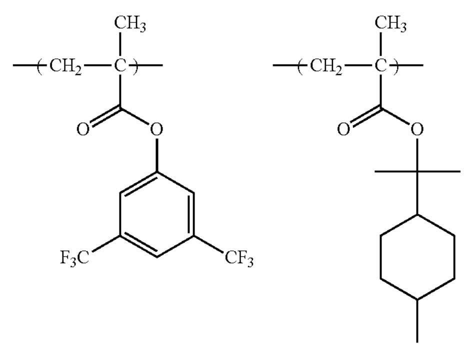
(HR-47)
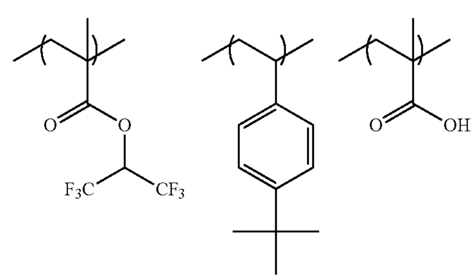

-continued
(HR-48)
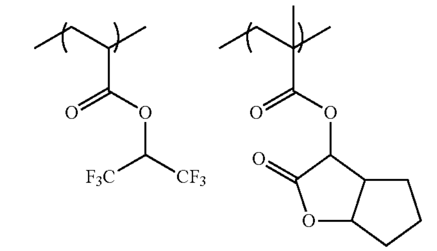
(HR-49)
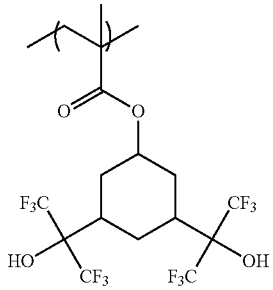
(HR-50)
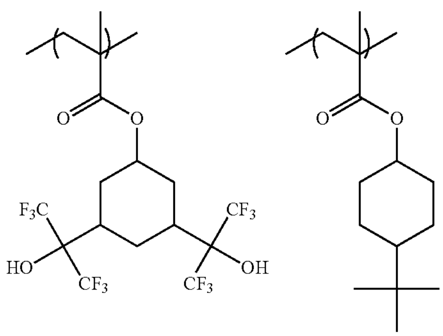
(HR-51)
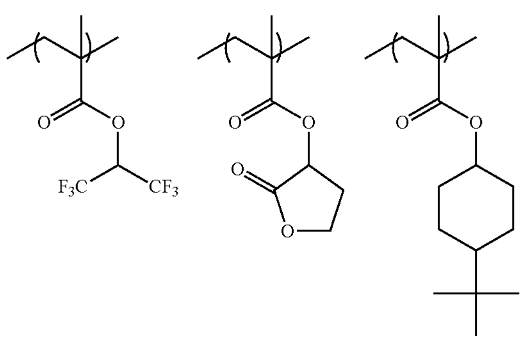
(HR-52)
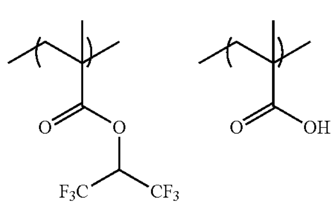
-continued
(HR-53)
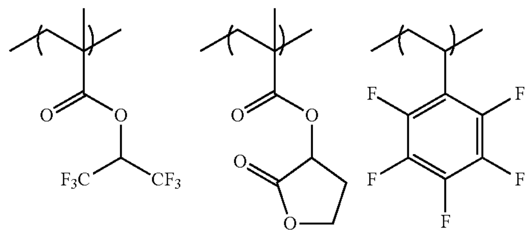
(HR-54)
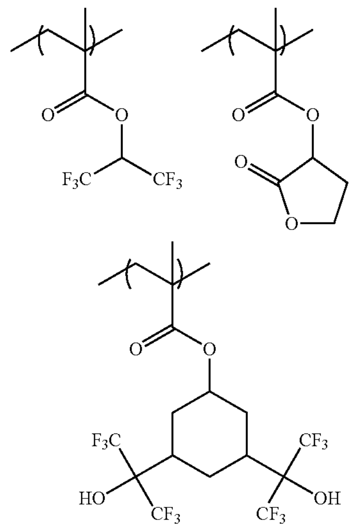
(HR-55)
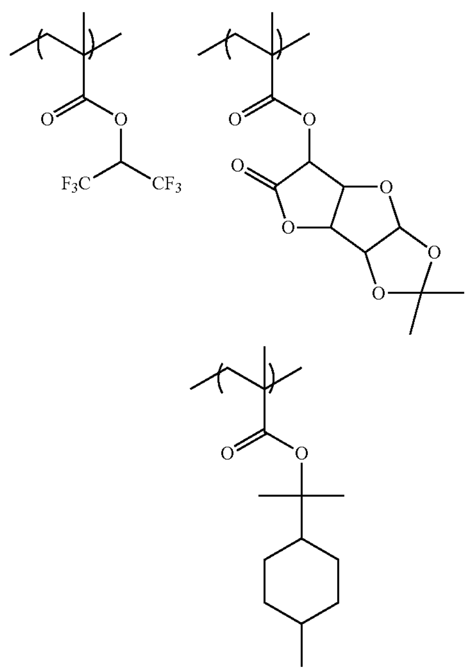
(HR-56)
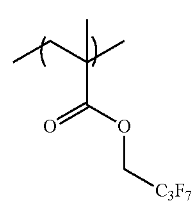

-continued
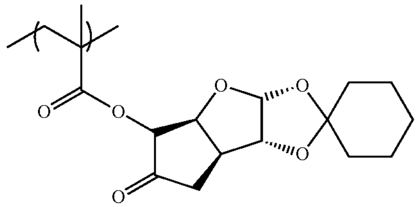
(HR-57)
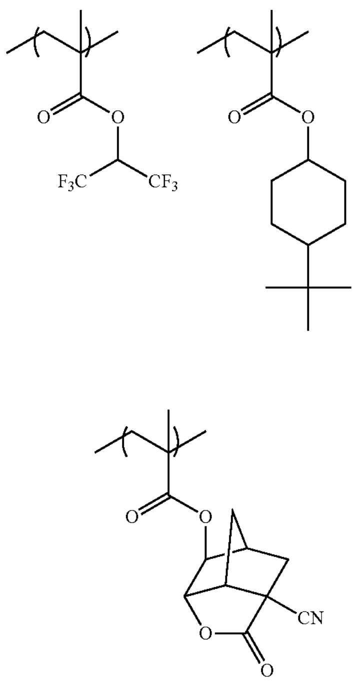
(HR-58)
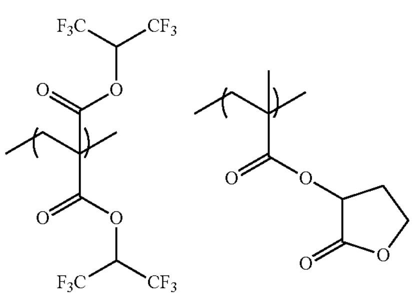
(HR-59)
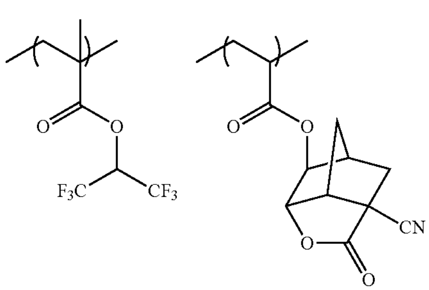
-continued
(HR-60)
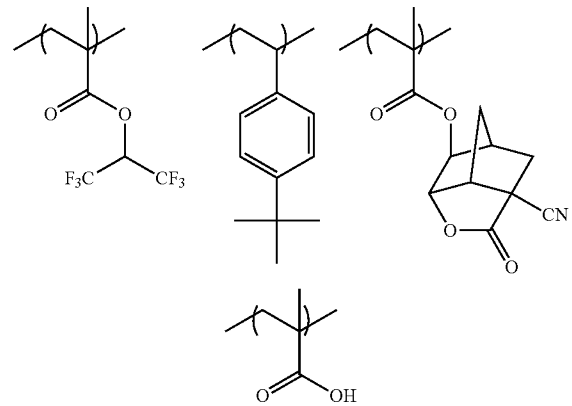
(HR-61)
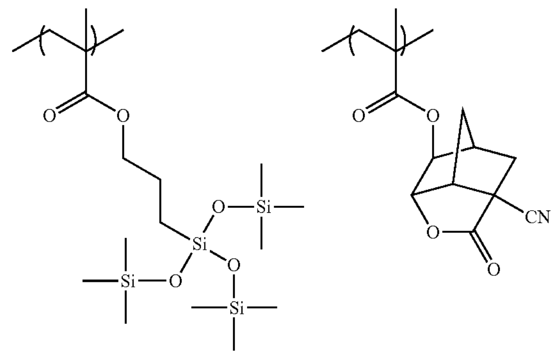
(HR-62)
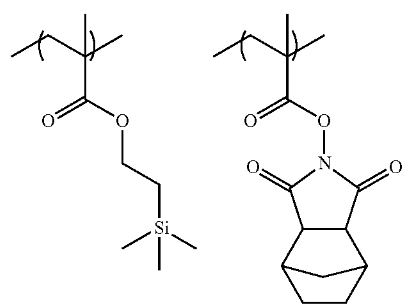
(HR-63)
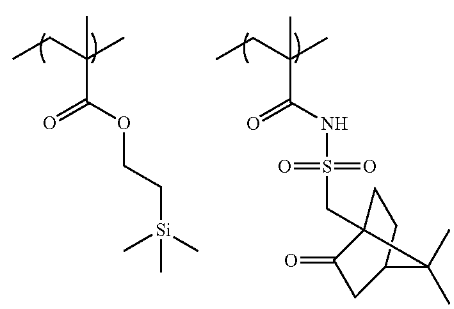
(HR-64)
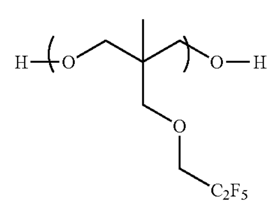

-continued
(HR-65)
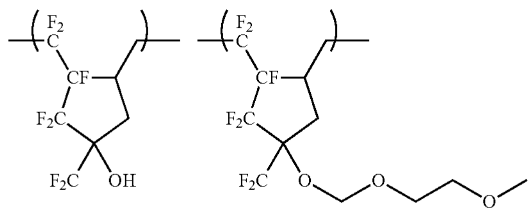
(HR-66)
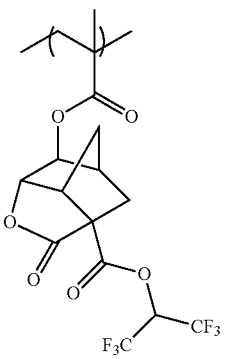
(HR-67)
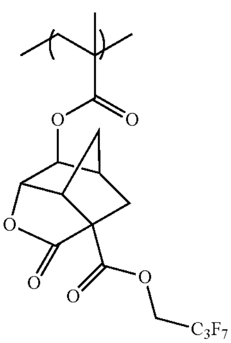
(HR-68)
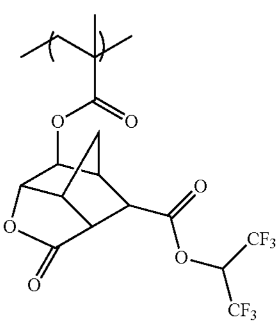
(HR-69)
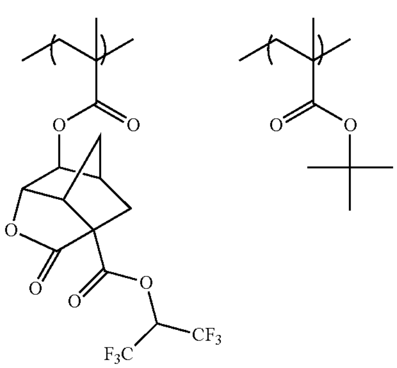
-continued
(HR-70)
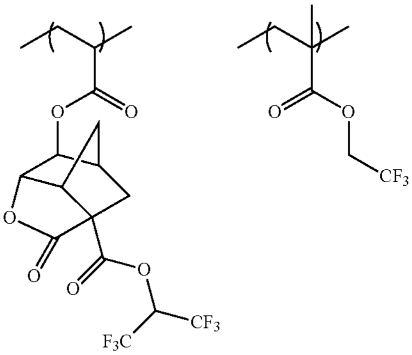
(HR-71)
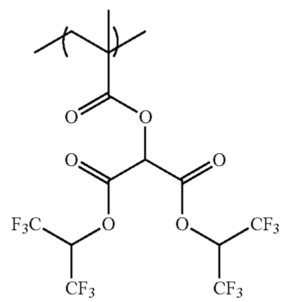
(HR-72)
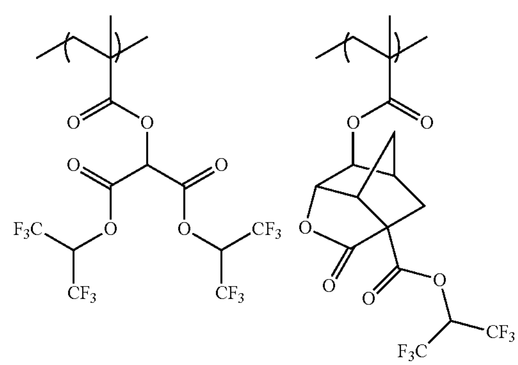
(HR-73)
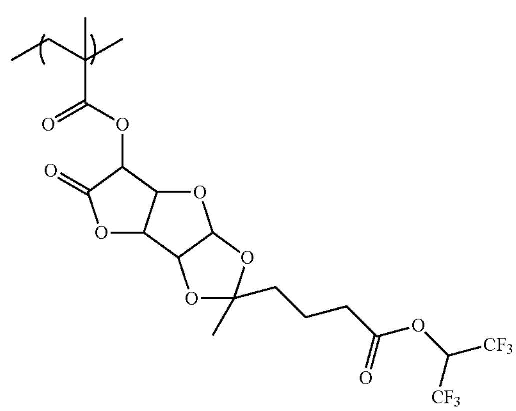

-continued
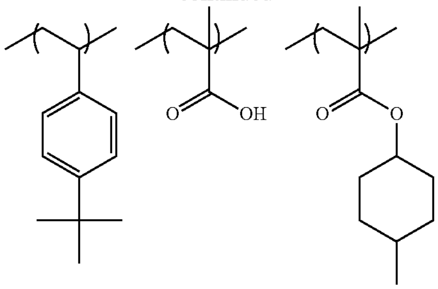
(HR-74)
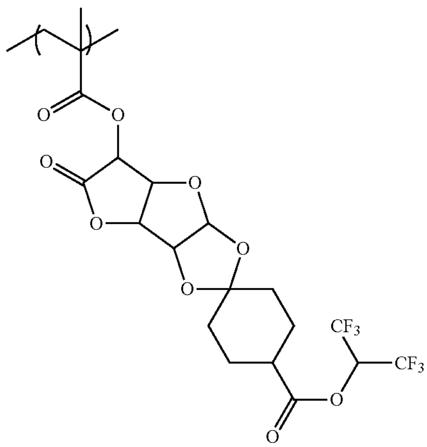
(HR-75)
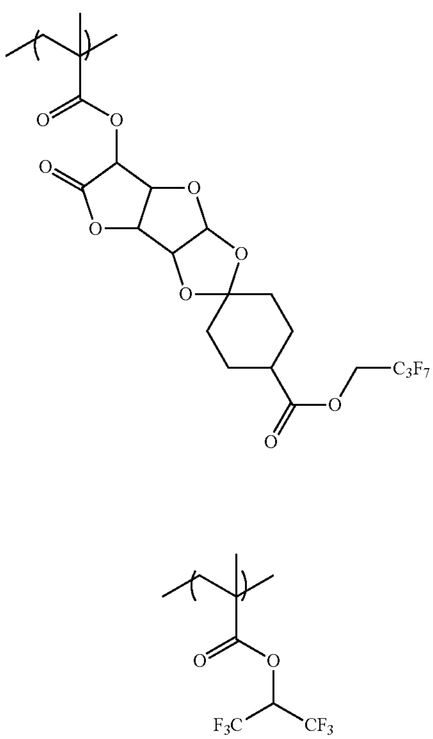
-continued
(HR-76)
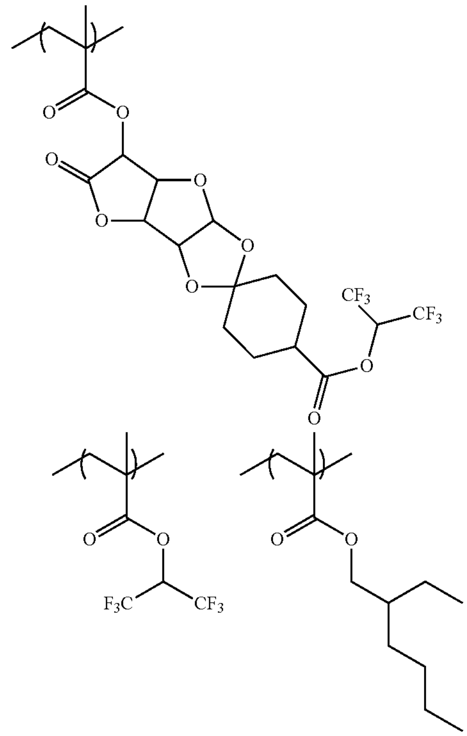
(HR-77)
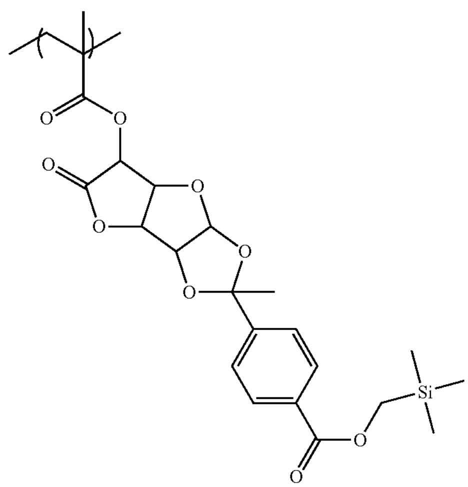
(HR-78)
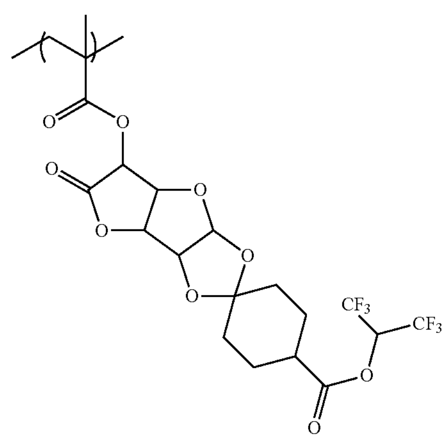

-continued
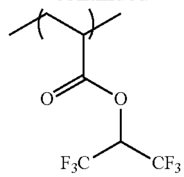
(HR-79)
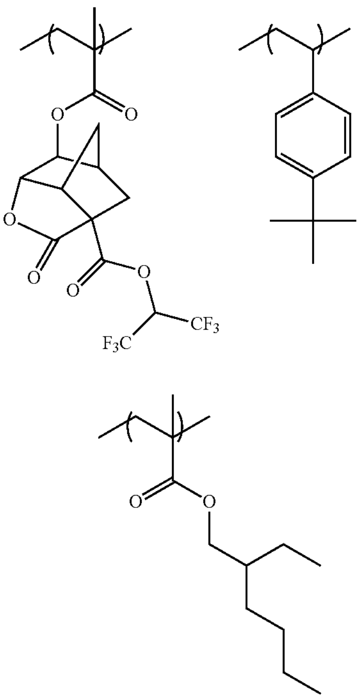
(HR-80)
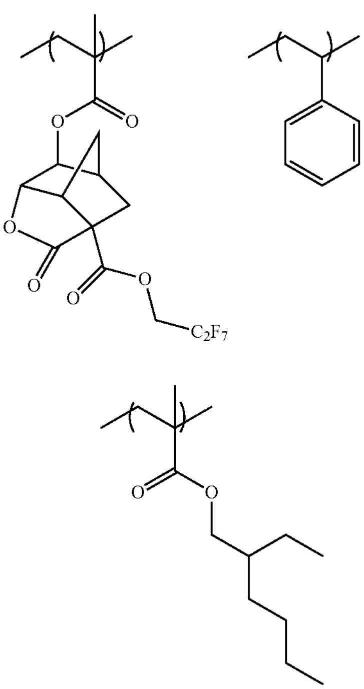
-continued
(HR-81)
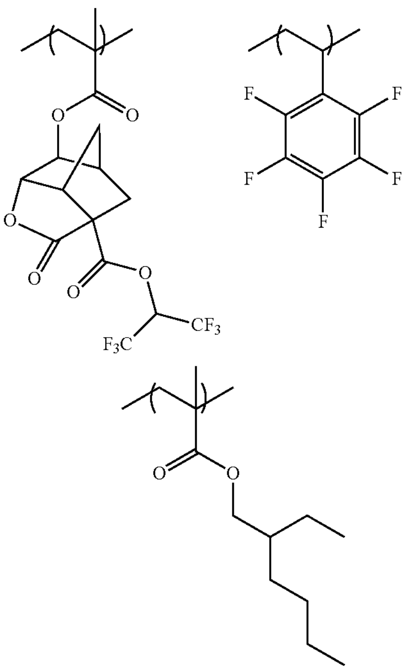
(HR-82)
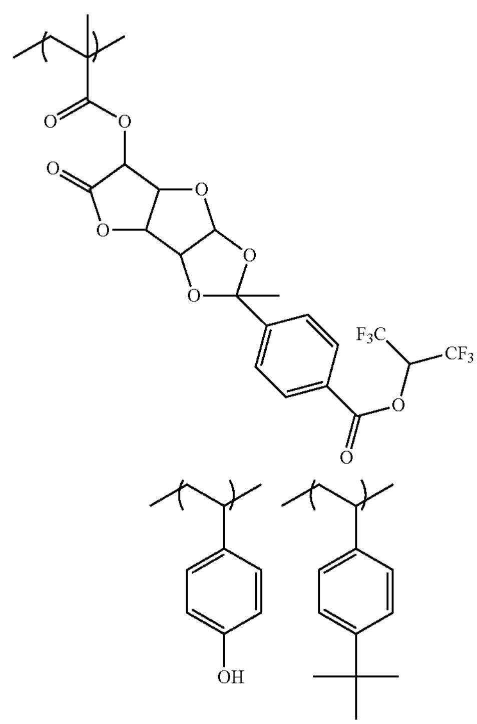
(HR-83)
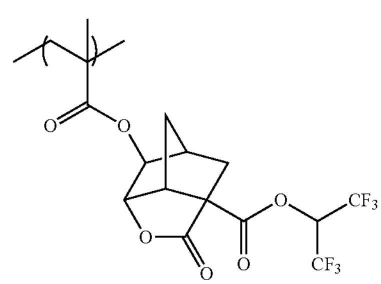

-continued
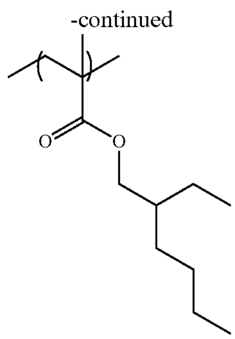
(HR-84)
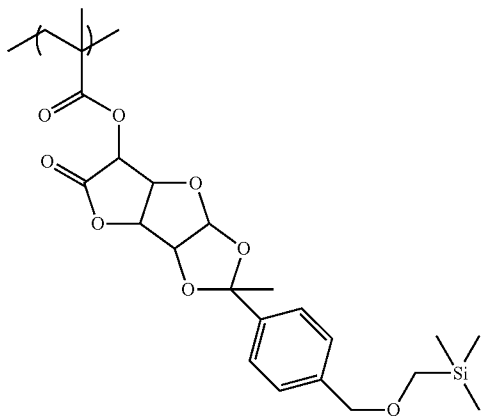
(HR-85)
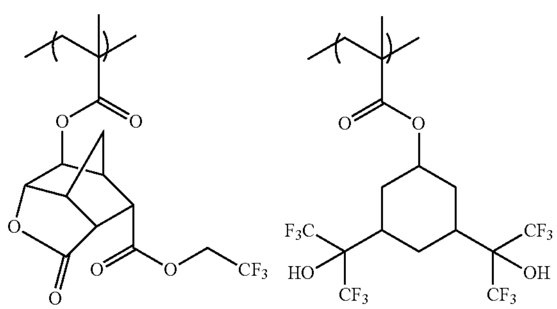
(HR-86)
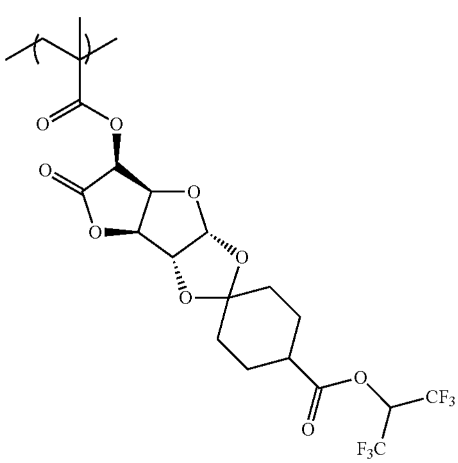
-continued
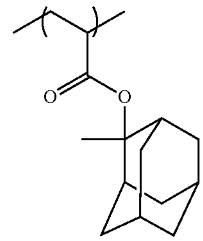
(HR-87)
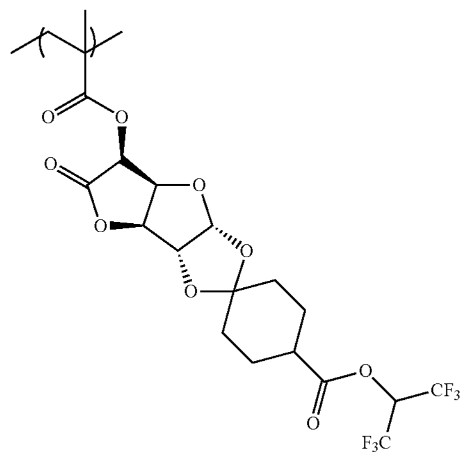
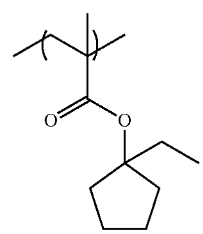
(HR-88)
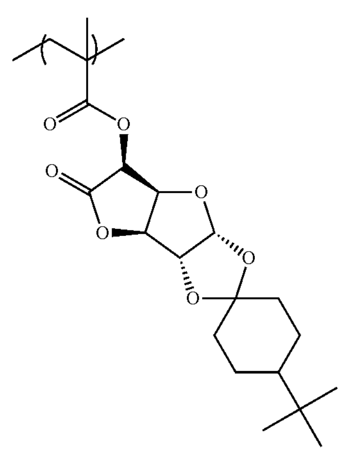

-continued
(HR-89)
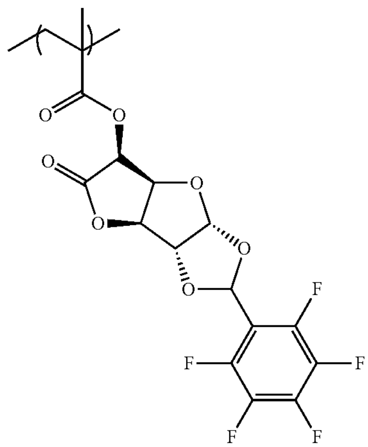
(HR-90)
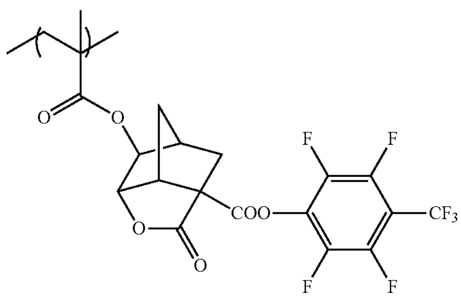
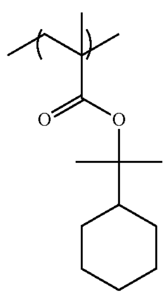
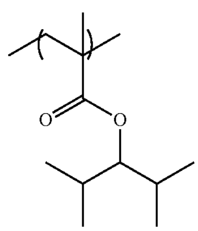
A-1
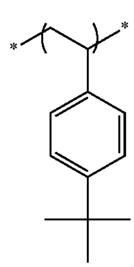
A-2
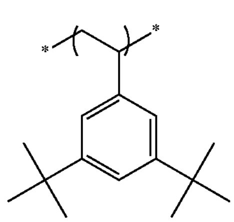
-continued
A-3
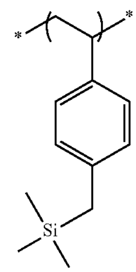
A-4
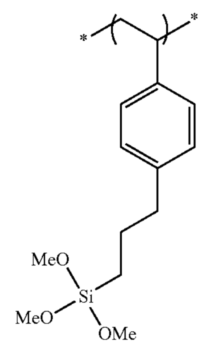
A-5
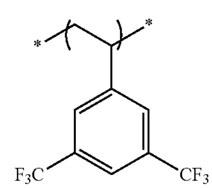
A-6
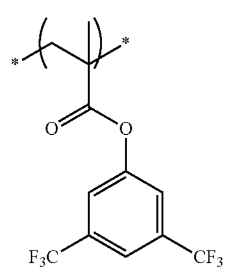
A-7
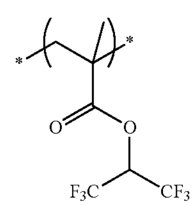
A-8
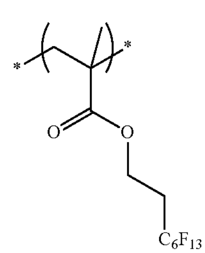

-continued
A-9
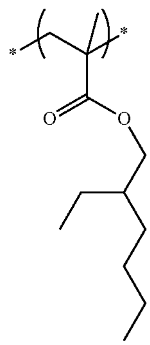
A-10
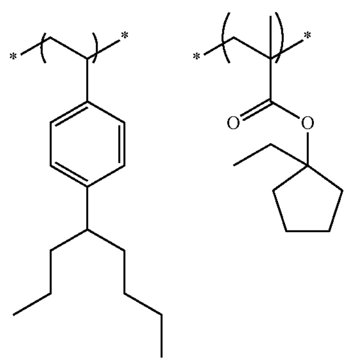
A-11
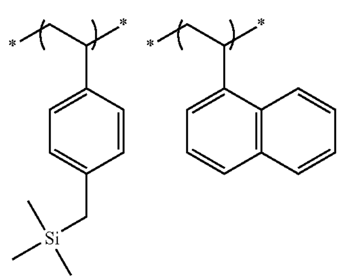
A-12
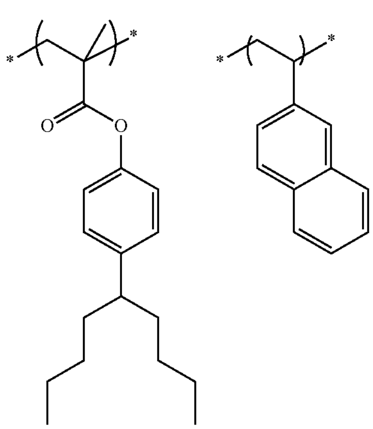
-continued
A-13
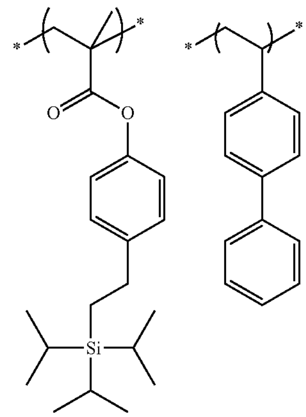
A-14
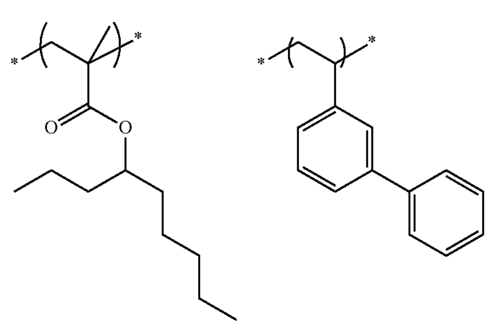
A-15
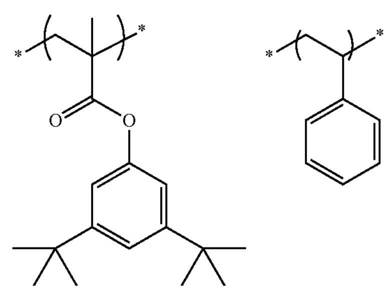
A-16
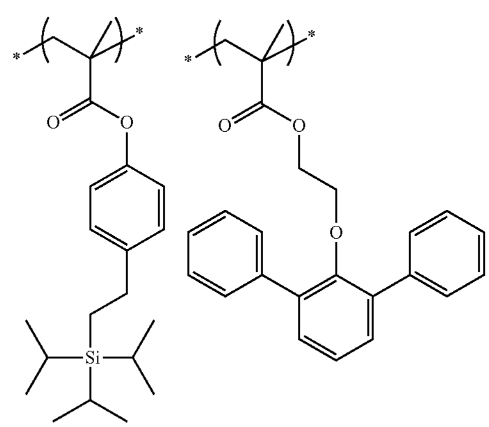

-continued
A-17
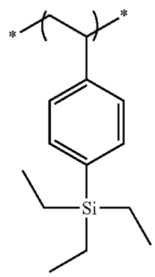
A-18
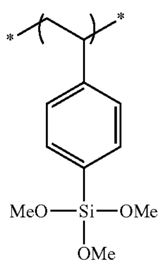
A-19
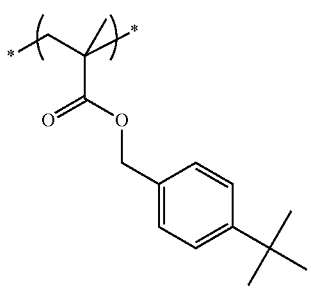
A-20
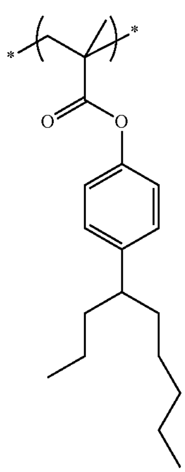
-continued
A-21
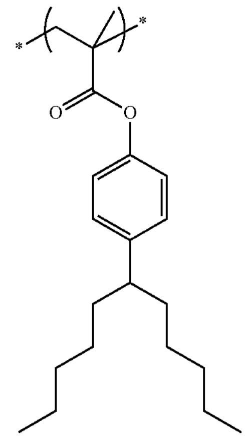
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |

TABLE 1-continued

| Resin | Composition | Mw | Mw/Mn |
|---|---|---|---|
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

TABLE 3

| Resin | Compositional Ratio | Mass Weight Average Molecular Weight (Mw) | Polydispersity (Mw/Mn) |
|---|---|---|---|
| A-1 | 100 | 11000 | 1.40 |
| A-2 | 100 | 12000 | 1.45 |
| A-3 | 100 | 11500 | 1.43 |
| A-4 | 100 | 11800 | 1.42 |
| A-5 | 100 | 11700 | 1.46 |
| A-6 | 100 | 11600 | 1.51 |
| A-7 | 100 | 11800 | 1.48 |
| A-8 | 100 | 11000 | 1.52 |
| A-9 | 100 | 11200 | 1.41 |
| A-10(1) | 97/3 | 11500 | 1.50 |
| A-10(2) | 95.5/4.5 | 11600 | 1.48 |
| A-10(3) | 94.5/5.5 | 11400 | 1.51 |
| A-10(4) | 93/7 | 11500 | 1.48 |
| A-11 | 70/30 | 11000 | 1.48 |
| A-12 | 70/30 | 11300 | 1.43 |
| A-13 | 80/20 | 11300 | 1.45 |
| A-14 | 80/20 | 11500 | 1.44 |
| A-15 | 80/20 | 11400 | 1.50 |
| A-16 | 80/20 | 11600 | 1.51 |
| A-17 | 100 | 11800 | 1.52 |
| A-18 | 100 | 11000 | 1.48 |
| A-19 | 100 | 11200 | 1.51 |

TABLE 3-continued

| Resin | Compositional Ratio | Mass Weight Average Molecular Weight (Mw) | Polydispersity (Mw/Mn) |
|---|---|---|---|
| A-20 | 100 | 11500 | 1.43 |
| A-21 | 100 | 11600 | 1.42 |

In the case where the hydrophobic resin contains a fluorine atom, the fluorine atom content is preferably from 5 to 80 mass %, more preferably from 10 to 80 mass %, based on the weight average molecular weight of the resin (HR). Also, the content of the fluorine atom-containing repeating unit is preferably from 10 to 100 mol %, more preferably from 30 to 100 mol %, based on all repeating units in the resin (HR).

In the case where the hydrophobic resin (HR) contains a silicon atom, the silicon atom content is preferably from 2 to 50 mass %, more preferably from 2 to 30 mass %, based on the weight average molecular weight of the resin (HR). Also, the content of the silicon atom-containing repeating unit is preferably from 10 to 90 mol %, more preferably from 20 to 80 mol %, based on all repeating units in the resin (HR).

The weight average molecular weight of the resin (HR) is, in terms of standard polystyrene, preferably from 1,000 to 100,000, more preferably from 1,000 to 50,000, still more preferably from 2,000 to 15,000.

One kind of a hydrophobic resin may be used alone, or two or more kinds of hydrophobic resins may be used in combination. The content of the resin (HR) in the composition may be appropriately adjusted so that the receding contact angle of the composition film can fall in the range above, but the content is preferably from 0.01 to 10 mass %, more preferably from 0.1 to 9 mass %, still more preferably from 0.5 to 8 mass %, based on the entire solid content of the composition.

In the resin (HR), similarly to the acid-decomposable resin, it is of course preferred that the amount of impurities such as metal is small, but the content of residual monomers or oligomer components is also preferably from 0 to 10 mass %, more preferably from 0 to 5 mass %, still more preferably from 0 to 1 mass %. By satisfying these conditions, a resist free from extraneous substances in liquid or change with aging in the sensitivity and the like can be obtained. Furthermore, in view of resolution, resist profile, side wall of pattern, roughness and the like, the molecular weight distribution (Mw/Mn, sometimes referred to as "polydispersity") is preferably from 1 to 3, more preferably from 1 to 2, still more preferably from 1 to 1.8, and most preferably from 1 to 1.5.

As the resin (HR), various commercially available products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the above-described solvent capable of dissolving the composition of the present invention, such as propylene glycol monomethyl ether acetate (PGMEA), propylene glycol monomethyl ether (PGME) and cyclohexanone. The polymerization is more preferably performed using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The concentration during the reaction is usually from 5 to 50 mass %, preferably from 30 to 50 mass %. The reaction temperature is usually from 10 to 150° C., preferably from 30 to 120° C., more preferably from 60 to 100° C.

After the completion of reaction, the reaction product is allowed to cool to room temperature and purified. In the purification, a conventional method, for example, a liquid-liquid extraction method of applying water washing or combining an appropriate solvent to remove residual monomers or oligomer components, a purification method in a solution state, such as ultrafiltration of removing by extraction only polymers having a molecular weight lower than a specific molecular weight, a reprecipitation method of adding dropwise the resin solution to a poor solvent to solidify the resin in the poor solvent and thereby remove residual monomers or the like, or a purification method in a solid state, such as washing of the resin slurry with a poor solvent after separation by filtration, may be applied. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent used may be appropriately selected according to the kind of the polymer from, for example, a hydrocarbon, a halogenated hydrocarbon, a nitro compound, an ether, a ketone, an ester, a carbonate, an alcohol, a carboxylic acid, water, and a mixed solvent containing such a solvent. Among these, the precipitation or reprecipitation solvent is preferably a solvent containing at least an alcohol (particularly methanol or the like) or water.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into account the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank, according to a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. More specifically, there may be used a method comprising, after the completion of radical polymerization reaction, precipitating a resin by bringing the polymer into contact with a solvent in which the polymer is sparingly soluble or insoluble (step a), separating the resin from the solution (step b), anew dissolving the resin in a solvent to prepare a resin solution A (step c), precipitating a resin solid by bringing the resin solution A into contact with a solvent in which the resin is sparingly soluble or insoluble and which is in a volumetric amount of less than 10 times (preferably a volumetric amount of 5 times or less) the resin solution A (step d), and separating the precipitated resin (step e).

With respect to the film formed from the resist composition according to the present invention, the exposure may be performed by filling a liquid (immersion medium) having a refractive index higher than that of air between the film and the lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film, and water is preferably used in view of easy availability and easy handleability, in addition to the above-described aspects.

Furthermore, a medium having a refractive index of 1.5 or more can be also used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if an impurity greatly differing in the refractive index from water is mixed, this incurs distortion of the optical image projected on the resist film. Therefore, the water used is preferably distilled water. Pure water obtained by further filtering the distilled water through an ion exchange filter or the like may be also used.

The electrical resistance of water is preferably 18.3 MQcm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or heavy water ($D_2O$) may be used in place of water.

In order to prevent the film from directly contacting with the immersion liquid, a film (hereinafter, sometimes referred to as a "topcoat") sparingly soluble in the immersion liquid may be provided between the film formed of the composition of the present invention and the immersion liquid. The functions required of the topcoat are suitability for coating as an overlayer of the composition film and sparing solubility in the immersion liquid. The topcoat is preferably unmixable with the composition film and capable of being uniformly coated as an overlayer of the composition film.

Specific examples of the topcoat include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is suitable also as the topcoat. Furthermore, a commercially available topcoat material may be also appropriately used. If impurities are dissolved out into the immersion liquid from the topcoat, the optical lens is contaminated. In this viewpoint, residual monomer components of the polymer are preferably little contained in the topcoat.

On peeling off the topcoat, a developer may be used or a releasing agent may be separately used. The releasing agent is preferably a solvent hardly permeating the film. From the standpoint that the peeling step can be performed simultaneously with the development step of the film, the topcoat is preferably peelable with an organic solvent-containing developer.

With no difference in the refractive index between the topcoat and the immersion liquid, the resolution is enhanced. In the case of using water as the immersion liquid, the topcoat preferably has a refractive index close to the refractive index of the immersion liquid. From the standpoint of having a refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and insoluble in water. In the case where the immersion liquid is an organic solvent, the topcoat may be either water-soluble or water-insoluble.

The hydrophobic resin may be used also in the case of not performing the immersion exposure. As for the effects brought about here, the hydrophobic resin can be unevenly distributed to the resist film surface and irrespective of exposed area or unexposed area of the resist film, accelerates the dissolution of the resist film in the organic developer, as a result, even in the case of forming a very fine pattern, the hydrophobic resin is expected to fulfill a function of suppressing roughening of pattern surface (particularly in the case of EUV exposure) and generation of a T-top profile, a reverse tapered profile and a bridge part.

[F] Surfactant

The composition of the present invention may further contain a surfactant. By virtue of containing a surfactant, when an exposure light source having a wavelength of 250 nm or less, particularly 220 nm or less, is used, a pattern with good sensitivity, resolution and adherence as well as fewer development defects can be formed.

As for the surfactant, it is particularly preferred to use a fluorine-containing and/or silicon-containing surfactant.

Examples of the fluorine-containing and/or silicon-containing surfactants include surfactants described in paragraph [0276] of U.S. Patent Application Publication 2008/0248425. There may be also used EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by DIC Corporation); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). Also, polysiloxane polymer KP-341 (produced by Shin-Etsu Chemical Co., Ltd.) may be used as the silicon-containing surfactant.

As the surfactant, other than these known surfactants, a surfactant may be synthesized by using a fluoro-aliphatic compound produced by a telomerization process (also called a telomer process) or an oligomerization process (also called an oligomer process). Specifically, a fluoro-aliphatic group-containing polymer derived from the fluoro-aliphatic compound may be used as the surfactant. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate or methacrylate and/or a (poly(oxyalkylene)) methacrylate, and the polymer may have an irregular distribution or may be a block copolymer.

Examples of the poly(oxyalkylene) group include a poly (oxyethylene) group, a poly(oxypropylene) group and a poly (oxybutylene) group. This group may also be a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoro-aliphatic group-containing monomer and a (poly(oxyalkylene)) acrylate or methacrylate may be also a ternary or higher copolymer obtained by simultaneously copolymerizing two or more different fluoro-aliphatic group-containing monomers or two or more different (poly(oxyalkylene)) acrylates or methacrylates.

Examples thereof include, as the commercially available surfactant, Megaface F 178, F-470, F-473, F-475, F-476 and F-472 (produced by DIC Corporation) and further include a copolymer of a $C_6F_{13}$ group-containing acrylate or methacrylate with a (poly(oxyalkylene)) acrylate or methacrylate, a copolymer of a $C_6F_{13}$ group-containing acrylate or methacrylate with a (poly(oxyalkylene)) acrylate or methacrylate and a (poly(oxypropylene))acrylate or methacrylate, a copolymer of a $C_8F_{17}$ group-containing acrylate or methacrylate with a (poly(oxyethylene)) acrylate or methacrylate, and a copolymer of a $C_8F_{17}$ group-containing acrylate or methacrylate with a (poly(oxyethylene)) acrylate or methacrylate and a (poly(oxypropylene)) acrylate or methacrylate.

Surfactants other than the fluorine-containing and/or silicon-containing surfactant, described in paragraph [0280] of U.S. Patent Application Publication No. 2008/0248425, may be also used.

As for these surfactants, one kind may be used alone, or two or more kinds may be used in combination.

In the case where the composition of the present invention contains a surfactant, the content of the surfactant is preferably from 0 to 2 mass %, more preferably from 0.0001 to 2 mass %, still more preferably from 0.0005 to 1 mass %, based on the entire solid content of the composition.

[G] Other Additives

The composition of the present invention may further contain a dissolution inhibiting compound, a dye, a plasticizer, a photosensitizer, a light absorber, and/or a compound capable of accelerating dissolution for a developer (for example, a phenol compound having a molecular weight of 1,000 or less, or a carboxyl group-containing alicyclic or aliphatic compound).

The composition of the present invention may further contain a dissolution inhibiting compound. The "dissolution inhibiting compound" as used herein is a compound having a molecular weight of 3,000 or less and being capable of decomposing by the action of an acid to decrease the solubility in a developer containing an organic solvent.

In order to prevent reduction in the transparency to light at a wavelength of 220 nm or less, the dissolution inhibiting compound is preferably an alicyclic or aliphatic compound having an acid-decomposable group, such as acid-decomposable group-containing cholic acid derivative described in *Proceeding of SPIE,* 2724, 355 (1996). Examples of the acid-decomposable group and alicyclic structure are the same as those described above.

In the case where the resist composition of the present invention is exposed to a KrF excimer laser or irradiated with an electron beam, the dissolution inhibiting compound preferably contains a structure where a phenolic hydroxyl group of a phenol compound is substituted with an acid-decomposable group. The phenol compound is preferably a compound containing from 1 to 9 phenol skeletons, more preferably from 2 to 6 phenol skeletons.

In the case where the composition of the present invention contains a dissolution inhibiting compound, the content thereof is preferably from 3 to 50 mass %, more preferably from 5 to 40 mass %, based on the entire solid content of the composition.

Specific examples of the dissolution inhibiting compound are illustrated below.

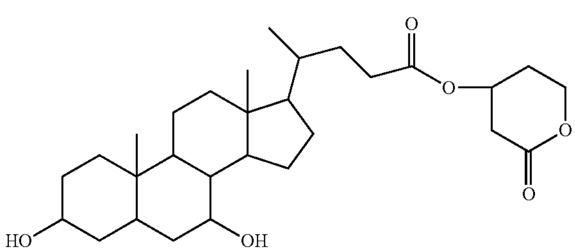

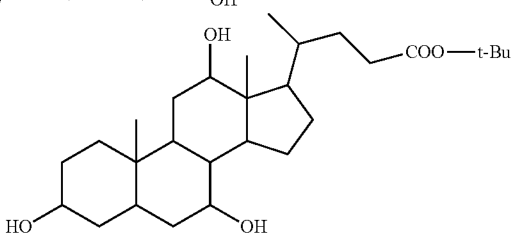

-continued

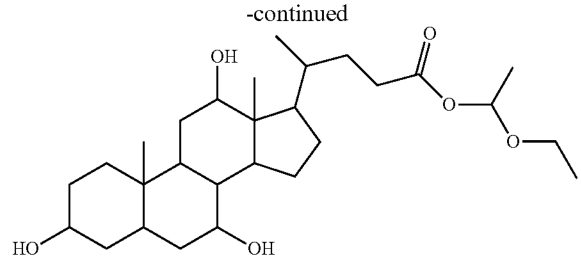

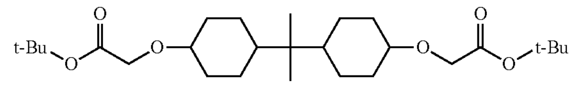

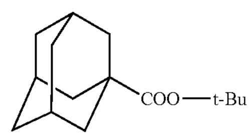

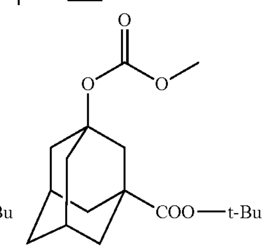

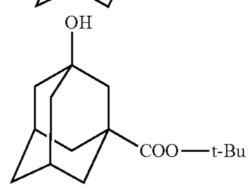

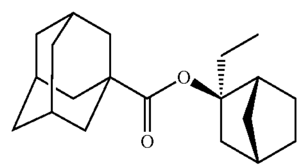

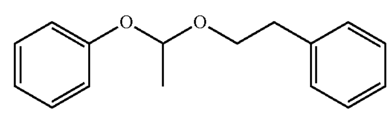

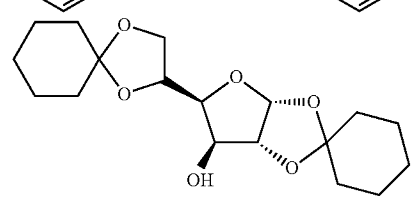

The phenol compound having a molecular weight of 1,000 or less can be easily synthesized by referring to the method described, for example, in JP-A-4-122938, JP-A-2-28531, U.S. Pat. No. 4,916,210 and European Patent 219294.

Examples of the alicyclic or aliphatic compound having a carboxy group include a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

<Pattern Forming Method>

The pattern forming method according to the present invention comprises (A) forming a film (resist film) by using the above-described composition, (B) exposing the film, and (C) developing the exposed film by using an organic solvent-containing developer. The method may further include (D) rinsing the developed film by using a rinsing solution.

The method also preferably includes a prebaking (PB) step after the film formation but before the exposure step. It is also preferred to include a post-exposure baking (PEB) step after the exposure step but before the development step.

As for the heating temperature, both PB step and PEB step are preferably performed at 40 to 130° C., more preferably at 50 to 120° C., still more preferably from 60 to 110° C. In particular, when the PEB step is performed at a low temperature of 60 to 90° C., the exposure latitude (EL) and the resolution can be remarkably enhanced.

The heating time is preferably from 30 to 300 seconds, more preferably from 30 to 180 seconds, still more preferably from 30 to 90 seconds.

In the pattern forming method of the present invention, the step of forming a film on a substrate by using the composition, the step of exposing the film, the heating step and the development step can be performed by generally known methods.

The light source used for exposure is an extreme ultraviolet ray (EUV light) or an electron beam (EB).

The film formed using the composition of the present invention may be subjected to immersion exposure. By this exposure, the resolution can be more enhanced. The immersion medium used may be any liquid as long as it has a refractive index higher than that of air, but pure water is preferred.

In this case, the above-described hydrophobic resin may be previously added to the composition, or after forming a film as above, a topcoat may be provided thereon. The performance required of the topcoat, the use method thereof and the like are described in *Ekishin Lithography no Process to Zairyo* (*Process and Material of Immersion Lithography*), Chapter 7, CMC Shuppan.

On peeling off the topcoat after exposure, a developer may be used or a releasing agent may be separately used. The releasing agent is preferably a solvent less permeating the film. From the standpoint that the peeling step can be performed simultaneously with the development step of the film, the topcoat is preferably peelable with a developer.

In the present invention, the substrate on which the film is formed is not particularly limited, and a substrate generally used in the production process of a semiconductor such as IC, in the production process of a liquid crystal device or a circuit board such as thermal head or in the lithography process of other photofabrications may be used. Examples of such a substrate include an inorganic substrate such as silicon, SiN and $SiO_2$, and a coating-type inorganic substrate such as SOG. If desired, an organic antireflection film may be formed between the film and the substrate.

The organic solvent-containing developer includes, for example, a polar solvent such as ketone-based solvent, ester-based solvent, alcohol-based solvent, amide-based solvent and ether-based solvent, and a hydrocarbon-based solvent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, methyl amyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, isoamyl acetate, n-pentyl acetate, propylene glycol monomethyl ether acetate, propylene glycol monoethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl propionate, methyl 3-methoxypropionate (MMP), ethyl propionate, ethyl 3-ethoxypropionate (EEP) and propyl propionate. Among these, an alkyl acetate such as methyl acetate, butyl acetate, ethyl acetate, isopropyl acetate and amyl acetate, and an alkyl propionate such as methyl propionate, ethyl propionate and propyl propionate are preferred.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol such as ethylene glycol, diethylene glycol and triethylene glycol; and a glycol ether such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether above, dioxane and tetrahydrofuran.

Examples of the amide-based solvent include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

Two or more kinds of these solvents may be mixed and used, or as long as sufficient performance can be exerted, the solvent may be used by mixing it with a solvent other than those described above and/or water. However, the percentage of water content of the entire developer is preferably less than 10 mass %, and it is more preferred to contain substantially no water. In other words, this developer is preferably a developer composed of substantially only an organic solvent. Even in this case, the developer may contain the later-described surfactant. Also, in this case, the developer may contain unavoidable impurities derived from the atmosphere.

The amount of the organic solvent used in the developer is preferably from 80 to 100 mass %, more preferably from 90 to 100 mass %, still more preferably from 95 to 100 mass %, based on the entire amount of the developer.

In particular, the organic solvent contained in the developer is preferably at least one solvent selected from a ketone-based solvent, an ester-based solvent, an alcohol-based solvent, an amide-based solvent and an ether-based solvent.

The vapor pressure at 20° C. of the organic solvent-containing developer is preferably 5 kPa or less, more preferably 3 kPa or less, still more preferably 2 kPa or less. By setting the vapor pressure of the developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the developer having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the developer having a vapor pressure of 2 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the developer, an appropriate amount of a surfactant may be added, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. The surfactant is preferably a nonionic surfactant. As the nonionic surfactant, it is more preferred to use a fluorine-containing surfactant or a silicon-containing surfactant.

The amount of the surfactant used is usually from 0.001 to 5 mass %, preferably from 0.005 to 2 mass %, more preferably from 0.01 to 0.5 mass %, based on the entire amount of the developer.

The developing method includes, for example, a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method).

In the case where the above-described various developing methods include a step of ejecting the developer toward the resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, still more preferably 1 $mL/sec/mm^2$ or less. The flow velocity has no particular lower limit but in view of throughput, is preferably 0.2 $mL/sec/mm^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film/resist pattern is kept from inadvertent chipping or collapse.

Here, the ejection pressure ($mL/sec/mm^2$) of the developer is the value at the outlet of the development nozzle in the developing apparatus.

The method for adjusting the ejection pressure of the developer includes, for example, a method of adjusting the ejection pressure by a pump or the like, and a method of supplying the developer from a pressurized tank and changing the pressure to adjust the ejection pressure.

After the step of performing the development, a step of stopping the development while replacing the developer with another solvent may be performed.

The pattern forming method of the present invention preferably further includes a rinsing step (a step of rinsing the film with an organic solvent-containing rinsing solution) after the development step.

The rinsing solution used in the rinsing step is not particularly limited as long as it does not dissolve the pattern after development, and a solution containing a general organic solvent may be used.

The rinsing solution includes, for example, a rinsing solution containing at least one kind of an organic solvent selected from a hydrocarbon-based solvent, a ketone-based solvent, an ester-based solvent, an alcohol-based solvent, an amide-based solvent and an ether-based solvent. The rinsing solution is more preferably a rinsing solution containing at least one kind of an organic solvent selected from a ketone-based solvent, an ester-based solvent, an alcohol-based solvent and an amide-based solvent, still more preferably a rinsing solution containing an alcohol-based solvent or an ester-based solvent.

The rinsing solution more preferably contains a monohydric alcohol, still more preferably a monohydric alcohol having a carbon number of 5 or more.

The monohydric alcohol may be linear, branched or cyclic. Examples of the monohydric alcohol include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. Examples of the monohydric alcohol having a carbon number of 5 or more include 1-hexanol, 2-hexanol, 4-methyl-2-pentanol, 1-pentanol, and 3-methyl-1-butanol.

As for each of these components, two or more kinds may be mixed and used, or the component may be used by mixing it with an organic solvent other than those described above.

The percentage of water content in the rinsing solution is preferably less than 10 mass %, more preferably less than 5 mass %, still more preferably less than 3 mass %. That is, the amount of the organic solvent used in the rinsing solution is preferably from 90 to 100 mass %, more preferably from 95 to 100 mass %, still more preferably from 97 to 100 mass %, based on the entire amount of the rinsing solution. By setting the percentage of water content of the rinsing solution to less than 10 mass %, good development characteristics can be obtained.

The vapor pressure at 20° C. of the rinsing solution is preferably from 0.05 to 5 kPa, more preferably from 0.1 to 5 kPa, still more preferably from 0.12 to 3 kPa. By setting the vapor pressure of the rinsing solution to be from 0.05 to 5 kPa, the temperature uniformity in the wafer plane is enhanced and at the same time, swelling due to permeation of the rinsing solution is suppressed, as a result, the dimensional uniformity in the wafer plane is improved.

In the rinsing solution, an appropriate amount of a surfactant may be added.

In the rinsing step, the wafer after development is rinsed by using the above-described rinsing solution. The method for rinsing treatment is not particularly limited but includes, for example, a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and thereafter, remove the rinsing solution from the substrate surface by spinning the substrate at a rotational speed of 2,000 to 4,000 rpm.

The pattern forming method of the present invention may further include a development step using an alkali developer (a step of forming a positive pattern), in addition to the development step using an organic solvent-containing developer. The order in which the development step using an alkali developer and the development step using an organic solvent-containing developer are performed is not particularly limited, but the development using an alkali developer is preferably performed before the development step using an organic solvent-containing developer. Also, a heating step is preferably performed before each of these development steps.

The type of the alkali developer is not particularly limited, but an aqueous solution of tetramethylammonium hydroxide is usually used. In the alkali developer, alcohols and/or a surfactant may be added each in an appropriate amount.

The alkali concentration of the alkali developer is usually from 0.1 to 20 mass %. The pH of the alkali developer is usually from 10.0 to 15.0. As for the alkali developer, use of an aqueous 2.38 mass % tetramethylammonium hydroxide solution is particularly preferred.

In the case of performing a rinsing treatment after the development using an alkali developer, pure water is typically used as the rinsing solution. In the rinsing solution, an appropriate amount of a surfactant may be added.

The present invention also relates to a method for manufacturing an electronic device, comprising the pattern forming method of the present invention, and an electronic device manufactured by this manufacturing method.

The electronic device of the present invention is suitably mounted on electric electronic equipment (such as home electronic device, OA·media-related device, optical device and communication device).

EXAMPLES

<Resin>

Resins (A-1) to (A-24), (RA-1) and (RA-2) shown below were synthesized as follows. The weight average molecular weight (Mw) and the polydispersity (Mw/Mn) of each resin are shown below. Also, the compositional ratio of respective repeating units of the resin is shown by molar ratio.

(A-1)

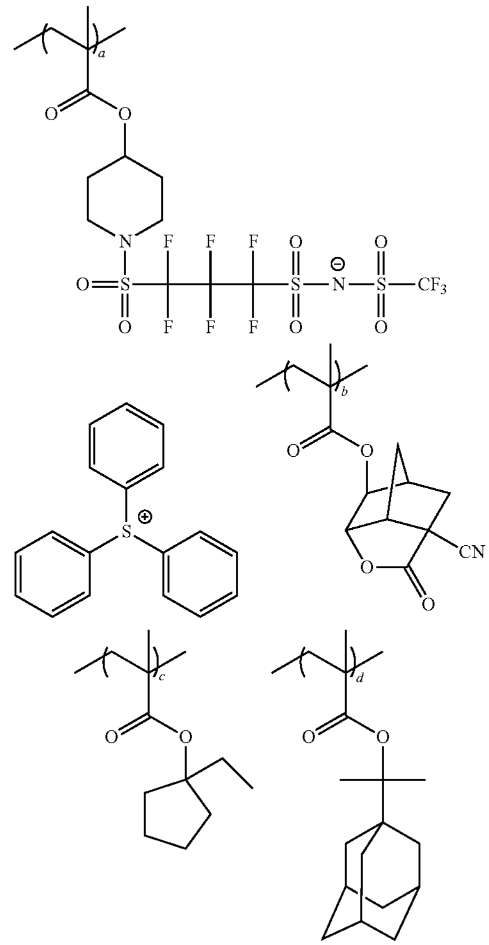

a/b/c/d = 5/43/37/15
Mw = 10500, Mw/Mn = 1.77

(A-2)

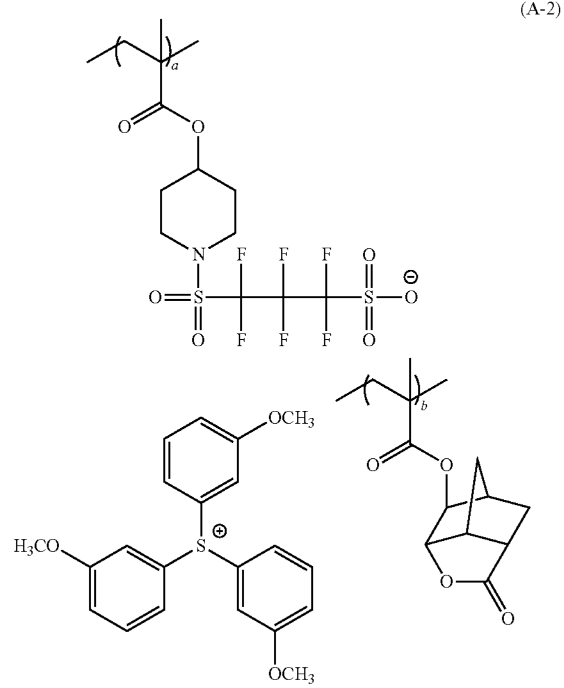

-continued
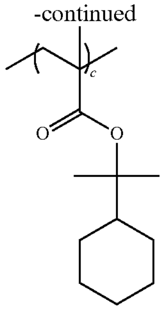
a/b/c = 10/30/60
Mw = 8500, Mw/Mn = 1.78
(A-3)
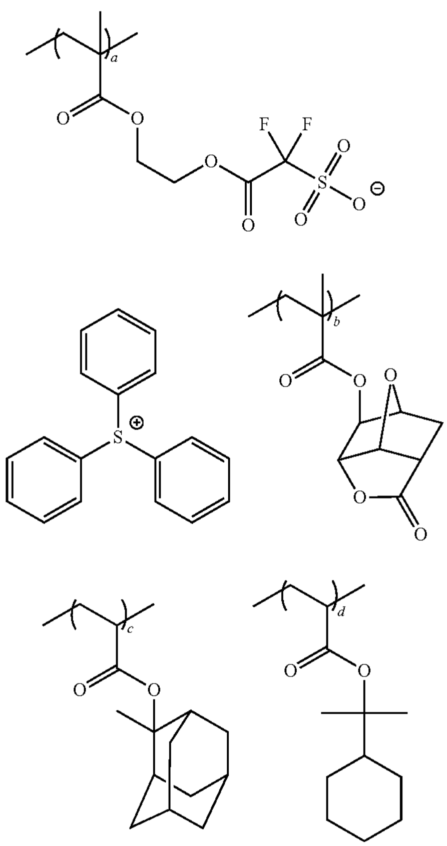
a/b/c/d = 10/40/10/40
Mw = 11500, Mw/Mn = 1.82
(A-4)
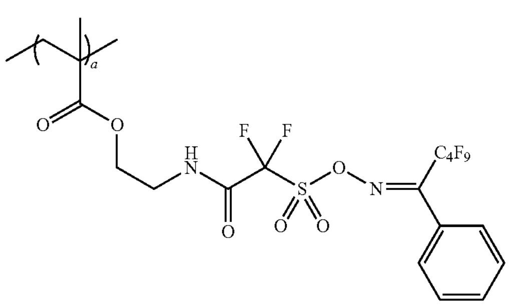
-continued
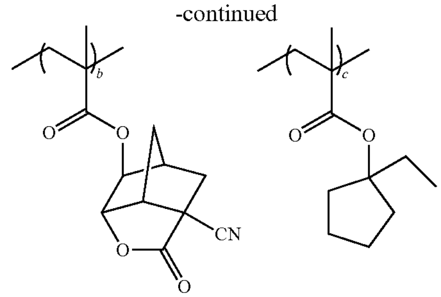
a/b/c = 20/35/45
Mw - 9000, Mw/Mn = 1.68
(A-5)
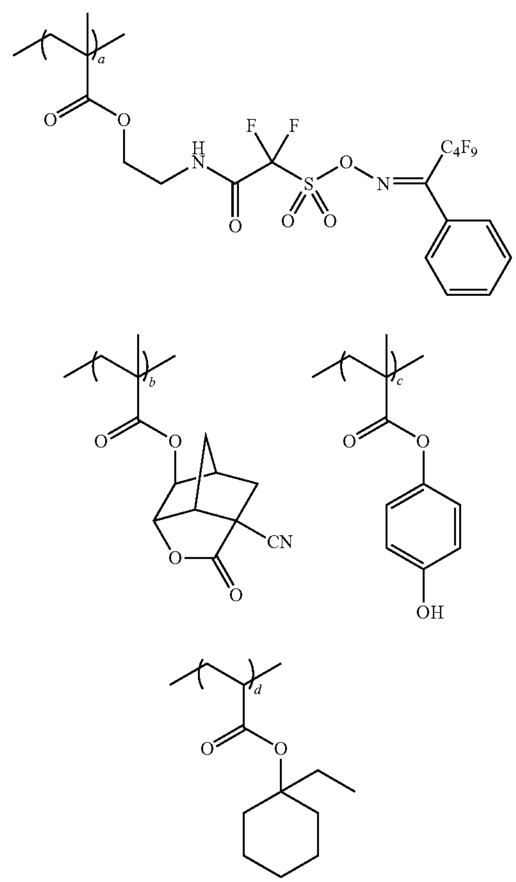
a/b/c/d = 2/15/15/50
Mw = 16000, Mw/Mn = 1.65
(A-6)
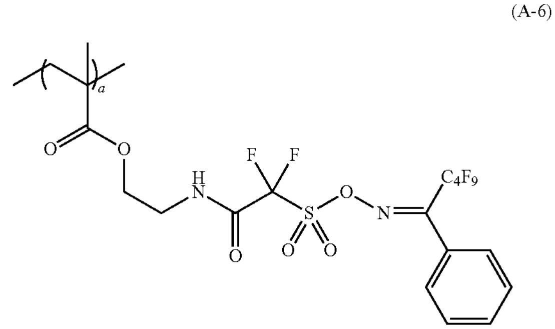

-continued
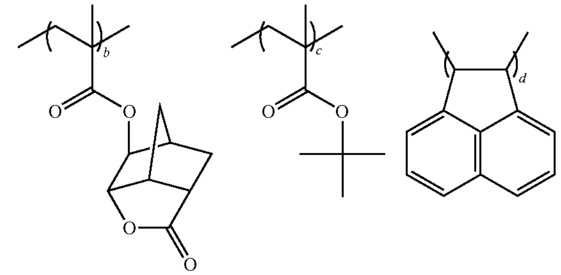
a/b/c/d = 20/20/50/10
Mw = 9500, Mw/Mn = 1.74
(A-7)
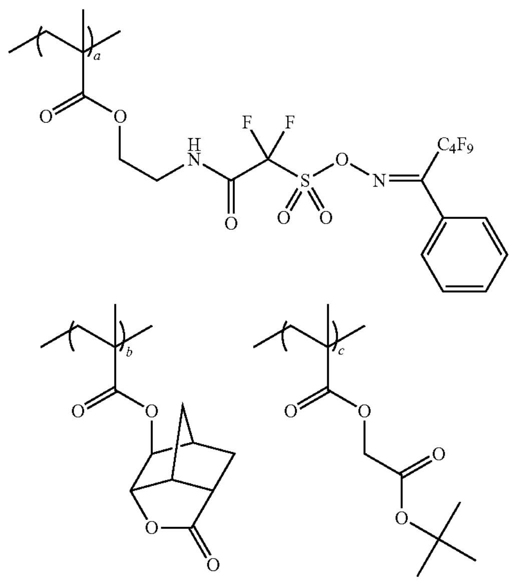
a/b/c/d = 20/35/45
Mw = 7500, Mw/Mn = 1.55
(A-8)
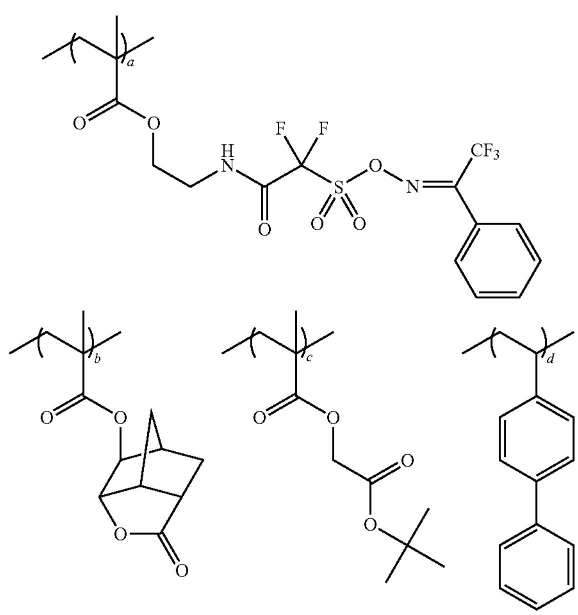
a/b/c/d = 15/30/50/5
Mw = 10000, Mw/Mn = 1.75
-continued
(A-9)
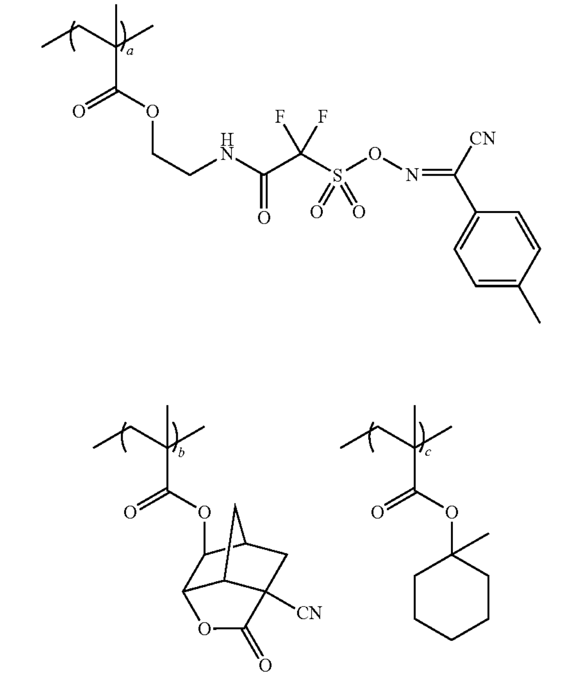
a/b/c = 15/40/45
Mw = 6500, Mw/Mn = 1.72
(A-10)
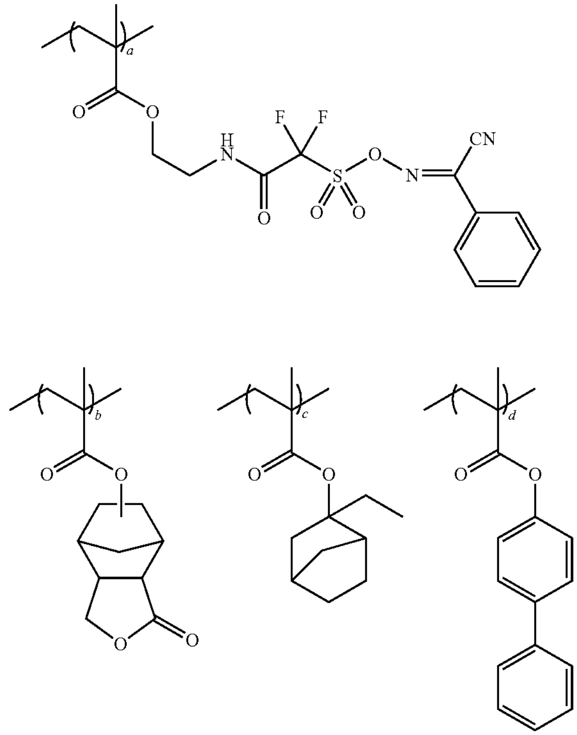
a/b/c/d = 15/25/45/15
Mw = 13000, Mw/Mn = 1.90

-continued
(A-11)
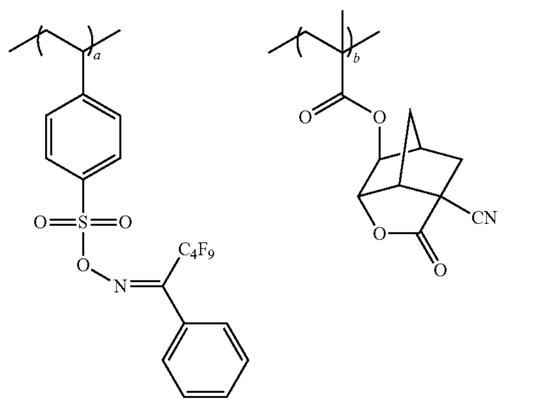
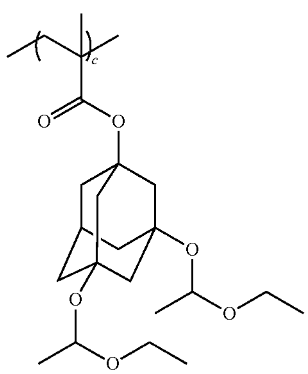
a/b/c = 20/30/50
Mw = 8600, Mw/Mn = 1.79
(A-12)
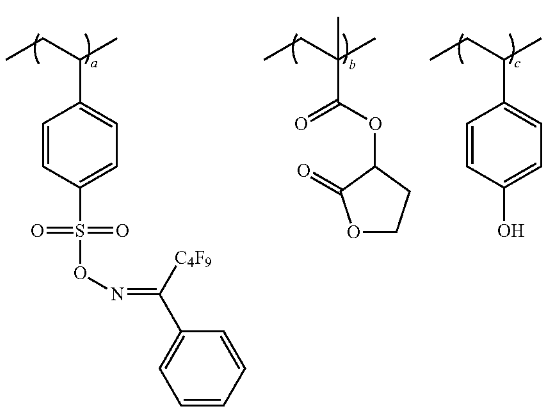
-continued
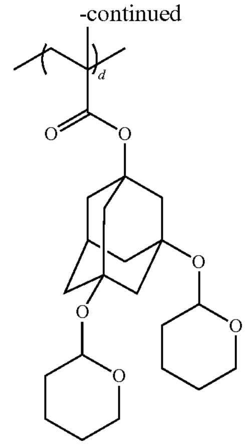
a/b/c/d = 20/30/10/40
Mw = 20500, Mw/Mn = 1.85
(A-13)
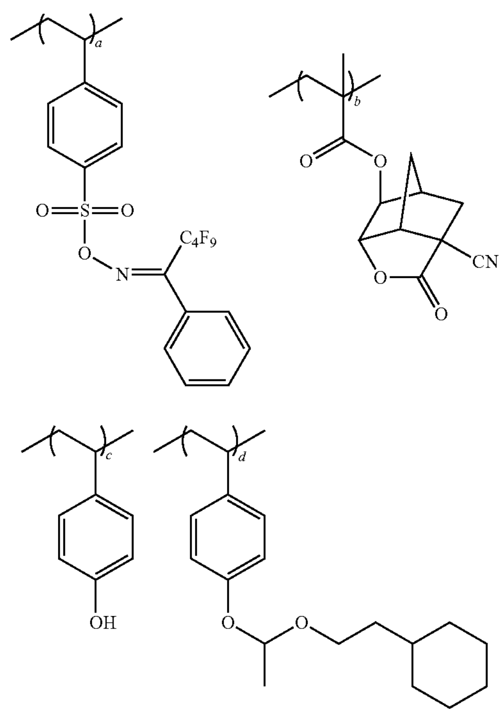
a/b/c/d = 20/20/10/50
Mw = 6500, Mw/Mn = 1.45
(A-14)
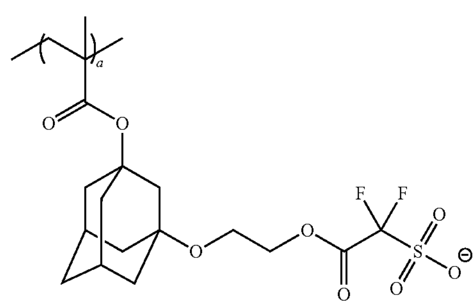

-continued
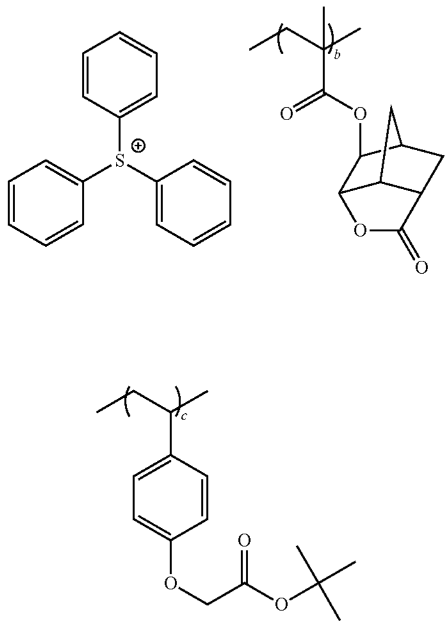
a/b/c = 10/40/50
Mw = 12500, Mw/Mn = 1.95
(A-15)
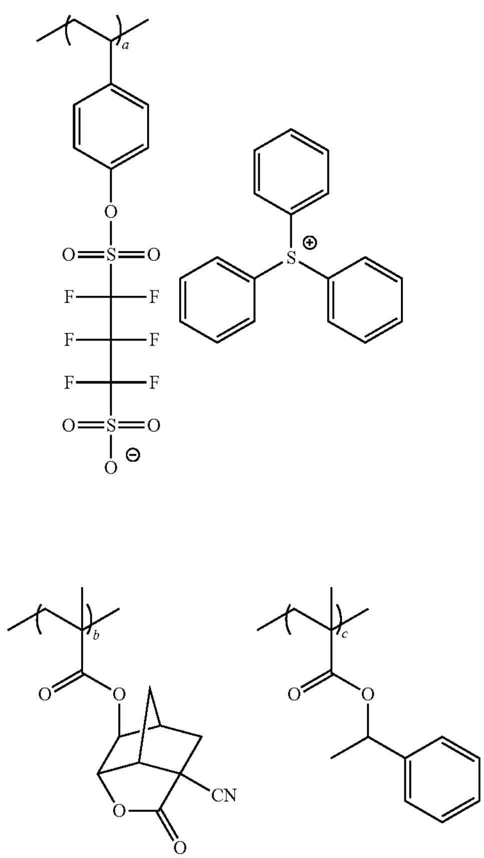
a/b/c = 15/40/45
Mw = 14500, Mw/Mn = 1.70
-continued
(A-16)
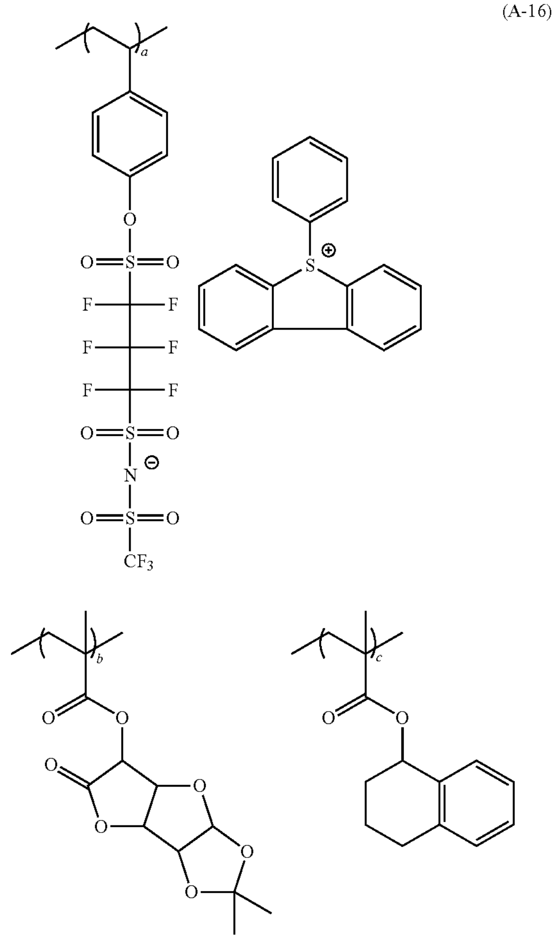
a/b/c = 10/35/55
Mw = 16000, Mw/Mn = 1.80
(A-17)
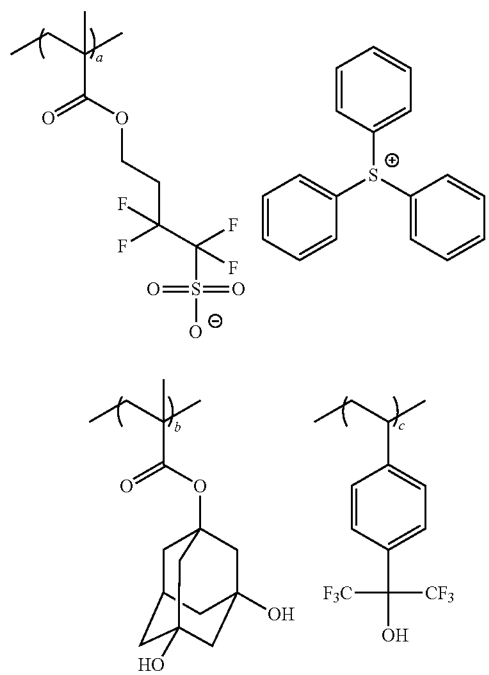

-continued
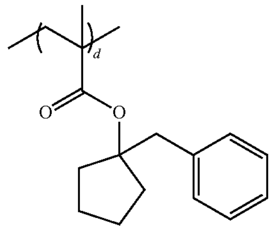
a/b/c/d = 10/30/10/50
Mw = 25000 Mw/Mn = 2.00
(A-18)
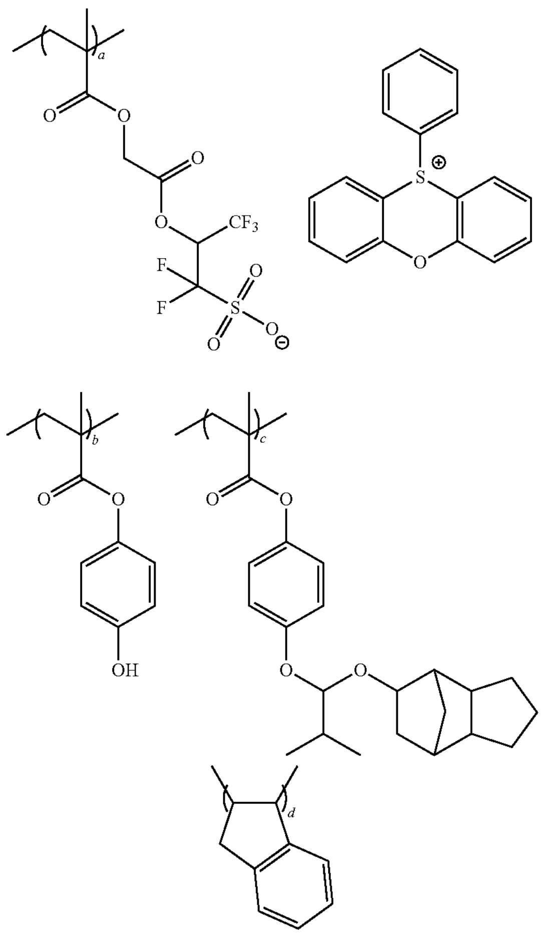
a/b/c/d = 10/25/50/15
Mw = 19000, Mw/Mn = 1.60
(A-19)
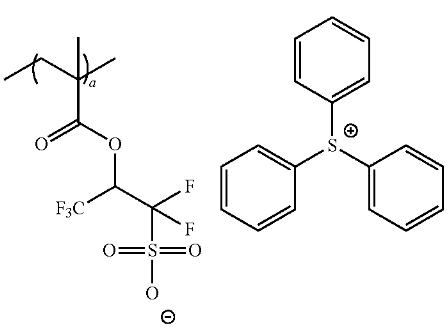
-continued
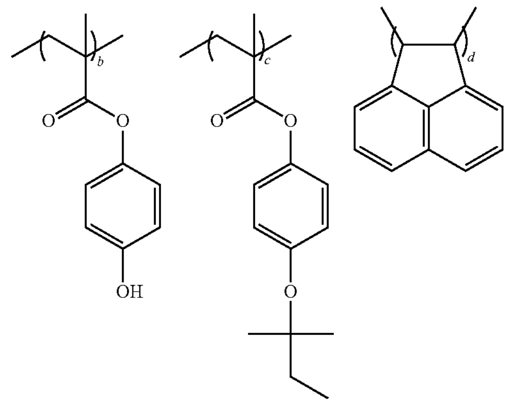
a/b/c/d = 15/15/55/15
Mw = 8500, Mw/Mn = 1.45
(A-20)
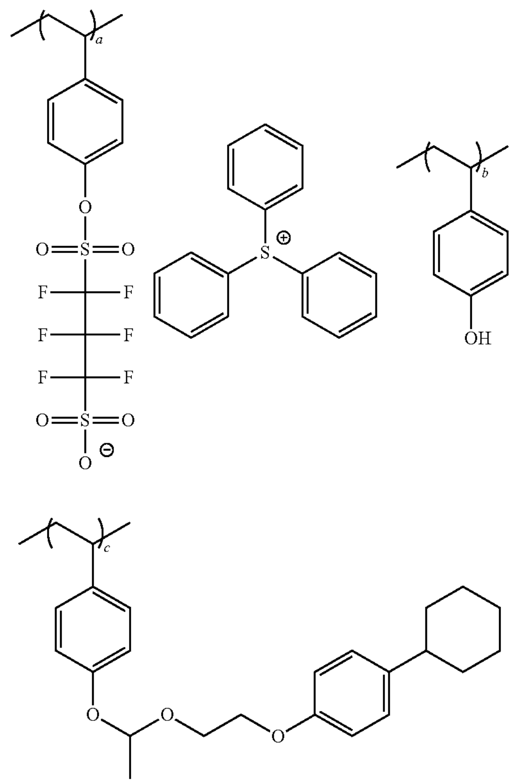
a/b/c = 15/20/65
Mw = 5500, Mw/Mn = 1.15
(A-21)
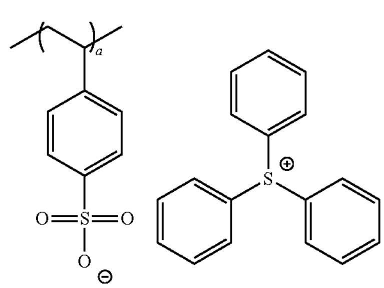

-continued
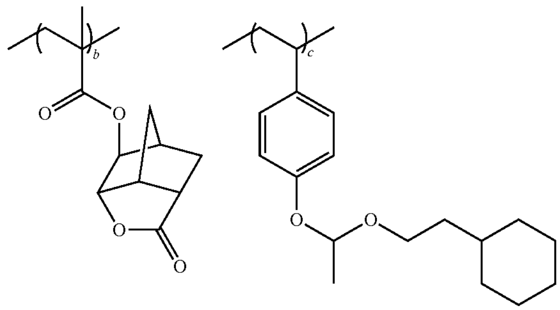
a/b/c = 15/30/55
Mw = 6500, Mw/Mn = 1.40
(A-22)
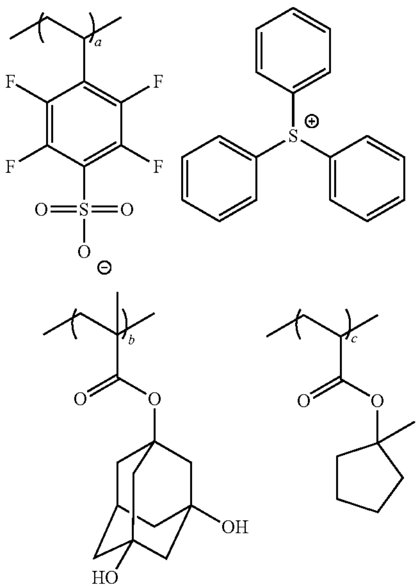
a/b/c = 15/40/45
Mw = 8000, Mw/Mn = 1.50
(A-23)
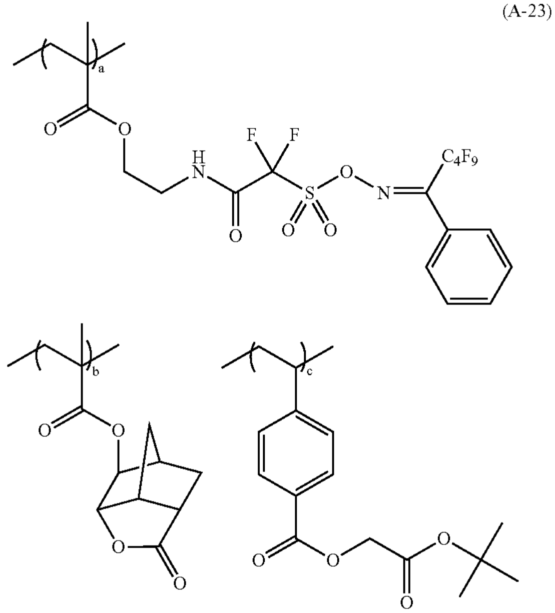
a/b/c = 20/30/50
Mw = 8000, Mw/Mn = 1.75
-continued
(A-24)
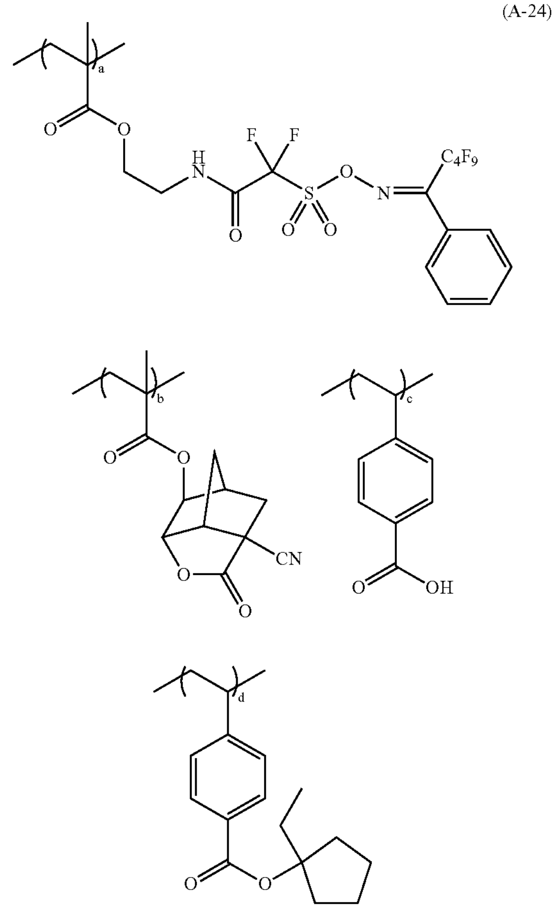
a/b/c/d = 15/25/10/50
Mw = 9000, Mw/Mn = 1.75
(RA-1)
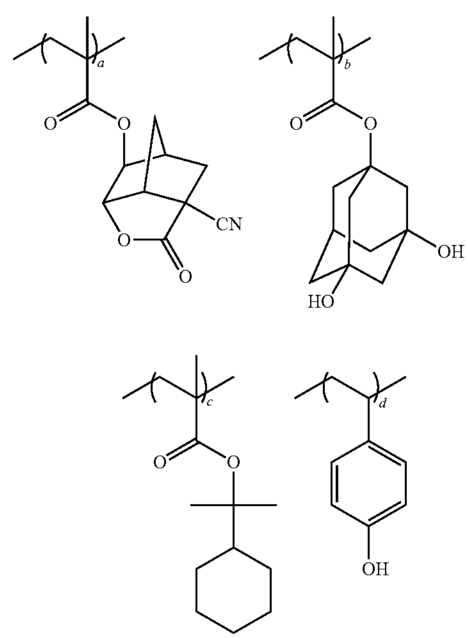
a/b/c/d = 40/10/40/10
Mw = 10000, Mw/Mn = 1.60

-continued (RA-2)

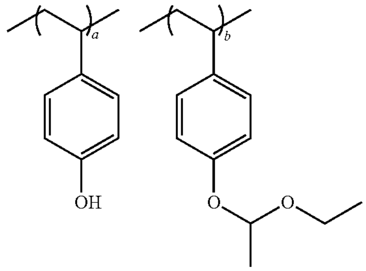

a/b = 55/45
Mw = 12700, Mw/Mn = 1.10

Synthesis Example 1

Resin (A-1)

In a nitrogen stream, 160 g of cyclohexanone was charged into a three-neck flask and heated at 80° C. (Solvent 1). Subsequently, monomer-A1 (13.58 g), monomer-1 (23.11 g), monomer-2 (12.48 g) and monomer-3 (31.35 g), which are shown below, were dissolved in cyclohexanone (297 g) to prepare a monomer solution. Furthermore, a solution obtained by adding and dissolving polymerization initiator V-601 (produced by Wako Pure Chemical Industries, Ltd.) in a ratio of 6.4 mol % based on monomers was added dropwise to Solvent 1 over 6 hours. After the completion of dropwise addition, the solution was further reacted at 80° C. for 2 hours. The reaction solution was allowed to cool and then added dropwise to a mixed solvent of 3,000 g of heptane/750 g of ethyl acetate, and the precipitated powder was collected by filtration and dried to obtain 62 g of Resin (A-1). The weight average molecular weight of Resin (A-1) obtained was 10,500, the polydispersity (Mw/Mn) was 1.77, and the compositional ratio as measured by $^{13}$C-NMR was 5/37/15/43. All of these operations were performed under yellow light.

Other resins were synthesized in the same manner.

monomer-A1

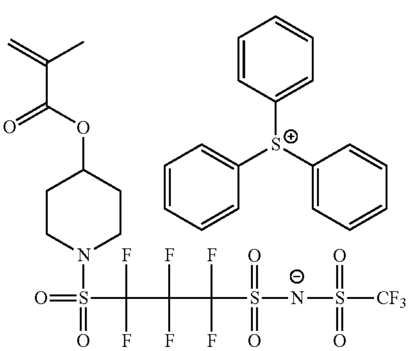

monomer-1

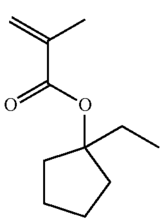

-continued monomer-2

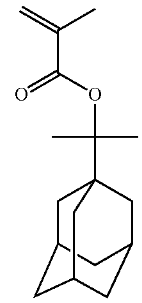

monomer-3

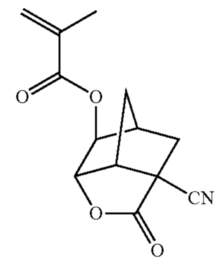

<Acid Generator>

As the acid generator, the following Compounds (PAG-1) and (PAG-2) were prepared.

PAG-1

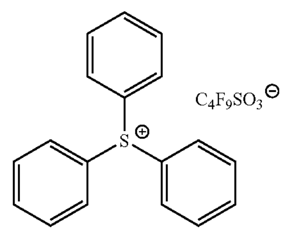

PAG-2

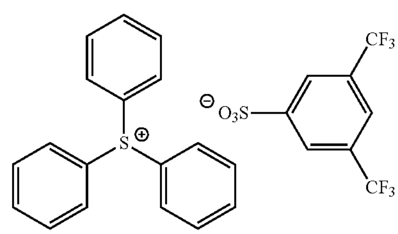

<Basic Compound>

As the basic compound, the following Compounds (N-1) to (N-9) were prepared.

N-1

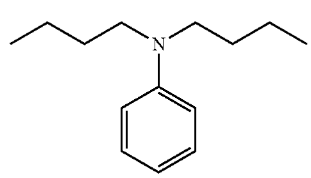

-continued

N-2

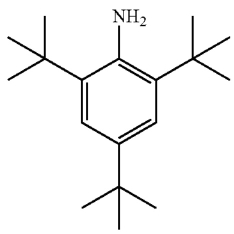

N-3

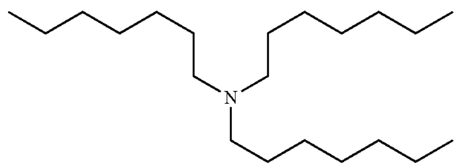

N-4

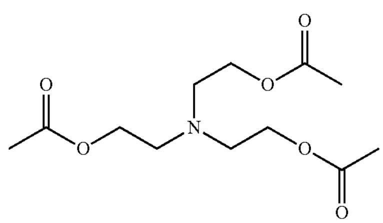

N-5

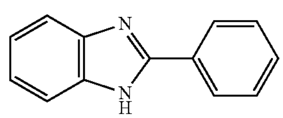

N-6

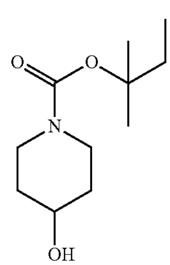

N-7

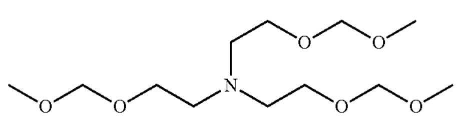

N-8

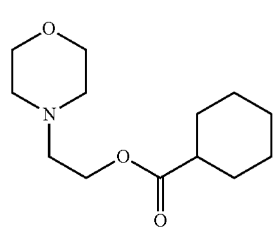

-continued

N-9

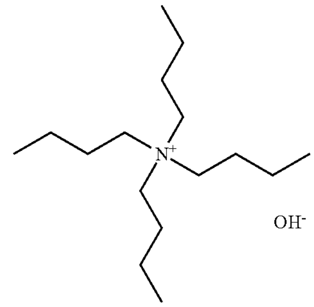

<Surfactant>

As the surfactant, the following compounds were prepared.

W-1: Megaface F176 (produced by DIC Corp.; fluorine-containing)

W-2: Megaface R08 (produced by DIC Corp.; fluorine- and silicon-containing)

W-3: Polysiloxane Polymer KP-341 (produced by Shin-Etsu Chemical Co., Ltd.; silicon-containing)

W-4: Troysol S-366 (produced by Troy Chemical)

W-5: KH-20 (produced by Asahi Kasei Corporation)

W-6: PolyFox (registered trademark) PF-6320 (produced by OMNOVA Solution Inc., fluorine-containing)

<Solvent>

As the solvent, the following compounds were prepared.

(Group a)

SL-1: Propylene glycol monomethyl ether acetate

SL-2: Propylene glycol monomethyl ether propionate

SL-3: 2-Heptanone (Group b)

SL-4: Ethyl lactate

SL-5: Propylene glycol monomethyl ether

SL-6: Cyclohexanone

Examples 1 to 24 and Comparative Examples 1 and 2

Electron Beam (EB) Exposure (1) Preparation of Coating Solution of Electron Beam-Sensitive or Extreme Ultraviolet-Sensitive Resin Composition, and Coating The coating solution composition according to the formulation shown in the Table below was microfiltered through a membrane filter having a pore size of 0.1 μm to obtain an electron beam-sensitive or extreme ultraviolet-sensitive resin composition (resist composition) solution.

This electron beam-sensitive or extreme ultraviolet-sensitive resin composition solution was coated on a 6-inch Si wafer previously subjected to a hexamethyldisilazane (HMDS) treatment, by using a spin coater, Mark 8, manufactured by Tokyo Electron Ltd. and dried on a hot plate at 100° C. for 60 seconds to obtain a resist film having a thickness of 50 nm.

(2) EB Exposure and Development

The resist film-coated wafer obtained in (1) above was patternwise irradiated by using an electron beam irradiation apparatus (HL750, manufactured by Hitachi, Ltd., accelerating voltage: 50 keV). At this time, the lithography was performed to form a 1:1 line-and-space pattern. After the electron beam lithography, the wafer was heated on a hot plate at 110° C. for 60 seconds, then developed by puddling butyl acetate as an organic developer for 30 seconds, rinsed by using 4-methyl-2-pentanol as a rinsing solution, spun at a rotational speed of 4,000 rpm for 30 seconds and baked at 90° C. for 60 seconds to obtain a resist pattern composed of a 1:1 line-and-space pattern having a line width of 50 nm.

Comparative Examples 3 to 6

Electron Beam (EB) Exposure

Preparation of an electron beam-sensitive or extreme ultra-violet-sensitive resin composition and pattern formation were performed in the same manner as in Example 1 except for changing the formulation as shown in the Table below, performing the development with an aqueous alkali solution (TMAH, an aqueous 2.38 mass % tetramethylammonium hydroxide solution) in pace of the organic developer, and using water as the rinsing solution.

(3) Evaluation of Resist Pattern

The obtained resist pattern was evaluated for sensitivity, resolution and LWR by means of a scanning electron microscope (S-9220, manufacture by Hitachi Ltd.) by the following methods. The results obtained are shown in the Table below.

(3-1) Sensitivity

The irradiation energy below which a 1:1 line-and-space pattern having a line width of 50 nm cannot be resolved was taken as the sensitivity (Eop). A smaller value indicates higher performance. In Comparative Examples 3 to 5, the 1:1 line-and-space pattern with a line width of 50 nm could not be resolved and therefore, the irradiation energy below which a 1:1 line-and-space pattern with a line width of 100 nm is not resolved was taken as the sensitivity (Eop).

(3-2) Resolution

The minimum line width below which the line-and-space (1:1) pattern at the Eop above cannot be separated was taken as the resolution. A smaller value indicates higher performance.

(3-3) Line Width Roughness (LWR)

With respect to the line width roughness, at arbitrary 50 points in the longitudinal 0.5 μm region of a line-and-space space pattern having a line width of 50 nm (in Comparative Examples 3 to 5, a 1:1 line-and-space pattern having a line width of 100 nm), the line width at the Eop above was measured and after determining the standard deviation thereof, 3σ was computed. A smaller value indicates higher performance.

TABLE 4

EB exposure

| | Resin (A) | Solvent (mass ratio) (40 g) | Basic Compound | Surfactant (5 mg) | Sensitivity (μC/cm²) | Resolution (nm) | LWR (nm) | Remarks |
|---|---|---|---|---|---|---|---|---|
| Example 1 | A-1 (0.988 g) | SL-1/SL-6 (70/30) | N-6 (7 mg) | W-2 | 14.0 | 32.5 | 4.2 | — |
| Example 2 | A-2 (0.990 g) | SL-1/SL-5 (80/20) | N-6 (5 mg) | W-1 | 13.0 | 32.0 | 3.9 | — |
| Example 3 | A-3 (0.990 g) | SL-1/SL-4 (75/25) | N-5 (5 mg) | W-1 | 12.9 | 32.0 | 4.0 | — |
| Example 4 | A-4 (0.992 g) | SL-1/SL-3 (70/30) | N-5 (3 mg) | W-1 | 12.2 | 30.5 | 3.8 | — |
| Example 5 | A-5 (0.991 g) | SL-1 | N-7 (4 mg) | W-3 | 11.3 | 31.5 | 3.7 | — |
| Example 6 | A-6 (0.991 g) | SL-1/SL-5 (80/20) | N-5 (4 mg) | W-1 | 11.2 | 30.0 | 3.5 | — |
| Example 7 | A-7 (0.995 g) | SL-1/SL-5 (75/25) | N-8 (5 mg) | — | 12.1 | 30.5 | 3.8 | — |
| Example 8 | A-8 (0.991 g) | SL-2/SL-6 (80/20) | N-3 (4 mg) | W-4 | 11.4 | 30.0 | 3.6 | — |
| Example 9 | A-9 (0.991 g) | SL-6/SL-1 (70/30) | N-5 (4 mg) | W-1 | 12.4 | 30.5 | 3.9 | — |
| Example 10 | A-10 (0.990 g) | SL-2/SL-5 (80/20) | N-4 (5 mg) | W-1 | 11.9 | 30.5 | 3.8 | — |
| Example 11 | A-11 (0.991 g) | SL-2/SL-4 (75/25) | N-2 (4 mg) | W-2 | 12.0 | 30.0 | 3.8 | — |
| Example 12 | A-12 (0.992 g) | SL-1 | N-1 (3 mg) | W-5 | 11.4 | 31.0 | 3.6 | — |
| Example 13 | A-13 (0.987 g) | SL-6 | N-7 (8 mg) | W-6 | 11.2 | 31.5 | 3.6 | — |
| Example 14 | A-14 (0.993 g) | SL-1/SL-5 (60/40) | N-4 (2 mg) | W-2 | 11.9 | 32.0 | 3.7 | — |
| Example 15 | A-15 (0.991 g) | SL-1/SL-5 (80/20) | N-7 (4 mg) | W-1 | 11.8 | 31.0 | 3.8 | — |

| | Resin (A) | Acid Generator | Solvent (mass ratio) (40 g) | Basic Compound | Surfactant (5 mg) | Sensitivity (μC/cm²) | Resolution (nm) | LWR (nm) | Remarks |
|---|---|---|---|---|---|---|---|---|---|
| Example 16 | A-16 (0.985 g) | — | SL-1/SL-6 (90/10) | N-8 (10 mg) | W-3 | 12.1 | 31.5 | 3.8 | — |
| Example 17 | A-17 (0.989 g) | — | SL-1/SL-4 (80/20) | N-6 (6 mg) | W-1 | 11.6 | 31.5 | 3.8 | — |
| Example 18 | A-18 (0.980 g) | — | SL-1/SL-4 (80/20) | N-5 (15 mg) | W-4 | 11.9 | 32.5 | 3.7 | — |
| Example 19 | A-19 (0.985 g) | — | SL-1/SL-4 (90/10) | N-8 (10 mg) | W-5 | 11.7 | 32.5 | 3.7 | — |
| Example 20 | A-20 (0.986 g) | — | SL-1 | N-7 (9 mg) | W-6 | 11.6 | 32.5 | 3.6 | — |

TABLE 4-continued

| | | | | | | | | | |
|---|---|---|---|---|---|---|---|---|---|
| EB exposure | | | | | | | | | |
| Example 21 | A-21 (0.983 g) | — | SL-1/SL-4 (70/30) | N-5 (12 mg) | W-2 | 12.6 | 32.0 | 3.8 | — |
| Example 22 | A-22 (0.991 g) | — | SL-1 | N-6 (4 mg) | W-1 | 11.9 | 32.5 | 3.7 | — |
| Example 23 | A-23 (0.991 g) | — | SL-1/SL-5 (80/20) | N-7 (4 mg) | W-1 | 11.2 | 30.0 | 3.6 | — |
| Example 24 | A-24 (0.991 g) | — | SL-1/SL-5 (80/20) | N-7 (4 mg) | W-1 | 11.4 | 30.0 | 3.7 | — |
| Comparative Example 1 | RA-1 (0.938 g) | PAG-1 (0.060 g) | SL-1 | N-9 (1 mg) | W-1 | 15.0 | 37.5 | 4.8 | Example 1 of JP-A-2011-217884 |
| Comparative Example 2 | RA-2 (0.870 g) | PAG-2 (0.060 g) | SL-1 | N-9 (10 mg) | W-1 | 14.5 | 50.0 | 4.7 | Example 17 of JP-A-2011-217884 |
| Comparative Example 3 | A-4 (0.590 g) | — | SL-1/SL-3 (70/30) | N-5 (3 mg) | W-1 | 48.2 | 55.0 | 6.0 | alkali development (positive development) |
| Comparative Example 4 | A-6 (0.991 g) | — | SL-1/SL-5 (80/20) | N-5 (4 mg) | W-1 | 46.2 | 54.0 | 5.7 | alkali development (positive development) |
| Comparative Example 5 | A-11 (0.991 g) | — | SL-2/SL-4 (75/25) | N-2 (4 mg) | W-2 | 49.1 | 60.5 | 5.9 | alkali development (positive development) |
| Comparative Example 6 | A-15 (0.991 g) | — | SL-1/SL-5 (80/20) | N-7 (4 mg) | W-1 | 38.5 | 41.0 | 4.9 | Alkali development (positive development) |

As apparent from the Table above, in Examples 1 to 24, high sensitivity, high resolution and high line width roughness (LWR) performance could be satisfied all at the same time at remarkably high levels.

In particular, as seen from comparison between Examples 4, 6, 11 and 15 and Comparative Examples 3, 4, 5 and 6 where positive development with an alkali developer was performed using the same resist compositions as in those Examples, a pattern with high resolution, high sensitivity and high LWR performance could be formed by employing the pattern forming method of the present invention using an organic developer. This is considered to result because as described above, in comparison with the case using an alkali developer, use of an organic developer brings reduction in the capillary force imposed on the sidewall of the pattern and in turn, the pattern collapse can be prevented.

Also, as compared with Comparative Examples 1 and 2 (corresponding to Examples 1 and 17 described in JP-A-2010-217884), in Examples using a resin containing the repeating unit (R), a pattern with high resolution and high LWR performance could be formed. This is considered to be a result brought about by factors including the followings. Since the resin has the repeating unit (R), that is, a structural moiety capable of decomposing upon irradiation with an electron beam or an extreme ultraviolet ray is bonded in the resin, (i) the diffusion length of the acid generated can be reduced, (ii) the dissolution contrast for the developer can be enhanced due to reduction in the solubility of the exposed area for an organic solvent-containing developer, and (iii) the structural moiety capable of decomposing upon irradiation with an actinic ray or radiation to generate an acid can be uniformly distributed in the resist film.

Furthermore, it has been found that from the standpoint of enhancing the sensitivity, the resin more preferably contains a repeating unit having an aromatic ring other than the repeating unit (R). This is considered because by having an aromatic ring, the generation efficiency of secondary electron by the irradiation with an electron beam is enhanced, as a result, increase of the generated acid and elevation of the sensitivity are brought about.

Also in the case of using a developer other than butyl acetate or using a rinsing solution other than 4-methyl-2-pentanol, the same excellent effects as in Examples above are obtained.

Examples 101 to 124 and Comparative Examples 101 and 102

Extreme Ultraviolet (EUV) Exposure (4) Preparation of Coating Solution of Electron Beam-Sensitive or Extreme Ultraviolet-Sensitive Resin Composition, and Coating The coating solution composition according to the formulation shown in the Table below was microfiltered through a membrane filter having a pore size of 0.05 μm to obtain an electron beam-sensitive or extreme ultraviolet-sensitive resin composition (resist composition) solution.

This electron beam-sensitive or extreme ultraviolet-sensitive resin composition solution was coated on a 8-inch Si wafer previously subjected to a hexamethyldisilazane (HMDS) treatment, by using a spin coater, ACT-12, manufactured by Tokyo Electron Ltd. and dried on a hot plate at 100° C. for 60 seconds to obtain a resist film having a thickness of 50 nm.

(5) EUV Exposure and Development

The resist film-coated wafer obtained in (4) above was patternwise exposed through an exposure mask (line/space=1/1) by using an EUV exposure apparatus (Micro Exposure Tool, manufactured by Exitech, NA: 0.3, quadrupole, outer sigma: 0.68, inner sigma: 0.36). After the irradiation, the wafer was heated on a hot plate at 110° C. for 60 seconds, then developed by puddling butyl acetate as an organic developer for 30 seconds, rinsed by using 4-methyl-2-pentanol as a rinsing solution, spun at a rotational speed of 4,000 rpm for 30 seconds and baked at 90° C. for 60 seconds to obtain a resist pattern composed of a 1:1 line-and-space pattern having a line width of 50 nm.

Comparative Examples 103 to 106

Extreme Ultraviolet (EUV) Exposure

Preparation of an electron beam-sensitive or extreme ultraviolet-sensitive resin composition and pattern formation were performed in the same manner as in Example 101 except for changing the formulation as shown in the Table below, performing the development with an aqueous alkali solution (TMAH, an aqueous 2.38 mass % tetramethylammonium hydroxide solution) in pace of the organic developer, and using water as the rinsing solution.

(6) Evaluation of Resist Pattern

The obtained resist pattern was evaluated for sensitivity, resolution and LWR by means of a scanning electron microscope (S-9380II, manufacture by Hitachi Ltd.) by the following methods. The results obtained are shown in the Table below.

(6-1) Sensitivity

The irradiation energy below which a 1:1 line-and-space pattern having a line width of 50 nm cannot be resolved was taken as the sensitivity (Eop). A smaller value indicates higher performance.

(6-2) Resolution

The minimum line width below which the line-and-space (1:1) pattern at the Eop above cannot be separated was taken as the resolution. A smaller value indicates higher performance.

(6-3) Line Width Roughness (LWR)

With respect to the line width roughness, at arbitrary 50 points in the longitudinal 0.5 μm region of a line-and-space space pattern having a line width of 50 nm, the line width at the Eop above was measured and after determining the standard deviation thereof, 3σ was computed. A smaller value indicates higher performance.

TABLE 5

EUV Exposure

| | Resin (A) | Solvent (mass ratio) (40 g) | Basic Compound | Surfactant (5 mg) | Sensitivity ($mJ/cm^2$) | Resolution (nm) | LWR (nm) | Remarks |
|---|---|---|---|---|---|---|---|---|
| Example 101 | A-1 (0.988 g) | SL-1/SL-6 (70/30) | N-6 (7 mg) | W-2 | 4.1 | 24.5 | 5.5 | — |
| Example 102 | A-2 (0.990 g) | SL-1/SL-5 (80/20) | N-6 (5 mg) | W-1 | 3.8 | 24.0 | 5.2 | — |
| Example 103 | A-3 (0.990 g) | SL-1/SL-4 (75/25) | N-5 (5 mg) | W-1 | 3.7 | 24.0 | 5.3 | — |
| Example 104 | A-4 (0.992 g) | SL-1/SL-3 (70/30) | N-5 (3 mg) | W-1 | 3.3 | 22.5 | 4.6 | — |
| Example 105 | A-5 (0.991 g) | SL-1 | N-7 (4 mg) | W-3 | 3.1 | 23.0 | 4.5 | — |
| Example 106 | A-6 (0.991 g) | SL-1/SL-5 (80/20) | N-5 (4 mg) | W-1 | 2.9 | 21.5 | 4.1 | — |
| Example 107 | A-7 (0.995 g) | SL-1/SL-5 (75/25) | N-8 (5 mg) | — | 3.3 | 22.5 | 4.5 | — |
| Example 108 | A-8 (0.991 g) | SL-2/SL-6 (80/20) | N-3 (4 mg) | W-4 | 3.0 | 21.5 | 4.1 | — |
| Example 109 | A-9 (0.991 g) | SL-6/SL-1 (70/30) | N-5 (4 mg) | W-1 | 3.3 | 22.5 | 4.4 | — |
| Example 110 | A-10 (0.990 g) | SL-2/SL-5 (80/20) | N-4 (5 mg) | W-1 | 3.1 | 22.0 | 4.2 | — |
| Example 111 | A-11 (0.991 g) | SL-2/SL-4 (75/25) | N-2 (4 mg) | W-2 | 3.2 | 21.5 | 4.2 | — |
| Example 112 | A-12 (0.992 g) | SL-1 | N-1 (3 mg) | W-5 | 3.0 | 21.5 | 4.0 | — |
| Example 113 | A-13 (0.987 g) | SL-6 | N-7 (8 mg) | W-6 | 2.9 | 22.0 | 4.0 | — |
| Example 114 | A-14 (0.993 g) | SL-1/SL-5 (60/40) | N-4 (2 mg) | W-2 | 2.9 | 22.5 | 4.1 | — |
| Example 115 | A-15 (0.991 g) | SL-1/SL-5 (80/20) | N-7 (4 mg) | W-1 | 3.2 | 22.0 | 4.1 | — |

| | Resin (A) | Acid Generator | Solvent (mass ratio) (40 g) | Basic Compound | Surfactant (5 mg) | Sensitivity ($mJ/cm^2$) | Resolution (nm) | LWR (nm) | Remarks |
|---|---|---|---|---|---|---|---|---|---|
| Example 116 | A-16 (0.985 g) | — | SL-1/SL-6 (90/10) | N-8 (10 mg) | W-3 | 3.3 | 22.5 | 4.3 | — |
| Example 117 | A-17 (0.989 g) | — | SL-1/SL-4 (80/20) | N-6 (6 mg) | W-1 | 3.0 | 22.5 | 4.1 | — |
| Example 118 | A-18 (0.980 g) | — | SL-1/SL-4 (80/20) | N-5 (15 mg) | W-4 | 3.1 | 22.5 | 4.2 | — |
| Example 119 | A-19 (0.985 g) | — | SL-1/SL-4 (90/10) | N-8 (10 mg) | W-5 | 3.1 | 22.5 | 4.1 | — |
| Example 120 | A-20 (0.986 g) | — | SL-1 | N-7 (9 mg) | W-6 | 3.0 | 22.5 | 4.0 | — |
| Example 121 | A-21 (0.983 g) | — | SL-1/SL-4 (70/30) | N-5 (12 mg) | W-2 | 3.2 | 22.0 | 4.0 | — |
| Example 122 | A-22 (0.991 g) | — | SL-1 | N-6 (4 mg) | W-1 | 3.5 | 23.0 | 4.3 | — |
| Example 123 | A-23 (0.991 g) | — | SL-1/SL-5 (80/20) | N-7 (4 mg) | W-1 | 2.8 | 21.5 | 4.0 | — |
| Example 124 | A-24 (0.991 g) | — | SL-1/SL-5 (80/20) | N-7 (4 mg) | W-1 | 2.8 | 22.0 | 4.0 | — |
| Comparative Example 101 | RA-1 (0.938 g) | PAG-1 (0.060 g) | SL-1 | N-9 (1 mg) | W-1 | 5.0 | 27.5 | 6.0 | Example 1 of JP-A-2011-217884 |
| Comparative Example 102 | RA-2 (0.870 g) | PAG-2 (0.060 g) | SL-1 | N-9 (10 mg) | W-1 | 4.5 | 30.0 | 6.3 | Example 17 of JP-A-2011-217884 |

TABLE 5-continued

| | | | | | | | | | |
|---|---|---|---|---|---|---|---|---|---|
| EUV Exposure | | | | | | | | | |
| Comparative Example 103 | A-4 (0.590 g) | — | SL-1/SL-3 (70/30) | N-5 (3 mg) | W-1 | 28.5 | 43.0 | 6.1 | alkali development (positive development) |
| Comparative Example 104 | A-6 (0.991 g) | — | SL-1/SL-5 (80/20) | N-5 (4 mg) | W-1 | 25.2 | 41.0 | 6.4 | alkali development (positive development) |
| Comparative Example 105 | A-11 (0.991 g) | — | SL-2/SL-4 (75/25) | N-2 (4 mg) | W-2 | 26.1 | 47.0 | 5.9 | alkali development (positive development) |
| Comparative Example 106 | A-15 (0.991 g) | — | SL-1/SL-5 (80/20) | N-7 (4 mg) | W-1 | 16.5 | 33.0 | 6.0 | alkali development (positive development) |

As seen from the Table above, in Examples 101 to 124, high sensitivity, high resolution and high line width roughness (LWR) performance could be satisfied all at the same time at remarkably high levels.

In particular, as seen from comparison between Examples 104, 106, 111 and 115 and Comparative Examples 103, 104, 105 and 106 where positive development with an alkali developer was performed using the same resist compositions as in those Examples, a pattern with high resolution, high sensitivity and high LWR performance could be formed by employing the pattern forming method of the present invention using an organic developer. This is considered to result because as described above, in comparison with the case using an alkali developer, use of an organic developer brings reduction in the capillary force imposed on the sidewall of the pattern and in turn, the pattern collapse can be prevented.

Also, as compared with Comparative Examples 101 and 102 (corresponding to Examples 1 and 17 described in JP-A-2010-217884), in Examples using a resin containing the repeating unit (R), a pattern with high resolution and high LWR performance could be formed. This is considered to be a result brought about by factors including the followings. Since the resin has the repeating unit (R), that is, a structural moiety capable of decomposing upon irradiation with an electron beam or an extreme ultraviolet ray is bonded in the resin, (i) the diffusion length of the acid generated can be reduced, (ii) the dissolution contrast for the developer can be enhanced due to reduction in the solubility of the exposed area for an organic solvent-containing developer, and (iii) the structural moiety capable of decomposing upon irradiation with an actinic ray or radiation to generate an acid can be uniformly distributed in the resist film.

Furthermore, it has been found that from the standpoint of enhancing the sensitivity, the resin more preferably contains a repeating unit having an aromatic ring other than the repeating unit (R). This is considered because by having an aromatic ring, the generation efficiency of secondary electron by the irradiation with an electron beam is enhanced, as a result, increase of the generated acid and elevation of the sensitivity are brought about.

In addition, when the resin contains a repeating unit having an aromatic ring other than the repeating unit (R), in the EUV exposure, the resolution and LWR performance were more improved. It is presumed that because the out-of-band light (leaked light generated in the ultraviolet region) in EUV was absorbed, harmful effects thereof (such as surface pattern roughness) were more eliminated.

Incidentally, also in the case of using a developer other than butyl acetate or using a rinsing solution other than 4-methyl-2-pentanol, the same excellent effects as in Examples above are obtained.

INDUSTRIAL APPLICABILITY

According to the present invention, a pattern forming method, an electron beam-sensitive or extreme ultraviolet-sensitive resin composition, and a resist film, which can satisfy high sensitivity, high resolution (e.g., high resolving power) and high line width roughness (LWR) performance all at the same time at remarkably high levels, as well as a manufacturing method of an electronic device using the same, and an electronic device, can be provided.

This application is based on Japanese patent application filed on Sep. 30, 2011 (Japanese Patent Application No. 2011-218546), and the contents thereof are incorporated herein by reference.

The invention claimed is:

1. A pattern forming method comprising:

(1) a step of forming a film by using an electron beam-sensitive or extreme ultraviolet-sensitive resin composition, (2) a step of exposing the film by using an electron beam or an extreme ultraviolet ray, and (3) a step of developing the exposed film by using an organic solvent-containing developer, wherein the electron beam-sensitive or extreme ultraviolet-sensitive resin composition contains (A) a resin containing (R) a repeating unit having a structural moiety capable of decomposing upon irradiation with an electron beam or an extreme ultraviolet ray to generate an acid, and (B) a solvent, and wherein the resin (A) contains a repeating unit represented by formula (I)

(I)

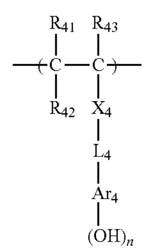

wherein each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ to form a ring and in this case, $R_{42}$ represents a single bond or an alkylene group;

each of $X_4$ and $L_4$ represents a single bond;

$Ar_4$ represents a (n+1)-valent aromatic ring group, and in the case of combining with $R_{42}$ to form a ring, $Ar_4$ represents a (n+2)-valent aromatic ring group; and n represents an integer of 1 to 4.

2. The pattern forming method according to claim 1, wherein the resin (A) further contains a repeating unit having a polar group.

3. The pattern forming method according to claim 2, wherein the polar group is selected from a hydroxyl group, a cyano group, a lactone group, a carboxylic acid group, a sulfonic acid group, an amide group, a sulfonamide group, an ammonium group, a sulfonium group, and a group formed by combining two or more thereof.

4. The pattern forming method according to claim 1, wherein the resin (A) further contains a repeating unit having an acidic group.

5. The pattern forming method according to claim 4, wherein the acidic group is any one of a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

6. The pattern forming method according to claim 1, wherein the structural moiety in the repeating unit (R) is a structure capable of generating an acid group in the side chain of the resin (A) upon irradiation with an electron beam or an extreme ultraviolet ray.

7. The pattern forming method according to claim 1, wherein the structural moiety in the repeating unit (R) is a nonionic structure.

8. The pattern forming method according to claim 7, wherein the nonionic structure is an oxime structure.

9. The pattern forming method according to claim 1, wherein the resin (A) further contains a repeating unit having a group capable of decomposing by the action of an acid to produce an alcoholic hydroxyl group.

10. The pattern forming method according to claim 1, wherein the electron beam-sensitive or extreme ultraviolet-sensitive resin composition further contains a hydrophobic resin.

11. The pattern forming method according to claim 1, further comprising:

a step of rinsing the developed film by using a rinsing solution containing an organic solvent.

12. A method for manufacturing an electronic device, comprising the pattern forming method claimed in claim 1.

13. The pattern forming method according to claim 1, wherein the repeating unit (R) is represented by any one of the following formulae (III) to (VII):

(III)

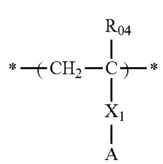

(IV)

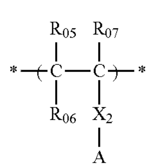

-continued (V)

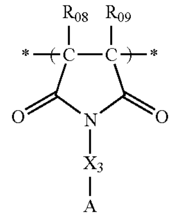

(VI)

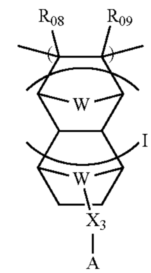

(VII)

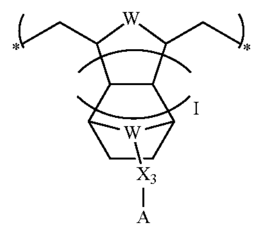

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxy group, —CO—$OR_{25}$ or —CO—N($R_{26}$)($R_{27}$), and in a case where $R_{06}$ represents —CO—N($R_{26}$)($R_{27}$), $R_{26}$ and $R_{27}$ may combine with each other to form a ring together with the nitrogen atom;

each of $X_1$ to $X_3$ contains an arylene group;

$R_{25}$ represents an alkyl group, a cycloalkyl group, an alkenyl group, a cycloalkenyl group, an aryl group or an aralkyl group;

each of $R_{26}$, $R_{27}$ and $R_{33}$ independently represents a hydrogen atom, an alkyl group, a cycloalkyl group, an alkenyl group, a cycloalkenyl group, an aryl group or an aralkyl group;

W represents —O—, —S— or a methylene group;

1 represents 0 or 1; and

A represents a structural moiety capable of decomposing upon irradiation with an actinic ray or radiation to generate an acid.

14. A pattern forming method comprising:

(1) a step of forming a film by using an electron beam-sensitive or extreme ultraviolet-sensitive resin composition, (2) a step of exposing the film by using an electron beam or an extreme ultraviolet ray, and (3) a step of developing the exposed film by using an organic solvent-containing developer, wherein the electron beam-sensitive or extreme ultraviolet-sensitive resin composition contains (A) a resin containing (R) a repeating unit having a structural moiety capable of decomposing upon irradiation with an electron beam or an extreme ultraviolet ray to generate an acid, and (B) a solvent, and wherein the resin (A) contains a repeating unit represented by formula (I)

(I)

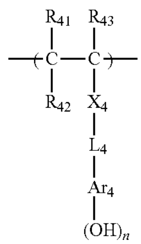

wherein each of $R_{41}$, $R_{42}$ and $R_{43}$ independently represents a hydrogen atom, an alkyl group, a halogen atom, a cyano group or an alkoxycarbonyl group, provided that $R_{42}$ may combine with $Ar_4$ to form a ring and in this case, $R_{42}$ represents a single bond or an alkylene group;

$L_4$ represents a single bond and $X_4$ represents —COO— or CONR$_{64}$—, and $R_{64}$ represents a hydrogen atom or an alkyl group;

$Ar_4$ represents a (n+1)-valent aromatic ring group, and in the case of combining with $R_{42}$ to form a ring, $Ar_4$ represents a (n+2)-valent aromatic ring group; and n represents an integer of 1 to 4.

15. The pattern forming method according to claim 14, wherein the resin (A) further contains a repeating unit having a polar group.

16. The pattern forming method according to claim 15, wherein the polar group is selected from a hydroxyl group, a cyano group, a lactone group, a carboxylic acid group, a sulfonic acid group, an amide group, a sulfonamide group, an ammonium group, a sulfonium group, and a group formed by combining two or more thereof.

17. The pattern forming method according to claim 14, wherein the resin (A) further contains a repeating unit having an acidic group.

18. The pattern forming method according to claim 17, wherein the acidic group is any one of a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

19. The pattern forming method according to claim 14, wherein the structural moiety in the repeating unit (R) is a structure capable of generating an acid group in the side chain of the resin (A) upon irradiation with an electron beam or an extreme ultraviolet ray.

20. The pattern forming method according to claim 14, wherein the structural moiety in the repeating unit (R) is a nonionic structure.

21. The pattern forming method according to claim 20, wherein the nonionic structure is an oxime structure.

22. The pattern forming method according to claim 14, wherein the resin (A) further contains a repeating unit having a group capable of decomposing by the action of an acid to produce an alcoholic hydroxyl group.

23. The pattern forming method according to claim 14, wherein the electron beam-sensitive or extreme ultraviolet-sensitive resin composition further contains a hydrophobic resin.

24. The pattern forming method according to claim 14, further comprising:

a step of rinsing the developed film by using a rinsing solution containing an organic solvent.

25. A method for manufacturing an electronic device, comprising the pattern forming method claimed in claim 14.

* * * * *